US011363296B2

(12) United States Patent
Sharangpani

(10) Patent No.: US 11,363,296 B2
(45) Date of Patent: Jun. 14, 2022

(54) LOSSLESS REDUCTION OF DATA BY USING A PRIME DATA SIEVE AND PERFORMING MULTIDIMENSIONAL SEARCH AND CONTENT-ASSOCIATIVE RETRIEVAL ON DATA THAT HAS BEEN LOSSLESSLY REDUCED USING A PRIME DATA SIEVE

(71) Applicant: Ascava, Inc., Los Altos Hills, CA (US)

(72) Inventor: Harshvardhan Sharangpani, Los Altos Hills, CA (US)

(73) Assignee: Ascava, Inc., Los Altos Hills, CA (US)

(*) Notice: Subject to any disclaimer, the term of this patent is extended or adjusted under 35 U.S.C. 154(b) by 0 days.

(21) Appl. No.: 16/606,061

(22) PCT Filed: Apr. 26, 2018

(86) PCT No.: PCT/US2018/029636
§ 371 (c)(1),
(2) Date: Oct. 17, 2019

(87) PCT Pub. No.: WO2018/200862
PCT Pub. Date: Nov. 1, 2018

(65) Prior Publication Data

US 2021/0144405 A1 May 13, 2021

Related U.S. Application Data

(60) Provisional application No. 62/491,864, filed on Apr. 28, 2017.

(51) Int. Cl.
*H04N 19/61* (2014.01)
*H04N 19/103* (2014.01)
(Continued)

(52) U.S. Cl.
CPC ........... *H04N 19/61* (2014.11); *H04N 19/103* (2014.11); *H04N 19/12* (2014.11); *H04N 19/176* (2014.11)

(58) Field of Classification Search
CPC ........ H04N 19/61; H04N 19/70; H04N 19/46; H04N 19/593; H04N 19/44; H04N 19/196; G10L 19/008; G10L 19/0017; H03M 7/40
See application file for complete search history.

(56) References Cited

U.S. PATENT DOCUMENTS

| | | | | |
|---|---|---|---|---|
| 2013/0339323 A1* | 12/2013 | Sulieman | G06F 16/182 707/693 |
| 2014/0119438 A1* | 5/2014 | Gonen | H04N 19/50 375/240.12 |
| 2016/0188622 A1 | 6/2016 | Sharangpani | |

FOREIGN PATENT DOCUMENTS

| | | |
|---|---|---|
| WO | 2006055587 A2 | 5/2006 |
| WO | 2011123882 A2 | 10/2011 |

(Continued)

OTHER PUBLICATIONS

International Preliminary Report on Patentability for PCT Patent Application No. PCT/US2018/029636 dated Nov. 7, 2019.

(Continued)

*Primary Examiner* — Farhan Mahmud
(74) *Attorney, Agent, or Firm* — Park, Vaughan, Fleming & Dowler LLP; Laxman Sahasrabuddhe

(57) ABSTRACT

Input data can be losslessly reduced by using a data structure that organizes prime data elements based on their contents. Alternatively, the data structure can organize prime data elements based on the contents of a name that is derived from the prime data elements. Specifically, video data can be losslessly reduced by (1) using the data structure to identify a set of prime data elements, and (2) using the set of prime data elements to losslessly reduce intra-frames. The input data can be dynamically partitioned based on the memory usage of components of the data structure. Parcels can be created based on the partitions to facilitate archiving and (Continued)

movement of the data. The losslessly reduced data can be stored using a set of distilled files and a set of prime data element files.

18 Claims, 82 Drawing Sheets

(51) Int. Cl.
*H04N 19/12* (2014.01)
*H04N 19/176* (2014.01)

(56) References Cited

FOREIGN PATENT DOCUMENTS

| | | | |
|---|---|---|---|
| WO | 2016106397 | A1 | 6/2016 |
| WO | 2016205209 | A1 | 12/2016 |
| WO | 2017100619 | A1 | 6/2017 |

OTHER PUBLICATIONS

International Search Report and Written Opinion of the Japan Patent Office for PCT Patent Application No. PCT/US2018/029636 dated Jul. 31, 2018.

* cited by examiner

FIG. 1H : Sample Specification for Format of an Element in the Distilled Data

| Field name | Size | Description | Encodings |
|---|---|---|---|
| Element type | 3 bits | Indicates Type of Distilled Element | 0: Prime Data Element in Prime Data Sieve<br>1: Derivative with Single PDE reconstitution (RP inline in the Distilled Data)<br>2: Derivative with Single PDE reconstitution (PRP in Prime Data Sieve)<br>3: Derivative with Single PDE reconstitution (PRP in PRP Sieve)<br>4: Derivative with Multiple PDE reconstitution (RP inline in the Distilled Data)<br>5: Derivative with Multiple PDE reconstitution (PRP in Prime Data Sieve)<br>6: Derivative with Multiple PDE reconstitution (PRP in PRP Sieve)<br>7: Prime Data Element Inline (in the Distilled Data)<br>Note: PRP = Prime Reconstitution Program, PDE = Prime Data Element |
| Element size | 2 bytes | Size of the Element<br>(size of the Element in the original input) | Encoded as (size -1). 0=1 byte,..... 65535 = 64Kbytes |
| Extra PDE count | 2 bits | *For Multiple PDE Reconstitution only*:<br>Number of extra Prime Data Elements | Encoded as (count-1). 0=1 element,.. 3=4 elements |
| Reference size | 3 bits | Size of reference in bytes to Prime Data Element or Reconstitution Program (RP) | Encoded as (size-1). 0=1 byte, 1=2 bytes,...7=8 bytes |
| PDE Size(s) | 2 bytes | Size of the Prime Data Element (PDE) | Encoded as (size -1). 0=1 byte,..... 65535 = 64Kbytes |
| PDE reference(s) | (Reference size) | References for default Prime Data Element and any extra Prime Data Elements | Element reference |
| RP size | 2 bytes | Size of the Reconstitution Program (RP) | Encoded as (size -1). 0=1 byte,..... 65535 = 64Kbytes |
| Reconstitution Program reference | (Reference size) | *For Reconstitution Program in Prime Data Sieve or Reconstitution Program Sieve only*:<br>Reference to Reconstitution Program | Reconstitution Program reference |
| Reconstitution Program (RP) | Variable | *For Reconstitution Program inline only:*<br>Reconstitution program | See FIG. 7A |

Example 1: Duplicate or Prime Data Element

| | | | | |
|---|---|---|---|---|
| Record type:0 | Element size: 2 bytes | Reference size: 5 (6 bytes) | PDE size : 2 bytes | PDE Reference: 6 bytes |

Example 2: Derivative with Single Element reconstitution, RP inline (13 bytes)

| | | | | | | |
|---|---|---|---|---|---|---|
| Record type:1 | Element size: 2 bytes | Reference size: 5 (6 bytes) | PDE size: 2 bytes | PDE Reference: 6 bytes | RP size: 2 bytes | Reconstitution Program: 13 bytes |

Example 3: Derivative with Multi Element reconstitution, 2 Prime Data Elements, RP in Element Store (Note: B=bytes)

| | | | | | | | | | |
|---|---|---|---|---|---|---|---|---|---|
| Record type:5 | Element size: 2B | Extra PDE count:1 | Ref size: 5 | PDE1 size: 2B | PDE1 Ref: 6B | PDE2 Size:2B | PDE2 Ref: 6B | RP size: 6B | RP Ref: 2B |

FIG. 3F

| Path Info |
| --- |
| Number Of Children N |

| Child ID | Number of differentiating bytes | Differentiating byte values | Reference to child node |
| --- | --- | --- | --- |
| 1 | 6 | abef12d6743a | node 27 |
| 2 | 2 | dcfa | node 16 |
| ... | ... | ... | ... |
| N | 4 | f3231929 | node 4198 |

| Path Info | | | | | |
|---|---|---|---|---|---|
| Number Of Children N | | | | | |
| Child ID | Number of differentiating bytes | Differentiating byte values | Reference to Prime Data Element | Count of Duplicates & Derivatives | Other Metadata for Prime Data Element |
| 1 | 1 | 17 | pde 76 | 4 | <...> |
| 2 | 1 | 32 | pde 4718 | 7 | <...> |
| ... | ... | ... | ... | ... | ... |
| N | 4 | 654aed21 | pde 786 | 12 | <...> |

| Path Info | | | | | | |
|---|---|---|---|---|---|---|
| Number Of Children N | | | | | | |
| Child ID | Number of differentiating bytes | Differentiating byte values | Reference to Prime Data Element | Navigation Lookahead bytes | Count of Duplicates & Derivatives | Other Metadata for Prime Data Element |
| 1 | 1 | 17 | pde 76 | 13476231 | 4 | <...> |
| 2 | 1 | 32 | pde 4718 | 00337650 | 7 | <...> |
| ... | ... | ... | ... | ... | ... | ... |
| N | 4 | 654aed21 | pde 786 | ed189721 | 12 | <...> |

FIG. 5A

*b8ac83d9dc7caf18f2f2e3f783a0ec69774bb50bbe1d3ef1ef8a82436ec43283*
*bc1c0f6a82e19c224b22f9b2*ac83d9619ae5571ad2bbcc15d3e493eef62054b0
5b2dbccce933483a6d3daab3cb19567dedbe33e952a966c49f3297191cf22aa3
1b98b9dcd0fb54a7f761415e*fc5572e8aef212eb21fba09e2aaf9b324cd6ca9b*
*993ef678dbeb51b4a43b294491b0*46093f9d44605fb4ee5cc194bb12c31f954f
5b2ddd65dc4003a55412aa409190d1b91907d693cd33c7109415ec31daa9a378
*2262d3caec40627aae7a544df689255136576b6460fa54eb7321ba8e18c1f211*
360c9eff00feaa95a399dc8528c57a76359b95b445f2762b991269cc431d771c
0f4a7991a466899884b1cbb3a414437134a001321da462897cc3361c0dd8ce33
*d3630fe7434d9a32baa9f914c6ccbb5767f5a96389a0863731ed017919f95b35*
ece4f346093f9d44605f1486e6596dc4313b471261411d08ac8a5111668ae0e3
1e479672707ad2c8b657256563b8*af466e39aa122c717ca0042ffdda90c09244*
*918dac17b6793f5abbdb4326bbdb4326da12cebef5b8*ac83d961889381ed4b02
ec62703f3a6b5da4081519dd55b0e8471ffd7a51dec5d33f22664955d9a26ec4
89ad2e41*d3630fe79c64f5e6916e84d8193b00c9a9e429028ca91bdbf5ad63b1*
*4e1a904884b1cbb364f3cf5a58b7dd5b*cb24796fb97d09f5fad3630fe730c0d8

FIG. 5B

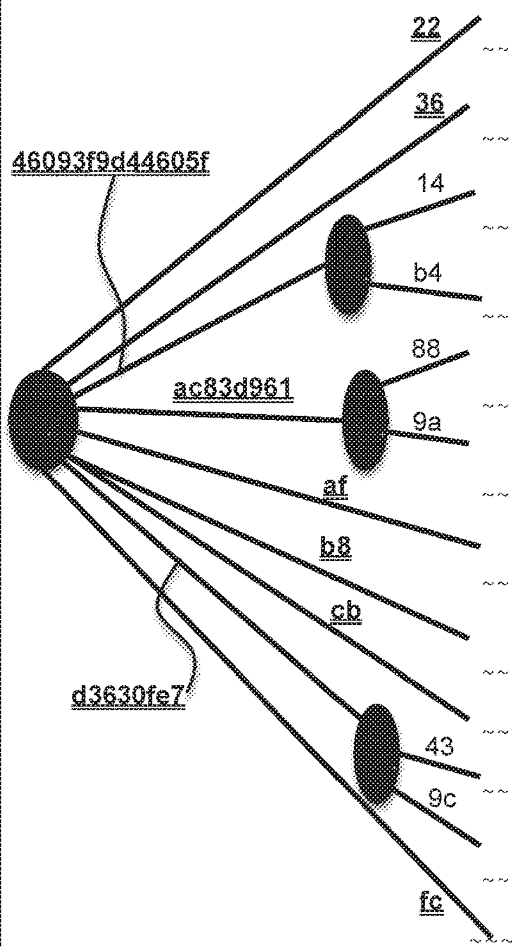

```
element #: element data with leading bytes of Name highlighted.
~~~~~~~~~:~~~~~~~~~~~~~~~~~~~~~~~~~~~~~~~~~~~~~~~~~~~
    1    : 2262d3caec40627aae7a544df689255136576b6460fa54eb7321ba8e18c1f211
~~~~~~~~~:~~~~~~~~~~~~~~~~~~~~~~~~~~~~~~~~~~~~~~~~~~~
    2    : 360c9eff00feaa95a399dc8528c57a76359b95b445f2762b991269cc431d771c0f4a7991
         :     a466899884b1cbb3a414437134a001321da462897cc3361c0dd8ce33
~~~~~~~~~:~~~~~~~~~~~~~~~~~~~~~~~~~~~~~~~~~~~~~~~~~~~
    3    : 46093f9d44605f1486e6596dc4313b471261411d08ac8a5111668ae0e31e479672707ad2
         :     c8b657256563b8
~~~~~~~~~:~~~~~~~~~~~~~~~~~~~~~~~~~~~~~~~~~~~~~~~~~~~
    4    : 46093f9d44605fb4ee5cc194bb12c31f954f5b2ddd65dc4003a55412aa409190d1b91907
         :     d693cd33c7109415ec31daa9a378
~~~~~~~~~:~~~~~~~~~~~~~~~~~~~~~~~~~~~~~~~~~~~~~~~~~~~
    5    : ac83d961889381ed4b02ec62703f3a6b5da4081519dd55b0e8471ffd7a51dec5d33f22664
         :     955d9a26ec489ad2e41
~~~~~~~~~:~~~~~~~~~~~~~~~~~~~~~~~~~~~~~~~~~~~~~~~~~~~
    6    : ac83d9619ae5571ad2bbcc15d3e493eef62054b05b2dbccce933483a6d3daab3cb19567de
         :     dbe33e952a966c49f3297191cf22aa31b98b9dcd0fb54a7f761415e
~~~~~~~~~:~~~~~~~~~~~~~~~~~~~~~~~~~~~~~~~~~~~~~~~~~~~
    7    : af466e39aa122c717ca0042ffdda90c09244918dac17b6793f5abbdb4326bbdb4326da12c
         :     ebef5b8
~~~~~~~~~:~~~~~~~~~~~~~~~~~~~~~~~~~~~~~~~~~~~~~~~~~~~
    8    : b8ac83d9dc7caf18f2f2e3f783a0ec69774bb50bbe1d3ef1ef8a82436ec43283bc1c0f6a8
         :     2e19c224b22f9b2
~~~~~~~~~:~~~~~~~~~~~~~~~~~~~~~~~~~~~~~~~~~~~~~~~~~~~
    9    : cb24796fb97d09f5fad3630fe730c0d8
~~~~~~~~~:~~~~~~~~~~~~~~~~~~~~~~~~~~~~~~~~~~~~~~~~~~~
   10    : d3630fe7434d9a32baa9f914c6ccbb5767f5a96389a0863731ed017919f95b35ece4f3
~~~~~~~~~:~~~~~~~~~~~~~~~~~~~~~~~~~~~~~~~~~~~~~~~~~~~
   11    : d3630fe79c64f5e6916e84d8193b00c9a9e429028ca91bdbf5ad63b14e1a904884b1cbb36
         :     4f3cf5a58b7dd5b
~~~~~~~~~:~~~~~~~~~~~~~~~~~~~~~~~~~~~~~~~~~~~~~~~~~~~
   12    : fc5572e8aef212eb21fba09e2aaf9b324cd6ca9b993ef678dbeb51b4a43b294491b0
~~~~~~~~~:~~~~~~~~~~~~~~~~~~~~~~~~~~~~~~~~~~~~~~~~~~~
```

FIG. 5C

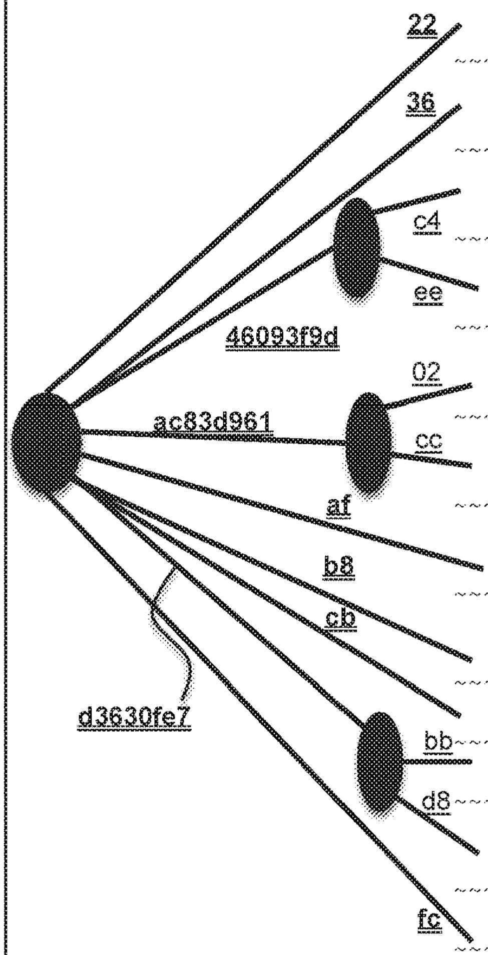

element #: element data with *first* and second dimensions of the name highlighted.

| element # | element data |
| --- | --- |
| 1 | 2262d3caec40627aae7a544df689255136576b6460fa54eb7321ba8e18c1f211 |
| 2 | 360c9eff00feaa95a399dc8528c57a76359b95b445f2762b991269cc431d771c0f4a7991 a466899884b1cbb3a414437134a001321da462897cc3361c0dd8ce33 |
| 3 | 46093f9d44605f1486e6596dc4313b471261411d08ac8a5111668ae0e31e479672707ad2 c8b657256563b8 |
| 4 | 46093f9d44605fb4ee5cc194bb12c31f954f5b2ddd65dc4003a55412aa409190d1b91907 d693cd33c7109415ec31daa9a378 |
| 5 | ac83d961889381ed4b02ec62703f3a6b5da4081519dd55b0e8471ffd7a51dec5d33f22664 955d9a26ec489ad2e41 |
| 6 | ac83d9619ae5571ad2bbcc15d3e493eef62054b05b2dbccce933483a6d3daab3cb19567de dbe33e952a966c49f3297191cf22aa31b98b9dcd0fb54a7f761415e |
| 7 | af466e39aa122c717ca0042ffdda90c09244918dac17b6793f5abbdb4326bbdb4326da12c ebef5b8 |
| 8 | b8ac83d9dc7caf18f2f2e3f783a0ec69774bb50bbe1d3ef1ef8a82436ec43283bc1c0f6a8 2e19c224b22f9b2 |
| 9 | cb24796fb97d09f5fad3630fe730c0d8 |
| 10 | d3630fe7434d9a32baa9f914c6ccbb5767f5a96389a0863731ed017919f95b35ece4f3 |
| 11 | d3630fe79c64f5e6916e84d8193b00c9a9e429028ca91bdbf5ad63b14e1a904884b1cbb36 4f3cf5a58b7dd5b |
| 12 | fc5572e8aef212eb21fba09e2aaf9b324cd6ca9b993ef678dbeb51b4a43b294491b0 |

FIG. 7A Example of instruction encodings for operations used by Reconstitution Program

| Operation | Opcode | Operands |
|---|---|---|
| insert | 0 | original offset, insert length, insert data ('length' bytes) |
| delete | 1 | original offset, length |
| replace | 2 | original offset, replace data (1 byte) |
| bulk replace | 3 | original offset, length, replace data ('length' bytes) |
| append | 4 | length, append data ('length' bytes) |
| multiply | 5 | original offset, product length, multiplier length, multiplier value |
| add | 6 | original offset, sum length, addend length, addend value |
| extension opcode | 7 | see extension operation table |

| Extension operation | Opcode | Scope | Operations and operands |
|---|---|---|---|
| arithmetic | 0 | single PDE | operation, original offset, operation length, operator length, operator |
| multi-element replace (replace with data from a 2nd element) | 1 | multiple PDEs | 2nd element handle, 2nd element offset, original offset, replace length |
| multi-element insert (insert data from a 2nd element) | 2 | multiple PDEs | 2nd element handle, 2nd element offset, original offset, insert length |
| Call & Execute Prime Reconstitution Program Inline (fetch Reconstitution Program from specified address, and execute on single Prime Data Element) | 3 | single PDE | Reference to Called Prime Reconstitution Program |
| Fetch, Modify, & Execute Prime Reconstitution Program (fetch Reconstitution Program from specified address, apply operations in subsequent window to derive new Reconstitution program, and then execute it) | 4 | reconstitution program | Reference to Prime Reconstitution Program, Window |
| reserved | 5-7 | reserved | Reserved |

| Field type | Field size |
|---|---|
| opcode or operation | 3 bits |
| offset | 5 bits |
| length | 5 bits |
| reference | 24 bits |
| handle | 2 bits |

Note: PDE=Prime Data Element

FIG. 8A

```
bc1c0f6a82e19c224b22f9b2ac83d9619ae5571ad2bbcc15d3e493eef62054b0 : chunk 1
fc29344c742bb3e45c197e655912553bd07ab2a91e9d3d2a3feddd3ed2d442b6 : chunk 2
993ef678dbeb51b4a43b294491b046093f9d44605fb4ee5cc194bb12c31f954f : chunk 3
65bc3565a3d9457b656eb3b4a72da8302ec5fb8dc7eeb77c577de08d2b46d3f4 : chunk 4
2262d3caec40627aae7a544df689255136576b6460fa54eb7321ba8e18c1f211 : chunk 5
0f4a7991a466899884b1d3630fe79c64f5e601321da462897cc3361c0dd8ce33 : chunk 6
1e479672707ad2c8b657256563b8af466e39aa122c717ca0042ffdda90c09244 : chunk 7
918dac17b6793f5abbdb4326bbdb4326da12cebef5b8ac83d961889381ed4b02 : chunk 8
ec62703f3a6b5da4081519dd55b0e8471ffd7a51dec5d33f22664955d9a26ec4 : chunk 9
89ad2e3ad3630fe79c64f5e6916e84d8193b00c9a9e429028ca91bdbf5ad63b1 : chunk 10

~~~~~~~~~~~~~~~~~~~~~~~~~~~~~ 42 million chunks in between ~~~~~~~~~~~~~~~~~~~~~~~~~~

ec62703f3a6b5da4081519dd55b0e8471ffd7a51dec5d33f22664955d9a26ec4 : chunk 42,000,011
bc1c0f6a82790ce19c224b22f9b2ac83d9619ae5571ad2bbec152054b0aeb712 : chunk 42,000,012
67b289ad2e41d3630fe79c64f5e6916e84d8193b00c9a9e429028ca91bdbf5ad : chunk 42,000,013
0f4a7991a466899884b1d3630fe79c64f5e6916e84d8193b00c9a9e429028ca9 : chunk 42,000,014
```

FIG. 8B

| element | chunk | MSBs of Name | elements with first, second & third dimensions of Name highlighted |
|---|---|---|---|
| 1 | 2 | 12553b1e9d197e | fc29344c742bb3e45c197e655912553bd07ab2a91e9d3d2a3fedd3ed2d442b6 |
| 2 | 3 | 46093f4460b4a4 | 993ef678dbeb51b4a43b294491b046093f9d44605fb4ee5cc194bb12c31f954f |
| 3 | 5 | 544df636577aae | 2262d3caec40627aae7a544df689255136576b6460fa54eb7321ba8e18c1f211 |
| 4 | 4 | 6eb3b42ec565a3 | 65bc3565a3d9457b656eb3b4a72da8302ec5fb8dc7eeb77c577de08d2b46d3f4 |
| 5 | 9 | 703f3a19dd6b5d | ec62703f3a6b5da4081519dd55b0e8471ffd7a51dec5d33f22664955d9a26ec4 |
| 6 | 8 | ac83d988934326 | 918dac17b6793f5abbdb4326bbdb4326da12cebef5b8ac83d961889381ed4b02 |
| 7 | 1 | ac83d9cc1582e1 | bc1c0f6a82e19c224b22f9b2ac83d9619ae5571ad2bbcc15d3e493eef62054b0 |
| 8 | 7 | af466e717c7ad2 | 1e479672707ad2c8b657256563b8af466e39aa122c717ca0042ffdda90c09244 |
| 9 | 6 | d3630fa4628998 | 0f4a7991a466899884b1d3630fe79c64f5e601321da462897cc3361c0dd8ce33 |
| 10 | 10 | d3630fe69189ad | 89ad2e3ad3630fe79c64f5e6916e84d8193b00c9a9e429028ca91bdbf5ad63b1 |

FIG. 8C

| Element | chunk | MSBs of Name | elements with first, second & third dimensions of Name highlighted |
|---|---|---|---|
| 1 | 2 | 12553b1e9d197e | fc29344c742bb3e45c197e655912553bd07ab2a91e9d3d2a3feddd3ed2d442b6 |
| 2 | 3 | 46093f4460b4a4 | 993ef678dbeb51b4a43b294491b046093f9d44605fb4ee5cc194bb12c31f954f |
| | | | . . . . . . Numerous elements installed . . . . . . |
| 13,143 | 5 | 544df636577aae | 2262d3caec40627aae7a544df689255136576b6460fa54eb7321ba8e18c1f211 |
| 13,144 | 4 | 6eb3b42ec565a3 | 65bc3565a3d9457b656eb3b4a72da8302ec5fb8dc7eeb77c577de08d2b46d3f4 |
| | | | . . . . . . Numerous elements installed . . . . . . |
| 24,789 | 9 | 703f3a19dd6b5d | ec62703f3a6b5da408151 9dd55b0e8471ffd7a51dec5d33f22664955d9a26ec4 |
| | | | . . . . . . Numerous elements installed . . . . . . |
| 187,125 | 8 | ac83d988934326 | 918dac17b6793f5abbdb4326bbdb4326da12cebef5b8ac83d961889381ed4b02 |
| 187,126 | 1 | ac83d9cc1582e1 | bc1c0f6a82e19c224b22f9b2ac83d9619ae5571ad2bbcc15d3e493eef62054b0 |
| | | | . . . . . . Numerous elements installed . . . . . . |
| 1,247,565 | 7 | af466e717c7ad2 | 1e479672707ad2c8b657256563b8af466e39aa122c717ca0042ffdda90c09244 |
| | | | . . . . . . Numerous elements installed . . . . . . |
| 9,299,997 | 6 | d3630fa4628998 | 0f4a7991a466899884b1d3630fe79c64f5e601321da462897cc3361c0dd8ce33 |
| 9,299,998 | 10 | d3630fe69189ad | 89ad2e3ad3630fe79c64f5e6916e84d8193b00c9a9e429028ca91bdbf5ad63b1 |
| 16,000,010 | | | . . . . . . . element 16,000,010 . . . . . . . . . . . . . . |

FIG. 8D

Chunk 42,000,011:

```
ec62703f3a6b5da408151 9dd55b0e8471ffd7a51dec5d33f22664955d9a26ec4
```

Chunk 42,000,012:

```
bc1c0f6a82790ce19c224b22f9b2ac83d9619ae5571ad2bbec152054b0aeb712
```

Derive vs element 187,125:

```
918dac17b6793f5abbdb4326bbdb4326da12cebef5b8ac83d961889381ed4b02~~~~~~~~~~~~~~~~
bc1c0f6a790c82e19c224b22f9b2~~~~~~~~~~~~~~~~ac83d9619ae5571ad2bbec152054b0aeb712
     <replace 14 bytes at original offset 0, bc1c0f6a790c82e19c224b22f9b2>
     <delete 8 bytes at original offset14>
     <replace 6 bytes at original  offset 18,9ae5571ad2bb>
     <insert 8 bytes at original offset 24, ec152054b0aeb712>
```

Derive vs element 187,126:

```
bc1c0f6a82~~~~e19c224b22f9b2ac83d9619ae5571ad2bbcc15d3e493eef62054b0
bc1c0f6a82790ce19c224b22f9b2ac83d9619ae5571ad2bbec15~~~~~~~~~~2054b0aeb712
   <insert 2 bytes at original offset 4, 790c>
   <replace 1 byte at original offset 22, ec>
   <delete 5 bytes at original offset 24>
   <append 3 bytes at end of accumulated bytes, aeb712>
```

FIG. 8E

Chunk 42,000,013:

```
67b289ad2e3ad3630fe79c64f5e6916e84d8193b00c9a9e429028ca91bdbf5ad
```

Derive vs element 9,299,998:

```
~~~~89ad2e3ad3630fe79c64f5e6916e84d8193b00c9a9e429028ca91bdbf5ad63b1
67b289ad2e3ad3630fe79c64f5e6916e84d8193b00c9a9e429028ca91bdbf5ad
  <insert 2 bytes at original offset 0, 67b2>
```

Chunk 42,000,014:

```
0f4a7991a466899884b1d3630fe79c64f5e6916e84d8193b00c9a9e429028ca9
```

Derive vs elements 9,299,997 and 9,299,998:

```
0f4a7991a466899884b1d3630fe79c64f5e601321da462897cc3361c0dd8ce33
          89ad2e3ad3630fe79c64f5e6916e84d8193b00c9a9e429028ca91bdbf5ad63b1

0f4a7991a466899884b1d3630fe79c64f5e6916e84d8193b00c9a9e429028ca9

(start with element 9,299,997)
 <multi-element insert, element 9,299,998, original offset 13,
    2nd element offset 7, length 19>
```

FIG. 9A

*b8ac83d9dc7caf18f2f2e3f783a0ec69774bb50bbe1d3ef1ef8a82436ec43283*
*bc1c0f6a82e19c224b22f9b2*ac83d9619ae5571ad2bbcc15d3e493eef62054b0
5b2dbccce933483a6d3daab3cb19567dedbe33e952a966c49f3297191cf22aa3
1b98b9dcd0fb54a7f761415e*fc5572e8aef212eb21fba09e2aaf9b324cd6ca9b*
*993ef678dbeb51b4a43b294491b0*360c9eff00feaa95a399dc8528c57a76359b
95b445f2762b991269cc431d771c0f4a7991a466899884b1cbb3a414437134a0
01321da462897cc3361c0dd8ce33*d3630fe7434d9a32baa9f914c6ccbb5767f5*
*A96389a0863731ed017919f95b35ece4f3*ac83d961889381ed4b02ec62703f3a
6b5da4081519dd55b0e8471ffd7a51dec5d33f22664955d9a26ec489ad2e41*d3*
*630fe79c64f5e6916e84d8193b00c9a9e429028ca91bdbf5ad63b14e1a904884*
*B1cbb364f3cf5a58b7dd5b*ac83d96188a7b6781a02ec62709fecf32b654003f7
fd3d6a5a2f9ded5a2f9dedada4b3c4f11c80a11bafbd4307da64d487653a21e4

FIG. 9B

Sieve

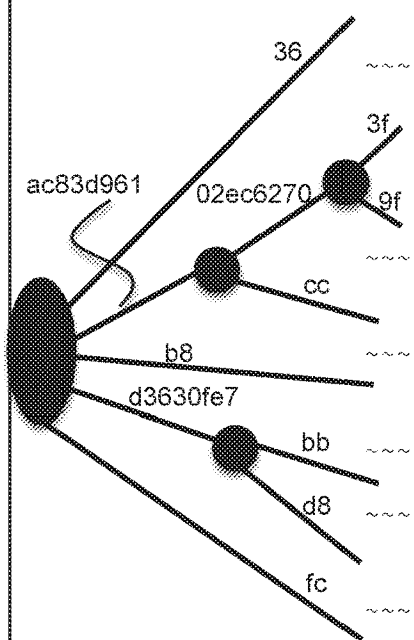

| element ID | element data with ***first*** and <u>second</u> dimensions of the name highlighted, |
|---|---|
| 1 | ***360c9eff***00feaa95a399dc8528c57a76359b95b445f2762b991269cc431d771c0f4a7991 a466899884b1cbb3a414437134a001321da462897cc3361c0dd8ce3 |
| 2 | ***ac83d961***889381ed4b02ec62703f3a6b5da4081519dd55b0e8471ffd7a51dec5d33f2266 4955d9a26ec489ad2e41 |
| 3 | ***ac83d961***88a7b6781a02ec62709fecf32b654003f7fd3d6a5a2f9ded5a2f9dedada4b3c4 f11c80a11bafbd4307da64d487653a21e4 |
| 4 | ***ac83d961***9ae5571ad2bbcc15d3e493eef62054b05b2dbccce933483a6d3daab3cb19567d edbe33e952a966c49f3297191cf22aa31b98b9dcd0fb54a7f761415e |
| 5 | ***b8ac83d9***dc7caf18f2f2e3f783a0ec69774bb50bbe1d3ef1ef8a82436ec43283bc1c0f6a 82e19c224b22f9b2 |
| 6 | ***d3630fe7***434d9a32baa9f914c6ccbb5767f5a96389a0863731ed017919f95b35ece4f3 |
| 7 | ***d3630fe7***9c64f5e6916e84d8193b00c9a9e429028ca91bdbf5ad63b14e1a904884b1cbb3 64f3cf5a58b7dd5b |
| 8 | ***fc5572e8***aef212eb21fba09e2aaf9b324cd6ca9b993ef678dbeb51b4a43b294491b0 |

Content Associative Structure that contains Prime Reconstitution Programs

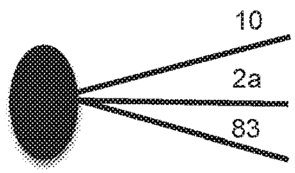

| Prime RP ID | Prime Reconstitution Program | RP Reference |
|---|---|---|
| 1 | 10944f51fd046d5e5b0c | 3 |
| 2 | 2a246404a4568a22 | 2 |
| 3 | 83f50a5a744f143e | 1 |

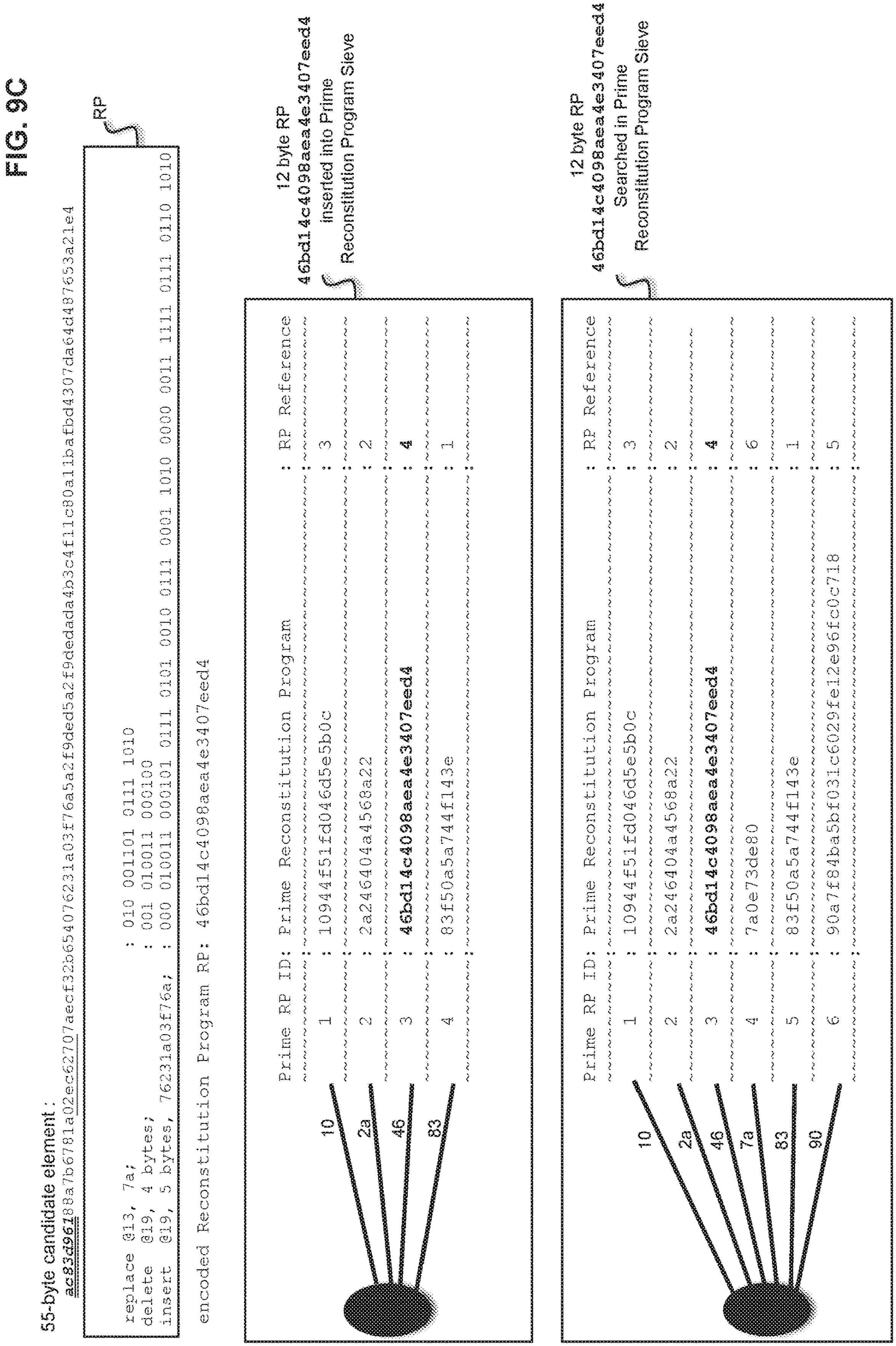
FIG. 9C
55-byte candidate element:
ac83d96188a7b6781a02ec62707aecf32b654076231a03f76a5a2f9ded5a2f9dedada4b3c4f11c80a11bafbd4307da64d487653a21e4
RP
replace @13, 7a; : 010 001101 0111 1010
delete @19, 4 bytes; : 001 010011 000100
insert @19, 5 bytes, 76231a03f76a; : 000 010011 000101 0111 0101 0010 0111 0001 1010 0000 0011 1111 0111 0110 1010
encoded Reconstitution Program RP: 46bd14c4098aea4e3407eed4
12 byte RP
46bd14c4098aea4e3407eed4
inserted into Prime
Reconstitution Program Sieve
Prime RP ID: Prime Reconstitution Program : RP Reference
1 : 10944f51fd046d5e5b0c : 3
2 : 2a246404a4568a22 : 2
3 : 46bd14c4098aea4e3407eed4 : 4
4 : 83f50a5a744f143e : 1
10
2a
46
83
12 byte RP
46bd14c4098aea4e3407eed4
Searched in Prime
Reconstitution Program Sieve
Prime RP ID: Prime Reconstitution Program : RP Reference
1 : 10944f51fd046d5e5b0c : 3
2 : 2a246404a4568a22 : 2
3 : 46bd14c4098aea4e3407eed4 : 4
4 : 7a0e73de80 : 6
5 : 83f50a5a744f143e : 1
6 : 90a7f84ba5bf031c6029fe12e96fc0c718 : 5
10
2a
46
7a
83
90

FIG. 10A

Reconstitution Program:

<insert 2 bytes at original offset 4, 790c>
<replace 1 byte at original offset 22, ec>
<delete 5 bytes at original offset 24>
<append 3 bytes at end of accumulated bytes, aeb783>

Element 187,126:

bc1c0f6a82e19c224b22f9b2ac83d9619ae5571ad2bbcc15d3e493eef62054b0

Execution of the Reconstitution Program:

<insert 2 bytes at original offset 4, 790c>
→ bc1c0f6a790c82e19c224b22f9b2ac83d9619ae5571ad2bbcc15d3e493eef62054b0

<replace 1 byte at original offset 22, ec>
→ bc1c0f6a790c82e19c224b22f9b2ac83d9619ae5571ad2bbec15d3e493eef62054b0

<delete 5 bytes at original offset 24>
→ bc1c0f6a790c82e19c224b22f9b2ac83d9619ae5571ad2bbec15~~d3e493eef6~~2054b0

<append 3 bytes at end of accumulated bytes, aeb783>
→ bc1c0f6a790c82e19c224b22f9b2ac83d9619ae5571ad2bbec152054b0aeb783

Chunk 42,000,012:

bc1c0f6a790c82e19c224b22f9b2ac83d9619ae5571ad2bbec152054b0aeb783

| Logical Block Address (LBA) | Distilled Data or Element specification in losslessly reduced form | | Reference to Count field in Leaf Node Structure for Prime Data Elements | Reference to Count field in Leaf Node Structure for Reconstitution Programs |
|---|---|---|---|---|
| | Opcode or Type of Element | References to associated Prime Data Element Blocks and Reconstitution Programs in Reconstitution Program Blocks | | |
| 1 | Prime | PDE_1 | PDE_Leaf_Node_7, Child_4, Count_PDE_1 | N/A |
| 2 | Derivative | PDE_1, RP_Block_1, Offset_1 | PDE_Leaf_Node_7, Child_4, Count_PDE_1 | RP_Leaf_Node_5, Child_2, Count_RP_1 |
| 3 | Prime | PDE_2 | PDE_Leaf_Node_9, Child_12, Count_PDE_2 | N/A |
| 4 | Derivative | PDE_1, RP_Block_1, Offset_2 | PDE_Leaf_Node_7, Child_4, Count_PDE_1 | RP_Leaf_Node_5, Child_2, Count_RP_2 |
| ... | ... | ... | ... | ... |
| 19 | Derivative | PDE_3, RP_Block_2, Offset_3 | PDE_Leaf_Node_14, Child_6, Count_PDE_3 | RP_Leaf_Node_5, Child_2, Count_RP_14 |
| ... | ... | ... | ... | ... |

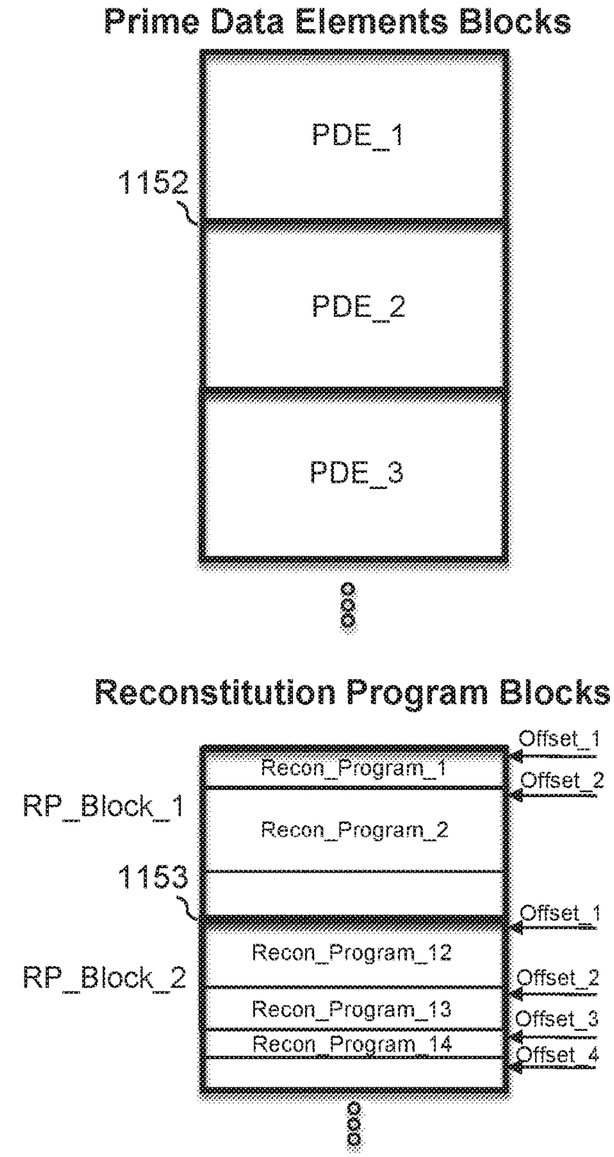

FIG. 13

| Path Info |
| --- |
| Number Of Children<br>N |

| Child ID | Number of differentiating bytes | Differentiating byte values | Reference to Prime Data Element | Navigation Lookahead bytes | Count of Duplicates & Derivatives | Other Metadata for Prime Data Element | Reverse References to Elements in the Distilled Data & indicator whether Element is Prime or Derivative |
| --- | --- | --- | --- | --- | --- | --- | --- |
| 1 | 1 | 17 | pde 76 | 13476231 | 4 | <...> | Elem 25: prime<br>Elem 43: prime<br>Elem 47: deriv<br>........................ |
| 2 | 1 | 32 | pde 4718 | 00337650 | 7 | <...> | Elem 62: prime<br>........................ |
| ... | ... | ... | ... | ... | ... | ... | .............. |
| N | 4 | 654aed21 | pde 786 | ed189721 | 12 | <...> | Elem 13: prime<br>Elem 96: deriv<br>Elem 97: deriv<br>Elem 98: prime<br>Elem 99: deriv<br>........................ |

PROD_ID:num;MFG:text;MONTH:text;CUS_LOC:text;CATEGORY:text;PRICE:num;

1404

<dim=1, key="MFG",prefix=4>
<dim=2, key="CATEGORY",prefix=4>
<dim=3, key="CUS_LOC",prefix=3>
<dim=4, key="MONTH",prefix=3>

FIG. 15

| Keyword | Reverse Reference to Element in Distilled File ( Filename, Element# ) | Offset in Reconstituted Element |
|---|---|---|
| Keyword 1 | File_FOO, Elem 11 | 90 |
| | File_XYZ, Elem 251 | 3043 |
| | File_ABC, Elem 9833 | 682 |
| Keyword 2 | File_Misc, Elem 61773 | 2080 |
| Keyword 3 | File_MyName, Elem 3 | 1641 |
| | File_XYZ, Elem 405 | 808 |
| ... | ... | ... |
| Keyword N | File FOO, Elem 2002 | 1740 |

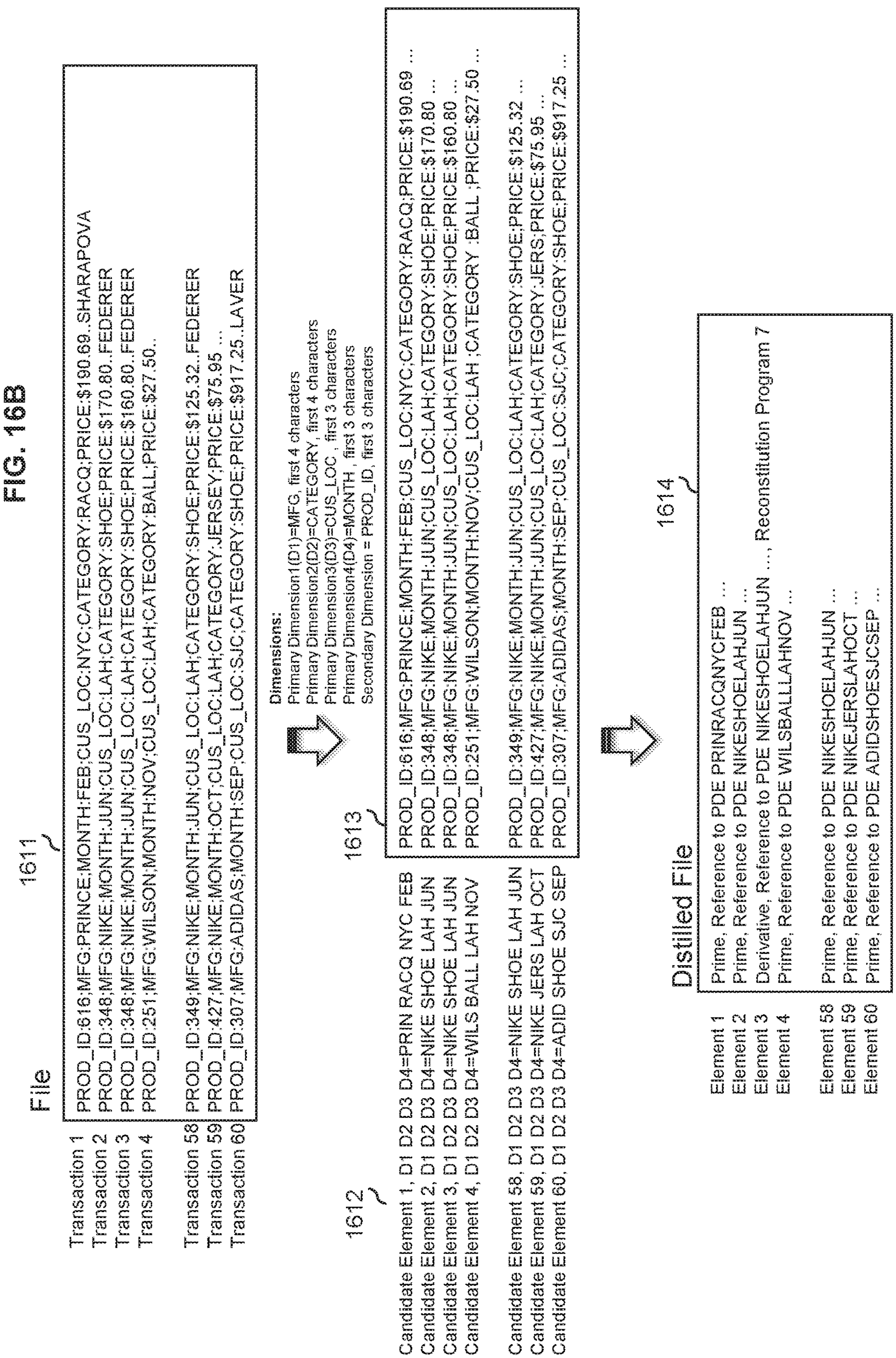
FIG. 16B
File
1611
Transaction 1 PROD_ID:616;MFG:PRINCE;MONTH:FEB;CUS_LOC:NYC;CATEGORY:RACQ;PRICE:$190.69..SHARAPOVA
Transaction 2 PROD_ID:348;MFG:NIKE;MONTH:JUN;CUS_LOC:LAH;CATEGORY:SHOE;PRICE:$170.80..FEDERER
Transaction 3 PROD_ID:348;MFG:NIKE;MONTH:JUN;CUS_LOC:LAH;CATEGORY:SHOE;PRICE:$160.80..FEDERER
Transaction 4 PROD_ID:251;MFG:WILSON;MONTH:NOV;CUS_LOC:LAH;CATEGORY:BALL;PRICE:$27.50..
Transaction 58 PROD_ID:349;MFG:NIKE;MONTH:JUN;CUS_LOC:LAH;CATEGORY:SHOE;PRICE:$125.32..FEDERER
Transaction 59 PROD_ID:427;MFG:NIKE;MONTH:OCT;CUS_LOC:LAH;CATEGORY:JERSEY;PRICE:$75.95 ...
Transaction 60 PROD_ID:307;MFG:ADIDAS;MONTH:SEP;CUS_LOC:SJC;CATEGORY:SHOE;PRICE:$917.25..LAVER
Dimensions:
Primary Dimension1(D1)=MFG, first 4 characters
Primary Dimension2(D2)=CATEGORY, first 4 characters
Primary Dimension3(D3)=CUS_LOC , first 3 characters
Primary Dimension4(D4)=MONTH , first 3 characters
Secondary Dimension = PROD_ID, first 3 characters
1612
Candidate Element 1, D1 D2 D3 D4=PRIN RACQ NYC FEB
Candidate Element 2, D1 D2 D3 D4=NIKE SHOE LAH JUN
Candidate Element 3, D1 D2 D3 D4=NIKE SHOE LAH JUN
Candidate Element 4, D1 D2 D3 D4=WILS BALL LAH NOV
Candidate Element 58, D1 D2 D3 D4=NIKE SHOE LAH JUN
Candidate Element 59, D1 D2 D3 D4=NIKE JERS LAH OCT
Candidate Element 60, D1 D2 D3 D4=ADID SHOE SJC SEP
1613
PROD_ID:616;MFG:PRINCE;MONTH:FEB;CUS_LOC:NYC;CATEGORY:RACQ;PRICE:$190.69 ...
PROD_ID:348;MFG:NIKE;MONTH:JUN;CUS_LOC:LAH;CATEGORY:SHOE;PRICE:$170.80 ...
PROD_ID:348;MFG:NIKE;MONTH:JUN;CUS_LOC:LAH;CATEGORY:SHOE;PRICE:$160.80 ...
PROD_ID:251;MFG:WILSON;MONTH:NOV;CUS_LOC:LAH ;CATEGORY :BALL ;PRICE:$27.50 ...
PROD_ID:349;MFG:NIKE;MONTH:JUN;CUS_LOC:LAH;CATEGORY:SHOE;PRICE:$125.32 ...
PROD_ID:427;MFG:NIKE;MONTH:JUN;CUS_LOC:LAH;CATEGORY:JERS;PRICE:$75.95 ...
PROD_ID:307;MFG:ADIDAS;MONTH:SEP;CUS_LOC:SJC;CATEGORY:SHOE;PRICE:$917.25 ...
Distilled File
1614
Element 1 Prime, Reference to PDE PRINRACQNYCFEB ...
Element 2 Prime, Reference to PDE NIKESHOELAHJUN ...
Element 3 Derivative, Reference to PDE NIKESHOELAHJUN ..., Reconstitution Program 7
Element 4 Prime, Reference to PDE WILSBALLLAHNOV ...
Element 58 Prime, Reference to PDE NIKESHOELAHJUN ...
Element 59 Prime, Reference to PDE NIKEJERSLAHOCT ...
Element 60 Prime, Reference to PDE ADIDSHOESJCSEP ...

FIG. 18A MP3 (MPEG-1 Level 3) Encoder
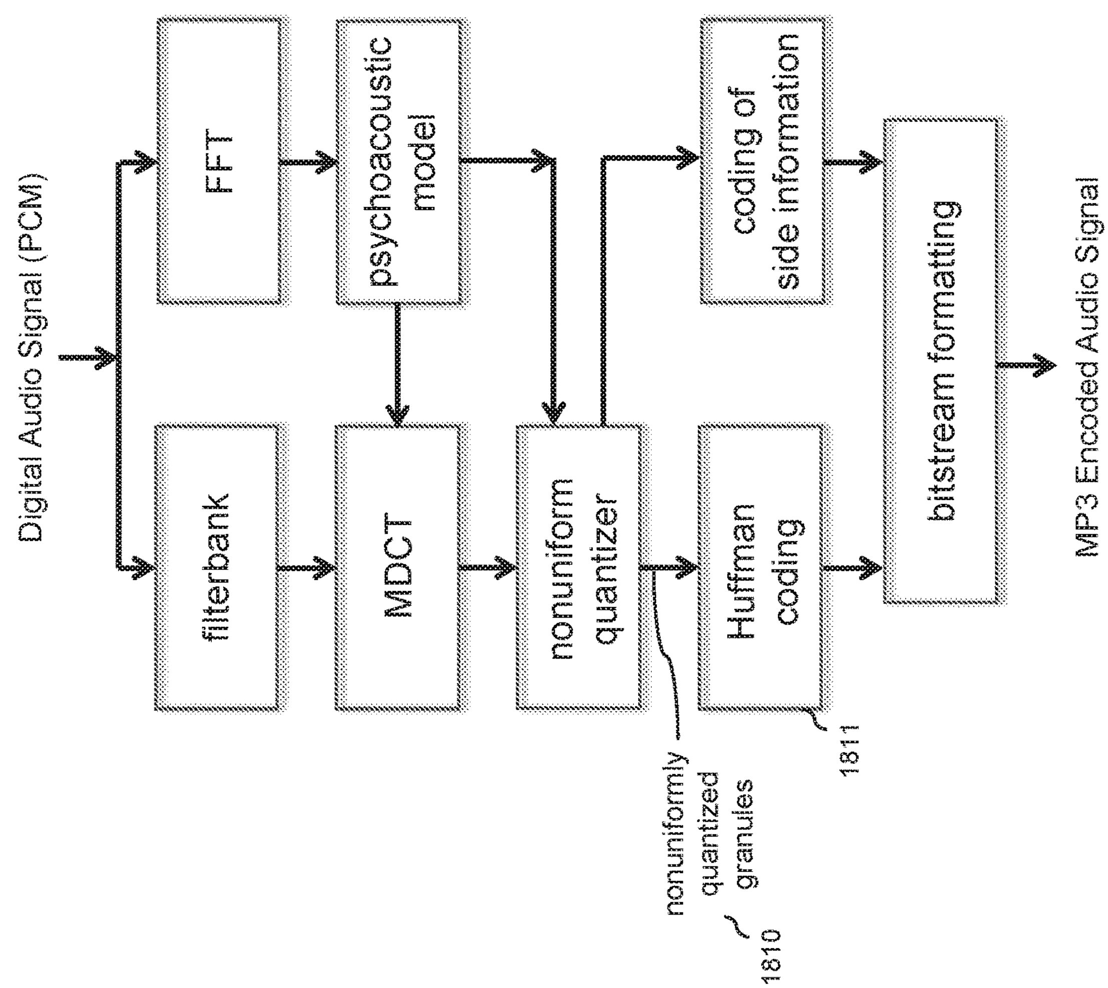

FIG. 18B MP3 (MPEG-1 Level 3) Decoder
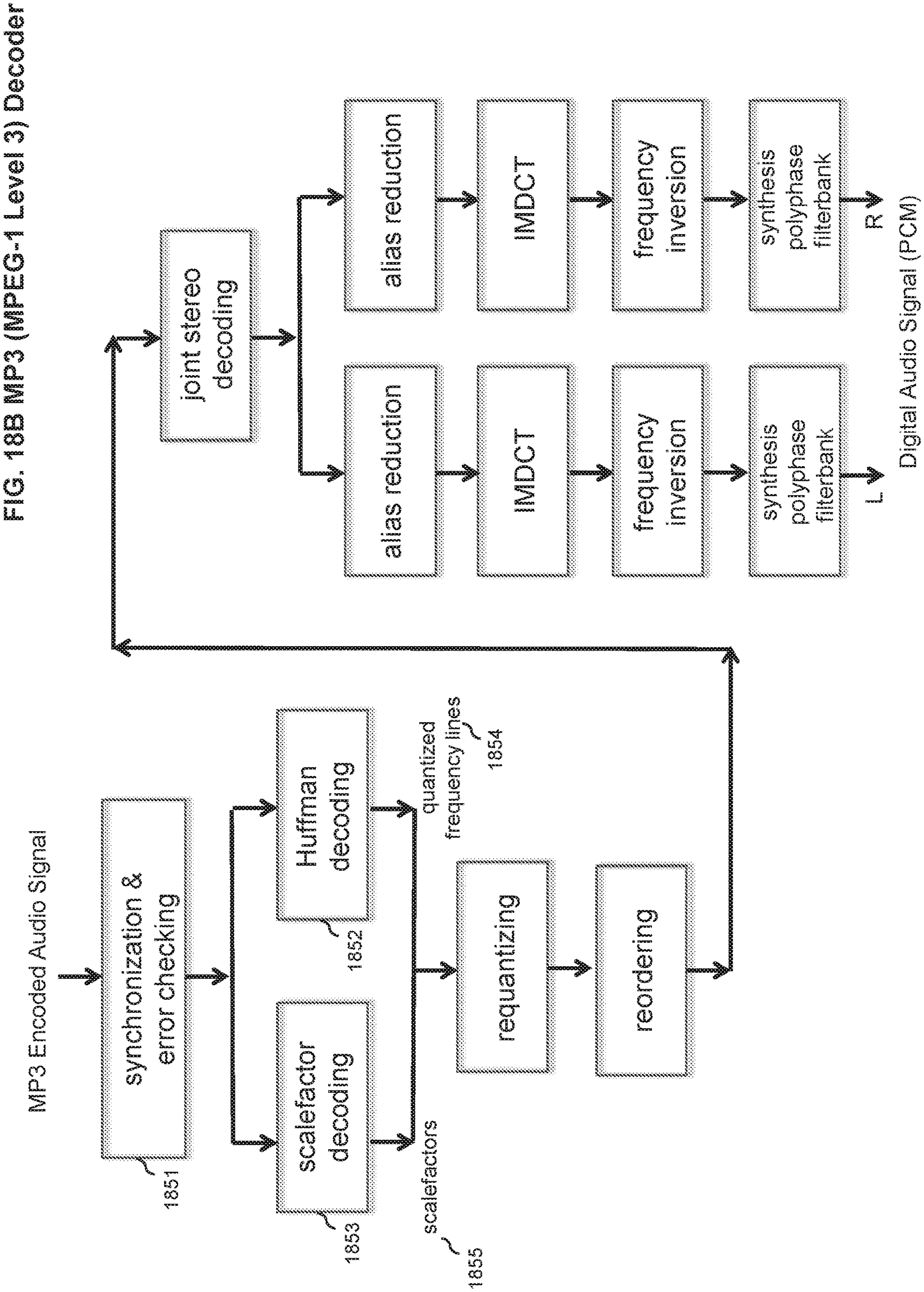

LOSSLESS REDUCTION OF DATA BY USING A PRIME DATA SIEVE AND PERFORMING MULTIDIMENSIONAL SEARCH AND CONTENT-ASSOCIATIVE RETRIEVAL ON DATA THAT HAS BEEN LOSSLESSLY REDUCED USING A PRIME DATA SIEVE

BACKGROUND

Technical Field

This disclosure relates to data storage, retrieval, and communication. More specifically, this disclosure relates to performing multidimensional search and content-associative retrieval on data that has been losslessly reduced using a prime data sieve.

Related Art

The modern information age is marked by the creation, capture, and analysis of enormous amounts of data. New data is generated from diverse sources, examples of which include purchase transaction records, corporate and government records and communications, email, social media posts, digital pictures and videos, machine logs, signals from embedded devices, digital sensors, cellular phone global positioning satellites, space satellites, scientific computing, and the grand challenge sciences. Data is generated in diverse formats, and much of it is unstructured and unsuited for entry into traditional databases. Businesses, governments, and individuals generate data at an unprecedented rate and struggle to store, analyze, and communicate this data. Tens of billions of dollars are spent annually on purchases of storage systems to hold the accumulating data. Similarly large amounts are spent on computer systems to process the data.

In most modern computer and storage systems, data is accommodated and deployed across multiple tiers of storage, organized as a storage hierarchy. The data that is needed to be accessed often and quickly is placed in the fastest albeit most expensive tier, while the bulk of the data (including copies for backup) is preferably stored in the densest and cheapest storage medium. The fastest and most expensive tier of data storage is the computer system's volatile random access memory or RAM, residing in close proximity to the microprocessor core, and offering the lowest latency and the highest bandwidth for random access of data. Progressively denser and cheaper but slower tiers (with progressively higher latency and lower bandwidth of random access) include non-volatile solid state memory or flash storage, hard disk drives (HDDs), and finally tape drives.

In order to more effectively store and process the growing data, the computer industry continues to make improvements to the density and speed of the data storage medium and to the processing power of computers. However, the increase in the volume of data far outstrips the improvement in capacity and density of the computing and data storage systems. Statistics from the data storage industry in 2014 reveal that new data created and captured in the past couple of years comprises a majority of the data ever captured in the world. The amount of data created in the world to date is estimated to exceed multiple zettabytes (a zettabyte is $10^{21}$ bytes). The massive increase in the data places great demands on data storage, computing, and communication systems that must store, process, and communicate this data reliably. This motivates the increased use of lossless data reduction or compression techniques to compact the data so that it can be stored at reduced cost, and likewise processed and communicated efficiently.

A variety of lossless data reduction or compression techniques have emerged and evolved over the years. These techniques examine the data to look for some form of redundancy in the data and exploit that redundancy to realize a reduction of the data footprint without any loss of information. For a given technique that looks to exploit a specific form of redundancy in the data, the degree of data reduction achieved depends upon how frequently that specific form of redundancy is found in the data. It is desirable that a data reduction technique be able to flexibly discover and exploit any available redundancy in the data. Since data originates from a wide variety of sources and environments and in a variety of formats, there is great interest in the development and adoption of universal lossless data reduction techniques to handle this diverse data. A universal data reduction technique is one which requires no prior knowledge of the input data other than the alphabet; hence, it can be applied generally to any and all data without needing to know beforehand the structure and statistical distribution characteristics of the data.

Goodness metrics that can be used to compare different implementations of data compression techniques include the degree of data reduction achieved on the target datasets, the efficiency with which the compression or reduction is achieved, and the efficiency with which the data is decompressed and retrieved for further use. The efficiency metrics assess the performance and cost-effectiveness of the solution. Performance metrics include the throughput or ingest rate at which new data can be consumed and reduced, the latency or time required to reduce the input data, the throughput or rate at which the data can be decompressed and retrieved, and the latency or time required to decompress and retrieve the data. Cost metrics include the cost of any dedicated hardware components required, such as the microprocessor cores or the microprocessor utilization (central processing unit utilization), the amount of dedicated scratch memory and memory bandwidth, as well as the number of accesses and bandwidth required from the various tiers of storage that hold the data. Note that reducing the footprint of the data while simultaneously providing efficient and speedy compression as well as decompression and retrieval has the benefit not only of reducing the overall cost to store and communicate the data but also of efficiently enabling subsequent processing of the data.

Many of the universal data compression techniques currently being used in the industry derive from the Lempel-Ziv compression method developed in 1977 by Abraham Lempel and Jacob Ziv—see e.g., Jacob Ziv and Abraham Lempel, "A Universal Algorithm for Sequential Data Compression," *IEEE transactions on information theory*, Vol. IT-23, No. 3, May 1977. This method became the basis for enabling efficient data transmission via the Internet. The Lempel-Ziv methods (named LZ77, LZ78 and their variants) reduce the data footprint by replacing repeated occurrences of a string with a reference to a previous occurrence seen within a sliding window of a sequentially presented input data stream. On consuming a fresh string from a given block of data from the input data stream, these techniques search through all strings previously seen within the current and previous blocks up to the length of the window. If the fresh string is a duplicate, it is replaced by a backward reference to the original string. If the number of bytes eliminated by the duplicate string is larger than the number of bytes required for the backward reference, a reduction of the data has been achieved. To search through all strings seen in the window, and to provide maximal string matching, implementations of these techniques employ a variety of schemes, including iterative scanning and building a temporary bookkeeping structure that contains a dictionary of all the strings seen in the window. Upon consuming new bytes of input to assemble a fresh string, these techniques either scan through all the bytes in the existing window, or make references to the dictionary of strings (followed by some computation) to decide whether a duplicate has been found and to replace it with a backward reference (or, alternatively, to decide whether an addition needs to be made to the dictionary).

The Lempel-Ziv compression method is often accompanied by a second optimization applied to the data, in which source symbols are dynamically re-encoded based upon their frequency or probability of occurrence in the data block being compressed, often employing a variable-width encoding scheme so that shorter length codes are used for the more frequent symbols, thus leading to a reduction of the data. For an example of such an entropy-based re-encoding method, see David A. Huffman, "A Method for the Construction of Minimum-Redundancy Codes," *Proceedings of the IRE—Institute of Radio Engineers*, September 1952, pp. 1098-1101. This technique is referred to as Huffman re-encoding, and typically needs a first pass through the data to compute the frequencies and a second pass to actually encode the data. Several variations along this theme are also in use.

One example that uses these techniques is a scheme known as "Deflate" which combines the Lempel-Ziv LZ77 compression method with Huffman re-encoding. Deflate provides a compressed stream data format specification that specifies a method for representing a sequence of bytes as a (usually shorter) sequence of bits, and a method for packing the latter bit sequences into bytes. The Deflate scheme was originally designed by Phillip W. Katz of PKWARE, Inc. for the PKZIP archiving utility. See e.g., "String searcher, and compressor using same," Phillip W. Katz, U.S. Pat. No. 5,051,745, Sep. 24, 1991. U.S. Pat. No. 5,051,745 describes a method for searching a vector of symbols (the window) for a predetermined target string (the input string). The solution employs a pointer array with a pointer to each of the symbols in the window, and uses a method of hashing to filter the possible locations in the window that are required to be searched for an identical copy of the input string. This is followed by scanning and string matching at those locations.

The Deflate scheme is implemented in the zlib library for data compression. Zlib is a software library that is a key component of several software platforms such as Linux, Mac OS X, iOS, and a variety of gaming consoles. The zlib library provides Deflate compression and decompression code for use by zip (file archiving), gzip (single file compression), png (Portable Network Graphics format for losslessly compressed images), and many other applications. Zlib is now widely used for data transmission and storage. Most HTTP transactions by servers and browsers compress and decompress the data using zlib. Similar implementations are increasingly being used by data storage systems.

A paper entitled "High Performance ZLIB Compression on Intel® Architecture Processors," that was published by Intel Corp. in April 2014 characterizes the compression and performance of an optimized version of the zlib library running on a contemporary Intel processor (Core I7 4770 processor, 3.4 GHz, 8 MB cache) and operating upon the Calgary corpus of data. The Deflate format used in zlib sets the minimum string length for matching to be 3 characters, the maximum length of the match to be 256 characters, and the size of the window to be 32 kilobytes. The implementation provides controls for 9 levels of optimization, with level 9 providing the highest compression but using the most computation and performing the most exhaustive matching of strings, and level 1 being the fastest level and employing greedy string matching. The paper reports a compression ratio of 51% using the zlib level 1 (fastest level) using a single-threaded processor and spending an average of 17.66 clocks/byte of input data. At a clock frequency of 3.4 GHz, this implies an ingest rate of 192 MB/sec while using up a single microprocessor core. The report also describes how the performance rapidly drops to an ingest rate of 38 MB/sec (average of 88.1 clocks/byte) using optimization level 6 for a modest gain in compression, and to an ingest rate of 16 MB/sec (average of 209.5 clocks/byte) using optimization level 9.

Existing data compression solutions typically operate at ingest rates ranging from 10 MB/sec to 200 MB/sec using a single processor core on contemporary microprocessors. To further boost the ingest rate, multiple cores are employed, or the window size is reduced. Even further improvements to the ingest rate are achieved using custom hardware accelerators, albeit at increased cost.

Existing data compression methods described above are effective at exploiting fine-grained redundancy at the level of short strings and symbols in a local window typically the size of a single message or file or perhaps a few files. These methods have serious limitations and drawbacks when they are used in applications that operate on large or extremely large datasets and that require high rates of data ingestion and data retrieval.

One important limitation is that practical implementations of these methods can exploit redundancy efficiently only within a local window. While these implementations can accept arbitrarily long input streams of data, efficiency dictates that a limit be placed on the size of the window across which fine-grained redundancy is to be discovered. These methods are highly compute-intensive and need frequent and speedy access to all the data in the window. String matching and lookups of the various bookkeeping structures are triggered upon consuming each fresh byte (or few bytes) of input data that creates a fresh input string. In order to achieve desired ingest rates, the window and associated machinery for string matching must reside mostly in the processor cache subsystem, which in practice places a constraint on the window size.

For example, to achieve an ingest rate of 200 MB/sec on a single processor core, the available time budget on average per ingested byte (inclusive of all data accesses and compute) is 5 ns., which means 17 clocks using a contemporary processor with operating frequency of 3.4 GHz. This budget accommodates accesses to on-chip caches (which take a handful of cycles) followed by some string matching. Current processors have on-chip caches of several megabytes of capacity. An access to main memory takes over 200 cycles (~70 ns.), so larger windows residing mostly in memory will further slow the ingest rate. Also, as the window size increases, and the distance to a duplicate string increases, so does the cost to specify the length of backward references, thus encouraging only longer strings to be searched across the wider scope for duplication.

On most contemporary data storage systems, the footprint of the data stored across the various tiers of the storage hierarchy is several orders of magnitude larger than the memory capacity in the system. For example, while a system could provide hundreds of gigabytes of memory, the data footprint of the active data residing in flash storage could be in the tens of terabytes, and the total data in the storage system could be in the range of hundreds of terabytes to multiple petabytes. Also, the achievable throughput of data accesses to subsequent tiers of storage drops by an order of magnitude or more for each successive tier. When the sliding window gets so large that it can no longer fit in memory, these techniques get throttled by the significantly lower bandwidth and higher latency of random IO (Input or Output operations) access to the next levels of data storage.

For example, consider a file or a page of 4 kilobytes of incoming data that can be assembled from existing data by making references to, say, 100 strings of average length of 40 bytes that already exist in the data and are spread across a 256 terabyte footprint. Each reference would cost 6 bytes to specify its address and 1 byte for string length while promising to save 40 bytes. Although the page described in this example can be compressed by more than fivefold, the ingest rate for this page would be limited by the 100 or more IO accesses to the storage system needed to fetch and verify the 100 duplicate strings (even if one could perfectly and cheaply predict where these strings reside). A storage system that offers 250,000 random IO accesses/sec (which means bandwidth of 1 GB/sec of random accesses to pages of 4 KB) could compress only 2,500 such pages of 4 KB size per second for an ingest rate of a mere 10 MB/sec while using up all the bandwidth of the storage system, rendering it unavailable as a storage system.

Implementations of conventional compression methods with large window sizes of the order of terabytes or petabytes will be starved by the reduced bandwidth of data access to the storage system, and would be unacceptably slow. Hence, practical implementations of these techniques efficiently discover and exploit redundancy only if it exists locally, on window sizes that fit in the processor cache or system memory. If redundant data is separated either spatially or temporally from incoming data by multiple terabytes, petabytes, or exabytes, these implementations will be unable to discover the redundancy at acceptable speeds, being limited by storage access bandwidth.

Another limitation of conventional methods is that they are not suited for random access of data. Blocks of data spanning the entire window that was compressed need to be decompressed before any chunk within any block can be accessed. This places a practical limit on the size of the window. Additionally, operations (e.g., a search operation) that are traditionally performed on uncompressed data cannot be efficiently performed on the compressed data.

Yet another limitation of conventional methods (and, in particular, Lempel-Ziv based methods) is that they search for redundancy only along one dimension—that of replacing identical strings by backward references. A limitation of the Huffman re-encoding scheme is that it needs two passes through the data, to calculate frequencies and then re-encode. This becomes slow on larger blocks.

Data compression methods that detect long duplicate strings across a global store of data often use a combination of digital fingerprinting and hashing schemes. This compression process is referred to as data deduplication. The most basic technique of data deduplication breaks up files into fixed-sized blocks and looks for duplicate blocks across the data repository. If a copy of a file is created, each block in the first file will have a duplicate in the second file and the duplicate can be replaced with a reference to the original block. To speed up matching of potentially duplicate blocks, a method of hashing is employed. A hash function is a function that converts a string into a numeric value, called its hash value. If two strings are equal, their hash values are also equal. Hash functions map multiple strings to a given hash value, whereby long strings can be reduced to a hash value of much shorter length. Matching of the hash values will be much faster than matching of two long strings; hence, matching of the hash values is done first, to filter possible strings that might be duplicates. If the hash value of the input string or block matches a hash value of strings or blocks that exist in the repository, the input string can then be compared with each string in the repository that has the same hash value to confirm the existence of the duplicate.

Breaking up a file into fixed-sized blocks is simple and convenient, and fixed-sized blocks are highly desirable in a high-performance storage system. However, this technique has limitations in the amount of redundancy it can uncover, which means that these techniques have low levels of compression. For example, if a copy of a first file is made to create a second file, and if even a single byte of data is inserted into the second file, the alignment of all downstream blocks will change, the hash value of each new block will be computed afresh, and the data deduplication method will no longer find all the duplicates.

To address this limitation in data deduplication methods, the industry has adopted the use of fingerprinting to synchronize and align data streams at locations of matching content. This latter scheme leads to variable-sized blocks based on the fingerprints. Michael Rabin showed how randomly chosen irreducible polynomials can be used to fingerprint a bit-string—see e.g., Michael O. Rabin, "Fingerprinting by Random Polynomials," *Center for Research in Computing Technology*, Harvard University, TR-15-81, 1981. In this scheme, a randomly chosen prime number p is used to fingerprint a long character-string by computing the residue of that string viewed as a large integer modulo p. This scheme requires performing integer arithmetic on k-bit integers, where $k=\log_2(p)$. Alternatively, a random irreducible prime polynomial of order k can be used, and the fingerprint is then the polynomial representation of the data modulo the prime polynomial.

This method of fingerprinting is used in data deduplication systems to identify suitable locations at which to establish chunk boundaries, so that the system can look for duplicates of these chunks in a global repository. Chunk boundaries can be set upon finding fingerprints of specific values. As an example of such usage, a fingerprint can be calculated for each and every 48-byte string in the input data (starting at the first byte of the input and then at every successive byte thereafter), by employing a polynomial of order 32 or lower. One can then examine the lower 13 bits of the 32-bit fingerprint, and set a breakpoint whenever the value of those 13 bits is a pre-specified value (e.g., the value 1). For random data, the likelihood of the 13 bits having that particular value would be 1 in $2^{13}$, so that such a breakpoint is likely to be encountered approximately once every 8 KB, leading to variable-sized chunks of average size 8 KB. The breakpoints or chunk boundaries will effectively be aligned to fingerprints that depend upon the content of the data. When no fingerprint is found for a long stretch, a breakpoint can be forced at some pre-specified threshold, so that the system is certain to create chunks that are shorter than a pre-specified size for the repository. See e.g., Athicha Muthitacharoen, Benjie Chen, and David Mazières, "A Low-bandwidth Network File System," SOSP '01, *Proceedings of the eighteenth ACM symposium on Operating Systems Principles*, Oct. 21, 2001, pp. 174-187.

The Rabin-Karp string matching technique developed by Michael Rabin and Richard Karp provided further improvements to the efficiency of fingerprinting and string matching (see e.g., Michael O. Rabin and R. Karp, "Efficient Randomized Pattern-Matching Algorithms," *IBM Jour. of Res.*

*and Dev.*, vol. 31, 1987, pp. 249-260). Note that a fingerprinting method that examines an m byte substring for its fingerprint can evaluate the fingerprinting polynomial function in O(m) time. Since this method would need to be applied on the substring starting at every byte of the, say, n byte input stream, the total effort required to perform fingerprinting on the entire data stream would be O(n×m). Rabin-Karp identified a hash function referred to as a Rolling Hash on which it is possible to compute the hash value of the next substring from the previous one by doing only a constant number of operations, independently of the length of the substring. Hence, after shifting one byte to the right, the computation of the fingerprint on the new m byte string can be done incrementally. This reduces the effort to compute the fingerprint to O(1), and the total effort for fingerprinting the entire data stream to O(n), linear with the size of the data. This greatly speeds up computation and identification of the fingerprints.

Typical data access and computational requirements for the above-described data deduplication methods can be described as follows. For a given input, once fingerprinting is completed to create a chunk, and after the hash value for the chunk is computed, these methods first need one set of accesses to memory and subsequent tiers of storage to search and look up the global hash table that keeps the hash values of all chunks in the repository. This would typically need a first IO access to storage. Upon a match in the hash table, this is followed by a second set of storage IOs (typically one, but could be more than one depending upon how many chunks with the same hash value exist in the repository) to fetch the actual data chunks bearing the same hash value. Lastly, byte-by-byte matching is performed to compare the input chunk to the fetched potentially matching chunks to confirm and identify the duplicate. This is followed by a third storage IO access (to the metadata space) for replacing the new duplicate block with a reference to the original. If there is no match in the global hash table (or if no duplicate is found), the system needs one IO to enter the new block into the repository and another IO to update the global hash table to enter in the new hash value. Thus, for large datasets (where the metadata and global hash table do not fit in memory, and hence need a storage IO to access them) such systems could need an average of three IOs per input chunk. Further improvements are possible by employing a variety of filters so that misses in the global hash table can often be detected without requiring the first storage IO to access the global hash table, thus reducing the number of IOs needed to process some of the chunks down to two.

A storage system that offers 250,000 random IO accesses/sec (which means bandwidth of 1 GB/sec of random accesses to pages of 4 KB) could ingest and deduplicate about 83,333 (250,000 divided by 3 IOs per input chunk) input chunks of average size 4 KB per second, enabling an ingest rate of 333 MB/sec while using up all the bandwidth of the storage system. If only half of the bandwidth of the storage system is used (so that the other half is available for accesses to the stored data), such a deduplication system could still deliver ingest rates of 166 MB/sec. These ingest rates (which are limited by I/O bandwidth) are achievable provided that sufficient processing power is available in the system. Thus, given sufficient processing power, data deduplication systems are able to find large duplicates of data across the global scope of the data with an economy of IOs and deliver data reduction at ingest rates in the hundreds of megabytes per second on contemporary storage systems.

Based on the above description, it should be clear that, while these deduplication methods are effective at finding duplicates of long strings across a global scope, they are effective mainly at finding large duplicates. If there are variations or modifications to the data at a finer grain, the available redundancy will not be found using this method. This greatly reduces the breadth of datasets across which these methods are useful. These methods have found use in certain data storage systems and applications, e.g., regular backup of data, where the new data being backed up has only a few files modified and the rest are all duplicates of the files that were saved in the previous backup. Likewise, data deduplication based systems are often deployed in environments where multiple exact copies of the data or code are made, such as in virtualized environments in datacenters. However, as data evolves and is modified more generally or at a finer grain, data deduplication based techniques lose their effectiveness.

Some approaches (usually employed in data backup applications) do not perform the actual byte-by-byte comparison between the input data and the string whose hash value matches that of the input. Such solutions rely on the low probability of a collision using strong hash functions like the SHA-1. However, due to the finite non-zero probability of a collision (where multiple different strings could map to the same hash value), such methods cannot be considered to provide lossless data reduction, and would not, therefore, meet the high data-integrity requirements of primary storage and communication.

Some approaches combine multiple existing data compression techniques. Typically, in such a setup, the global data deduplication methods are applied to the data first. Subsequently, on the deduplicated dataset, and employing a small window, the Lempel-Ziv string compression methods combined with Huffman re-encoding are applied to achieve further data reduction.

However, in spite of employing all hitherto-known techniques, there continues to be a gap of several orders of magnitude between the needs of the growing and accumulating data and what the world economy can affordably accommodate using the best available modern storage systems. Given the extraordinary requirements of storage capacity demanded by the growing data, there continues to be a need for improved ways to further reduce the footprint of the data. There continues to be a need to develop methods that address the limitations of existing techniques, or that exploit available redundancy in the data along dimensions that have not been addressed by existing techniques. At the same time, it continues to be important to be able to efficiently access and retrieve the data at an acceptable speed and at an acceptable cost of processing. There also continues to be a need to be able to efficiently perform search operations directly on the reduced data.

In summary, there continues to be a long-felt need for lossless data reduction solutions that can exploit redundancy across large and extremely large datasets and provide high rates of data ingestion, data search, and data retrieval.

SUMMARY

Embodiments described herein feature techniques and systems that can perform lossless data reduction on large and extremely large datasets while providing high rates of data ingestion and data retrieval, and that do not suffer from the drawbacks and limitations of existing data compression systems.

Specifically, some embodiments can extract compressed moving-picture data and compressed audio data from the video data. Next, the embodiments can extract intra-frames (I-frames) from the compressed moving-picture data. The embodiments can then losslessly reduce the I-frames to obtain losslessly-reduced I-frames. Losslessly reducing the I-frames can comprise, for each I-frame, (1) identifying a first set of prime data elements by using the I-frame to perform a first content-associative lookup on a data structure that organizes prime data elements based on their contents, and (2) using the first set of prime data elements to losslessly reduce the I-frame. The embodiments can additionally decompress the compressed audio data to obtain a set of audio components. Next, for each audio component in the set of audio components, the embodiments can (1) identify a second set of prime data elements by using the audio component to perform a second content-associative lookup on the data structure that organizes prime data elements based on their contents, and (2) use the second set of prime data elements to losslessly reduce the audio component.

Some embodiments can initialize a data structure that is stored in a first memory device and that is configured to organize prime data elements based on their contents. Next, the embodiments can factorize input data into a sequence of candidate elements. For each candidate element, the embodiments can (1) identify a set of prime data elements by using the candidate element to perform a content-associative lookup on the data structure, and (2) losslessly reduce the candidate element by using the set of prime data elements, wherein the candidate element is added to the data structure as a new prime data element if the candidate element is not sufficiently reduced in size. Next, the embodiments can store the losslessly reduced candidate element in a second memory device. Upon detecting that a size of one or more components of the data structure is greater than a threshold, the embodiments can (1) move one or more components of the data structure to the second memory device, and (2) initialize the one or more components of the data structure that were moved to the second memory device. A losslessly reduced data lot can include (1) losslessly reduced candidate elements that were stored on the second memory device between temporally adjacent initializations, and (2) components of the data structure that were moved to the second memory device between the temporally adjacent initializations. In a variation, the embodiments can create a set of parcels based on losslessly reduced data lots stored on the second memory device, wherein the set of parcels facilitates archival and movement of data from one computer to another computer.

Some embodiments can factorize input data into a sequence of candidate elements. Next, for each candidate element, the embodiments can (1) split the candidate element into one or more fields, (2) for each field, divide the field by a prime polynomial to obtain a quotient-and-remainder pair, (3) determine a name based on one or more quotient-and-remainder pairs, (4) identify a set of prime data elements by using the name to perform a content-associative lookup on a data structure that organizes prime data elements based on contents of their respective names, and (5) losslessly reduce the candidate element by using the set of prime data elements.

Some embodiments can factorize input data into a sequence of candidate elements. Next, for each candidate element, the embodiments can (1) identify a set of prime data elements by using the candidate element to perform a content-associative lookup on a data structure that organizes prime data elements based on their contents, and (2) losslessly reduce the candidate element by using the set of prime data elements. The embodiments can then store losslessly reduced candidate elements in a set of distilled files. Next, the embodiments can store the prime data elements in a set of prime data element files. In some embodiments, each losslessly reduced candidate element specifies, for each prime data element that was used to reduce the candidate element, a prime data element file that contains the prime data element and an offset where the prime data element can be found in the prime data element file. In some embodiments, each distilled file stores a list of prime data element files that contain prime data elements that were used to losslessly reduce candidate elements that are stored in the distilled file.

Using the set of prime data elements to losslessly reduce a data element (e.g., an I-frame, an audio component, a candidate element, etc.) can comprise: (1) in response to determining that a sum of (i) sizes of references to the set of prime data elements and (ii) a size of a description of a reconstitution program is less than a threshold fraction of a size of the data element, generating a first losslessly reduced representation of the data element, wherein the first losslessly reduced representation includes a reference to each prime data element in the set of prime data elements and a description of the reconstitution program; and (2) in response to determining that the sum of (i) the sizes of the references to the set of prime data elements and (ii) the size of the description of the reconstitution program is greater than or equal to the threshold fraction of the size of the data element, adding the data element as a new prime data element in the data structure, and generating a second losslessly reduced representation of the data element, wherein the second losslessly reduced representation includes a reference to the new prime data element. Note that the description of the reconstitution program can specify a sequence of transformations which, when applied to the set of prime data elements (i.e., the one or more prime data elements that were used to losslessly reduce the data element), results in the data element.

BRIEF DESCRIPTION OF THE FIGURES

FIG. 1H presents an example of a format and a specification describing the structure of the Distilled Data in accordance with some embodiments described herein.

FIG. 3F presents a self-describing tree node data structure in accordance with some embodiments described herein.

FIG. 3G presents a self-describing leaf node data structure in accordance with some embodiments described herein.

FIG. 3H presents a self-describing leaf node data structure that includes the Navigation Lookahead field in accordance with some embodiments described herein.

FIGS. 5A-5C illustrate an actual example of how data can be organized using embodiments described herein.

FIG. 7A provides an example of the transformations that could be specified in the Reconstitution Program in accordance with some embodiments described herein.

FIGS. 8A-8E illustrate how data reduction can be performed by factorizing input data into fixed sized elements and organizing the elements in a tree data structure that was described in reference to FIGS. 3D and 3E in accordance with some embodiments described herein.

FIGS. 9A-9C illustrate an example of the Data Distillation™ scheme based on the system shown in FIG. 1C in accordance with some embodiments described herein.

FIG. 10A provides an example of how transformations specified in the Reconstitution Program are applied to a Prime Data Element to yield a Derivative Element in accordance with some embodiments described herein.

FIG. 11I illustrates how the Data Distillation™ apparatus may be used for data reduction in a block processing storage system.

FIGS. 13-17 illustrate how multidimensional search and data retrieval can be performed on the reduced data in accordance with some embodiments described herein.

FIGS. 18A-B show a block diagram for an Encoder and Decoder for compression and decompression of audio data according to the MPEG 1, Layer 3 Standard (also referred to as MP3).

DETAILED DESCRIPTION

Figure 1A:
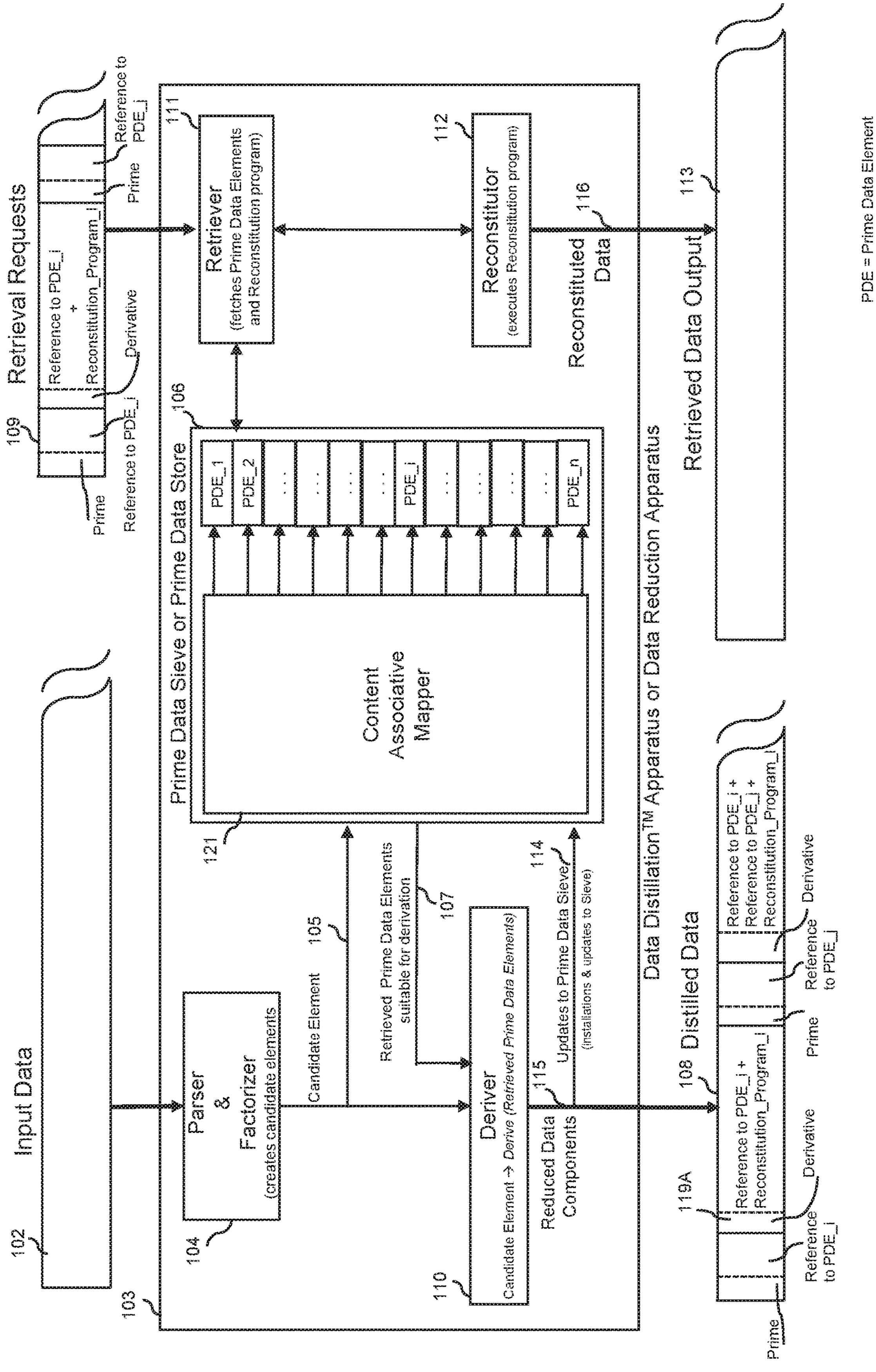
FIG. 1A illustrates methods and apparatuses for data reduction that factorize input data into elements and derive these from Prime Data Elements resident in a Prime Data Sieve in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein. In this disclosure, when a phrase uses the term "and/or" with a set of entities, the phrase covers all possible combinations of the set of entities unless specified otherwise. For example, the phrase "X, Y, and/or Z" covers the following seven combinations: "X only," "Y only," "Z only," "X and Y, but not Z," "X and Z, but not Y," "Y and Z, but not X," and "X, Y, and Z."

Efficient Lossless Reduction of Data Using a Prime Data Sieve

In some embodiments described herein, data is organized and stored to efficiently uncover and exploit redundancy globally across the entire dataset. An input data stream is broken up into constituent pieces or chunks called elements, and redundancy among the elements is detected and exploited at a grain finer than the element itself, thus reducing the overall footprint of stored data. A set of elements called Prime Data Elements are identified and used as common and shared building blocks for the dataset, and stored in a structure referred to as the Prime Data Store or Prime Data Sieve. A Prime Data Element is simply a sequence of bits, bytes, or digits of a certain size. Prime Data Elements can be either fixed-sized or variable-sized, depending upon the implementation. Other constituent elements of the input data are derived from Prime Data Elements and are referred to as Derivative Elements. Thus, input data is factorized into Prime Data Elements and Derivative Elements.

The Prime Data Sieve orders and organizes the Prime Data Elements so that the Prime Data Sieve can be searched and accessed in a content-associative manner. Given some input content, with some restrictions, the Prime Data Sieve can be queried to retrieve Prime Data Elements containing that content. Given an input element, the Prime Data Sieve can be searched, using the value of the element, or the values of certain fields in the element, to quickly provide either one or a small set of Prime Data Elements from which the input element can be derived with minimal storage required to specify the derivation. In some embodiments, the elements in the Prime Data Sieve are organized in tree form. A Derivative Element is derived from a Prime Data Element by performing transformations on it, such transformations being specified in a Reconstitution Program, which describes how to generate the Derivative Element from one or more Prime Data Elements. A Distance Threshold specifies a limit on the size of the stored footprint of a Derivative Element. This threshold effectively specifies the maximum allowable distance of Derivative Elements from Prime Data Elements, and also places a limit on the size of the Reconstitution Program that can be used to generate a Derivative Element.

Retrieval of derivative data is accomplished by executing the Reconstitution Program on the one or more Prime Data Elements specified by the derivation.

In this disclosure, the above-described universal lossless data reduction technique may be referred to as a Data Distillation™ process. It performs a function similar to distillation in chemistry—separating a mixture into its constituent elements. The Prime Data Sieve is also referred to as the Sieve or the Data Distillation™ Sieve or the Prime Data Store.

In this scheme, the input data stream is factorized into a sequence of elements, each element being either a Prime Data Element or a Derivative Element which derives from one or more Prime Data Elements. Each element is transformed into a losslessly reduced representation which, in the case of a Prime Data Element includes a reference to the Prime Data Element, and in the case of a Derivative Element includes references to the one or more Prime Data Elements involved in the derivation, and a description of the Reconstitution Program. Thus the input data stream is factorized into a sequence of elements that are in the losslessly reduced representation. This sequence of elements (appearing in the losslessly reduced representation) is referred to as a distilled data stream or distilled data. The sequence of elements in the distilled data has a one-to-one correspondence to the sequence of elements in the input data, i.e., the $n^{th}$ element in the sequence of elements in the distilled data corresponds to the $n^{th}$ element in the sequence of elements in the input data.

The universal lossless data reduction technique described in this disclosure receives an input data stream and converts it into the combination of a distilled data stream and a Prime Data Sieve, such that the sum of the footprints of the distilled data stream and the Prime Data Sieve is usually smaller than the footprint of the input data stream. In this disclosure, the distilled data stream and the Prime Data Sieve are collectively called the losslessly reduced data, and will also be referred to interchangeably as the "reduced data stream" or "reduced data" or "Reduced Data" Likewise, for the sequence of elements that is produced by the lossless data reduction techniques described in this disclosure, and that appear in the losslessly reduced format, the following terms are used interchangeably: "reduced output data stream," "reduced output data", "distilled data stream," "distilled data", and "Distilled Data."

FIG. 1A illustrates methods and apparatuses for data reduction that factorize input data into elements and derive these from Prime Data Elements resident in a Prime Data Sieve in accordance with some embodiments described herein. This figure illustrates an overall block diagram of the data reduction or Data Distillation™ methods and apparatuses and provides an overview of the functional components, structures, and operations. The components and/or operations illustrated in FIG. 1A may be realized using software, hardware, or a combination thereof.

A sequence of bytes is received from an input data stream and presented as Input Data 102 to Data Reduction Apparatus 103, also referred to as the Data Distillation™ Apparatus. Parser & Factorizer 104 parses the incoming data and breaks it into chunks or candidate elements. The Factorizer decides where in the input stream to insert breaks to slice up the stream into candidate elements. Once two consecutive breaks in the data have been identified, a Candidate Element 105 is created by the Parser and Factorizer and presented to Prime Data Sieve 106, also referred to as the Data Distillation™ Sieve.

Data Distillation™ Sieve or Prime Data Sieve 106 contains all the Prime Data Elements (labeled as PDEs in FIG. 1A), and orders and organizes them based upon their value or content. The Sieve provides support for two kinds of access. First, each of the Prime Data Elements can be directly accessed via a reference to the location where the Prime Data Element resides in the Sieve. Second, elements can be accessed in a content-associative manner by using Content-Associative Mapper 121, which could be implemented in software, hardware, or a combination thereof. This second form of access to the Sieve is an important feature that is used by the disclosed embodiments either to identify a Prime Data Element that exactly matches a Candidate Element 105, or to identify Prime Data Elements from which the candidate element can be derived. Specifically, given a candidate element, e.g., Candidate Element 105, the Prime Data Sieve 106 can be searched (based upon the value of the Candidate Element 105, or based upon the value of certain fields in the Candidate Element 105), to quickly provide one or a small set of Prime Data Elements 107 from which the candidate element can be derived with minimal storage needed to specify the derivation.

The Sieve or Prime Data Sieve 106 can be initialized with a set of Prime Data Elements whose values are spread across the data space. Alternatively, the Sieve can start out empty, and Prime Data Elements can be added to it dynamically as data is ingested, in accordance with the Data Distillation™ process described herein in reference to FIGS. 1A-C and FIG. 2.

Deriver 110 receives the Candidate Element 105 and the retrieved Prime Data Elements suitable for derivation 107 (which are content associatively retrieved from the Prime Data Sieve 106), determines whether or not the Candidate Element 105 can be derived from one or more of these Prime Data Elements, generates Reduced Data Components 115 (comprised of references to the relevant Prime Data Elements and the Reconstitution Program), and provides updates 114 to the Prime Data Sieve. If the candidate element is a duplicate of a retrieved Prime Data Element, the Deriver places into the Distilled Data 108 a reference (or pointer) to the Prime Data Element located in the Prime Data Sieve, and also an indicator that this is a Prime Data Element. If no duplicate is found, the Deriver expresses the candidate element as the result of one or more transformations performed on one or more retrieved Prime Data Elements, where the sequence of transformations is collectively referred to as the Reconstitution Program, e.g., Reconstitution Program 119A. Each derivation may require its own unique program to be constructed by the Deriver. The Reconstitution Program specifies transformations such as insertions, deletions, replacements, concatenations, arithmetic, and logical operations that can be applied to the Prime Data Elements. Provided the footprint of the Derivative Element (calculated as the size of the Reconstitution Program plus the size of the references to the required Prime Data Elements) is within a certain specified Distance Threshold with respect to the candidate element (to enable data reduction), the candidate element is reformulated as a Derivative Element and replaced by the combination of the Reconstitution Program and references to the relevant Prime Data Element (or elements)—these form the Reduced Data Components 115 in this case. If the threshold is exceeded, or if no suitable Prime Data Element was retrieved from the Prime Data Sieve, the Prime Data Sieve may be instructed to install the candidate as a fresh Prime Data Element. In this case, the Deriver places into the distilled data a reference to the newly added Prime Data Element, and also an indicator that this is a Prime Data Element.

A request for Retrieval of data (e.g., Retrieval Requests 109) can be in the form of either a reference to a location in the Prime Data Sieve containing a Prime Data Element, or in the case of a derivative, a combination of such a reference to a Prime Data Element and an associated Reconstitution Program (or in the case of a derivative based on multiple Prime Data Elements, a combination of the references to multiple Prime Data Elements and an associated Reconstitution Program). Using the one or more references to Prime Data Elements in the Prime Data Sieve, Retriever 111 can access the Prime Data Sieve to fetch the one or more Prime Data Elements and provide the one or more Prime Data Elements as well as the Reconstitution Program to Reconstitutor 112, which executes the transformations (specified in the Reconstitution Program) on the one or more Prime Data Elements to generate the Reconstituted Data 116 (which is the data that was requested) and deliver it to the Retrieved Data Output 113 in response to the data retrieval request.

In a variation of this embodiment, the Prime Data Elements may be stored in the Sieve in compressed form (using techniques known in the prior art, including Huffman Coding and Lempel Ziv methods) and decompressed when needed. This has the advantage of reducing the overall footprint of the Prime Data Sieve. The only constraint is that Content Associative Mapper 121 must continue to provide Content Associative Access to the Prime Data Elements as before.

Figure 1B:
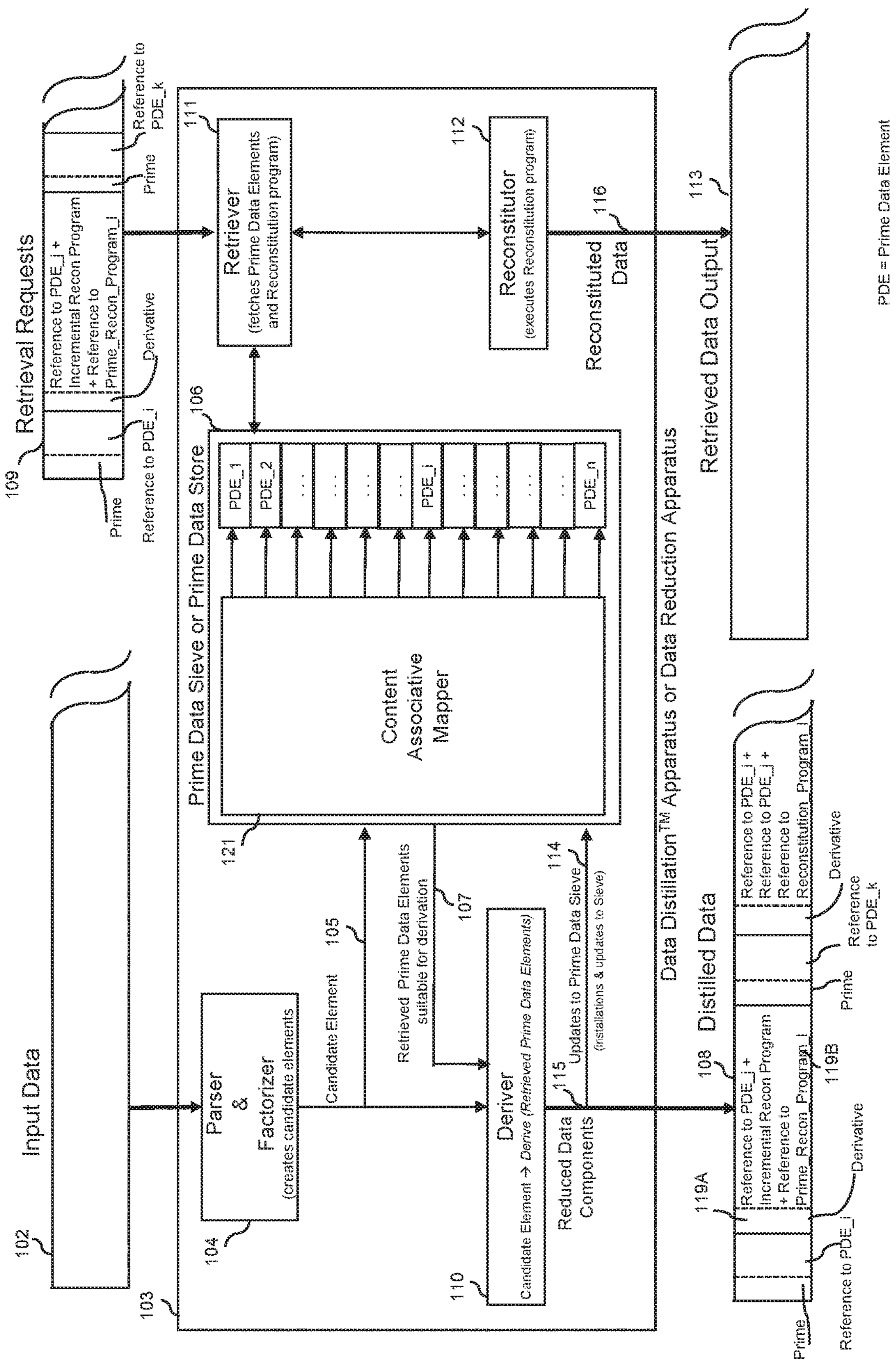
FIGS. 1B-1G illustrate variations of the methods and apparatuses illustrated in FIG. 1A in accordance with some embodiments described herein.
Figure 1C:
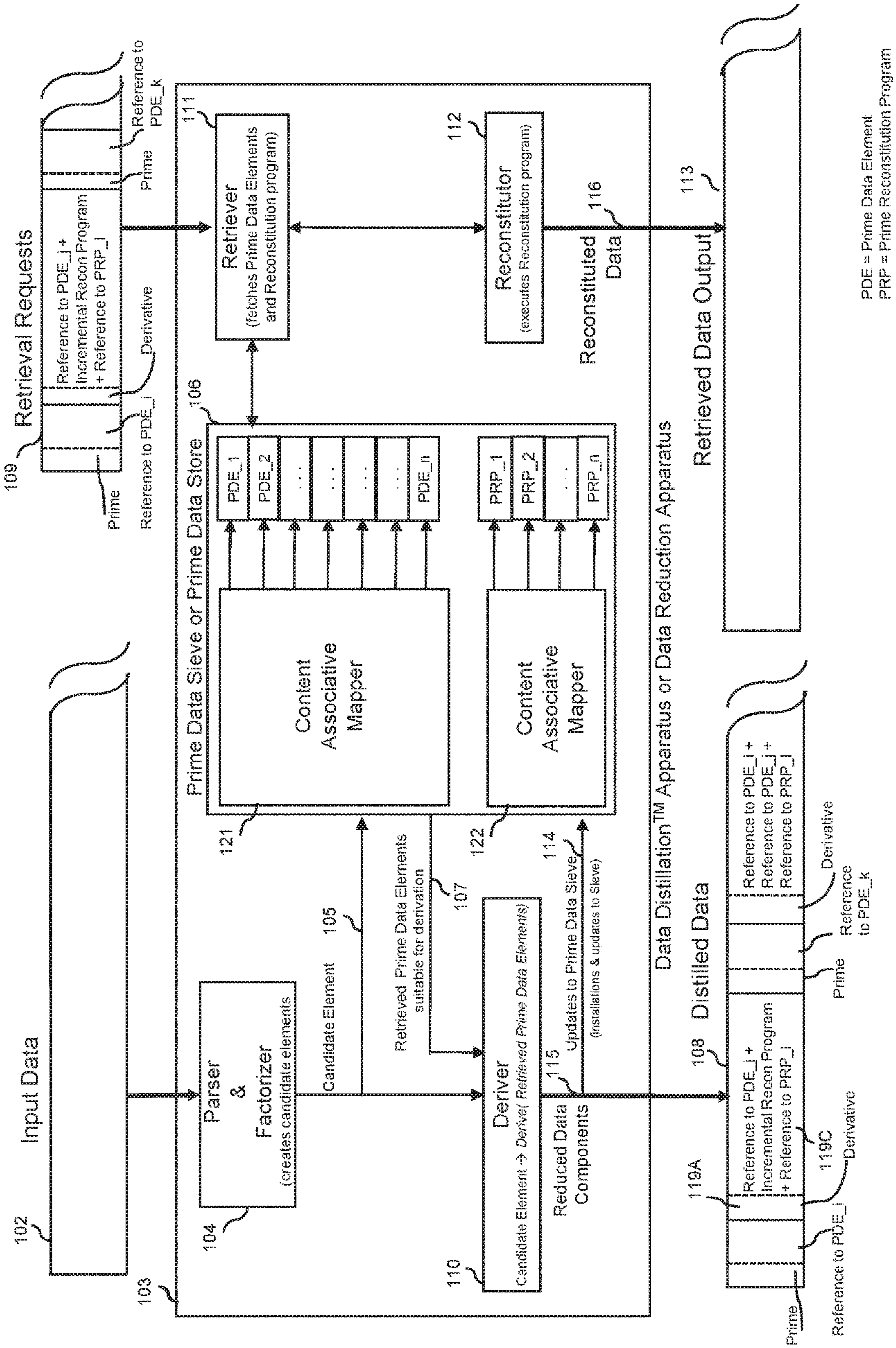

FIGS. 1B and 1C illustrate variations of the methods and apparatuses illustrated in FIG. 1A in accordance with some embodiments described herein. In FIG. 1B, Reconstitution Programs may be stored in the Prime Data Sieve and treated like Prime Data Elements. A reference or pointer 119B to the Reconstitution Program is provided in Distilled Data 108 instead of providing the Reconstitution Program 119A itself. Further data reduction is achieved if the Reconstitution Program is shared by other derivatives, and if the reference or pointer to the Reconstitution Program (plus any metadata that is required to distinguish between a Reconstitution Program and a reference to a Reconstitution Program) requires less storage space than the Reconstitution Program itself.

In FIG. 1B, Reconstitution Programs may be treated and accessed just like Prime Data Elements, and, stored in the Prime Data Sieve as Prime Data Elements, thereby allowing content-associative search and retrieval of the Reconstitution Programs from the Prime Data Sieve. During the derivation process to create a Derivative Element, once Deriver 110 determines the Reconstitution Program needed for the derivation, it can then determine whether or not this candidate Reconstitution Program is already present in the Prime Data Sieve, or whether this candidate Reconstitution Program can be derived from another entry that already exists in the Prime Data Sieve. If the candidate Reconstitution Program is already present in the Prime Data Sieve, then Deriver 110 can determine the reference to the pre-existing entry and include the reference in Distilled Data 108. If the candidate Reconstitution Program can be derived from an existing entry already resident in the Prime Data Sieve, the Deriver can deliver a derivative or reformulation of the candidate Reconstitution Program to the Distilled Data, i.e., the Deriver places into the Distilled Data a reference to the entry that pre-exists in the Prime Data Sieve along with an incremental Reconstitution Program that derives the candidate Reconstitution Program from the pre-existing entry. If the candidate Reconstitution Program is neither present in the Prime Data Sieve nor derivable from entries in the Prime Data Sieve, then Deriver 110 can add the Reconstitution Program to the Prime Data Sieve (the operation that adds a Reconstitution Program to the sieve may return the reference to the newly added entry), and include the reference to the Reconstitution Program in Distilled Data 108.

FIG. 1C presents a variation of the methods and apparatuses illustrated in FIG. 1B in accordance with some embodiments described herein. Specifically, the mechanism in FIG. 1C that is used to store and query Reconstitution Programs is similar to the mechanism that is used to store and query Prime Data Elements, but the Reconstitution Programs are maintained in a structure (called the Prime Reconstitution Program Sieve) separate from that containing the Prime Data Elements. Entries in such a structure are referred to as Prime Reconstitution Programs (labeled as PRPs in FIG. 1C). Recall that Prime Data Sieve 106 included content-associative mapper 121 that supported fast content-associative lookup operations. The embodiment illustrated in FIG. 1C includes Content-Associative Mapper 122 which is similar to Content-Associative Mapper 121. In FIG. 1C, Content-Associative Mapper 122 and Content-Associative Mapper 121 have been shown to be part of the Prime Data Sieve or Prime Data Store 106. In other embodiments, content-associative mapper 122 and the Reconstitution Programs may be stored separately from the Prime Data Sieve or Prime Data Store 106 in a structure called the Prime Reconstitution Program Sieve.

In a variation of this embodiment, the Prime Data Elements may be stored in the Sieve in compressed form (using techniques known in the prior art, including Huffman Coding and Lempel Ziv methods) and decompressed when needed. Likewise, Prime Reconstitution Programs may be stored in the Prime Reconstitution Program Sieve in compressed form (using techniques known in the prior art, including Huffman Coding and Lempel Ziv methods) and decompressed when needed. This has the advantage of reducing the overall footprint of the Prime Data Sieve and Prime Reconstitution Program Sieve. The only constraint is that Content Associative Mappers 121 and 122 must continue to provide Content Associative Access to the Prime Data Elements and Prime Reconstitution Programs as before.

Figure 1D:
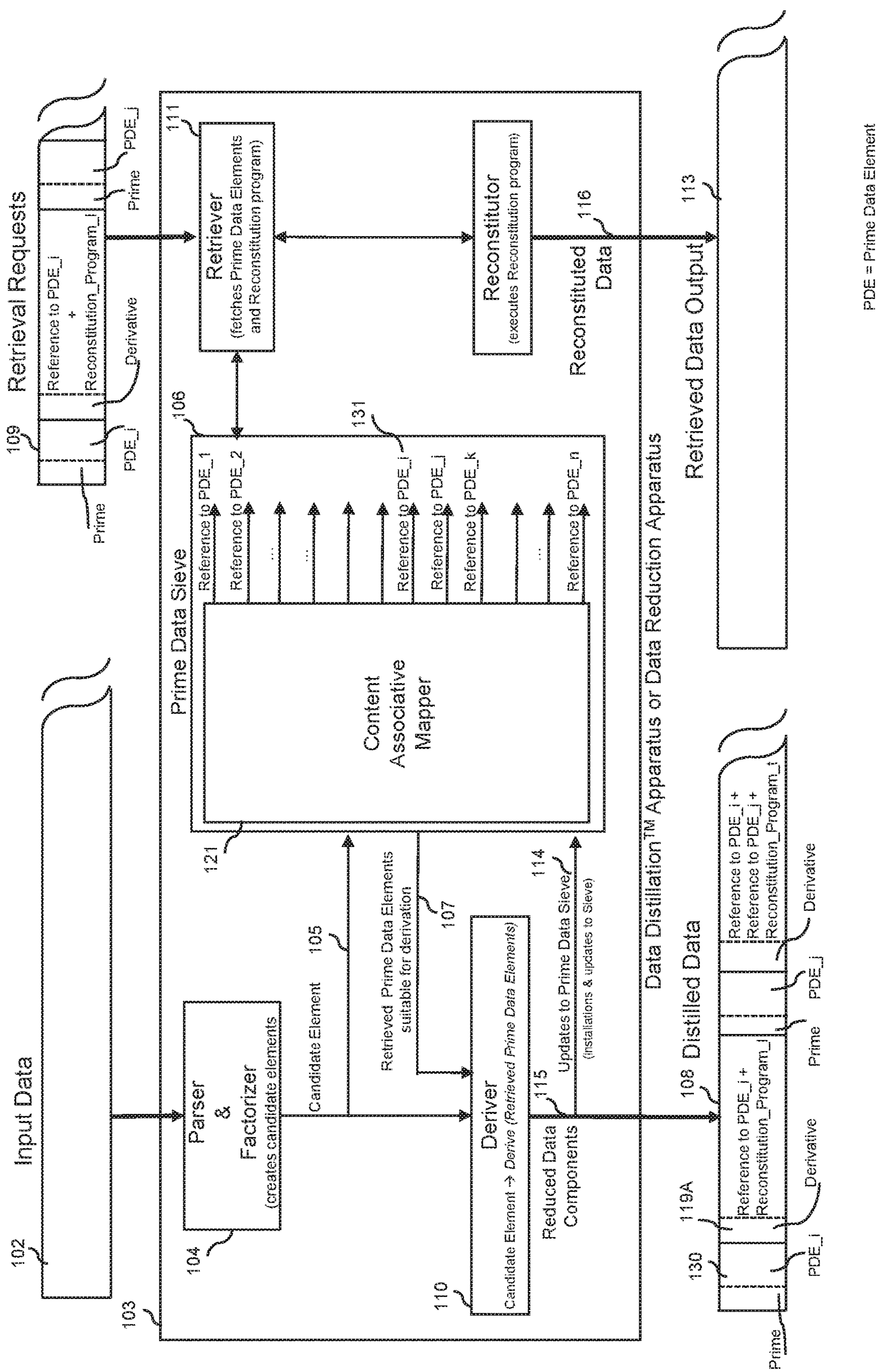

FIG. 1D presents a variation of the methods and apparatuses illustrated in FIG. 1A in accordance with some embodiments described herein. Specifically, in the embodiment described in FIG. 1D, Prime Data Elements are stored inline in the Distilled Data. Prime Data Sieve or Prime Data Store 106 continues to provide content-associative access to the Prime Data Elements, and continues to logically contain the Prime Data Elements. It maintains references or links to the Prime Data Elements that are located inline in the Distilled Data. For example, in FIG. 1D, Prime Data Element 130 is located inline in Distilled Data 108. Prime Data Sieve or Prime Data Store 106 maintains a Reference 131 to Prime Data Element 130. Once again, in this setup, the losslessly reduced representation of a Derivative Element will contain a reference to the required Prime Data Element. During data retrieval, Retriever 111 will fetch the required Prime Data Element from where it is located.

Figure 1E:
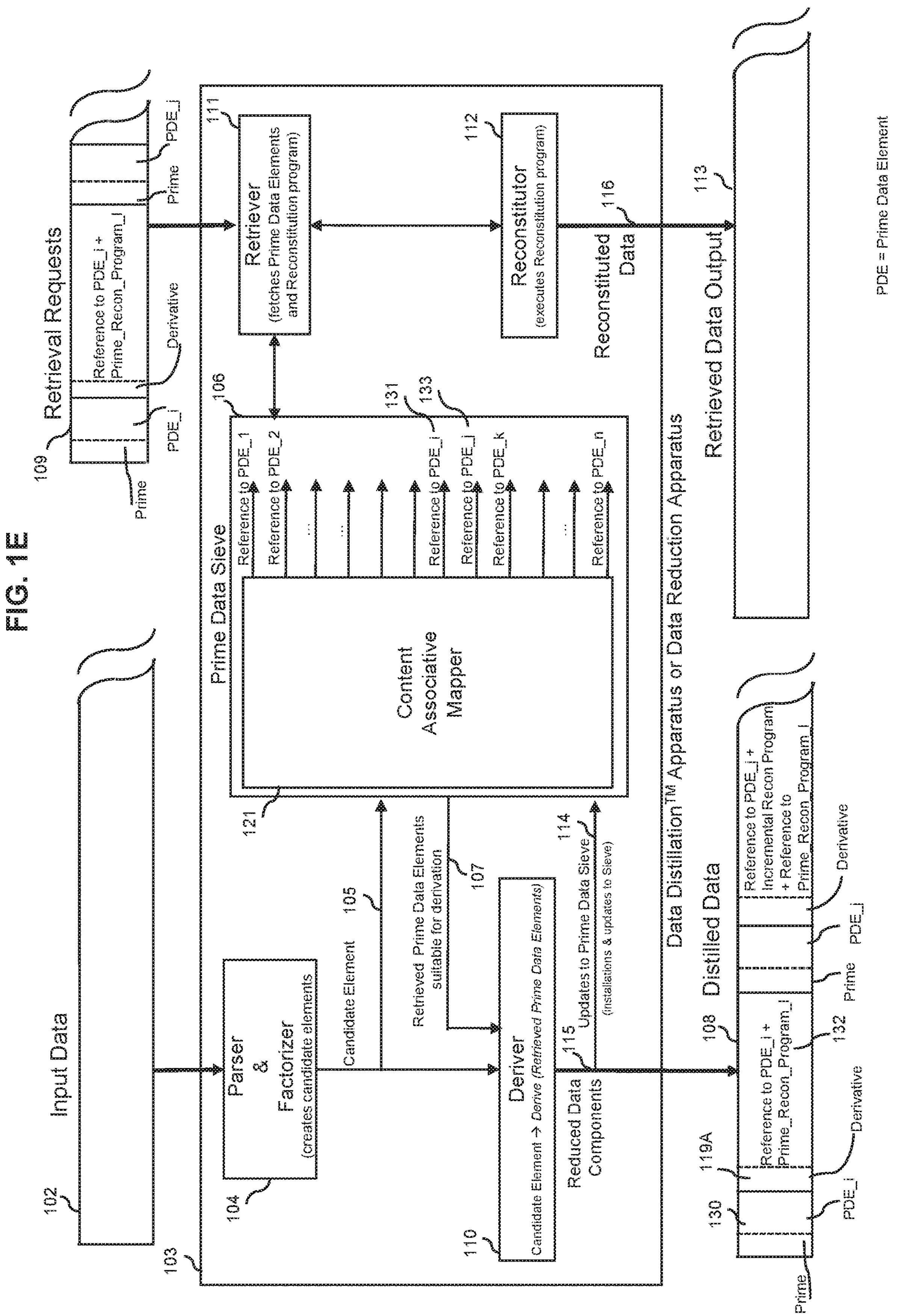

FIG. 1E presents a variation of the methods and apparatuses illustrated in FIG. 1D in accordance with some embodiments described herein. Specifically, in the embodiment described in FIG. 1E, just like in the setup illustrated in FIG. 1B, Reconstitution Programs may be derived from other Prime Reconstitution Programs, and specified as an Incremental Reconstitution Program plus a reference to a Prime Reconstitution Program. Such Prime Reconstitution Programs are treated like Prime Data Elements and logically installed in the Prime Data Sieve. Furthermore, in this setup, both Prime Data Elements and Prime Reconstitution Programs are stored inline in the Distilled Data. Prime Data Sieve or Prime Data Store 106 continues to provide content-associative access to the Prime Data Elements and the Prime Reconstitution Programs, and continues to logically contain these Prime Data Elements and Prime Reconstitution Programs while maintaining references or links to where they are located inline in the Distilled Data. For example, in FIG. 1E, Prime Data Element 130 is located inline in Distilled Data 108. Also in FIG. 1E, Prime Reconstitution Program 132 is located inline in Distilled Data. Prime Data Sieve or Prime Data Store 106 maintains a Reference 131 (which is Reference_to_PDE_i) to Prime Data Element 130 (which is PDE_i), and a Reference 133 (which is Reference_to_PDE_j) to the Prime Reconstitution Program 132 (which is Prime_Recon_Program_1). Once again, in this setup, the losslessly reduced representation of a Derivative Element will contain a reference to the required Prime Data Element and required Prime Reconstitution Program. During data retrieval, Retriever 111 will fetch the required components from where they are located in the corresponding Distilled Data.

Figure 1F:
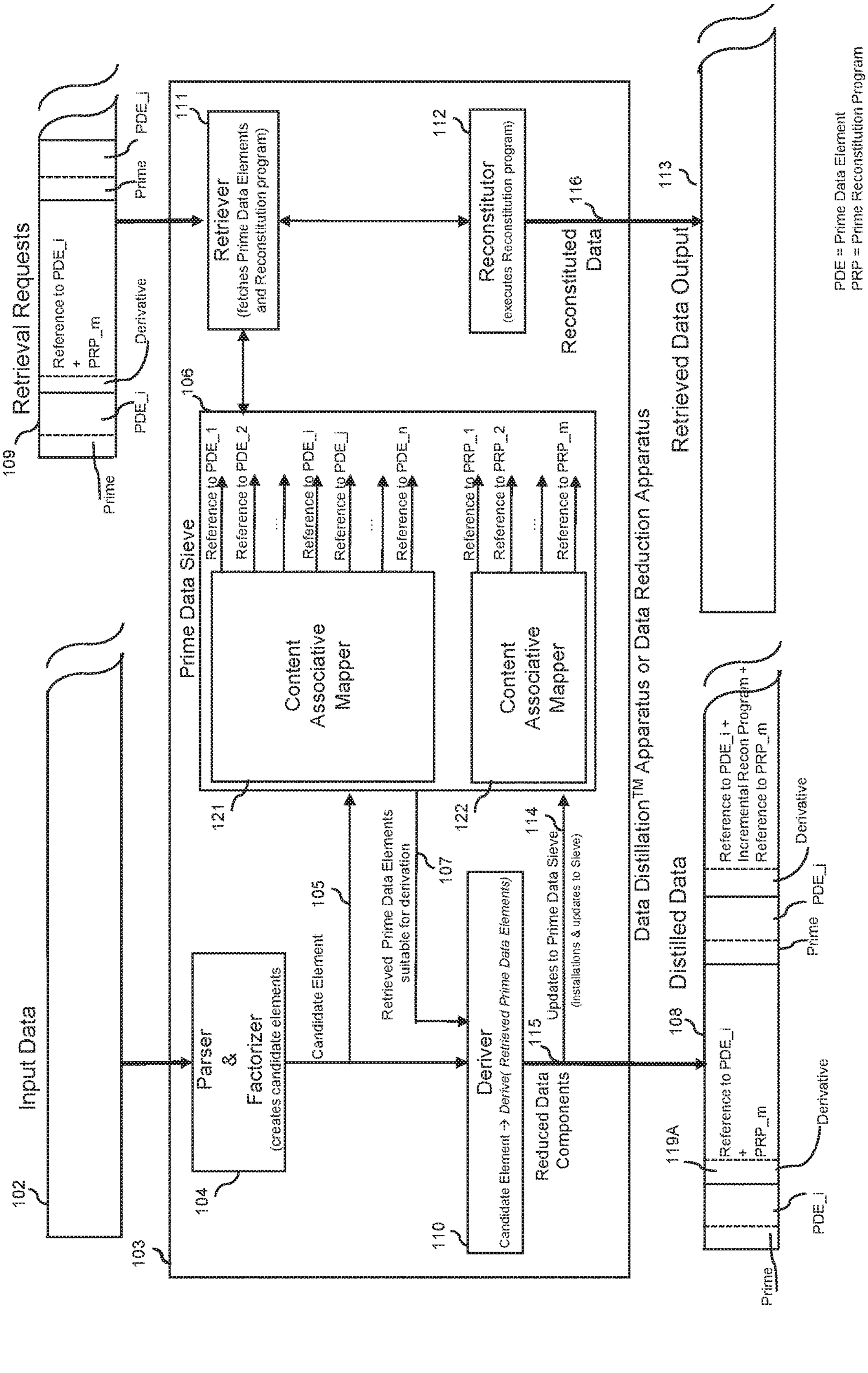

FIG. 1F presents a variation of the methods and apparatuses illustrated in FIG. 1E in accordance with some embodiments described herein. Specifically, in the embodiment described in FIG. 1F, just like in the setup illustrated in FIG. 1C, Prime Data Sieve 108 contains separate mappers—Content Associative Mapper 121 for the Prime Data Elements and Content Associative Mapper 122 for the Prime Reconstitution Programs.

Figure 1G:
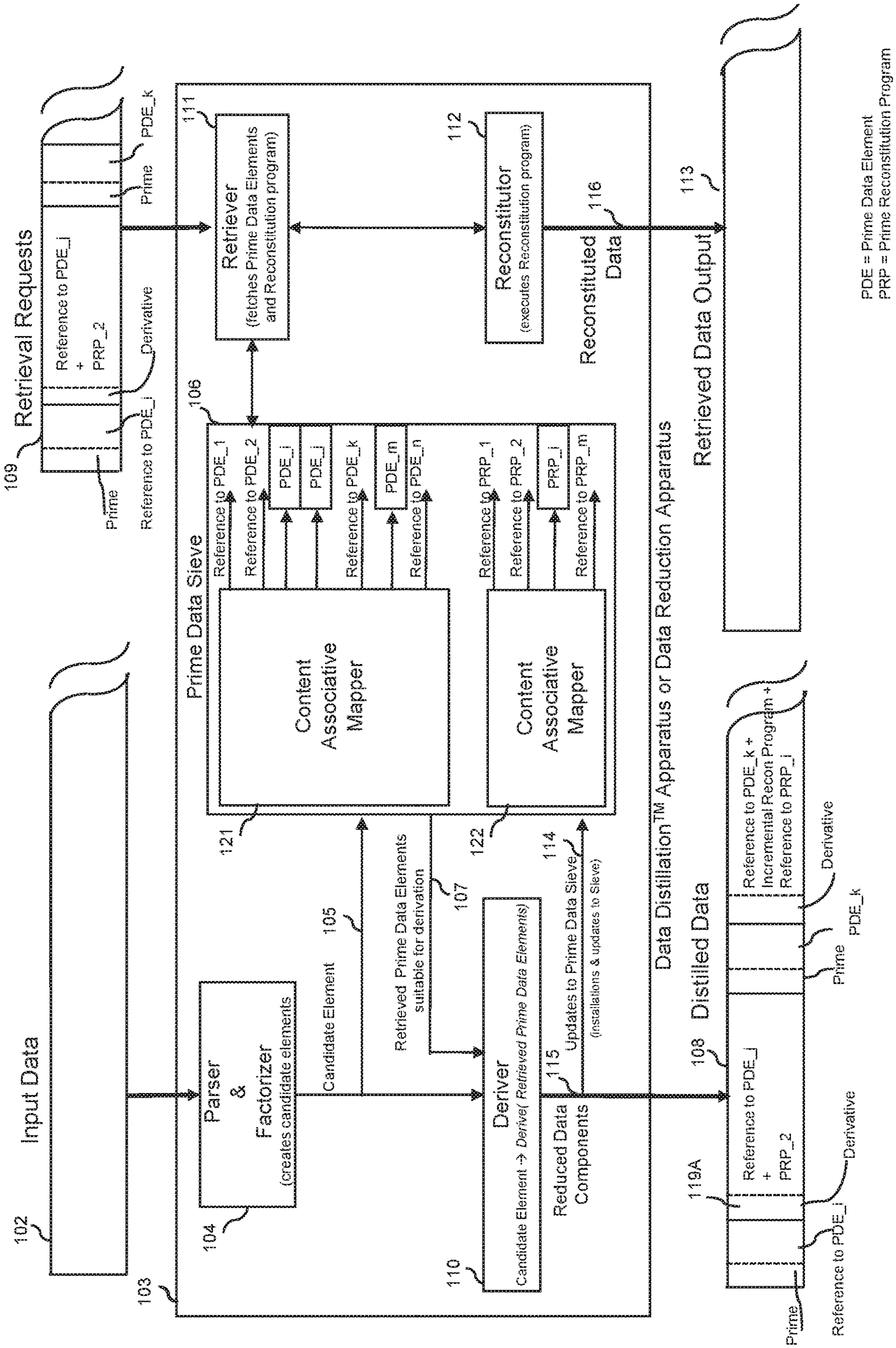

FIG. 1G presents a more generalized variation of the methods and apparatuses illustrated in FIG. 1A through FIG. 1F. Specifically, in the embodiment described in FIG. 1G, Prime Data Elements may be located either in the Prime Data Sieve or inline in the Distilled Data. Some Prime Data Elements may be located in the Prime Data Sieve while others are located inline in the Distilled Data. Likewise, Prime Reconstitution Programs may be located either in the Prime Data Sieve or inline in the Distilled Data. Some Prime Reconstitution Programs may be located in the Prime Data Sieve while others are located inline in the Distilled Data. The Prime Data Sieve logically contains all the Prime Data Elements and Prime Reconstitution Programs and in the case where the Prime Data Element or the Prime Reconstitution Program is located inline in the Distilled Data, the Prime Data Sieve furnishes the reference to its location.

The foregoing descriptions of methods and apparatuses for data reduction that factorize input data into elements and derive these from Prime Data Elements resident in a Prime Data Sieve have been presented only for purposes of illustration and description. They are not intended to be exhaustive or to limit the present invention to the forms disclosed. Accordingly, many modifications and variations will be apparent to practitioners skilled in the art.

FIG. 1H presents an example of a format and a specification describing the structure of the Distilled Data 119A in FIGS. 1A-G of the method and apparatus for the Data Distillation™ process in accordance with some embodiments described herein. Since the Data Distillation™ process factorizes input data into Prime Data Elements and Derivative Elements, the format for the losslessly reduced representation of the data identifies these elements and describes the various components of these elements in the Distilled Data. The self-describing format identifies each Element in the Distilled Data, indicates whether it is a Prime Data Element or a Derivative Element, and describes the various components of the Element, namely, references to one or more Prime Data Elements installed in the Sieve, a reference to a Reconstitution Program installed in the Prime Data Sieve (as in 119B of FIG. 1B) or a reference to a Reconstitution Program stored in a Prime Reconstitution Program (PRP) Sieve (as in 119C of FIG. 1C), and in-lined Reconstitution Programs (RPs). The Prime Reconstitution Program (PRP) Sieve is also referred to interchangeably as a Prime Reconstitution Program (PRP) Store. The format in FIG. 1H has provisions to specify a derivation by executing a Reconstitution Program on multiple Prime Data Elements, with the sizes of the Derivative Element and each of the Prime Data Elements being independently specifiable. The format in FIG. 1H also has provision to specify a Prime Data Element which is located inline in the Distilled Data rather than located within the Prime Data Sieve. This is specified by Opcode encoding 7 which specifies that the type of Element is a Prime Data Element that is located Inline in the Distilled Data. The Distilled Data is stored in the data storage system using this format. Data in this format is consumed by the Data Retriever 111, so that the various components of the data can be fetched and subsequently reconstituted.

Figure 1I:
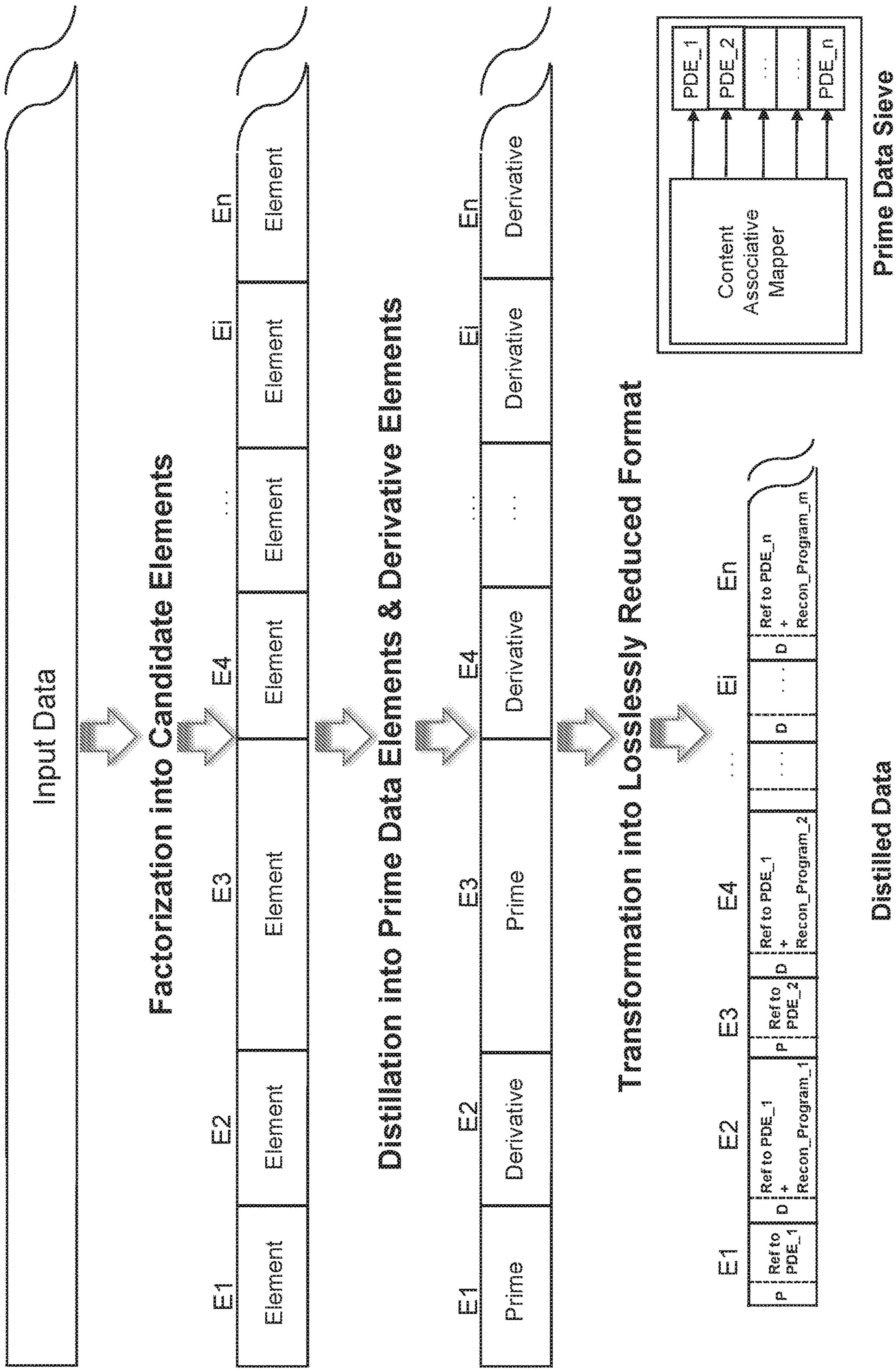
FIGS. 1I through 1P illustrate the conceptual transformation of Input Data into the losslessly reduced form for the variations of the methods and apparatuses for data reduction shown in FIG. 1A through FIG. 1G.

FIGS. 1I through 1P illustrate the conceptual transformation of Input Data into the losslessly reduced form for the variations of the methods and apparatuses for data reduction shown in FIG. 1A through FIG. 1G. FIG. 1I illustrates how a stream of Input Data is factorized into candidate elements, and subsequently candidate elements are deemed to be either Prime Data Elements or Derivative Elements. Lastly, the data is transformed into the losslessly reduced form. FIGS. 1I through 1N show variations of the losslessly reduced form for the various embodiments.

Figure 1J:
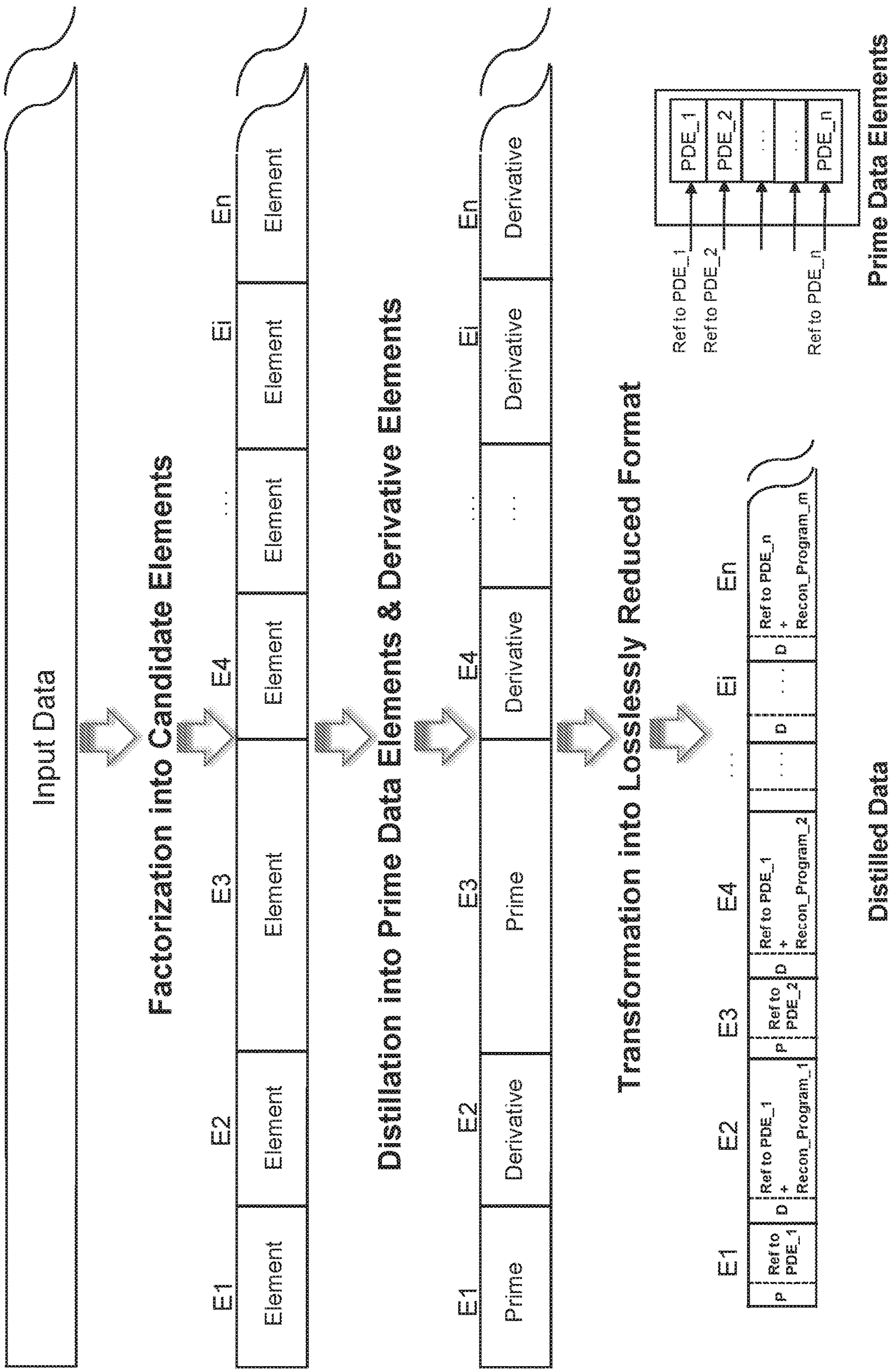
Figure 1K:
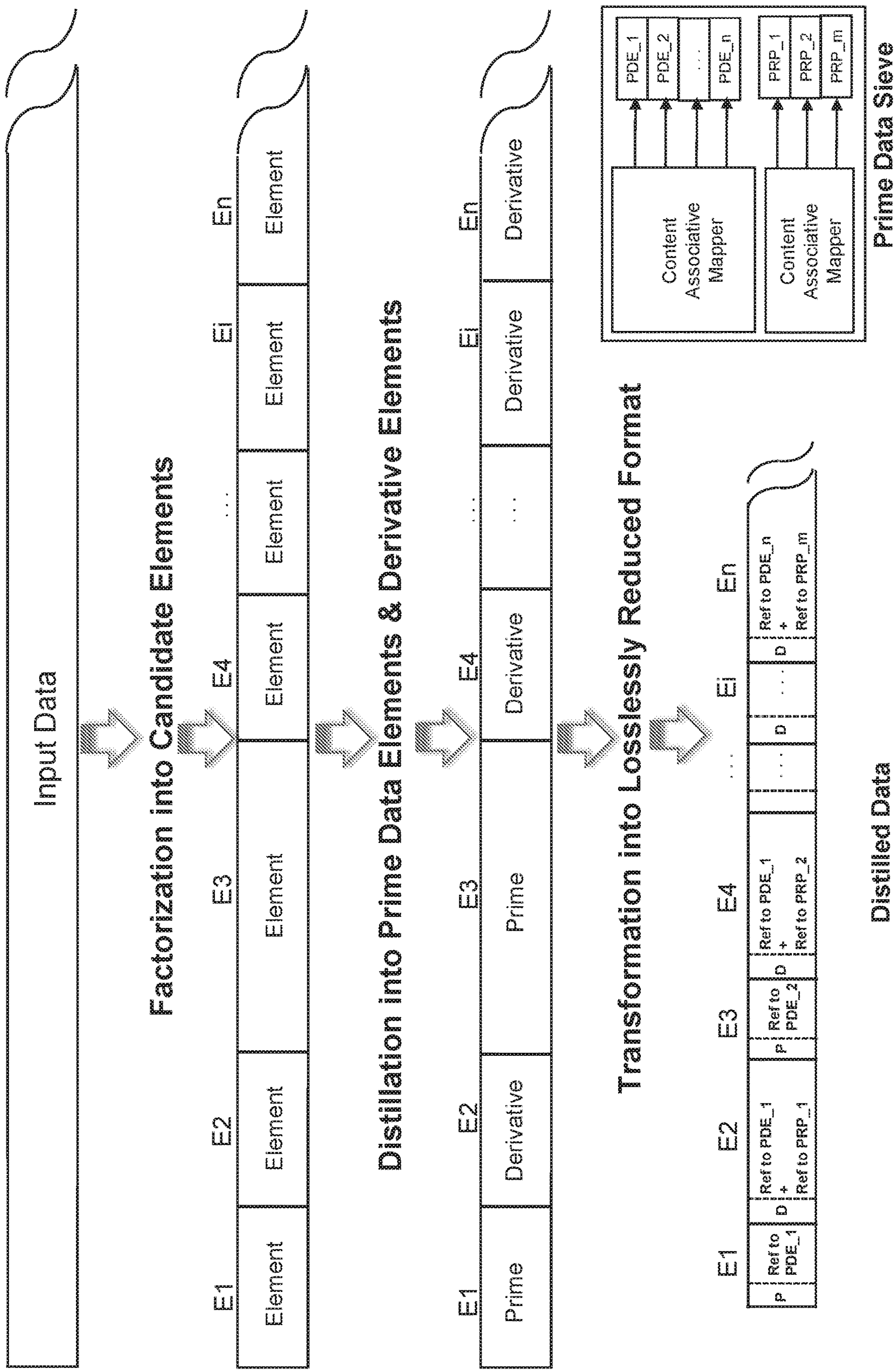
Figure 1L:
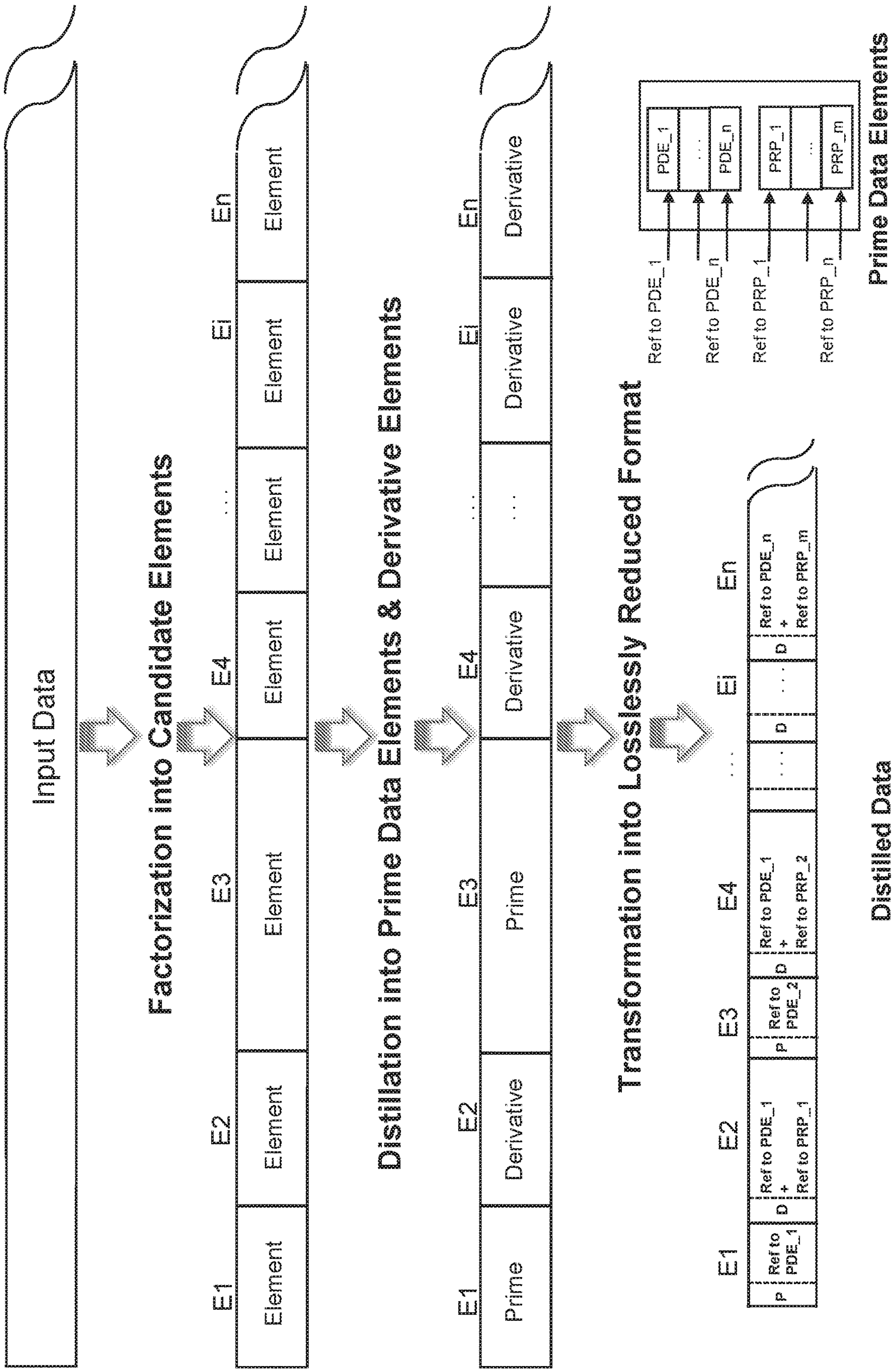

FIG. 1I and FIG. 1J show examples of the losslessly reduced form of the data produced by the methods and apparatuses illustrated in FIG. 1A. The losslessly reduced form in FIG. 1I includes the Content Associative Mapper and is the form that enables continuous further ingestion of data and reduction of this data against the existing Prime Data Elements, Meanwhile the losslessly reduced form in FIG. 1J no longer retains the Content Associative Mapper, leading to a smaller footprint of the data. FIG. 1K and FIG. 1L show examples of the losslessly reduced form of the data produced by the methods and apparatuses illustrated in FIG. 1C. The losslessly reduced form in FIG. 1K includes the Content Associative Mappers and is the form that enables continuous further ingestion of data and reduction of this data against the existing Prime Data Elements and Prime Reconstitution Programs, Meanwhile the losslessly reduced form in FIG. 1L no longer retains the Content Associative Mappers, leading to a smaller footprint of the data.

Figure 1M:
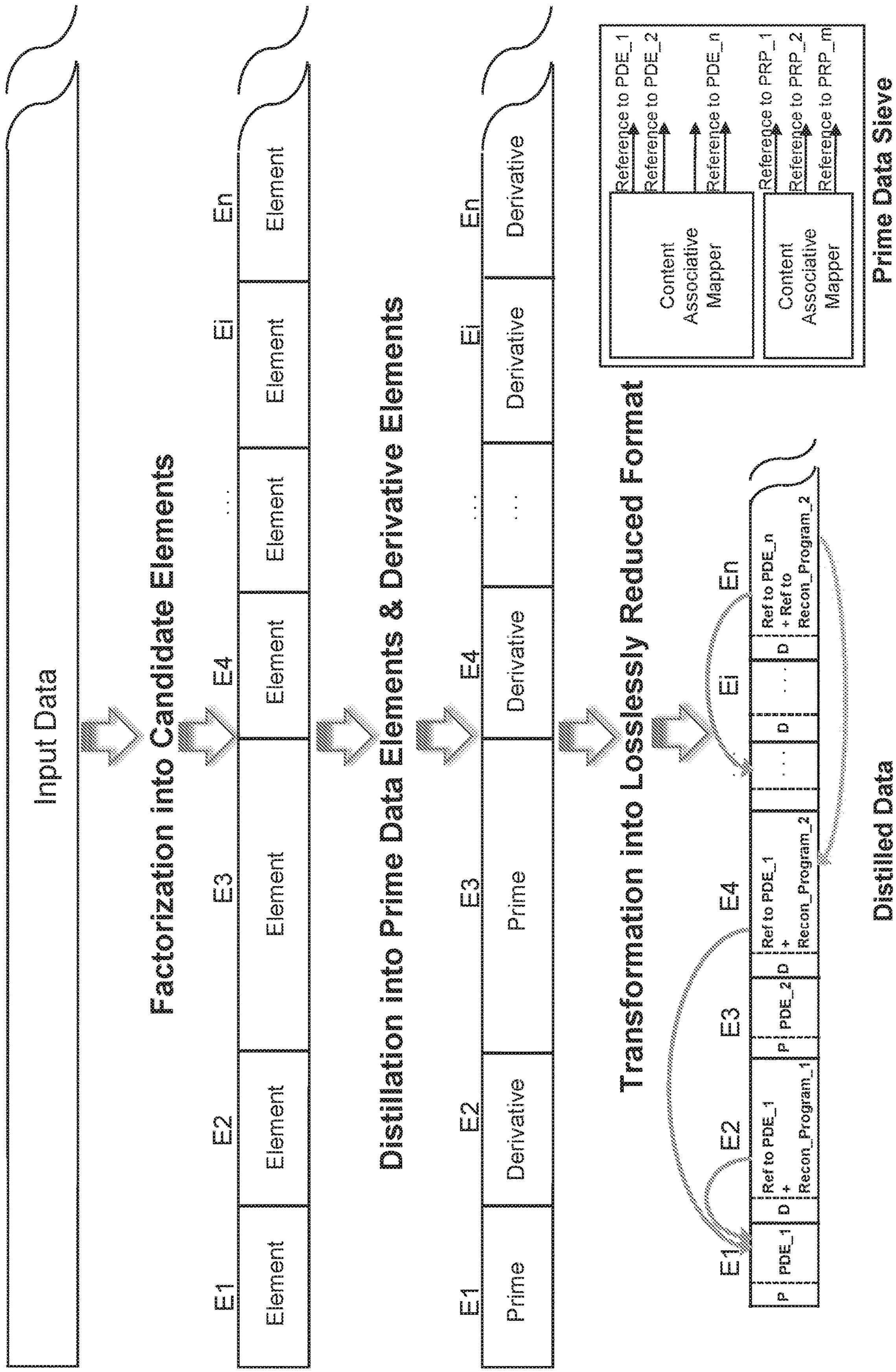
Figure 1N:
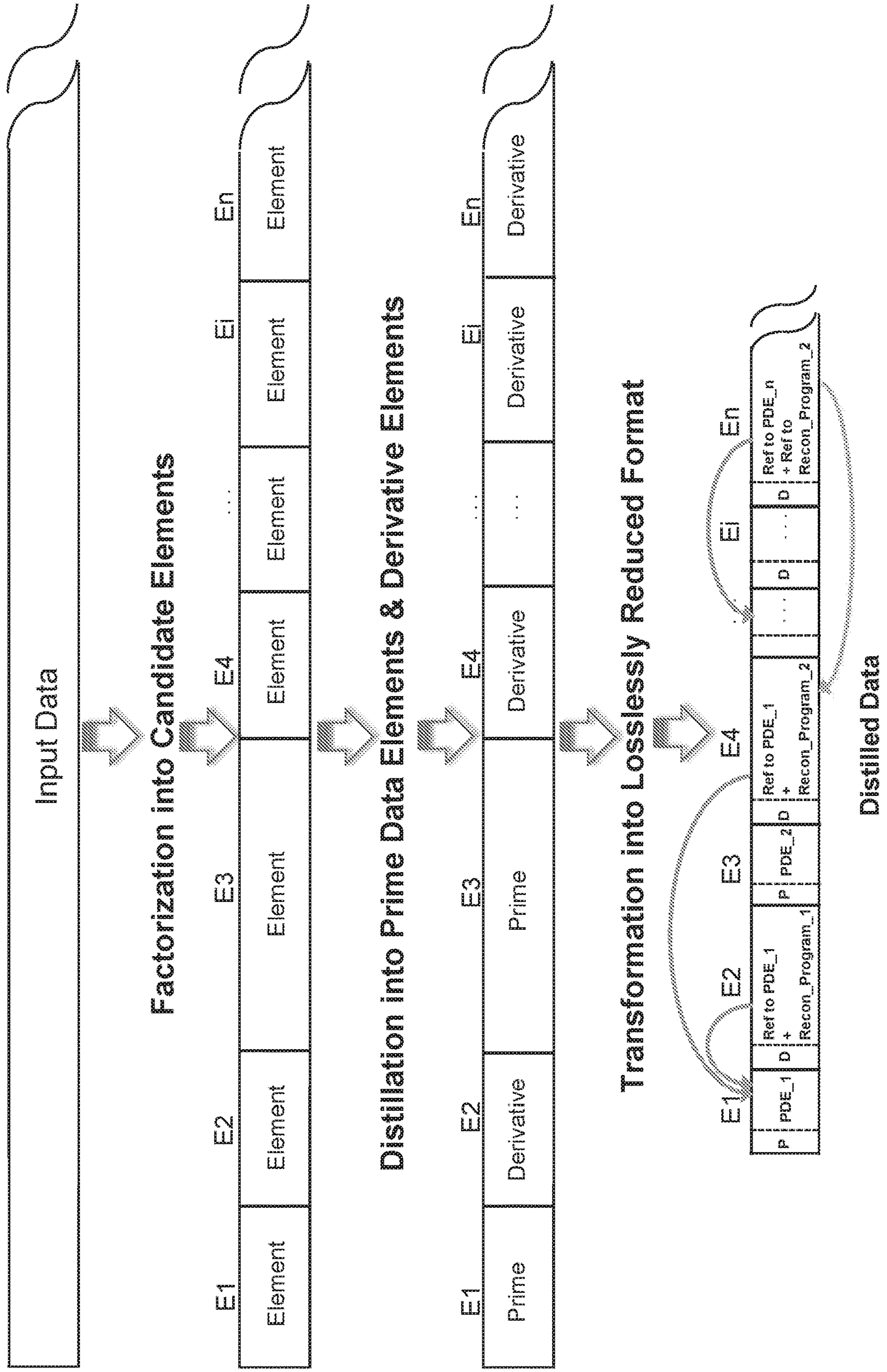
Figure 1O:
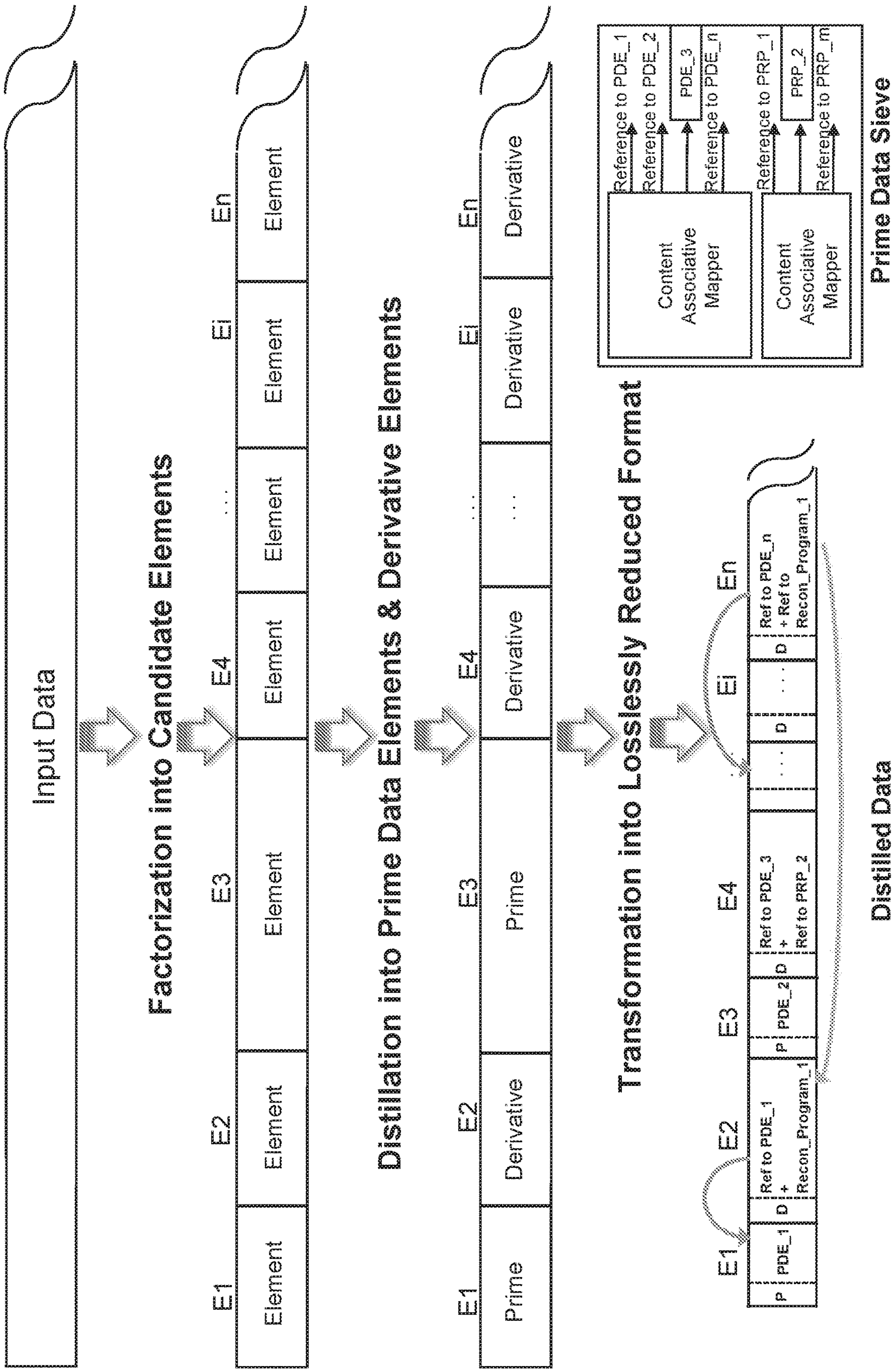
Figure 1P:
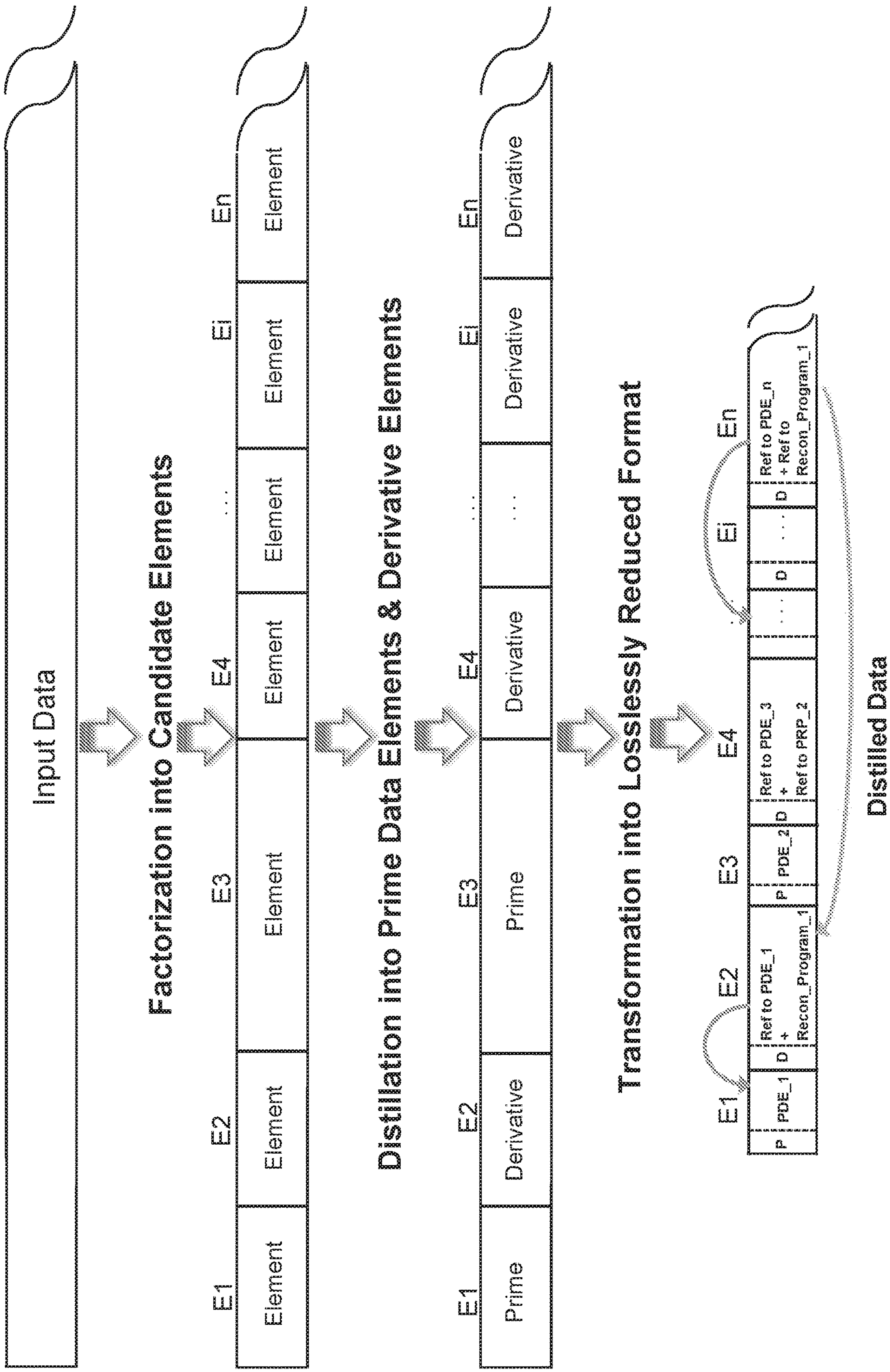

FIG. 1M and FIG. 1N show examples of the losslessly reduced form of the data produced by the methods and apparatuses illustrated in FIG. 1F, where Prime Data Elements and Prime Reconstitution Programs are located inline in the Distilled Data. The losslessly reduced form in FIG. 1M includes the Content Associative Mappers and is the form that enables continuous further ingestion of data and reduction of this data against the existing Prime Data Elements and Prime Reconstitution Programs, Meanwhile the losslessly reduced form in FIG. 1N no longer retains the Content Associative Mappers, leading to a smaller footprint of the data. FIG. 1O and FIG. 1P show examples of the losslessly reduced form of the data produced by the methods and apparatuses illustrated in FIG. 1G, where Prime Data Elements and Prime Reconstitution Programs may be located either inline in the Distilled Data or in the Prime Data Sieve. The losslessly reduced form in FIG. 1O includes the Content Associative Mappers and is the form that enables continuous further ingestion of data and reduction of this data against the existing Prime Data Elements and Prime Reconstitution Programs, Meanwhile the losslessly reduced form in FIG. 1P no longer retains the Content Associative Mappers, leading to a smaller footprint of the data.

In variations of the embodiments shown in FIGS. 1A through P, the various components of the Reduced Data may be further reduced or compressed using techniques known in the prior art (such as Huffman Coding, and Lempel Ziv methods) and stored in this compressed form. These components can be subsequently decompressed when they are needed for use in the Data Distillation Apparatus. This has the benefit of further reducing the overall footprint of the data.

Figure 2:
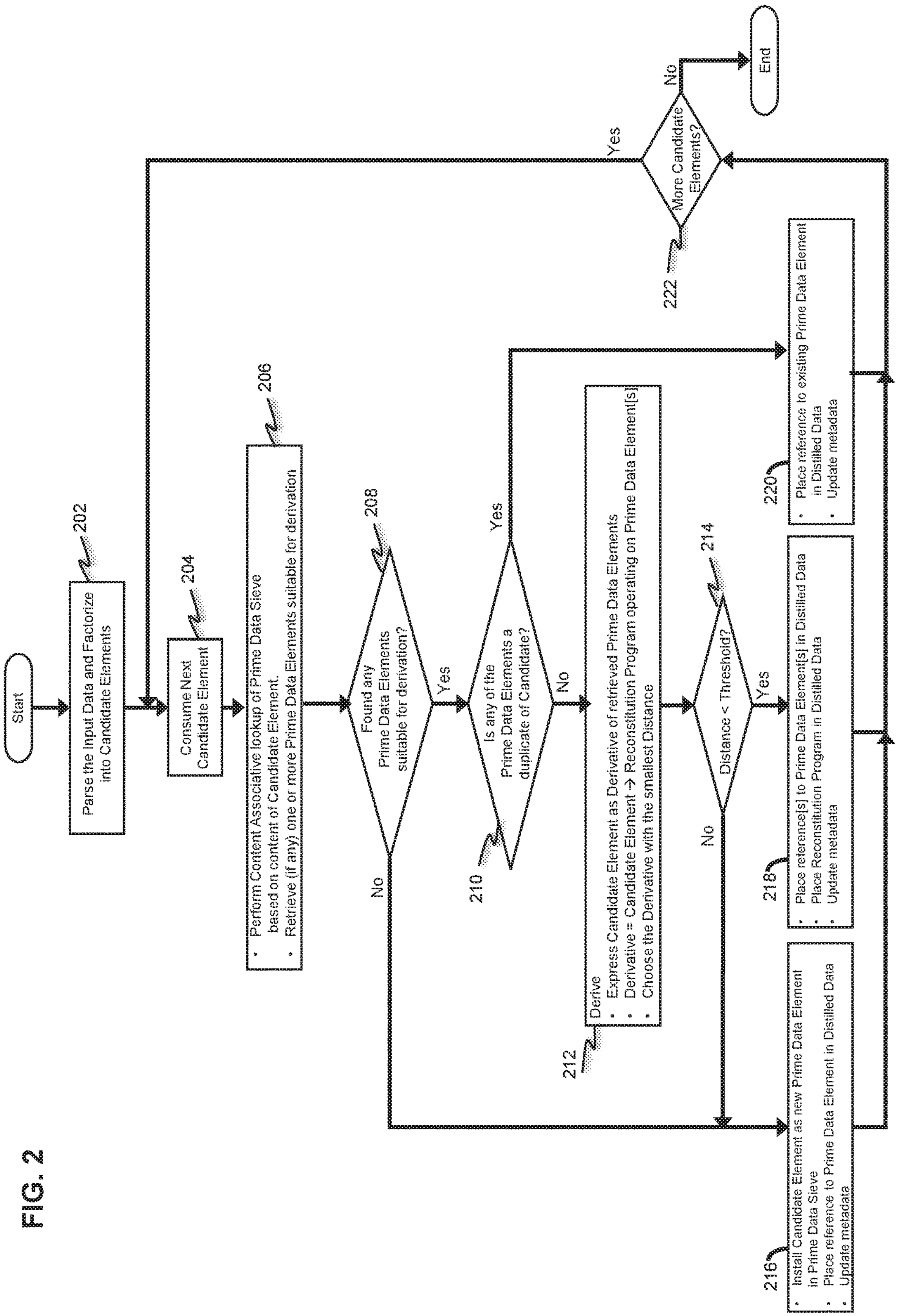
FIG. 2 illustrates a process for data reduction by factorizing input data into elements and deriving these elements from Prime Data Elements residing in a Prime Data Sieve in accordance with some embodiments described herein.

FIG. 2 illustrates a process for data reduction by factorizing input data into elements and deriving these elements from Prime Data Elements residing in a Prime Data Sieve in accordance with some embodiments described herein. As input data arrives, it can be parsed and factorized or broken up into a series of candidate elements (operation 202). The next candidate element is consumed from the input (operation 204), and a content-associative lookup of the Prime Data Sieve is performed based on the content of the candidate element to see if there are any suitable elements from which the candidate element can be derived (operation 206). If the Prime Data Sieve does not find any such elements ("No" branch of operation 208), the candidate element will be allocated and entered into the Sieve as a new Prime Data Element, and the entry in the distilled data created for the candidate element will be a reference to the newly created Prime Data Element (operation 216). If the content-associative lookup of the Prime Data Sieve does yield one or more suitable elements from which the candidate may potentially be derived ("Yes" branch of operation 208), analysis and computation is performed on the retrieved Prime Data Elements to derive the candidate element from them. Note that in some embodiments only metadata for the suitable Prime Data Elements is fetched first and analysis is performed on the metadata, with the suitable Prime Data Elements being subsequently fetched only if deemed useful (in these embodiments the metadata for a Prime Data Element provides some information about the content of the Prime Data Element, thereby allowing the system to quickly rule out matches or assess derivability based on the metadata). In other embodiments, the Prime Data Sieve retrieves the Prime Data Elements directly (i.e., without first retrieving the metadata to analyze the metadata before retrieving the Prime Data Element) so analysis and computation is performed on the retrieved Prime Data Elements.

A first check is performed to see if the candidate is a duplicate of any of these elements (operation 210). This check can be sped up using any suitable hashing technique. If the candidate is identical to a Prime Data Element retrieved from the Prime Data Sieve ("Yes" branch of operation 210), the entry in the distilled data created for the candidate element is replaced by a reference to this Prime Data Element and an indication that this entry is a Prime Data Element (operation 220). If no duplicate is found ("No" branch of operation 210), the entries retrieved from the Prime Data Sieve based on the candidate element are regarded as entries from which the candidate element is potentially derivable. The following is an important, novel, and non-obvious feature of the Prime Data Sieve: when a duplicate is not found in the Prime Data Sieve, the Prime Data Sieve can return Prime Data Elements that, although not identical to the candidate element, are elements from which the candidate element may potentially be derived by applying one or more transformations to the Prime Data Element(s). The process can then perform analysis and computation to derive the candidate element from either the most suitable Prime Data Element or a set of suitable Prime Data Elements (operation 212). In some embodiments, the derivation expresses the candidate element as the result of transformations performed on the one or more Prime Data Elements, such transformations being collectively referred to as the Reconstitution Program. Each derivation may require its own unique program to be constructed. In addition to constructing the Reconstitution Program, the process can also compute a distance metric that generally indicates a level of storage resources and/or computational resources that are required to store the reformulation of the candidate element and to reconstitute the candidate element from the reformulation. In some embodiments, the footprint of the Derivative Element is used as a measure of the distance of the candidate from the Prime Data Element(s)—specifically, a Distance metric can be defined as the sum of the size of the Reconstitution Program plus the size of the references to the one or more Prime Data Elements involved in the derivation. The derivation with the shortest Distance can be chosen. The Distance for this derivation is compared with a Distance Threshold (operation 214), and if the Distance does not exceed the Distance Threshold, the derivation is accepted ("Yes" branch of operation 214). In order to yield data reduction, the Distance Threshold must always be less than the size of the candidate element. For example, the Distance Threshold may be set to 50% of the size of the candidate element, so that a derivative will only be accepted if its footprint is less than or equal to half the footprint of the candidate element, thereby ensuring a reduction of 2× or greater for each candidate element for which a suitable derivation exists. The Distance Threshold can be a predetermined percentage or fraction, either based on user-specified input or chosen by the system. The Distance Threshold may be determined by the system based on static or dynamic parameters of the system. Once the derivation is accepted, the candidate element is reformulated and replaced by the combination of the Reconstitution Program and references to the one or more Prime Data Elements. The entry in the distilled data created for the candidate element is replaced by the derivation, i.e., it is replaced by an indication that this is a derivative element, along with the Reconstitution Program plus references to the one or more Prime Data Elements involved in the derivation (operation 218). On the other hand, if the Distance for the best derivation exceeds the Distance Threshold ("No" branch of operation 214), none of the possible derivatives will be accepted. In that case, the candidate element may be allocated and entered into the Sieve as a new Prime Data Element, and the entry in the distilled data created for the candidate element will be a reference to the newly created Prime Data Element along with an indication that this is a Prime Data Element (operation 216).

Finally, the process can check if there are any additional candidate elements (operation 222), and return to operation 204 if there are more candidate elements ("Yes" branch of operation 222), or terminate the process if there are no more candidate elements ("No" branch of operation 222).

A variety of methods can be employed to perform operation 202 in FIG. 2, i.e., to parse the incoming data and break it into candidate elements. The factorization algorithm needs to decide where in the byte stream to insert breaks to slice up the stream into candidate elements. Possible techniques include (but are not limited to) breaking up the stream into fixed-sized blocks (such as pages of 4096 bytes), or applying a method of fingerprinting (such as techniques that apply random prime polynomials to substrings of the input stream) to locate in the data stream suitable fingerprints that become the boundaries of elements (this technique could lead to variable-sized elements), or parsing of the input to detect headers or some pre-declared structure and delineating elements based on this structure. The input could be parsed to detect certain structure that is declared through a schema. The input could be parsed to detect the existence of pre-declared patterns, grammars, or regular expressions in the data. Once two consecutive breaks in the data have been identified, a candidate element is created (the candidate element is the data that is located between the two consecutive breaks) and presented to the Prime Data Sieve for content-associative lookup. If variable-sized elements are created, the length of the candidate element needs to be specified and carried as metadata along with the candidate element.

One important function of the Prime Data Sieve is to provide content-associative lookup based upon a candidate element presented to it, and to quickly provide one or a small set of Prime Data Elements from which a candidate element can be derived with minimal storage needed to specify the derivation. This is a difficult problem given a large dataset. Given terabytes of data, even with kilobyte-sized elements, there are billions of elements to search and choose from. The problem is even more severe on larger datasets. It becomes important to organize and order the elements using a suitable technique and then detect similarities and derivability within that organization of the elements, to be able to quickly provide a small set of suitable Prime Data Elements.

The entries in the Sieve could be ordered based upon the value of each element (i.e., Prime Data Element), so that all entries could be arranged by value in ascending or descending order. Alternatively, they could be ordered along a principal axis that is based upon the value of certain fields in the element, followed by subordinate axes that use the rest of the content of the element. In this context, a field is a set of contiguous bytes from the content of the element. Fields could be located by applying a method of fingerprinting to the contents of the element so that the location of a fingerprint identifies the location of a field. Alternatively, certain fixed offsets inside the content of the element could be chosen to locate a field. Other methods could also be employed to locate a field, including, but not limited to, parsing the element to detect certain declared structure, and locating fields within that structure.

In yet another form of organization, certain fields or combinations of fields within the element could be considered as dimensions, so that a concatenation of these dimensions followed by the rest of the content of each element could be used to order and organize the data elements. In general, the correspondence or mapping between fields and dimensions can be arbitrarily complex. For example, in some embodiments exactly one field may map to exactly one dimension. In other embodiments, a combination of multiple fields, e.g., F1, F2, and F3, may map to a dimension. The combining of fields may be achieved either by concatenating the two fields or by applying any other suitable function to them. The important requirement is that the arrangement of fields, dimensions, and the rest of the content of an element that is used to organize elements must enable all Prime Data Elements to be uniquely identified by their content and ordered in the Sieve.

In yet another embodiment, a certain suitable function (such as an algebraic or arithmetic transformation) can be applied to the element, where the function has the property that the result of the function uniquely identifies each element. In one such embodiment, each element is divided by a prime polynomial or some chosen number or value and the result of the division (which comprises the quotient and remainder pair) is taken as the function used to organize and order the element in the prime data sieve. For example, the bits comprising the remainder can form the leading bytes of the result of the function followed by the bits comprising the quotient. Or alternatively, the bits comprising the quotient can be used to form the leading bytes of the result of the function followed by the bits comprising the remainder. For a given divisor used to divide the input element, the quotient and remainder pair will uniquely identify the element, and hence this pair can be used to form the result of the function that is used to organize and order the element in the prime data sieve. By applying this function to each element, prime data elements can be organized in the sieve based on the result of function. The function will still uniquely identify each prime data element and will provide an alternate method to sort and organize the prime data elements in the prime data sieve.

In yet another embodiment, a certain suitable function (such as an algebraic or arithmetic transformation) can be applied to each field of the element, where the function has the property that the result of the function uniquely identifies that field. For example, a function such as division by a suitable polynomial or number or value may be executed on successive fields or successive portions of the content of each element, so that the concatenation of the results of the successive functions may be used to order and organize the element in the prime data sieve. Note that, on each field, a different polynomial may be used for division. Each function will furnish a suitably ordered concatenation of the bits from the quotient and remainder emitted by the division operation for that portion or field. Each prime data element can be ordered and organized in the sieve by using this concatenation of functions that are applied to the fields of the element. The concatenation of functions will still uniquely identify each prime data element and will provides an alternate method to sort and organize the prime data elements in the prime data sieve.

In some embodiments, the contents of an element can be represented as an expression as follows: Element=Head .* sig1 .* sig2 .* . . . sigI .* . . . sigN .* Tail, where "Head" is a sequence of bytes comprising the leading bytes of the element, "Tail" is a sequence of bytes comprising the concluding bytes of the element, and "sig1","sig2","sigI", and "sigN" are various signatures or patterns or regular expressions or sequences of bytes of certain lengths within the body of the content of the element that characterize the element. The expression ".*" between the various signatures is the wildcard expression, i.e., it is the regular expression notation that allows any number of intervening bytes of any value other than the signature that follows the expression ".*". In some embodiments, the N-tuple (sig1, sig2, . . . sigI, . . . sigN) is referred to as the Skeletal Data Structure or the Skeleton of the element, and can be regarded as a reduced and essential subset or essence of the element. In other embodiments, the (N+2)-tuple (Head, sig1, sig2, . . . sigI, . . . sigN, Tail) is referred to as the Skeletal Data Structure or the Skeleton of the element. Alternatively, an N+1 tuple may be employed that includes either the Head or the Tail along with the rest of the signatures.

A method of fingerprinting can be applied to the content of the element to determine the locations of the various components (or signatures) of the Skeletal Data Structure within the content of the element. Alternatively, certain fixed offsets inside the content of the element could be chosen to locate a component. Other methods could also be employed to locate a component of the Skeletal Data Structure, including, but not limited to, parsing the element to detect certain declared structure, and locating components within that structure. Prime Data Elements can be ordered in the Sieve based on their Skeletal Data Structure. In other words, the various components of the Skeletal Data Structure of the element can be considered as Dimensions, so that a concatenation of these dimensions followed by the rest of the content of each element could be used to order and organize the Prime Data Elements in the Sieve.

Some embodiments factorize the input data into candidate elements, where the size of each candidate element is substantially larger than the size of a reference needed to access all such elements in the global dataset. One observation about data that is broken into such data chunks (and that is being accessed in a content-associative fashion) is that the actual data is very sparse with respect to the total possible values that the data chunk can specify. For example, consider a 1 zettabyte dataset. One needs about 70 bits to address every byte in the dataset. At a chunk size of 128 bytes (1024 bits), there are approximately $2^{63}$ chunks in the 1 zettabyte dataset, so that one needs 63 bits (fewer than 8 bytes) to address all of the chunks. Note that an element or chunk of 1024 bits could have one of $2^{1024}$ possible values, while the number of actual values of the given chunks in the dataset is at most $2^{63}$ (if all the chunks are distinct). This indicates that the actual data is extremely sparse with respect to the number of values that can be reached or named by the content of an element. This enables use of a tree structure, which is well-suited for organizing very sparse data in a manner that enables efficient content-based lookups, allows new elements to be efficiently added to the tree structure, and is cost-effective in terms of the incremental storage needed for the tree structure itself. Although there are only $2^{63}$ distinct chunks in the 1 zettabyte dataset, thus requiring only 63 differentiating bits of information to tell them apart, the relevant differentiating bits might be spread across the entire 1024 bits of the element and occur at different locations for each element. Therefore, to fully differentiate all the elements, it is insufficient to examine only a fixed 63 bits from the content, but rather the entire content of the element needs to participate in the sorting of the elements, especially in a solution that provides true content-associative access to any and every element in the dataset. In the Data Distillation™ framework, it is desirable to be able to detect derivability within the framework used to order and organize the data. Keeping all of the above in mind, a tree structure based upon the content (which progressively differentiates the data as more of the content is examined) is a suitable organization to order and differentiate all the elements in the factorized dataset. Such a structure provides numerous intermediate levels of subtrees which can be treated as groupings of derivable elements or groupings of elements with similar properties of derivability. Such a structure can be hierarchically augmented with metadata characterizing each subtree or with metadata characterizing each element of data. Such a structure can effectively communicate the composition of the entire data it contains, including the density, proximity, and distribution of actual values in the data.

Some embodiments organize the Prime Data Elements in the Sieve in tree form. Each Prime Data Element has a distinct "Name" which is constructed from the entire content of the Prime Data Element. This Name is designed to be sufficient to uniquely identify the Prime Data Element and to differentiate it with respect to all other elements in the tree. There are several ways in which the Name can be constructed from the content of the Prime Data Element. The Name may be simply comprised of all the bytes of the Prime Data Element, with these bytes appearing in the Name in the same order as they exist in the Prime Data Element. In another embodiment, certain fields or combinations of fields referred to as Dimensions (where fields and dimensions are as described earlier) are used to form the leading bytes of the Name, with the rest of the content of the Prime Data Element forming the rest of the Name, so that the entire content of the Prime Data Element is participating to create the complete and unique Name of the element. In yet another embodiment, the fields of the Skeletal Data Structure of the element are chosen as Dimensions (where fields and dimensions are as described earlier), and are used to form the leading bytes of the Name, with the rest of the content of the Prime Data Element forming the rest of the Name, so that the entire content of the Prime Data Element is participating to create the complete and unique Name of the element.

In some embodiments, the Name for the element can be computed by performing algebraic or arithmetic transformations on the element while retaining the property that each name uniquely identifies each element. In one such embodiment, each element is divided by a prime polynomial or some chosen number or value and the result of the division (which is the quotient and remainder pair) is used to form the Name of the element. For example, the bits comprising the remainder can form the leading bytes of the Name followed by the bits comprising the quotient. Or alternatively, the bits comprising quotient can be used to form the leading bytes of the Name followed by the bits comprising the remainder. For a given divisor used to divide the input element, the quotient and remainder pair will uniquely identify the element, and hence this pair can be used to form the Name of each element. Using this formulation of the Name, prime data elements can be organized in the sieve based on their Names. The Name will still uniquely identify each prime data element and will provide an alternate method to sort and organize the prime data elements in the prime data sieve.

In another embodiment, a variation of this method of generating a Name (which involves division and extracting quotient/remainder pairs) may be employed, where division by a suitable polynomial or number or value may be executed on successive fields or successive portions of the content of each element, yielding successive portions of the Name for each element (each portion being a suitably ordered concatenation of the bits from the quotient and remainder emitted by the division operation for that portion or field). Note that, on each field, a different polynomial may be used for division. Using this formulation of the Name, prime data elements can be organized in the sieve based on their Names. The Name will still uniquely identify each prime data element and will provides an alternate method to sort and organize the prime data elements in the prime data sieve.

The Name of each Prime Data Element is used to order and organize the Prime Data Elements in the tree. For most practical datasets, even those that are very large in size (such as a 1 zettabyte dataset, comprised of $2^{58}$ elements of, say, 4 KB size), it is expected that a small subset of the bytes of the Name will often serve to sort and order the majority of the Prime Data Elements in the tree.

FIGS. 3A, 3B, 3C, 3D, and 3E illustrate different data organization systems that may be used to organize Prime Data Elements based on their Name in accordance with some embodiments described herein.

Figure 3A:
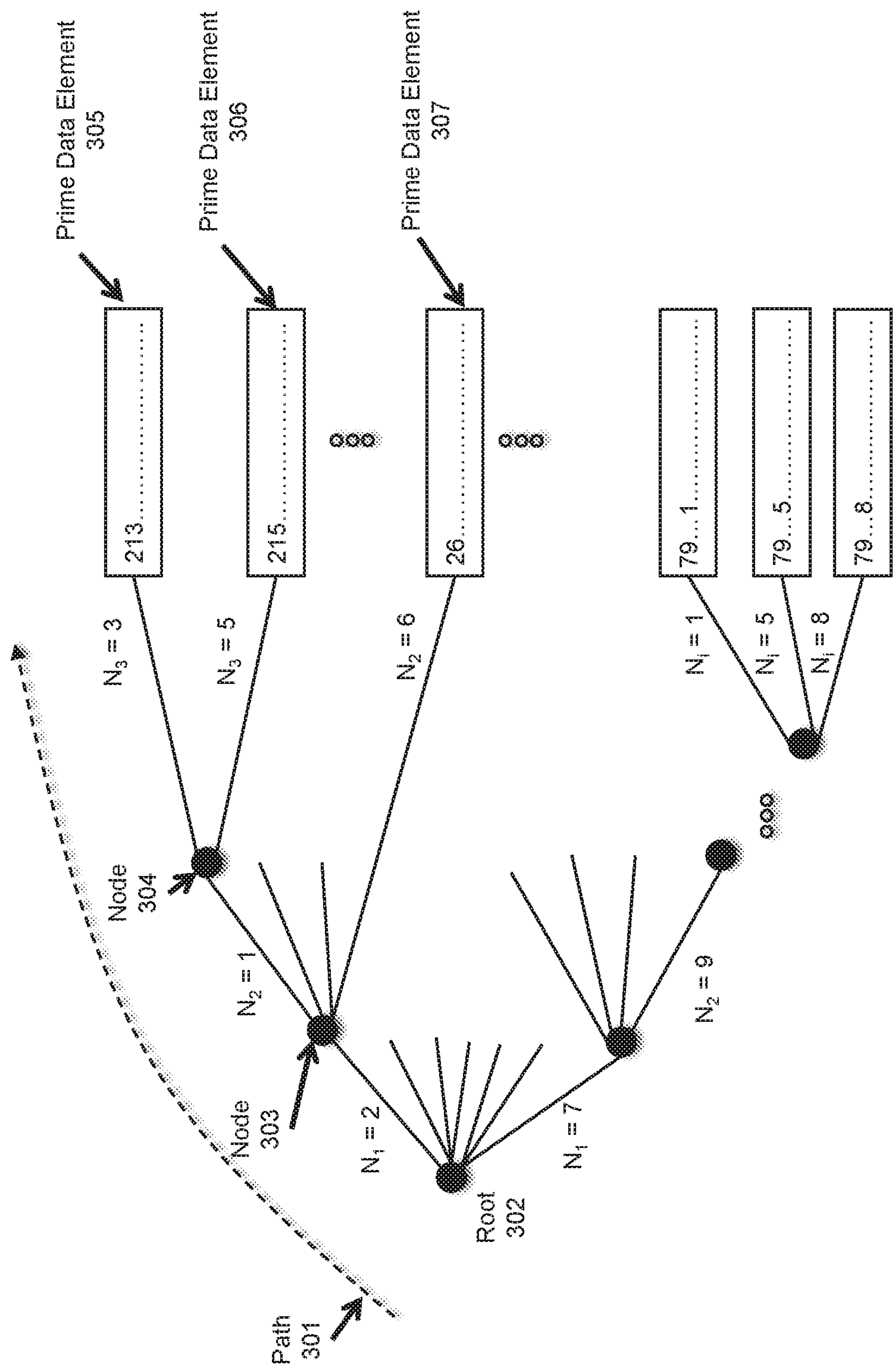
FIGS. 3A, 3B, 3C, 3D, and 3E illustrate different data organization systems that may be used to organize Prime Data Elements based on their Name in accordance with some embodiments described herein.

FIG. 3A shows a trie data structure in which Prime Data Elements are organized into progressively smaller groups based on the values of successive bytes from the Name of each Prime Data Element. In the example shown in FIG. 3A, each Prime Data Element has a distinct Name which is constructed from the entire content of the Prime Data Element, and this Name is simply comprised of all the bytes of the Prime Data Element, with these bytes appearing in the Name in the same order as they exist in the Prime Data Element. The root node of the trie represents all the Prime Data Elements. Other nodes of the trie represent subsets or groups of Prime Data Elements. Starting at the root node or 1st level of the trie (labeled as Root 302 in FIG. 3A), Prime Data Elements are grouped into subtrees based upon the value of the most significant byte of their Name (labeled as N1 in FIG. 3A). All Prime Data Elements with the same value in the most significant byte of their Name will be grouped together into a common subtree, and a link denoted by that value will exist from the root node to a node representing that subtree. For example, in FIG. 3A, Node 303 represents a subtree or group of Prime Data Elements that each have the same value 2 in their most significant byte N1 of their respective Names. In FIG. 3A, this group includes Prime Data Elements 305, 306, and 307.

At the second level of the trie, the second most significant byte of the Name of each Prime Data Element is used to further divide each group of the Prime Data Elements into smaller subgroups. For example, in FIG. 3A, the group of Prime Data Elements represented by Node 303 is further subdivided into subgroups using the second most significant byte N2. Node 304 represents the subgroup of Prime Data Elements which have the value 2 in their most significant byte N1, and also the value 1 in their second most significant byte N2 of their respective Names. This subgroup includes Prime Data Elements 305 and 306.

The process of subdivision continues at each level of the trie creating links from a parent node to each child node, where a child node represents a subset of the Prime Data Elements represented by the parent node. This process continues until there are only individual Prime Data Elements at the leaves of the trie. A leaf node represents a group of leaves. In FIG. 3A, Node 304 is a leaf node. The group of Prime Data Elements represented by Node 304 comprises Prime Data Elements 305 and 306. In FIG. 3A, this group is further subdivided into individual Prime Data Elements 305 and 306 using the third most significant byte of their Names. The value of N3=3 leads to Prime Data Elements 305, while the value N3=5 leads to Prime Data Element 306. In this example, out of their complete Names, only 3 significant bytes are sufficient to fully identify Prime Data Elements 305 and 306. Likewise, only two significant bytes from the Name are sufficient to identify Prime Data Element 307.

This example illustrates how, in the given mix of Prime Data Elements, only a subset of the bytes of the Name serves to identify Prime Data Elements in the tree, and the entire Name is not needed to arrive at a unique Prime Data Element. Also, Prime Data Elements or groups of Prime Data Elements might each require a different number of significant bytes to be able to uniquely identify them. Thus, the depth of the trie from the root node to a Prime Data Element could vary from one Prime Data Element to another. Furthermore, in the trie, each node might have a different number of links descending to subtrees below.

In such a trie, each node has a name comprised of the sequence of bytes that specifies how to reach this node. For example, the name for Node 304 is "21". Also, the subset of bytes from the Name of the element that uniquely identifies the element in the current distribution of elements in the tree is the "Path" to this Prime Data Element from the root node. For example, in FIG. 3A, Path 301 with a value of 213 identifies Prime Data Elements 305.

The trie structure described here may create deep trees (i.e., trees that have many levels) since every differentiating byte of the Name of an element in the tree adds one level of depth to the trie.

Note that the tree data structures in FIGS. 3A-3E have been drawn from left to right. Therefore, as we move from the left side of the figure to the right side of the figure, we move from higher levels of the tree to lower levels of the tree. Below a given node (i.e., toward the right of a given node in FIGS. 3A-3E), for any child selected by a certain value of the differentiating byte from the Name, all elements resident in the subtrees below that child will have the same value in that corresponding byte in the Name of the element.

We now describe a method for content-associative lookup of the trie structure, given an input candidate element. This method involves navigation of the trie structure using the Name of the candidate element, followed by subsequent analysis and screening to decide what to return as the result of the overall content-associative lookup. In other words, the trie navigation process returns a first outcome, and then analysis and screening is performed on that outcome to determine the result of the overall content-associative lookup.

To begin the trie navigation process, the value of the most significant byte from the Name of the candidate element will be used to select a link (denoted by that value) from the root node to a subsequent node representing a subtree of Prime Data Elements with that same value in the most significant byte of their Names. Proceeding from this node, the second byte from the Name of the candidate element is examined and the link denoted by that value is selected, thus advancing one level deeper (or lower) into the trie and selecting a smaller subgroup of Prime Data Elements that now share with the candidate element at least two significant bytes from their Names. This process continues until a single Prime Data Element is reached or until none of the links match the value of the corresponding byte from the Name of the candidate element. Under either of these conditions, the tree navigation process terminates. If a single Prime Data Element is reached, it may be returned as the outcome of the trie navigation process. If not, one alternative is to report a "miss". Another alternative is to return multiple Prime Data Elements that are in the subtree that is rooted at the node where the navigation terminated.

Once the trie navigation process has terminated, other criteria and requirements may be used to analyze and screen the outcome of the trie navigation process to determine what should be returned as the result of the content-associative lookup. For example, when either a single Prime Data Element or multiple Prime Data Elements are returned by the trie navigation process, there could be an additional requirement that they share a certain minimum number of bytes with the Name of the candidate element before qualifying to be returned as the result of the content-associative lookup (otherwise the content-associative lookup returns a miss). Another example of a screening requirement could be that, if the trie navigation process terminates without reaching a single Prime Data Element so that multiple Prime Data elements (rooted at the node where the trie navigation terminated) are returned as the outcome of the trie navigation process, then these multiple Prime Data Elements will qualify to be returned as the result of the overall content-associative lookup only if the number of these elements is fewer than a certain specified limit (otherwise the content-associative lookup returns a miss). Combinations of multiple requirements may be employed to determine the result of the content-associative lookup. In this manner, the lookup process will either report a "miss" or return a single Prime Data Element, or if not a single Prime Data Element, then a set of Prime Data Elements that are likely to be good starting points for deriving the candidate element.

FIGS. 3B-3E described below relate to variations and modifications to the tree data structure illustrated in FIG. 3A. Although these variations provide improvements and advantages over the trie data structure illustrated in FIG. 3A, the process for navigating the data structure is similar to the process described above in reference to FIG. 3A. That is, after the tree navigation for the tree data structures shown in FIGS. 3B-3E terminates, and subsequent analysis and screening is performed to determine the result of the overall content-associative lookup, the overall process either returns a miss, a single Prime Data Element, or a set of Prime Data Elements that are likely to be good starting points for deriving the candidate element.

Figure 3B:
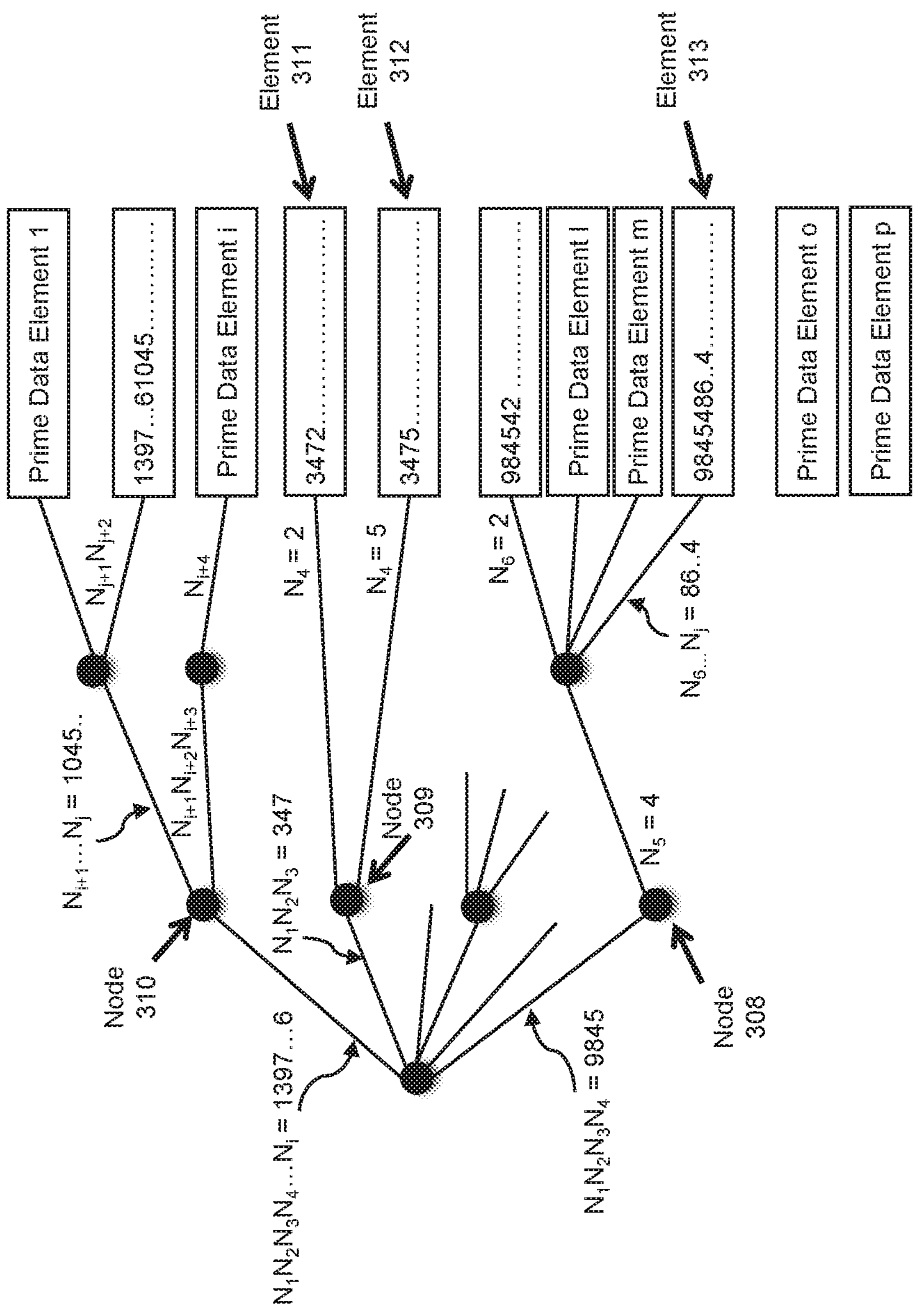

FIG. 3B illustrates another data organization system that may be used to organize Prime Data Elements based on their Name. In the example shown in FIG. 3B, each Prime Data Element has a distinct Name, which is constructed from the entire content of the Prime Data Element, and this Name is simply comprised of all the bytes of the Prime Data Element, with these bytes appearing in the Name in the same order as they exist in the Prime Data Element. FIG. 3B shows a more compact structure where a single link employs multiple bytes (rather than the single byte used in the trie in FIG. 3A) from the Name of the Prime Data Elements in the subtree below to create subdivisions or the next level of groupings. The links from parent nodes to child nodes are now denoted by multiple bytes. Further, from any given parent node, each link might employ a different number of bytes to differentiate and identify the subtree associated with that link. For example, in FIG. 3B, the link from the root node to Node 308 is differentiated by using 4 bytes ($N_1N_2N_3N_4$=9845) from the Name, while the link from the root node to Node 309 is differentiated by using 3 bytes ($N_1N_2N_3$=347) from the Name.

Note that, during tree navigation (using content from a given candidate element), upon arriving at any parent node in the tree, the tree navigation process needs to ensure that sufficient bytes from the Name of the candidate element are examined to unambiguously decide which link to choose. To choose a given link, the bytes from the Name of the candidate must match all the bytes that denote the transition to that particular link. Once again, in such a tree, each node of the tree has a name comprised of the sequence of bytes that specifies how to reach this node. For example, the name of node 309 can be "347" because it represents a group of Prime Data Elements (e.g., elements 311 and 312) with the 3 leading bytes of their Names being "347". Upon a lookup of the tree using a candidate element with the leading 3 bytes of the Name being 347, this data pattern causes the tree navigation process to reach node 309 as shown in FIG. 3B. Once again, the subset of bytes from the Name of the element that uniquely identifies the element in the current mix of elements in the tree is the "Path" to this Prime Data Element from the root node. For example, in FIG. 3B, the sequence of bytes 3475 leads to Prime Data Element 312, and uniquely identifies Prime Data Element 312 in the mix of Prime Data Elements shown in that example.

For diverse and sparse data, the tree structure in FIG. 3B can prove more flexible and compact than the trie structure of FIG. 3A.

Figure 3C:
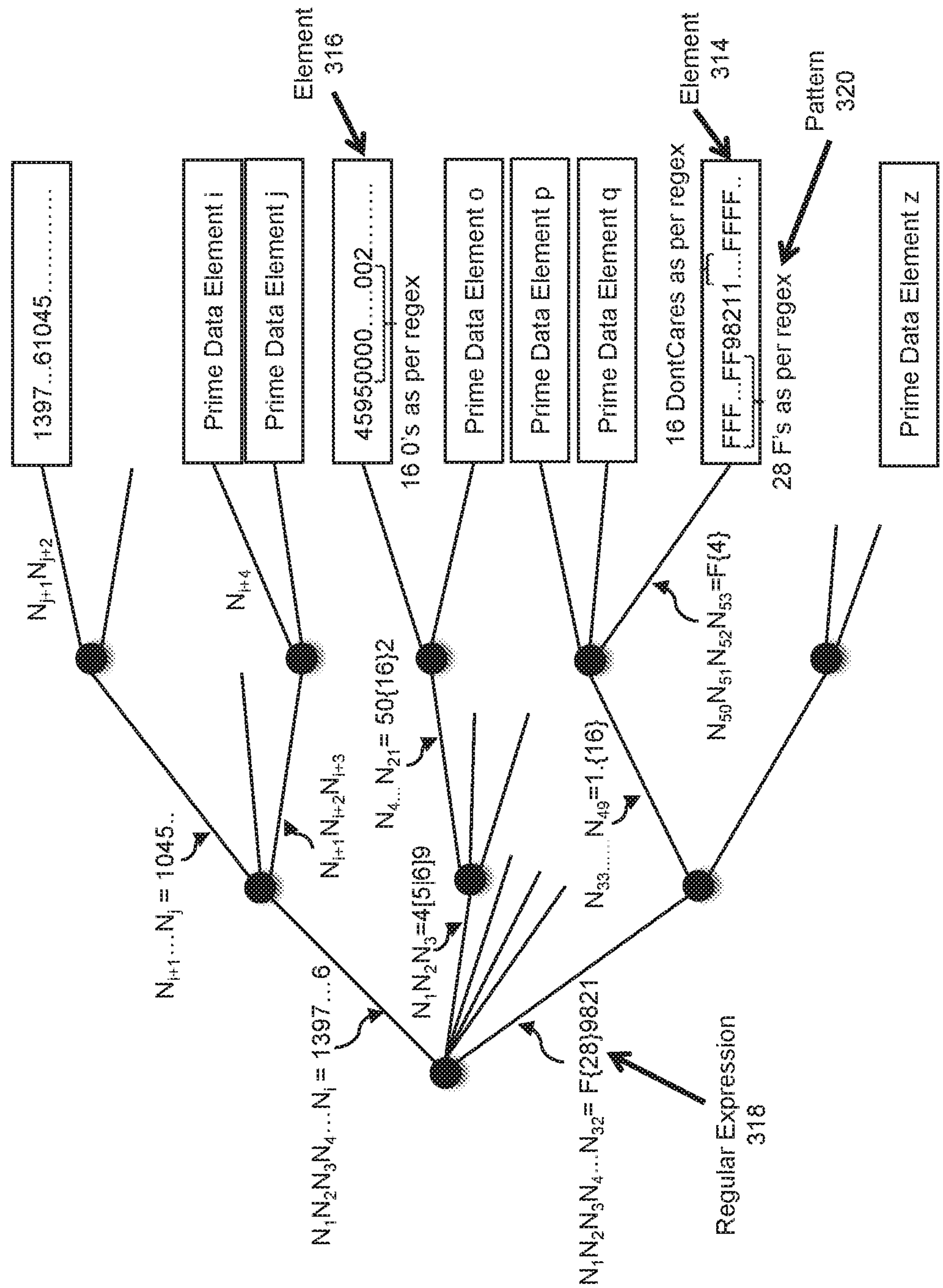

FIG. 3C illustrates another data organization system that may be used to organize Prime Data Elements based on their Name. In the example shown in FIG. 3C, each Prime Data Element has a distinct Name, which is constructed from the entire content of the Prime Data Element, and this Name is simply comprised of all the bytes of the Prime Data Element, with these bytes appearing in the Name in the same order as they exist in the Prime Data Element. FIG. 3C shows another variation (to the organization described in FIG. 3B) that further compacts the tree and groups elements in a subtree by using regular expressions (where necessary and/or useful) to specify the values from the Name of Prime Data Elements that lead to the various links. The use of regular expressions allows an efficient grouping of elements that share the same expression on corresponding bytes under the same subtree; this can then be followed by a more local disambiguation of distinct Prime Data Elements within the subtree. Also, the use of the regular expressions allows a more compact way to describe the values of bytes needed to map the element to any subtree below. This further reduces the number of bytes needed to specify the tree. For example, regular expression 318 specifies a pattern of 28 consecutive "F"s; if this link is followed during tree navigation, we may reach element 314, which includes pattern 320 that has 28 consecutive "F"s as per regular expression 318. Likewise, the path that reaches element 316 has a link or branch that uses a regular expression that specifies a pattern with 16 consecutive "0"s. For such a tree, the tree navigation process needs to detect and execute such regular expressions in order to determine which link to choose.

Figure 3D:
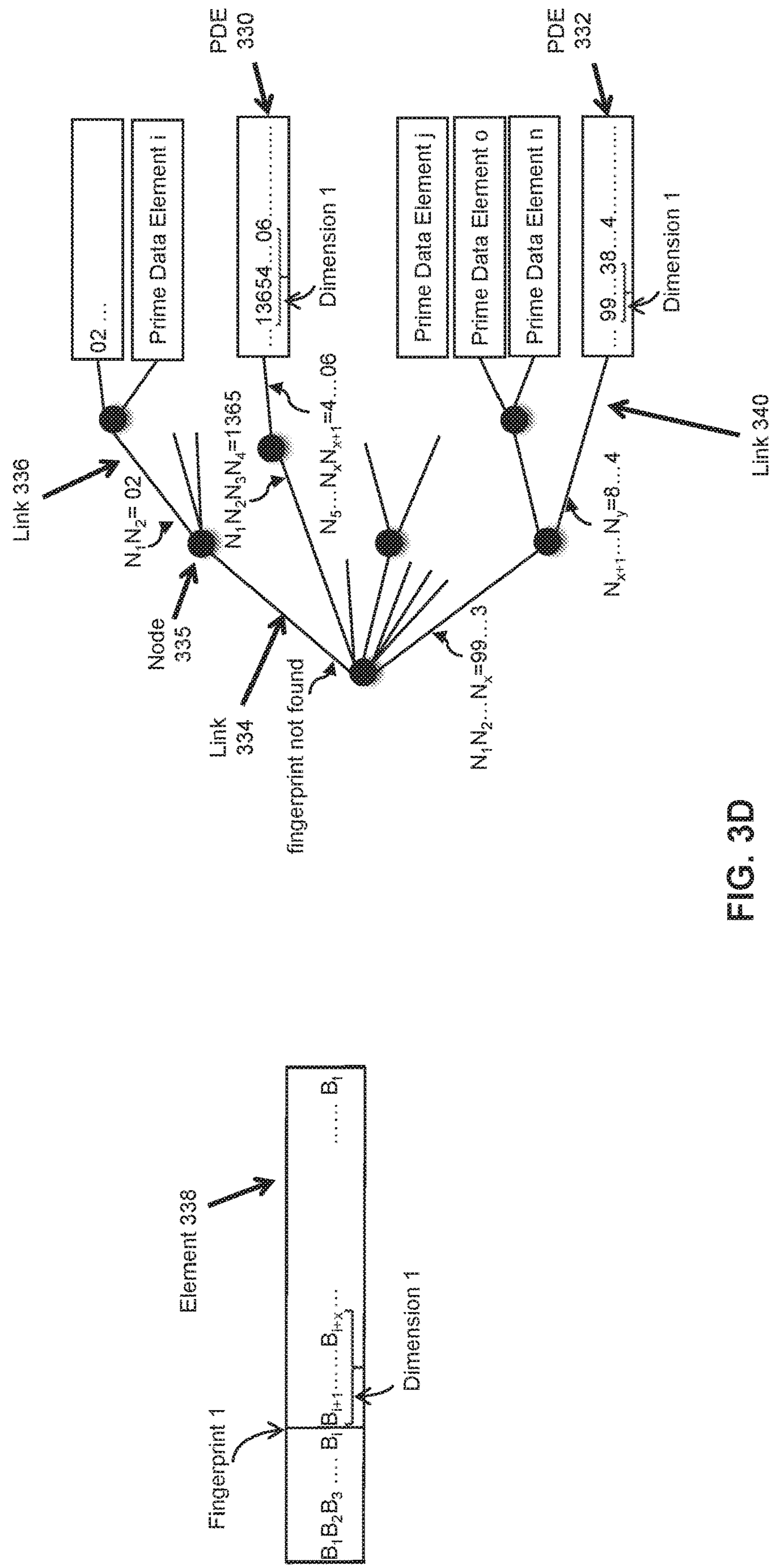

FIG. 3D illustrates another data organization system that may be used to organize Prime Data Elements based on their Name. In the example shown in FIG. 3D, each Prime Data Element has a distinct Name, which is constructed from the entire content of the Prime Data Element. A method of fingerprinting is applied to each element to identify locations of fields that contain content that evaluates to a chosen fingerprint. A field at the location of the first fingerprint found in the element is treated as a Dimension and a certain number of bytes (say, x bytes, where x is significantly smaller than the number of bytes in the element) from this field are extracted and used as the leading bytes of the Name of the Element, with the rest of the bytes of the Name being comprised of the rest of the bytes of the Prime Data Element and appearing in the same cyclic order as they exist in the Prime Data Element. This Name is used to organize the Prime Data Elements in the tree. In this example, when no fingerprint is detected in an element, the Name is formulated by simply using all the bytes of the element in the order in which they exist in the element. A separate subtree (denoted by an indication that no fingerprints were found) holds and organizes all such elements based upon their Names.

For example, as shown in FIG. 3D, a fingerprinting technique can be applied to Element 338 (which contains t bytes of data viz. $B_1B_2B_3 \ldots B_t$) to obtain fingerprint location "Fingerprint 1" at byte $B_{i+1}$ which identifies the field which will be chosen as "Dimension 1." Next, x bytes from the location identified by "Fingerprint 1" can be extracted to form "Dimension 1" and these x bytes can be used as the leading bytes $N_1N_2 \ldots N_x$ of the Name of each element in FIG. 3D. Subsequently, the rest of the t−x bytes from element 338 (starting from $B_{i+x+1}$, and later wrapping around to $B_1B_2B_3 \ldots B_i$) are concatenated and used as the rest of the bytes $N_{x+1}\ N_{x+2} \ldots N_t$ of the Name. When no fingerprints are found in the element, the Name $N_1\ N_2 \ldots N_t$ is simply $B_1B_2B_3 \ldots B_t$ from Element 338. Prime Data Elements are sorted and organized in the tree using their Names. For example, Prime Data Element (PDE) 330 is identified and reached after traversing two levels of the tree using the Path 13654 . . . 06, where the bytes 13654 . . . 0 are $N_1\ N_2 \ldots N_x$ which are the bytes from Dimension 1. A separate subtree at Node 335, arrived at from the root along link 334 (denoted by an indication that no fingerprints were found) holds and organizes all Prime Data Elements whose content did not evaluate to the chosen fingerprint. Thus, in this organization, some links, e.g., link 336, may organize elements using a Name that is comprised of the bytes of the element appearing in the same order as in the element, while other links, e.g., link 340, may organize elements using a Name that is formulated using fingerprints.

Upon receiving a candidate element, the process applies the same technique described above to determine the Name of the candidate element, and uses this Name to navigate the tree for a content-associative lookup. Thus, the same and consistent treatment is applied to Prime Data Elements (upon their installation into the tree) and candidate elements (upon receiving them from the Parser & Factorizer) in order to create their Names. The tree navigation process uses the Name of the candidate element to navigate the tree. In this embodiment, if no fingerprint is found in the candidate element, the tree navigation process navigates down the subtree that organizes and contains Prime Data Elements whose content did not evaluate to the fingerprint.

Figure 3E:
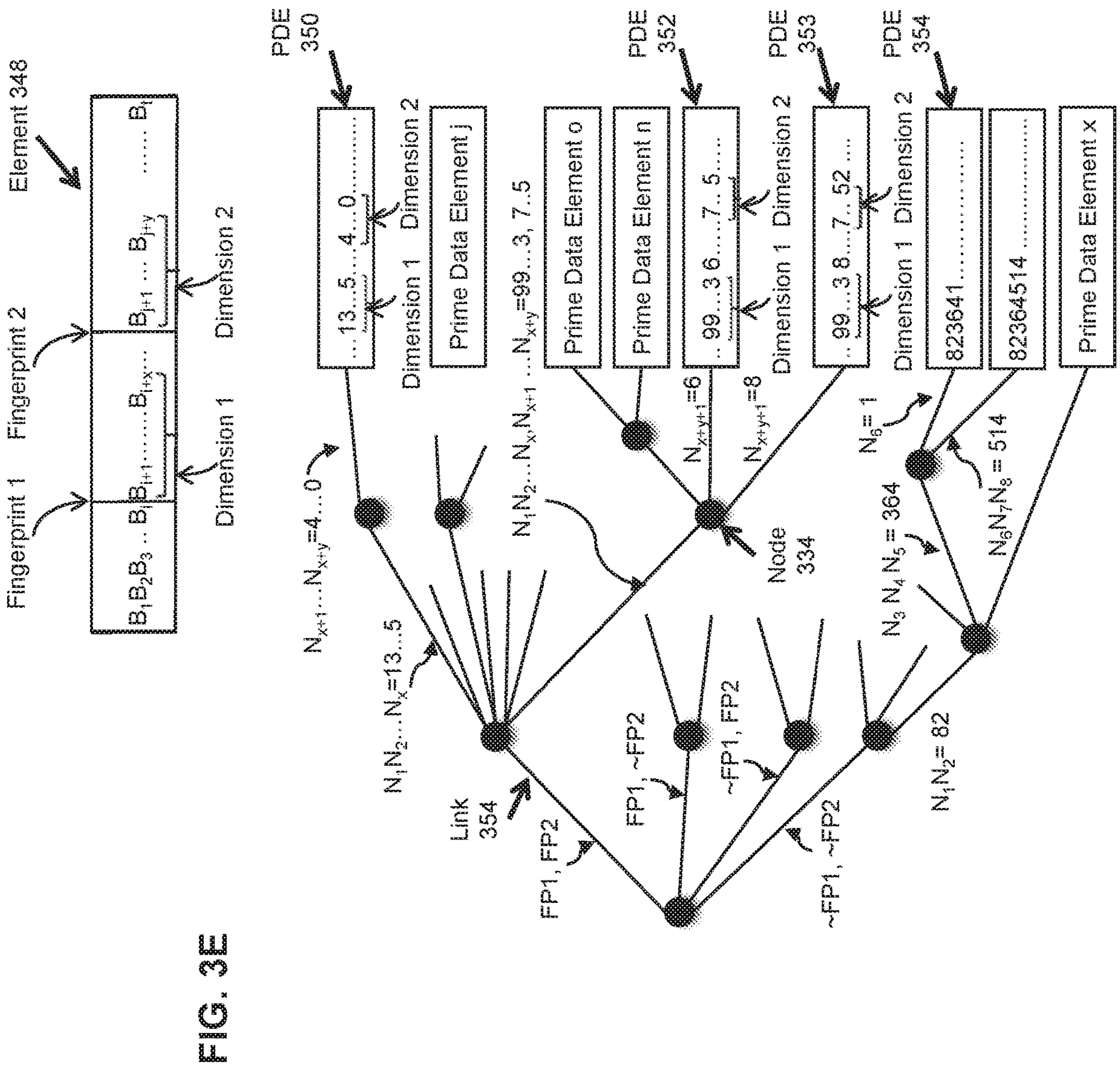

FIG. 3E illustrates another data organization system that may be used to organize Prime Data Elements based on their Name. In the example shown in FIG. 3E, each Prime Data Element has a distinct Name, which is constructed from the entire content of the Prime Data Element. A method of fingerprinting is applied to each element to identify locations of fields that contain content that evaluates to either of two fingerprints. The field at the location of the first occurrence of the first fingerprint (Fingerprint1 in FIG. 3E) in the element is treated as a first Dimension (Dimension 1), and the field located at the first occurrence of the second fingerprint (Fingerprint2 in FIG. 3E) is treated as a second Dimension (Dimension 2). The use of fingerprinting to look for two distinct fingerprints on an element leads to four possible scenarios: (1) both fingerprints are found in the element, (2) fingerprint1 is found but fingerprint 2 is not found, (3) fingerprint 2 is found but fingerprint 1 is not found, and (4) no fingerprints are found. Prime Data Elements can be grouped into 4 subtrees corresponding to each of the scenarios. In FIG. 3E, "FP1" denotes the presence of Fingerprint1, "FP2" denotes the presence of Fingerprint2, "~FP1" denotes the absence of Fingerprint1, and "~FP2" denotes the absence of Fingerprint2.

For each of the 4 scenarios, the Name of an element is created as follows: (1) When both fingerprints are found, x bytes from the location identified by "Fingerprint 1" can be extracted to form "Dimension 1" and y bytes from the location identified by "Fingerprint 2" can be extracted to form "Dimension 2" and these x+y bytes can be used as the leading bytes $N_1N_2 \ldots N_{x+y}$ of the Name of each such element in FIG. 3E. Subsequently, the rest of the t−(x+y) bytes from element 348 are extracted in cyclic fashion (starting after the bytes from the first dimension) and concatenated and used as the rest of the bytes $N_{x+y+1}\ N_{x+y+2} \ldots N_t$ of the Name. (2) When fingerprint 1 is found but not fingerprint 2, x bytes from the location identified by "Fingerprint 1" can be extracted to form the leading dimension, and these x bytes can be used as the leading bytes $N_1\ N_2 \ldots N_x$ of the Name of each such element. Subsequently, the rest of the t−x bytes from element 348 (starting from $B_{i+x+1}$, and later wrapping around to $B_1B_2B_3 \ldots B_i$) are concatenated and used as the rest of the bytes $N_{x+1}\ N_{x+2} \ldots N_t$ of the Name. (3) When fingerprint 2 is found but not fingerprint 1, y bytes from the location identified by "Fingerprint 2" can be extracted to form the leading dimension, and these y bytes can be used as the leading bytes $N_1\ N_2 \ldots N_y$ of the Name of each such element. Subsequently, the rest of the t−y bytes from element 348 (starting from $B_{j+y+1}$, and later wrapping around to $B_1B_2B_3 \ldots B_j$) are concatenated and used as the rest of the bytes $N_{y+1}\ N_{y+2} \ldots N_t$ of the Name. (4) When no fingerprints are found in the element, the Name $N_1\ N_2 \ldots N_t$ is simply $B_1B_2\ B_3 \ldots B_t$ from element 348. Thus, a separate subtree exists for each of these 4 scenarios. The process to extract Name $(N_1N_2N_3 \ldots N_t)$ for element 348 can be summarized for the four scenarios as follows:

(1) both Fingerprint1 and Fingerprint2 found:

$N_1-N_x \leftarrow B_{i+1}-B_{i+x}$=x bytes from Dimension 1

$N_{x+1}-N_{x+y} \leftarrow B_{j+1}-B_{j+y}$=y bytes from Dimension 2

$N_{x+y+1} \ldots N_t$=Rest of the bytes (from the Candidate Element of size t bytes)=$B_{i+x+1}B_{i+x+2}B_{i+x+3} \ldots B_jB_{j+y+1}B_{j+y+2}B_{j+y+3} \ldots B_tB_1B_2B_3 \ldots B_i$ (2) Fingerprint1 found, Fingerprint2 not found:

$N_1-N_x \leftarrow B_{i+1}-B_{i+x}$=x bytes from Dimension 1

$N_{x+1} \ldots N_t$=Rest of the bytes (from the Candidate Element of size t bytes)=$B_{i+x+1}B_{i+x+2}B_{i+x+3} \ldots B_tB_1B_2B_3 \ldots B_i$ (3) Fingerprint2 found, Fingerprint1 not found:

$N_1-N_y \leftarrow B_{j+1}-B_{j+y}$=y bytes from Dimension 2

$N_{y+1} \ldots N_t$=Rest of the bytes (from the Candidate Element of size t bytes)=$B_{j+y+1}B_{j+y+2}B_{j+y+3} \ldots B_tB_1B_2B_3 \ldots B_j$ (4) No fingerprints found:

$N_1-N_x \leftarrow B_1-B_t$

Upon receiving a candidate element, the process applies the same technique described above to determine the Name of the candidate element. In this embodiment, the 4 methods of Name construction described above (depending upon whether fingerprint 1 and fingerprint 2 are found or not) are applied to the candidate element just as they were to Prime Data Elements when they were entered into the Sieve. Thus, the same and consistent treatment is applied to Prime Data Elements (upon their installation into the tree) and to candidate elements (upon receiving them from the Parser & Factorizer) in order to create their Names. The tree navigation process uses the Name of the candidate element to navigate the tree for a content-associative lookup.

If the content-associative lookup is successful, it will yield Prime Data Elements that have the same patterns at the locations of the specific dimensions as the candidate element. For example, if both fingerprints are found in the candidate element, the tree navigation process will take it down link 354 of the tree, starting from the root node. If the candidate element has the pattern "99 . . . 3" as 'Dimension 1" and the pattern "7 . . . 5" as 'Dimension 2", the tree navigation process will arrive at Node 334. This reaches a subtree containing two Prime Data Elements (PDE 352 and PDE 353), which are likely targets for the derivation. Additional analysis and screening is performed (by first examining the metadata, and if needed, by subsequently fetching and examining the actual Prime Data Elements) to determine which Prime Data Element is best suited for the derivation. Thus, embodiments described herein identify a variety of tree structures that can be used in the Sieve. Combinations of such structures or variations thereof could be employed to organize the Prime Data Elements. Some embodiments organize the Prime Data Elements in tree form, wherein the entire content of the element is used as the Name of the element. However, the sequence in which bytes appear in the Name of the element is not necessarily the sequence in which the bytes appear in the element. Certain fields of the element are extracted as dimensions and used to form the leading bytes of the Name, and the rest of the bytes of the element make up the rest of the Name. Using these Names, the elements are ordered in the Sieve in tree form. The leading digits of the Name are used to differentiate the higher branches (or links) of the tree, and the rest of the digits are used to progressively differentiate all branches (or links) of the tree. Each node of the tree could have a different number of links emanating from that node. Also, each link from a node could be differentiated and denoted by a different number of bytes, and the description of these bytes could be accomplished through use of regular expressions and other powerful ways to express their specification. All these features lead to a compact tree structure. At the leaf nodes of the tree reside references to individual Prime Data Elements.

In one embodiment, a method of fingerprinting can be applied to the bytes comprising the Prime Data Element. A number of bytes residing at the location identified by the fingerprint can be used to make up a component of the element Name. One or more components could be combined to provide a dimension. Multiple fingerprints could be used to identify multiple dimensions. These dimensions are concatenated and used as the leading bytes of the Name of the element, with the rest of the bytes of the element comprising the rest of the Name of the element. Since the dimensions are located at positions identified by fingerprints, it increases the likelihood that the Name is being formed from consistent content from each element. Elements that have the same value of content at the fields located by the fingerprint will be grouped together along the same leg of the tree. In this fashion, similar elements will be grouped together in the tree data structure. Elements with no fingerprints found in them can be grouped together in a separate subtree, using an alternative formulation of their Names.

In one embodiment, a method of fingerprinting can be applied to the content of the element to determine the locations of the various components (or signatures) of the Skeletal Data Structure (described earlier) within the content of the element. Alternatively, certain fixed offsets inside the content of the element could be chosen to locate a component. Other methods could also be employed to locate a component of the Skeletal Data Structure of the element, including, but not limited to, parsing the element to detect certain declared structure, and locating components within that structure. The various components of the Skeletal Data Structure of the element can be considered as Dimensions, so that a concatenation of these dimensions followed by the rest of the content of each element is used to create the Name of each element. The Name is used to order and organize the Prime Data Elements in the tree.

In another embodiment, the element is parsed in order to detect certain structure in the element. Certain fields in this structure are identified as dimensions. Multiple such dimensions are concatenated and used as the leading bytes of the Name, with the rest of the bytes of the element comprising the rest of the Name of the element. Since the dimensions are located at positions identified by parsing the element and detecting its structure, it increases the likelihood that the Name is being formed from consistent content from each element. Elements that have the same value of content at the fields located by the parsing will be grouped together along the same leg of the tree. In this fashion, once again, similar elements will be grouped together in the tree data structure.

In some embodiments, each node in the tree data structure contains a self-describing specification. Tree nodes have one or more children. Each child entry contains information on the differentiating bytes on the link to the child, and a reference to the child node. A child node may be a tree node or leaf node. FIG. 3F presents a self-describing tree node data structure in accordance with some embodiments described herein. The tree node data structure shown in FIG. 3F specifies (A) information pertaining to the Path from the root node to this tree node, including all or a subset of the following components: the actual sequence of bytes from the Name to reach this tree node, the number of bytes of the Name consumed to reach this node from the root node, an indication whether this number of bytes consumed is greater than some pre-specified threshold, and other metadata that describes the Path to this node and is useful for the content-associative search of the tree as well as for decisions relating to the construction of the tree, (B) the number of children the node has, and (C) for each child (wherein each child corresponds to a branch of the tree) it specifies (1) Child ID, (2) number of differentiating bytes needed from the succeeding bytes of the Name in order to transition down this link of the tree, (3) the specification for the actual value of the bytes from the Name that take it down this link, and (4) a reference to the child node.

FIG. 3G presents a self-describing leaf node data structure in accordance with some embodiments described herein. Leaf nodes have one or more children. Each child is the link to a Prime Data Element. Each child entry contains information on the differentiating bytes on the link to the Prime Data Element, a reference to the Prime Data Element, count of Duplicates & Derivatives and other metadata about the Prime Data Element. The leaf node data structure shown in FIG. 3G specifies (A) information pertaining to the Path from the root node to this leaf node, including all or a subset of the following components: the actual sequence of bytes from the Name to reach this leaf node, the number of bytes of the Name consumed to reach this node from the root node, an indication whether this number of bytes consumed is greater than some pre-specified threshold, and other metadata that describes the Path to this node and is useful for the content-associative search of the tree as well as for decisions relating to the construction of the tree, (B) the number of children the node has, and (C) for each child (wherein each child corresponds to a Prime Data Element under the leaf node) it specifies (1) Child ID, (2) number of differentiating bytes needed from the succeeding bytes of the Name in order to transition down this link of the tree to a Prime Data Element, (3) the specification for the actual value of the bytes from the Name that take it down this leg, (4) a reference to the Prime Data Element that terminates the tree on this path of the tree, (5) a count of how many duplicates and derivatives are pointing to this Prime Data Element (this is used to ascertain whether an entry can be deleted from the Sieve upon a deletion of data in the storage system), and (6) other metadata for the Prime Data Element including Size of Prime Data Element, etc.

In order to increase the efficiency with which fresh Prime Data Elements get installed into the tree, some embodiments incorporate an additional field into the leaf node data structure for each Prime Data Element that is kept at the leaf node of the tree. Note that when a fresh element has to be inserted into the tree, additional bytes of the Name or content of each of the Prime Data Elements in the subtree in question might be needed in order to decide where in the subtree to insert the fresh element, or whether to trigger a further partitioning of the subtree. The need for these additional bytes could require fetching several of the Prime Data Elements in question in order to extract the relevant differentiating bytes for each of these elements with respect to the fresh element. In order to reduce and optimize (and, in most cases, fully eliminate) the number of IOs needed for this task, the data structure in the leaf node includes a certain number of additional bytes from the Name of each Prime Data Element under that leaf node. These additional bytes are referred to as Navigation Lookahead bytes, and assist in sorting the Prime Data Elements with respect to a fresh incoming element. The Navigation Lookahead bytes for a given Prime Data Element are installed into the leaf node structure upon installation of the Prime Data Element into the Sieve. The number of bytes to be retained for this purpose could be chosen statically or dynamically using a variety of criteria, including the depth of the subtree involved and the density of Prime Data Elements in that subtree. For example, for Prime Data Elements being installed at shallow levels of the tree, the solution may add a longer Navigation Lookahead Field than for Prime Data Elements residing in a very deep tree. Also, when a fresh element is being installed into the Sieve, and if there are already many Prime Data Elements in the existing target subtree (with increased likelihood of an imminent repartitioning), then additional Navigation Lookahead bytes could be retained for the fresh Prime Data Element when it is being installed into the subtree.

FIG. 3H presents the leaf node data structure for a leaf node that includes the Navigation Lookahead field. This data structure specifies (A) information pertaining to the Path from the root node to this leaf node, including all or a subset of the following components: the actual sequence of bytes from the Name to reach this leaf node, the number of bytes of the Name consumed to reach this node from the root node, an indication whether this number of bytes consumed is greater than some pre-specified threshold, and other metadata that describes the Path to this node and is useful for the content-associative search of the tree as well as for decisions relating to the construction of the tree, (B) the number of children the node has, and (C) for each child (wherein each child corresponds to a Prime Data Element under the leaf node) it specifies (1) Child ID, (2) number of differentiating bytes needed from the succeeding bytes of the Name in order to transition down this link of the tree to a Prime Data Element, (3) the specification for the actual value of the bytes that take it down this leg, (4) a reference to the Prime Data Element that terminates the tree on this path of the tree, (5) the Navigation Lookahead fields that specify how many bytes of Navigation Lookahead are retained for the Prime Data Element, as well as the actual values of those bytes, (6) a count of how many duplicates and derivatives are pointing to this Prime Data Element (this is used to ascertain whether an entry can be deleted from the Sieve upon a deletion of data in the storage system), and (7) other metadata for the Prime Data Element including size of Prime Data Element, etc.

In some embodiments, the various branches of the tree are used to map the various data elements into groups or ranges formed by interpreting the differentiating bytes along a link leading to a child subtree as a range delimiter. All elements in that child subtree will be such that the values of the corresponding bytes in the element will be less than or equal to the values for the differentiating bytes specified for the link to the particular child subtree. Thus each subtree will now represent a group of elements whose values fall within a specific range. Within a given subtree, each subsequent level of the tree will progressively divide the set of elements into smaller ranges. This embodiment provides a different interpretation to the components of the self-describing tree node structure shown in FIG. 3F. The N children in FIG. 3F are ordered by value of their differentiating bytes in the tree node data structure and represent an ordered sequence of non-overlapping ranges. For N nodes, there are N+1 ranges—the lowest or 1st range comprises of values less than or equal to the smallest entry and the N+1th range comprises of values greater than the Nth entry. The N+1th range will be treated as out of range, so that the N links lead to N subtrees or ranges below.

For example, in FIG. 3F, Child 1 defines the lowest range and uses 6 bytes (of value abef12d6743a) to differentiate its range – the range for Child 1 is from 00000000 to abef12d6743a. If the corresponding 6 bytes of the candidate element fall within this range, inclusive of the end values, the link for this child will be chosen. If the corresponding 6 leading bytes of the candidate element are larger than the range delimiter abef12d6743a, Child 1 will not be selected. To examine whether the candidate falls within the range for Child 2, two conditions must be satisfied—firstly the candidate must be outside the range for the immediately preceding child (Child 1 in this example), and secondly the corresponding bytes in its Name must be less than or equal to the range delimiter for Child 2. In this example, the range delimiter for Child 2 is described by 2 bytes of value dcfa. Hence the 2 corresponding bytes for the candidate element must be less than or equal to dcfa. Using this method, the candidate element and all the children in the tree node can be examined to check which of the N+1 ranges the candidate element falls in. For the example shown in FIG. 3F, a miss condition will be detected if the 4 corresponding bytes of the Name of the candidate element are greater than the value of the differentiating bytes for the link for Child N, which is f3231929.

The tree navigation process can be modified to accommodate this new range node. Upon arriving at a range node, to choose a given link emanating from that node, the bytes from the Name of the candidate must fall within the range defined for that particular link. If the value of the bytes from the Name of the candidate is larger than the value of the corresponding bytes in all the links, the candidate element falls outside of all ranges spanned by the subtree below—in this case (referred to as an "out of range condition") a miss condition is detected and the tree navigation process terminates. If the leading bytes of the Name of the candidate element fall within the range determined by the corresponding differentiating bytes along a link leading to the child subtree, tree navigation continues to that subtree below. Unless it terminates due to an "out of range condition", tree navigation can progressively continue deeper down the tree until it reaches a leaf node data structure.

This kind of range node can be employed in the tree structure in conjunction with the trie nodes described in FIGS. 3A-3E. In some embodiments, a certain number of levels of upper nodes of the tree structure can be trie nodes with tree traversal being based on exact matches between the leading bytes of the Name of the candidate element and the corresponding bytes along a link of the tree. Subsequent nodes can be range nodes with tree traversal dictated by the range in which the corresponding bytes of the Name of the candidate element falls. Upon termination of the tree navigation process, as described earlier in this document, a variety of criteria can be used to decide what to return as the result of the overall content associative lookup.

The foregoing descriptions of methods and apparatuses for representing and using tree nodes and leaf nodes have been presented only for purposes of illustration and description. They are not intended to be exhaustive or to limit the present invention to the forms disclosed. Accordingly, many modifications and variations will be apparent to practitioners skilled in the art.

Upon being presented a candidate element as input, the tree node and leaf node structures described above can be traversed and a content-associative lookup of the tree can be performed based upon the content of the candidate element. The Name of the candidate element will be constructed from the bytes of the candidate element just as the Name of a Prime Data Element was constructed from the content of the Prime Data Element when it was installed in the Sieve. Given an input candidate element, the method for content-associative lookup of the tree involves navigation of the tree structure using the Name of the candidate element, followed by subsequent analysis and screening to decide what to return as the result of the overall content-associative lookup. In other words, the tree navigation process returns a first outcome, and then analysis and screening is performed on that outcome to determine the result of the overall content-associative lookup.

If there are any Prime Data Elements with the same leading bytes of Name as the candidate (or bytes such that they fall within the same range), the tree will identify that subset of Prime Data Elements in the form of a subtree of elements denoted by a link. In general, each tree node or leaf node can store information that enables the tree navigation process to determine which outgoing link, if any, is to be selected to navigate to the next lower level in the tree based upon the corresponding bytes of the Name of the input element, and the identity of the node that is reached when the tree is navigated along the selected link. If each node contains this information, then the tree navigation process can recursively navigate down each level in the tree until no matches are found (at which point the tree navigation process can return a set of Prime Data Elements that exists in the subtree rooted at the current node) or a Prime Data Element is reached (at which point the tree navigation process can return the Prime Data Element and any associated metadata).

Once the tree navigation process has terminated, other criteria and requirements may be used to analyze and screen the outcome of the tree navigation process to determine what should be returned as the result of the overall content-associative lookup. First, one could pick the Prime Data Element with the most number of leading bytes from the Name in common with the candidate. Second, when either a single Prime Data Element or multiple Prime Data Elements are returned by the tree navigation process, there could be an additional requirement that they share a certain minimum number of bytes with the Name of the candidate element before qualifying to be returned as the result of the content-associative lookup (otherwise, the content-associative lookup returns a miss). Another example of a screening requirement could be that, if the tree navigation process terminates without reaching a single Prime Data Element so that multiple Prime Data elements (rooted at the node where the tree navigation terminated) are returned as the outcome of the tree navigation process, then these multiple Prime Data Elements will qualify to be returned as the result of the overall content-associative lookup only if the number of these elements is fewer than a certain specified limit such as 4-16 elements (otherwise, the content-associative lookup returns a miss). Combinations of multiple requirements may be employed to determine the result of the content-associative lookup. If multiple candidates still remain, one could examine Navigation Lookahead bytes and also associated metadata to decide which Prime Data Elements are the most suitable. If still unable to narrow the choice down to a single Prime Data Element, one could furnish multiple Prime Data Elements to the Derive function. In this manner, the lookup process will either report a "miss," or return a single Prime Data Element, or if not a single Prime Data Element, then a set of Prime Data Elements that are likely to be good starting points for deriving the candidate element.

The tree needs to be designed for efficient content-associative access. A well-balanced tree will provide a comparable depth of access for much of the data. It is expected that the upper few levels of the tree will often be resident in the processor cache, the next few levels in fast memory, and the subsequent levels in flash storage. For very large datasets, it is possible that one or more levels need to reside in flash storage and even disk.

Figure 4:
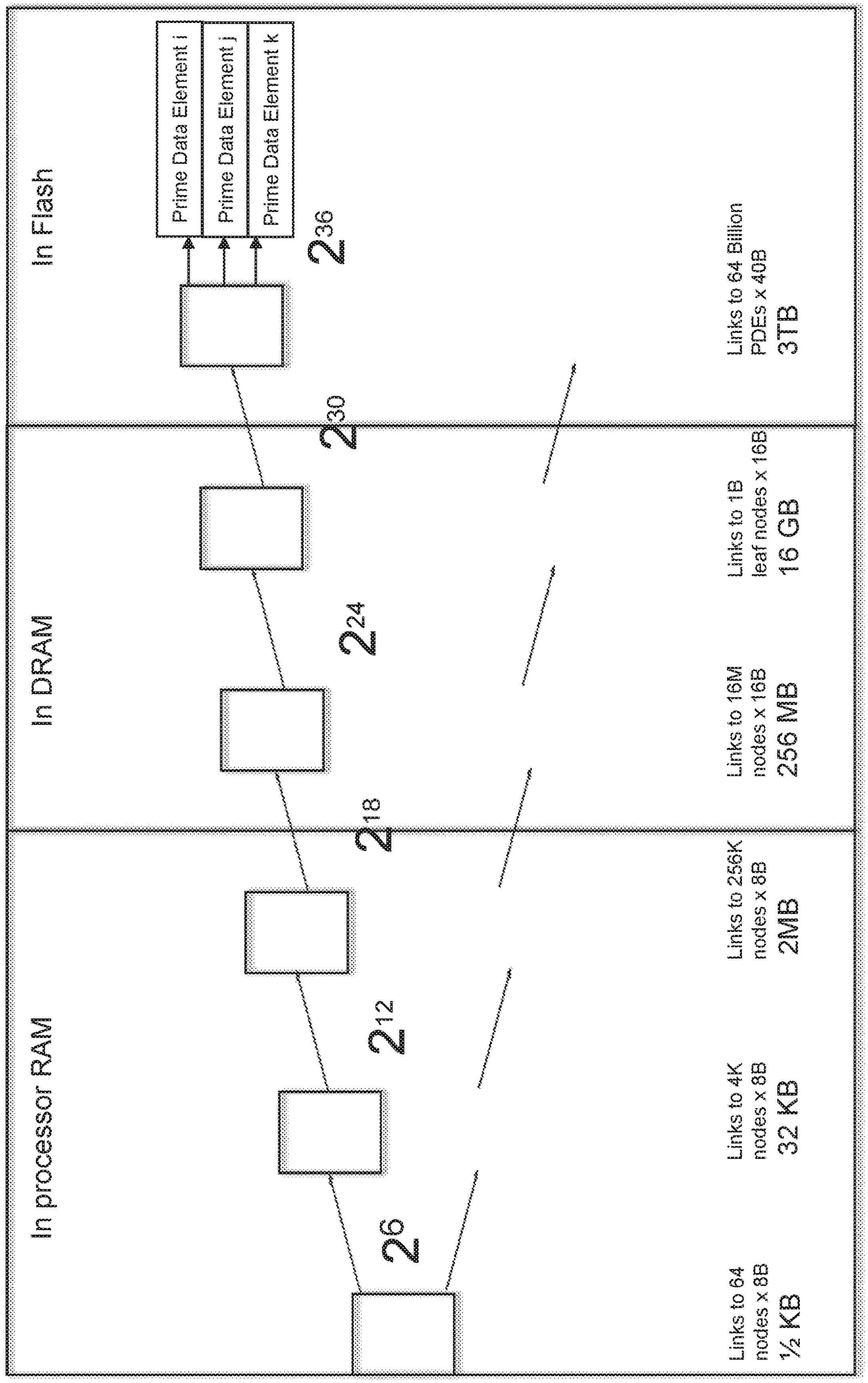
FIG. 4 shows an example of how 256 TB of prime data may be organized in tree form, and presents how the tree may be laid out in memory and storage in accordance with some embodiments described herein.

FIG. 4 shows an example of how 256 TB of prime data may be organized in tree form, and presents how the tree may be laid out in memory and storage in accordance with some embodiments described herein. Assuming an average fanout of 64 (which is $2^6$) children per node, the reference for a Prime Data Element can be accessed by reaching a leaf node data structure (e.g., as described in FIG. 3H) which is resident at (on average) the 6th level of the tree (i.e., after 5 link traversals or hops). So, such a structure at the 6th level of the tree, after 5 hops, will reside alongside another $2^{30}$ such nodes, each with an average of 64 children (these children are the references to the Prime Data Elements), thus accommodating approximately 64 billion Prime Data Elements. At an element size of 4 KB, this accommodates 256 TB of Prime Data Elements.

The tree can be laid out so that the 6 levels of the tree can be traversed as follows: 3 levels residing in on-chip cache (containing approximately four thousand "upper level" tree node data structures specifying transitions for links to approximately 256 K nodes), 2 levels in memory (containing 16 million "middle level" tree node data structures specifying transitions for links to 1 billion leaf nodes approximately), and the 6th level in flash storage (accommodating a billion leaf node data structures). The 1 billion leaf node data structures resident at this 6th level of the tree in flash storage furnish the references for the 64 billion Prime Data Elements (on average 64 elements per leaf node).

In the example shown in FIG. 4, at the 4th and 5th levels, each node devotes on average 16 bytes per element (1 byte for child ID, e.g., a 6-byte reference to the PDE, plus a byte for byte count, plus 8 bytes on average to specify actual transition bytes as well as some metadata). At the 6th level, each leaf node devotes on average 48 bytes per element (1 byte for child ID, 1 byte for byte count, 8 bytes to specify actual transition bytes, 6-byte reference to the Prime Data Element, 1 byte for count of derivatives off this Prime Data Element, 16 bytes of Navigation Lookahead, 2 bytes for size of Prime Data Element, as well as 13 bytes of other metadata), thus the total capacity in flash storage required for the tree (including the references to the Prime Data Elements, and including any metadata) is about 3 Terabytes. The total capacity required for the upper nodes of the tree is a smaller fraction of this size (since there are fewer nodes, and fewer bytes are needed to specify the tighter reference to the children nodes, and less metadata is required per node). In the example, the upper tree nodes devote on average 8 bytes per element (1 byte for child ID, 1 byte for byte count, plus 3-4 bytes on average to specify actual transition bytes, and 2-3 byte reference to the child node). Overall, in this example, a synthetic dataset with 256 TB of prime data is sorted into one billion groups using 3 TB (or 1.17% of 256 TB) of additional apparatus.

In the example shown in FIG. 4, where 256 TB of prime data contains 64 billion Prime Data Elements of 4 KB each, one needs fewer than 5 bytes (or 36 bits) of address to fully differentiate the 64 billion Prime Data Elements. From a content-associative standpoint, if the mix of data is such that an average of 4 bytes of progressive Name are consumed at each of the first 3 levels, and 8 bytes at each of the next 3 levels, a total of 36 bytes (288 bits) of Name (on average) would differentiate all the 64 billion Prime Data Elements. These 36 bytes would be less than 1% of the 4 KB that make up each element. If a Prime Data Element of 4 KB can be identified by 1% (or even 5-10%) of its bytes, then the rest of the bytes (which make up the majority of the bytes) could tolerate perturbations, and a candidate with such perturbations could still reach this Prime Data Element and be considered for derivation from it.

Note that the number of bytes needed on any given link (to differentiate the various subtrees below) will be governed by the actual data in the mix of elements that comprise the dataset. Likewise, the number of links out of a given node will also vary with the data. The self-describing tree node and leaf node data structures will declare the actual number and the values of the bytes needed for each link, as well as the number of links emanating from any node.

Further controls can be placed to limit the amount of cache, memory, and storage devoted at the various levels of the tree, to sort the input into as many differentiated groups as possible, within the allocated budget of incremental storage. To handle situations where there are densities and pockets of data that require very deep subtrees to fully differentiate the elements, such densities could be handled efficiently by grouping a larger set of related elements into a flat group at a certain depth (e.g. the $6^{th}$ level) of the tree and performing a streamlined search and derivation upon these (by first examining the Navigation Lookahead and metadata to determine the best Prime Data Element, or else (as a fallback) looking only for duplicates rather than the full derivation that is afforded by the method for the rest of the data). This would circumvent the creation of very deep trees. Another alternative is to allow deep trees (with many levels) as long as these levels fit in available memory. The moment the deeper levels spill out to flash or disk, steps can be taken to flatten the tree from that level onwards, to minimize the latency that would otherwise be incurred by multiple successive accesses to deeper levels of tree nodes stored in flash or disk, It is expected that a relatively small fraction of the total bytes from the Name of the element will often be sufficient to identify each Prime Data Element. Studies performed on a variety of real world datasets using the embodiments described herein confirm that a small subset of the bytes of a Prime Data Element serves to order the majority of the elements to enable the solution. Thus, such a solution is efficient in terms of the amount of storage that it requires for its operation.

In terms of accesses needed for the example from FIG. 4, once for every incoming 4 KB chunk of input (or candidate element), the scheme will need the following accesses to query the tree structure and reach a leaf node: three cache references, two memory references (or perhaps multiple memory references), plus a single IO from flash storage to access the leaf node data structure. This single IO from storage would fetch a 4 KB page which would hold information for the leaf node data structure for a group of approximately 64 elements which would include the 48 bytes devoted to the Prime Data Element in question. These 48 bytes would include metadata on the Prime Data Element in question. This would conclude the tree lookup process. Subsequently, the number of IOs needed would depend upon whether the candidate element turns out to be a duplicate, a derivative, or a fresh Prime Data Element to be installed in the Sieve.

A candidate element that is a duplicate of a Prime Data Element will need 1 IO to fetch the Prime Data Element in order to verify the duplicate. Once the duplicate is verified, there will be one more IO to update the metadata in the tree. Hence, ingestion of duplicate elements will need two IOs after the tree lookup, for a total of 3 IOs.

A candidate element that fails the tree lookup and is neither a duplicate nor a derivative requires 1 more IO to store the element as a new Prime Data Element in the Sieve, and another IO to update the metadata in the tree. Thus, ingestion of a candidate element that fails the tree lookup will require 2 IOs after the tree lookup, leading to a total of 3 IOs. However, for candidate elements where the tree lookup process terminates without needing a storage IO, a total of only 2 IOs is needed for ingesting such candidate elements.

A candidate element that is a derivative (but not a duplicate) will first need 1 IO to fetch the Prime Data Element needed to compute the derivation. Since it is expected that most often derivations will be off a single Prime Data Element (rather than multiple), only a single IO will be needed to fetch the Prime Data Element. Subsequent to successful completion of the derivation, 1 more IO will be needed to store the Reconstitution Program and the derivation details in the entry created for the element in storage, and another IO to update the metadata in the tree (such as counts, etc.) to reflect the new derivative. Hence, ingestion of a candidate element that becomes a derivative requires 3 additional IOs after the first tree lookup for a total of 4 IOs.

In summary, to ingest a candidate element and apply the Data Distillation™ method to it (while exploiting redundancy globally across a very large dataset) requires approximately 3 to 4 IOs. Compared to what is needed by traditional data deduplication techniques, this is typically just one more IO per candidate element, in return for which redundancy can be exploited globally across the dataset at a grain that is finer than the element itself.

A storage system that offers 250,000 random IO accesses/sec (which means bandwidth of 1 GB/sec of random accesses to pages of 4 KB) could ingest and perform the Data Distillation™ method on about 62,500 input chunks per second (250,000 divided by 4 IOs per input chunk of average size 4 KB each). This enables an ingest rate of 250 MB/sec while using up all the bandwidth of the storage system. If only half of the bandwidth of the storage system is used (so that the other half is available for accesses to the stored data), such a Data Distillation™ system could still deliver ingest rates of 125 MB/sec. Thus, given sufficient processing power, Data Distillation™ systems are able to exploit redundancy globally across the dataset (at a grain that is finer than the element itself) with an economy of IOs and deliver data reduction at ingest rates in the hundreds of megabytes per second on contemporary storage systems.

Thus, as confirmed by the test results, embodiments described herein achieve the complex task of searching for elements (from which an input element can be derived with minimal storage needed to specify the derivation) from a massive store of data with an economy of IO accesses and with minimal incremental storage needed for the apparatus. This framework thus constructed makes it feasible to find elements suitable for derivation using a smaller percentage of the total bytes of the element, leaving the bulk of the bytes available for perturbation and derivation. An important insight that explains why this scheme works effectively for much data is that the tree provides a wieldy, fine-grained structure that allows one to locate the differentiating and distinguishing bytes that identify elements in the Sieve, and although these bytes are each at different depths and positions in the data, they can be isolated and stored efficiently in the tree structure.

FIGS. 5A-5C illustrate an actual example of how data can be organized using embodiments described herein. FIG. 5A illustrates 512 bytes of input data, and the result of factorization (e.g., the result of performing operation 202 in FIG. 2). In this example fingerprinting is applied to determine breaks in the data, so that consecutive breaks identify candidate elements. Alternating candidate elements have been shown using bold and regular font. For example, the first candidate element is "b8ac83d9dc7caf18f2f2e3f783a0ec69774bb50bbe1d3ef1e f8a82436ec43283 bc1c0f6a82e19c224b22f9b2," and the next candidate element is "ac83d9619ae5571ad2bbcc15d3e493eef62054b0 5b2dbccce933483a6d3daab3cb19567dedbe33e952a966c49 f3297191cf22aa3 1b98b9dcd0fb54a7f761415e," and so forth. The input in FIG. 5A is factorized into 12 variable-sized candidate elements as shown. The leading bytes of each chunk are used to order and organize elements in the Sieve. FIG. 5B illustrates how the 12 candidate elements shown in FIG. 5A can be organized as Prime Data Elements in the Sieve in tree form using their Names, and using a tree structure described in FIG. 3B. Each element has a distinct Name, constructed from the entire content of the element. In this example, since fingerprinting is applied to determine the breaks between the 12 candidate elements, the leading bytes of each candidate element will already be aligned to an anchor fingerprint; hence, the leading bytes of each Name will already have been constructed from a first dimension of content anchored at this fingerprint. The leading bytes of the Name organize the various elements. For example, if the first byte in the Name of the element is equal to "0x22" then the top link is taken to select Prime Data Element #1. Note that various links in FIG. 5B are differentiated using a varying number of bytes as explained in reference to the tree data structure illustrated in FIG. 3B.

FIG. 5C illustrates how the 12 candidate elements shown in FIG. 5A can be organized using a tree data structure described in reference to FIG. 3D. Fingerprinting is further applied to the content of each element to identify a secondary fingerprint within the content of the element. Bytes of content extracted from the location of the first fingerprint (already existing at the boundary of each element) and second fingerprint are concatenated to form the leading bytes of the Name, which are used to organize the elements. In other words, the element Name is constructed as follows: bytes of data from two dimensions or fields (located by an anchor fingerprint and a secondary fingerprint respectively) are concatenated to form the leading bytes of the Name, followed by the rest of the bytes. As a consequence of this choice of construction of the Name, a different sequence of bytes leads to the various Prime Data Elements in FIG. 5C (vs. FIG. 5B). For example, to reach Prime Data Element #4, the tree navigation process first takes the link corresponding to "46093f9d" which are the leading bytes of the field at the first dimension (i.e., the first fingerprint), and then takes the link corresponding to "c4" which is the leading byte of the field located at the second dimension (i.e., the second fingerprint).

Figure 6A:
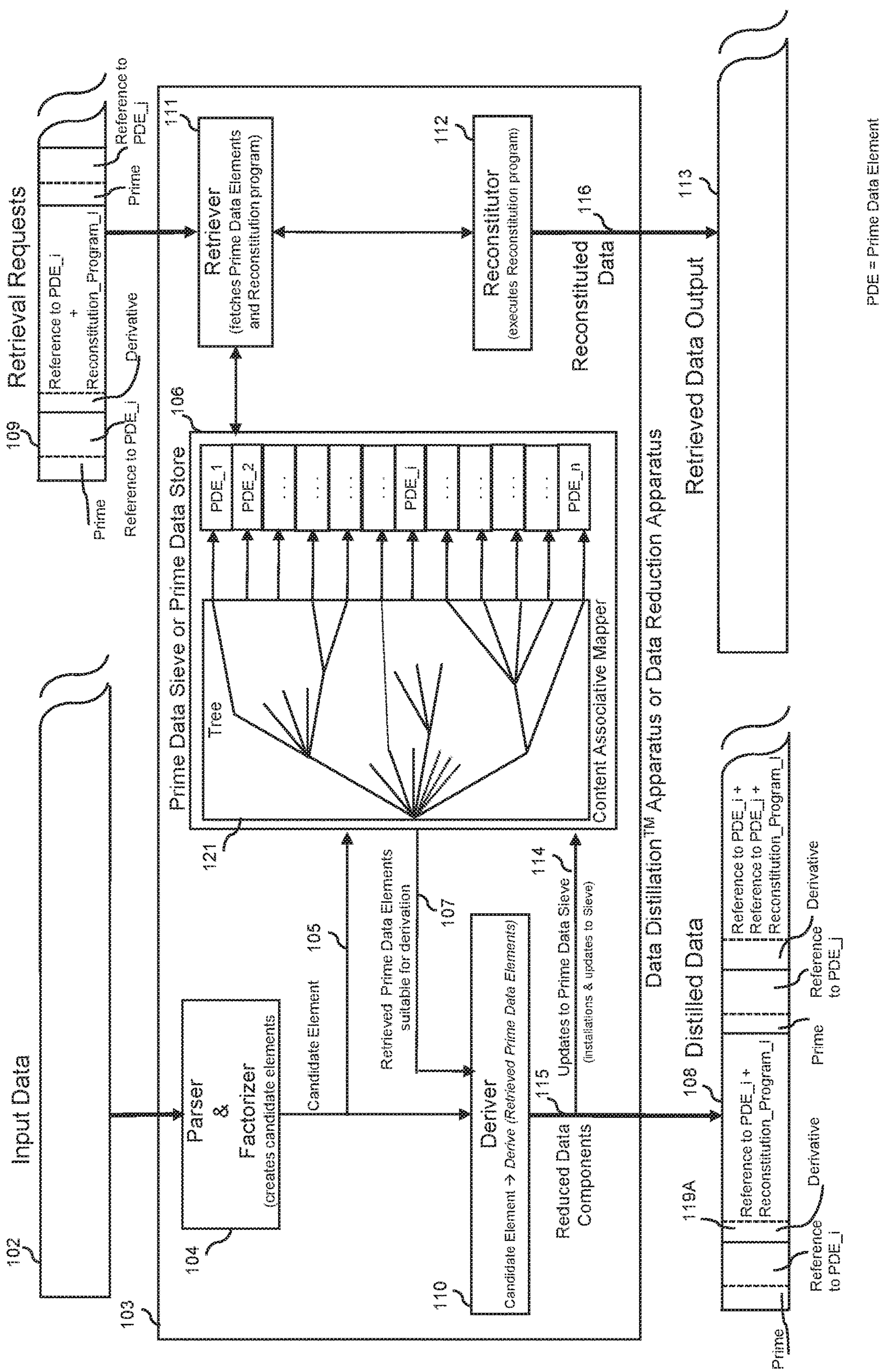
FIGS. 6A-6C show how tree data structures can be used for content-associative mappers described in reference to FIGS. 1A-1C, respectively, in accordance with some embodiments described herein.
Figure 6B:
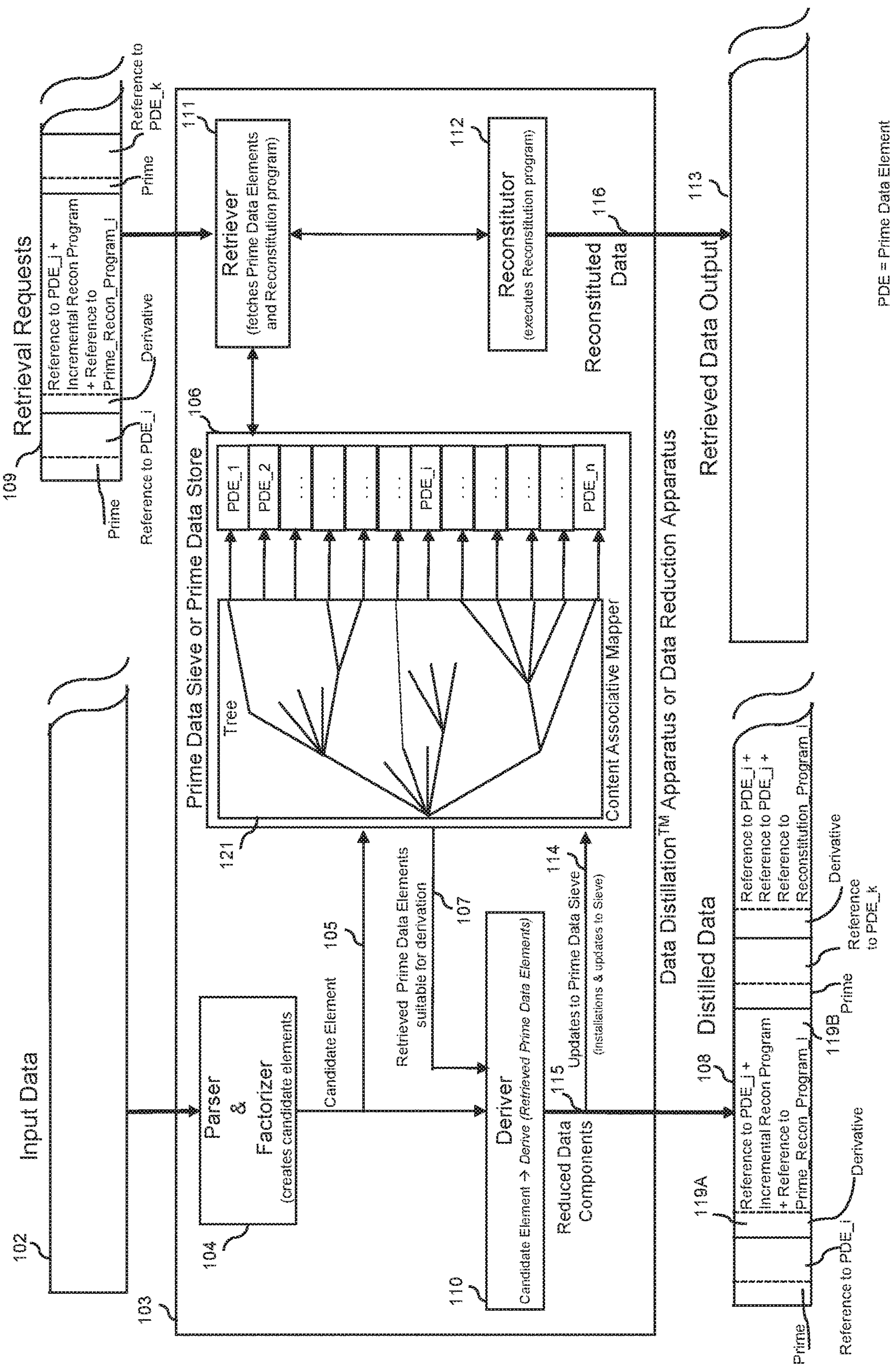
Figure 6C:
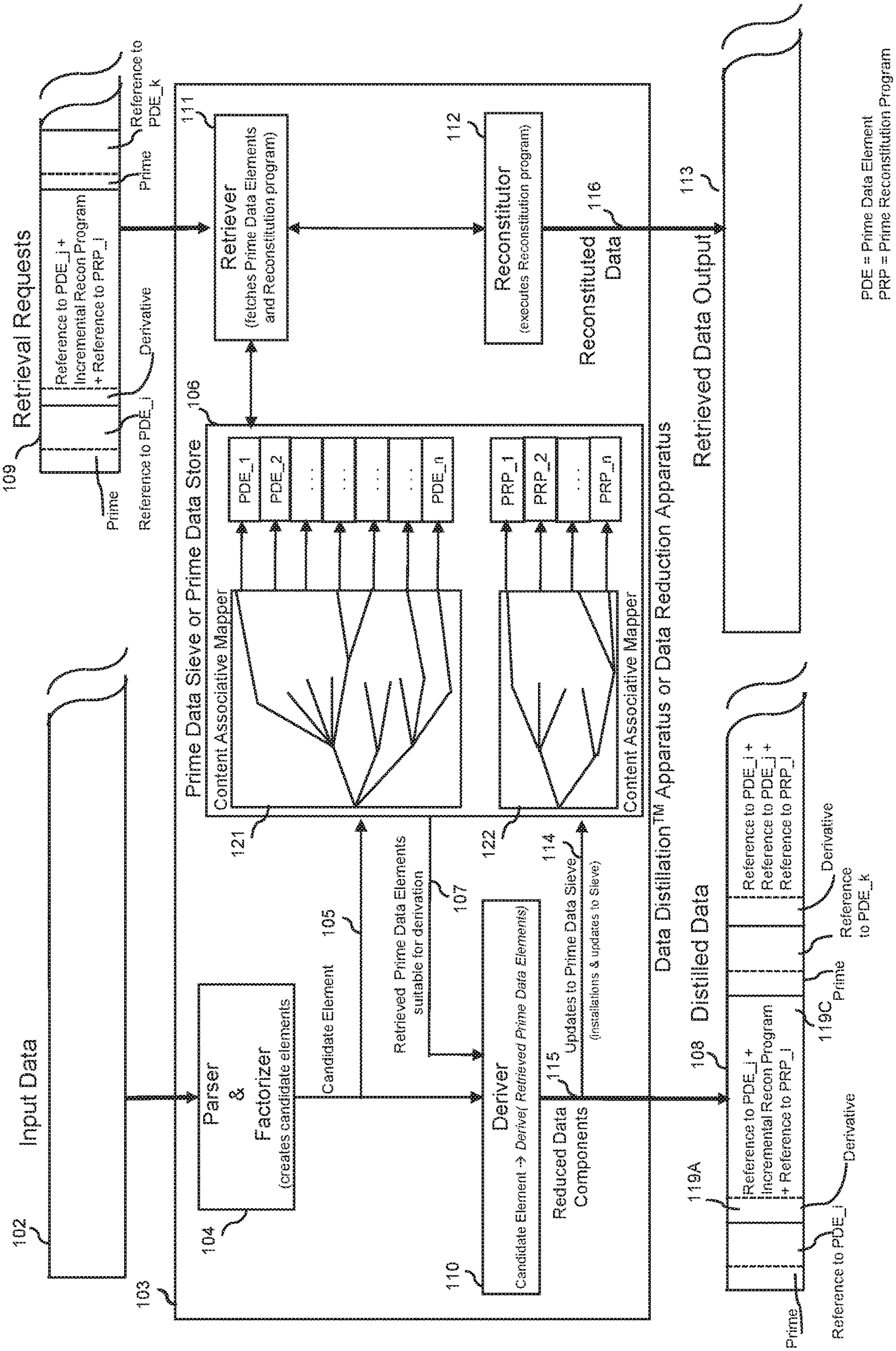

FIGS. 6A-6C show how tree data structures can be used for content-associative mappers 121 and 122 described in reference to FIGS. 1A-1C, respectively, in accordance with some embodiments described herein.

Once the difficult problem of finding suitable Prime Data Elements (from which to attempt to derive the candidate element) has been solved, the problem is narrowed down to examining one or a small subset of Prime Data Elements and optimally deriving the candidate element from them with minimum storage needed to specify the derivation. Other objectives include keeping the number of accesses to the storage system to a minimum, and keeping the derivation time and the reconstitution time acceptable.

The Deriver must express the candidate element as the result of transformations performed on the one or more Prime Data Elements, and must specify these transformations as a Reconstitution Program which will be used to regenerate the derivative upon data retrieval. Each derivation may require its own unique program to be constructed. The function of the Deriver is to identify these transformations and create the Reconstitution Program with the smallest footprint. A variety of transformations could be employed, including arithmetic, algebraic, or logical operations performed upon the one or more Prime Data Elements or upon specific fields of each Element. Additionally, one could use byte manipulation transformations, such as the concatenation, insertion, replacement, and deletion of bytes in the one or more Prime Data Elements.

FIG. 7A provides an example of the transformations that could be specified in the Reconstitution Program in accordance with some embodiments described herein. The vocabulary of transformations specified in this example includes arithmetic operations on fields of specified length in the element, as well as insertions, deletions, appends, and replacements of a declared length of bytes at specified offsets in the Prime Data Element. A variety of techniques and operations could be employed by the Deriver to detect the similarities and the differences between the candidate element and the one or more Prime Data Elements, and to construct the Reconstitution Program. The Deriver could exploit the vocabulary available in the underlying hardware to perform its function. The end result of the work is to specify the transformations in the vocabulary specified for the Reconstitution Program, and to do so using a minimal amount of incremental storage and in a manner that also enables fast data retrieval.

The Deriver could avail of the processing power of the underlying machine and work within the processing budget allocated to it to provide the best analysis possible within the cost-performance constraints of the system. Given that microprocessor cores are more readily available, and given that IO accesses to storage are expensive, the Data Distillation™ solution has been designed to take advantage of the processing power of contemporary microprocessors to efficiently perform local analysis and derivation of the content of the candidate element off a few Prime Data Elements. It is expected that the performance of the Data Distillation™ solution (on very large data) will be rate-limited not by the computational processing but by the IO bandwidth of a typical storage system. For example, it is expected that a couple of microprocessor cores will suffice to perform the required computation and analysis to support ingest rates of several hundred megabytes per second on a typical flash-based storage system supporting 250,000 IOs/sec. Note that two such microprocessor cores from a contemporary microprocessor such as the Intel Xeon Processor E5-2687W (10 cores, 3.1 GHz, 25 MB cache) is a fraction (two of ten) of the total computational power available from the processor.

Figure 7B:
FIG. 7B shows examples of the results of Candidate Elements being derived from Prime Data Elements in accordance with some embodiments described herein.

FIG. 7B shows examples of the results of candidate elements being derived from Prime Data Elements in accordance with some embodiments described herein. Specifically, the data pattern "Elem" is the Prime Data Element that is stored in the Prime Data Sieve, and the data pattern "Cand" is the candidate element that is to be derived from the Prime Data Element. The 18 common bytes between "Cand" and "Elem" have been highlighted. Reconstitution program 702 specifies how data pattern "Cand" can be derived from data pattern "Elem." As shown in FIG. 7B, Reconstitution program 702 illustrates how to derive "Cand" from "Elem" by using 1 byte Replace, 6 bytes Insert, 3 bytes Delete, 7 bytes bulk Replace. Cost to specify the derivative is 20 bytes+3 byte reference=23 bytes, which is 65.71% of the original size. Note that the Reconstitution Program 702 shown is a human-readable representation of the program and may not be how the program is actually stored by embodiments described herein. Likewise other Reconstitution Programs based on arithmetic operations such as multiplication and addition have also been shown in FIG. 7B. For example, if "Elem" is bc1c0f6a790c82e19c224b22f900ac83d9619ae5571ad2bbe c152054ffffff83 and "Cand" is bc1c0f6a790c82e19c224b22f91c4da1aa0369a0461ad2bbec 152054ffffff83, then the 8-byte difference can be derived as shown using multiply (00ac83d9619ae557)*2a=[00]1c4da1aa0369a046. The cost to specify the derivative: 4 bytes+3 byte reference=7 bytes, which is 20.00% of the original size. Alternatively, if "Elem" is bc1c0f6a790c82e19c224b22f9b2ac83ffffffffffffffffffffffffffff b283, and "Cand" is bc1c0f6a790c82e19c224b22f9b2ac830000000000000000 000000000002426, then the 16-byte difference can be derived as shown using addition, e.g., by adding 0x71a3 to the 16-byte region starting at offset 16, and discarding the carry. The cost to specify the derivative is 5 bytes+3 byte reference=8 bytes, which is 22.85% of the original size. Note that the sample encodings in FIG. 7A have been chosen for illustration purposes only. The examples in FIG. 7B have data sizes of 32 bytes, and so 5 bits suffice for the length and offset fields within the element. For large elements (e.g., a 4 KB element), the sizes of these fields would need be increased to 12 bits. Likewise, the sample encoding accommodates a reference size of 3 bytes or 24 bits. This should allow 16 million Prime Data Elements to be referenced. If the reference needs to be able to address any location in, say, 256 TB of data, the reference would need to be 6 bytes in size. When such a dataset is factorized into 4 KB elements, the 6 bytes needed to specify the reference will be a small fraction of the size of the 4 KB element.

The size of the information needed to specify the Derivative element (that is derived from the one or more Prime Data Elements) is the sum of the size of the Reconstitution Program and the size of the references needed to specify the required (one or more) Prime Data Elements. The size of the information needed to specify a candidate element as a Derivative element is referred to as the Distance of the candidate from the Prime Data Element. When the candidate can be feasibly derived from any one set of multiple sets of Prime Data Elements, the set of Prime Data Elements with the shortest Distance is chosen as the target.

When the candidate element needs to be derived from more than one Prime Data Element (by assembling extracts derived from each of these), the Deriver needs to factor in the cost of the additional accesses to the storage system and weigh that against the benefit of a smaller Reconstitution Program and a smaller Distance. Once an optimal Reconstitution Program has been created for a candidate, its Distance is compared with the Distance Threshold; if it does not exceed the threshold, the derivation is accepted. Once a derivation is accepted, the candidate element is reformulated as a Derivative Element and replaced by the combination of the Prime Data Element and the Reconstitution Program. The entry in the distilled data created for the candidate element is replaced by the Reconstitution Program plus the one or more references to the relevant Prime Data Elements. If the Distance for the best derivation exceeds the Distance Threshold, the derivative will not be accepted.

In order to yield data reduction, the Distance Threshold must always be less than the size of the candidate element. For example, the Distance Threshold may be set to 50% of the size of the candidate element, so that a derivative will only be accepted if its footprint is less than or equal to half the footprint of the candidate element, thereby ensuring a reduction of 2× or greater for each candidate element for which a suitable derivation exists. The Distance Threshold can be a predetermined percentage or fraction, either based on user-specified input or chosen by the system. The Distance Threshold may be determined by the system based on static or dynamic parameters of the system.

FIGS. 8A-8E illustrate how data reduction can be performed by factorizing input data into fixed-sized elements and organizing the elements in a tree data structure that was described in reference to FIGS. 3D and 3E in accordance with some embodiments described herein. FIG. 8A shows how the input data can be simply factorized into 32-byte chunks. Specifically, FIG. 8A shows the first 10 chunks, and then few more chunks which appear say 42 million chunks later. FIG. 8B shows the organization of the Prime Data Elements in the Sieve using Names constructed such that the leading bytes of the Name are comprised of content from 3 dimensions in the content of the element (corresponding to locations of an anchor fingerprint, a secondary fingerprint, and a tertiary fingerprint). Specifically, in FIG. 8B, each 32 byte chunk becomes a candidate element of 32 bytes (Fixed-Sized Blocks). A method of fingerprinting is applied to the content of the element. Each element has a Name, which is constructed as follows: bytes of data from three dimensions or fields (located by an anchor fingerprint, a secondary fingerprint, and a tertiary fingerprint respectively) of the element are concatenated to form the leading bytes of the Name, followed by the rest of the bytes of the element. The Name is used to organize elements in the Sieve. As shown in FIG. 8B, the first 10 chunks contain no duplicates or derivatives, and are successively installed as elements in the Sieve. FIG. 8B shows the Sieve after the $10^{th}$ chunk is consumed. FIG. 8C shows the contents of the Sieve at a subsequent point in time after consuming an additional several million elements of data input, e.g., after the next 42 million chunks are presented. The Sieve is examined for duplicates or derivatives. Chunks that cannot be derived from elements get installed in the Sieve. FIG. 8C shows the Sieve after the 42 million chunks are consumed, containing say 16,000,010 elements (logically addressable with 3 bytes of reference address), with the remaining 26,000,000 chunks becoming derivatives. FIG. 8D shows an example of fresh input that is subsequently presented to the Sieve and identified as a duplicate of an entry (shown as element number 24,789) in the Sieve. In this example, the Sieve identifies element 24,789 (chunk 9) as the most suitable element for chunk 42,000,011. The derive function determines that the new chunk is an exact duplicate and replaces it with a reference to element 24,789. The cost to represent the derivative is 3 byte reference vs 35B original, which is 8.57% of the original size. FIG. 8D shows a second example of an input (Chunk 42,000,012) that is converted into a derivative of an entry (shown as element number 187,126) in the Sieve. In this example, the Sieve determines that there are no exact matches. It identifies elements 187,125 and 187,126 (chunks 8 & 1) as the most suitable elements. The new element is derived from the most suitable element. Derivation vs element 187,125 and derivation vs element 187,126 are illustrated in FIG. 8D. The cost to represent the derivative vs element 187,125 is 39 bytes+3 byte reference=42 bytes, which is 120.00% of the original size. The cost to represent the derivative vs element 187,126 is 12 bytes+3 byte reference=15 bytes, which is 42.85% of the original size. The best derivation (vs element 187,126) is chosen. The reconstitution size is compared to a threshold. For example if the threshold is 50%, this derivative (42.85%) is accepted. FIG. 8E provides two additional examples of data chunks that are derived from Prime Data Elements, including one example where the derivative is actually created by deriving from two Prime Data Elements. In the first example, chunk 42,000,013 is presented. The Sieve identifies element 9,299,998 (chunk 10) as the most suitable element. Derivation vs element 9,299,998 is shown in FIG. 8E. The cost to represent the derivative is 4 bytes+3 byte reference=7 bytes, which is 20.00% of the original size. The reconstitution size is compared to a threshold. For example if the threshold is 50%, this derivative (20.00%) is accepted. In the second example, chunk 42,000,014 is presented. In this example, chunk 42,000,014 is such that one half of the chunk can be best derived from element 9,299,997 while the other half of the chunk can be best derived from element 9,299,998. Hence, a multi-element derivative is created to yield further data reduction. The multi-element derivation is shown in FIG. 8E. Cost to represent this multi-element derivative is 3 byte reference+3 bytes+3 byte reference=9 bytes, which is 25.71% of the original size. The reconstitution size is compared to a threshold, e.g., if threshold is 50%, this derivative (25.71%) is accepted. Note that the best outcome from a single element derivative would have been 45.71%.

FIGS. 8A-E illustrate an important advantage of the Data Distillation™ system: that it can be effective in performing data reduction while consuming and producing fixed-sized blocks. Note that fixed-sized blocks are highly desired in a high-performance storage system. Using the Data Distillation™ apparatus, a large incoming input file comprised of numerous blocks of fixed size can be factorized into numerous elements of fixed size, so that all the Prime Data Elements are of fixed size. The potentially variable-sized Reconstitution Programs for each derivative element can be packed together and kept in-line in the Distilled Data file, which can subsequently be chunked into fixed-sized blocks. Thus, for all practical purposes, powerful data reduction can be performed while consuming and producing fixed-sized blocks in the storage system.

FIGS. 9A-C illustrate an example of the Data Distillation™ scheme that was first shown in FIG. 1C: this scheme employs a separate Prime Reconstitution Program Sieve that can be accessed in a content-associative manner. Such a structure enables the detection of a derivative that constructs a Reconstitution Program that is already present in the Prime Reconstitution Program Sieve. Such a derivative can be reformulated to reference the existing Reconstitution Program. This enables the detection of redundancy among Reconstitution Programs. In FIG. 9A, input data is ingested. A method of fingerprinting is applied to the data, and chunk boundaries are set at the fingerprint positions. The input is factorized into 8 candidate elements as shown (alternating chunks shown in bold and regular font in FIG. 9A). In FIG. 9B, the 8 candidate elements are shown as organized in the Sieve. Each element has a distinct Name, constructed from the entire content of the element. In this example, the element Name is constructed as follows: bytes of data from two dimensions or fields (located by an anchor fingerprint and a secondary fingerprint, respectively) are concatenated to form the leading bytes of the Name, followed by the rest of the bytes. The Name is used to order elements in the Sieve, and also provide content-associative access to it through a tree structure. FIG. 9B also shows a second content-associative structure that contains Prime Reconstitution Programs. FIG. 9C illustrates duplicate reconstitutions. Suppose a 55-byte candidate element (shown in FIG. 9C) that is not a duplicate of any Prime Data Element arrives. Element 3 is selected as the most suitable element—the first 2 dimensions are the same for PDEs 2 and 3, but the rest of the bytes starting with 88a7 match Element 3. The new input is derived from Element 3 with a 12-byte Reconstitution Program (RP). Encodings are as shown in FIG. 7A. Note that, for this example, max element size is 64 bits and all offsets and lengths are encoded as 6-bit values, as opposed to the 5-bit lengths and offsets shown in FIG. 7A. The Prime Reconstitution Program Sieve is searched and this new RP is not found. This RP is inserted into the Prime Reconstitution Program Sieve, ordered based on its value. The new element is reformulated as a reference to Prime Data Element 3 and a reference to the newly created Prime Reconstitution Program at reference 4 in the Prime Reconstitution Program Sieve. The total storage size for this derived element is: 3-byte PDE reference, 3-byte RP reference, 12-byte RP=18 bytes, which is 31.0% of the size vs. storing it as a PDE. Later, suppose a copy of the 55-byte candidate element arrives. As before, a 12-byte RP is created based on Element 3. The Prime Reconstitution Program Sieve is searched and the RP with Prime RP ID=3, RP reference=4, is found. This candidate element is represented in the system as a reference to Prime Data Element 3 and a reference to Reconstitution Program 4. The total storage size added for this derived element is now: 3-byte PDE reference, 3-byte RP reference=6 bytes, which is 10.3% of the size vs. storing it as a PDE.

Figure 10C:
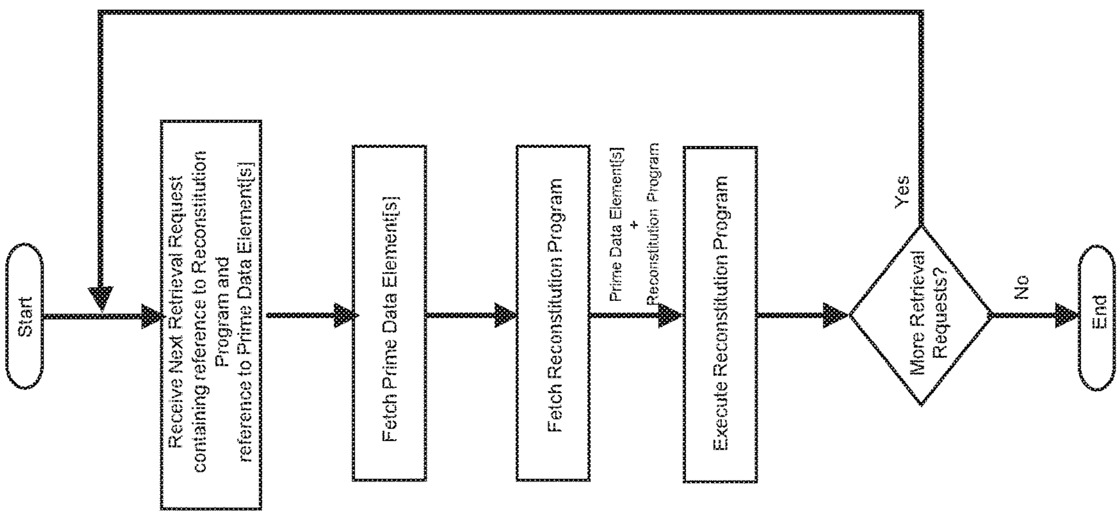
FIGS. 10B-10C illustrate data retrieval processes in accordance with some embodiments described herein.
Figure 10B:
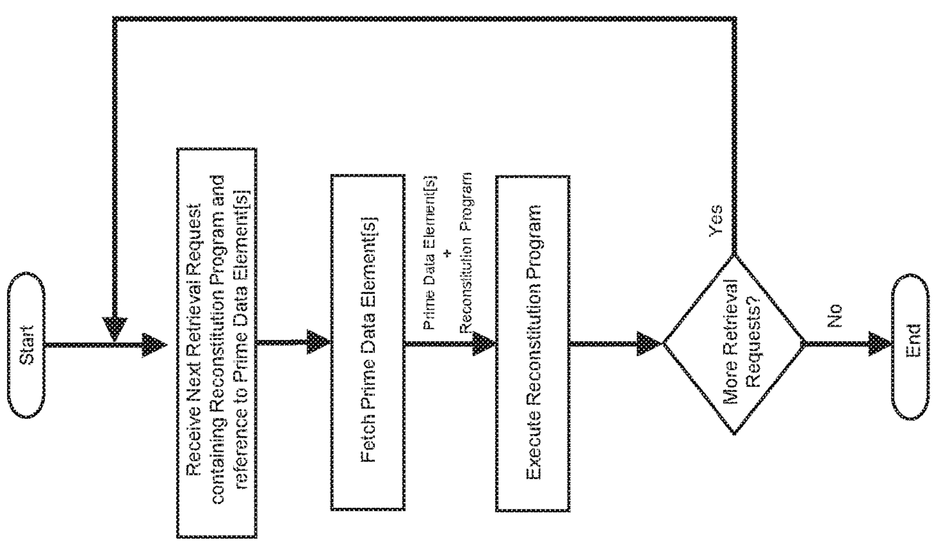

FIG. 10A provides an example of how transformations specified in the Reconstitution Program are applied to a Prime Data Element to yield a Derivative Element in accordance with some embodiments described herein. The example shows a Derivative Element specified to be generated from Prime Data Element numbered 187,126 (this Prime Data Element is also shown in the Sieve in FIG. 8C) by applying to it four transformations (an insertion, replacement, deletion, and append) as specified by the Reconstitution Program shown. As shown in FIG. 10A, element 187,126 is loaded from the Sieve, and the Reconstitution Program is executed to derive chunk 42,000,012 from element 187,126. FIGS. 10B-10C illustrate data retrieval processes in accordance with some embodiments described herein. Each data retrieval request essentially takes the form of an Element in the Distilled Data, presented to the retrieval engine in the losslessly reduced format. The losslessly reduced format for each Element contains references to the associated Prime Data Element(s) and the Reconstitution Program. The Retriever of the Data Distillation™ apparatus fetches the Prime Data Elements and Reconstitution Program and furnishes these to the Reconstitutor for reconstitution. After the relevant Prime Data Elements and Reconstitution Program for an Element of the Distilled Data have been fetched, the Reconstitutor executes the Reconstitution Program to generate the Element in its original unreduced form. The effort required by the data retrieval process to execute the reconstitution is linear with respect to the size of the Reconstitution Program and the size of the Prime Data Elements. Hence, high data retrieval rates can be achieved by the system.

It is evident that to reconstitute an Element from the losslessly reduced form in the Distilled Data to its original unreduced form, only the Prime Data Element(s) and Reconstitution Program specified for the Element need to be fetched. Thus, to reconstitute a given Element, no other Elements need to be accessed or reconstituted. This makes the Data Distillation™ apparatus efficient even when servicing a random sequence of requests for reconstitution and retrieval. Note that traditional methods of compression such as the Lempel Ziv method need to fetch and decompress the entire window of data containing a desired block. For example, if a storage system employs the Lempel-Ziv method to compress 4 KB blocks of data using a window of 32 KB, then to fetch and decompress a given 4 KB block, the entire window of 32 KB needs to be fetched and decompressed. This imposes a performance penalty because more bandwidth is consumed and more data needs to be decompressed in order to deliver the desired data. The Data Distillation™ apparatus does not incur such a penalty.

Figures 11A, 11B, 11C, 11D, 11E, 11F:
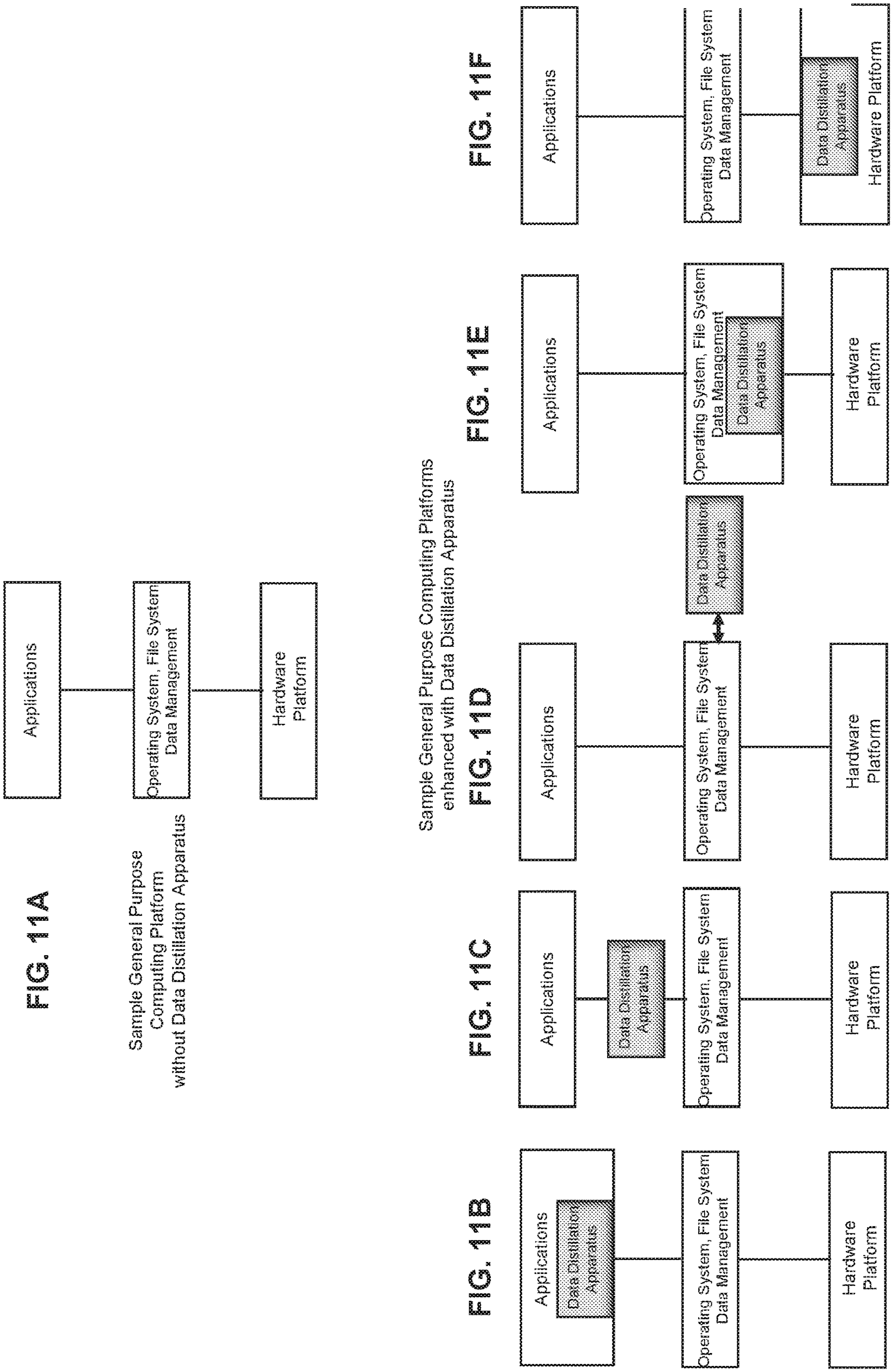
FIG. 11A-11G illustrate systems that include a Data Distillation™ mechanism (which can be implemented using software, hardware, or a combination thereof) in accordance with some embodiments described herein.

The Data Distillation™ apparatus can be integrated into computer systems in a variety of ways to organize and store data in a manner that efficiently uncovers and exploits redundancy globally across the entire data in the system. FIGS. 11A-11G illustrate systems that include a Data Distillation™ mechanism (which can be implemented using software, hardware, or a combination thereof) in accordance with some embodiments described herein. FIG. 11A presents a general purpose computing platform with software applications running on system software executing on a hardware platform comprised of processors, memory and data storage components. FIG. 11B shows the Data Distillation™ apparatus integrated into the application layer of the platform, with each specific application using the apparatus to exploit redundancy within the dataset for that application. FIG. 11C shows the Data Distillation™ apparatus employed to provide a data virtualization layer or service for all applications running above it. FIGS. 11D and 11E show two different forms of integration of the Data Distillation™ apparatus with the operating system, file system and data management services of the sample computing platform. Other methods of integration include (but are not limited to) integration with an embedded computing stack in the hardware platform such as that employed in a flash-based data storage subsystem as shown in FIG. 11F.

Figure 11G:
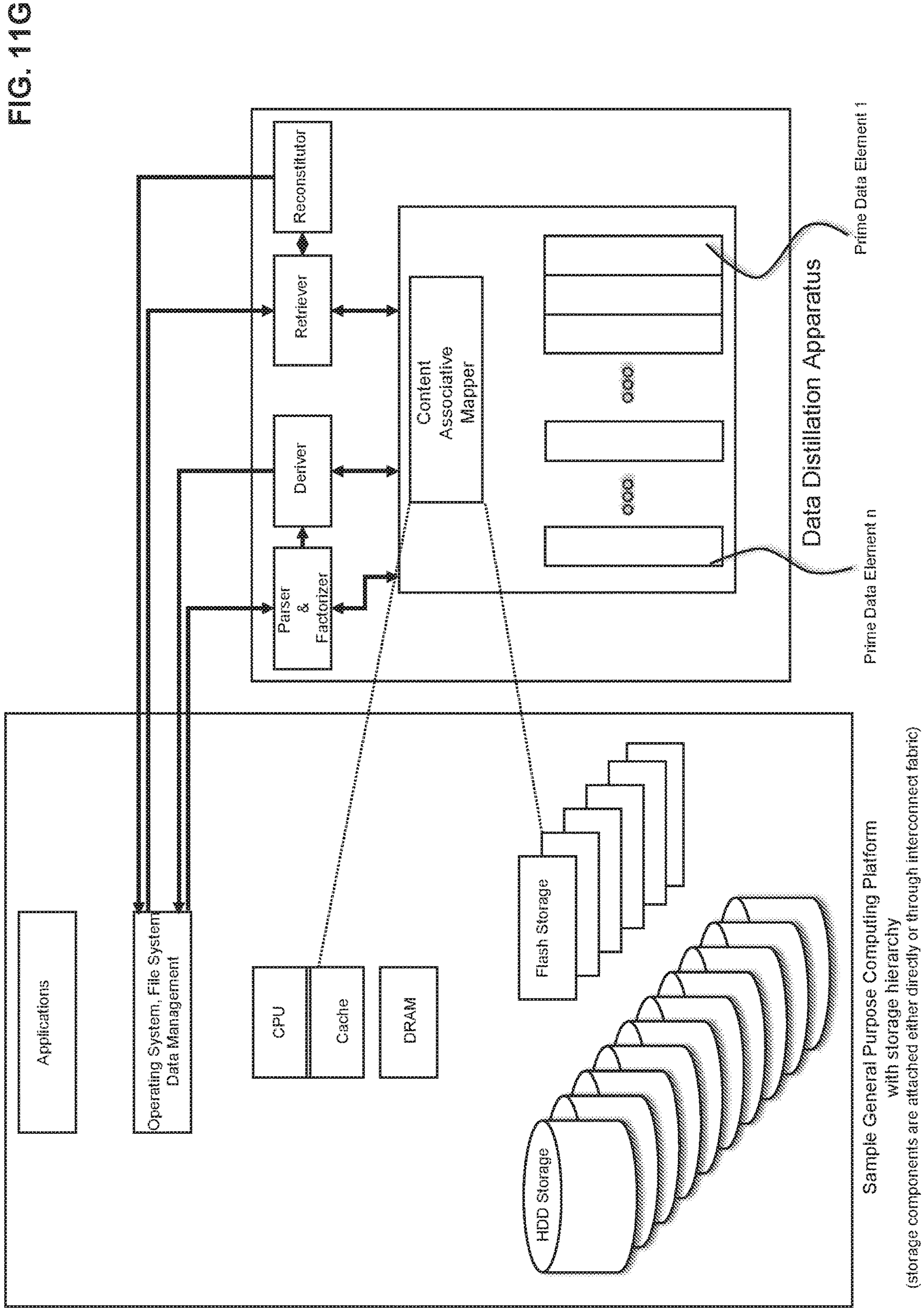

FIG. 11G presents additional details of the integration of the Data Distillation™ apparatus with the sample computing platform shown in FIG. 11D. FIG. 11G shows the components of the Data Distillation™ apparatus, with the Parser & Factorizer, Deriver, Retriever, and Reconstitutor executing as software on the general purpose processor, and the content-associative mapping structure residing across a few levels of the storage hierarchy. The Prime Data Sieve can reside in the storage media (such as flash-based storage drives).

Figure 11H:
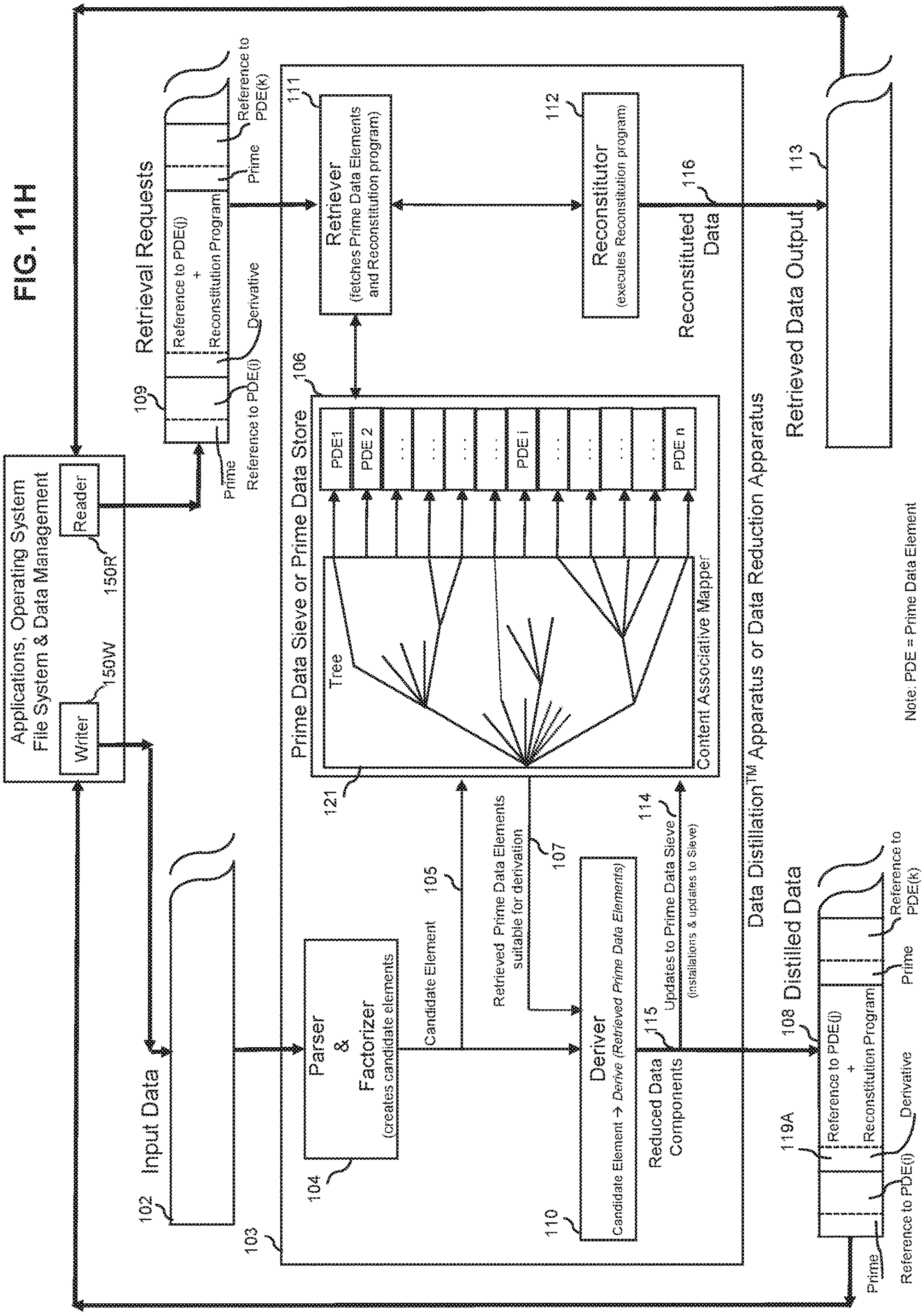
FIG. 11H shows how the Data Distillation™ apparatus may interface with a sample general purpose computing platform in accordance with some embodiments described herein.

FIG. 11H shows how the Data Distillation™ apparatus may interface with the sample general purpose computing platform.

A file system (or filesystem) associates a file (e.g., a text document, a spreadsheet, an executable, a multimedia file, etc.) with an identifier (e.g., a filename, a file handle, etc.), and enables operations (e.g., read, write, insert, append, delete, etc.) to be performed on the file by using the identifier associated with the file. The namespace implemented by a file system can be flat or hierarchical. Additionally, the namespace can be layered, e.g., a top-layer identifier may be resolved into one or more identifiers at successively lower layers until the top-layer identifier is completely resolved. In this manner, a file system provides an abstraction of the physical data storage device(s) and/or storage media (e.g., computer memories, flash drives, disk drives, network storage devices, CD-ROMs, DVDs, etc.) that physically store the contents of the file.

The physical storage devices and/or storage media that are used for storing information in a file system may use one or multiple storage technologies, and can be located at the same network location or can be distributed across different network locations. Given an identifier associated with a file and one or more operation(s) that are requested to be performed on the file, a file system can (1) identify one or more physical storage devices and/or storage media, and (2) cause the physical storage devices and/or storage media that were identified by the file system to effectuate the operation that was requested to be performed on the file associated with the identifier.

Whenever a read or a write operation is performed in the system, different software and/or hardware components may be involved. The term “Reader” can refer to a collection of software and/or hardware components in a system that are involved when a given read operation is performed in the system, and the term “Writer” can refer to a collection of software and/or hardware components in a system that are involved when a given write operation is performed in the system. Some embodiments of the methods and apparatuses for data reduction described herein can be utilized by or incorporated into one or more software and/or hardware components of a system that are involved when a given read or write operation is performed. Different Readers and Writers may utilize or incorporate different data reduction implementations. However, each Writer that utilizes or incorporates a particular data reduction implementation will correspond to a Reader that also utilizes or incorporates the same data reduction implementation. Note that some read and write operations that are performed in the system may not utilize or incorporate the data reduction apparatus. For example, when Data Distillation™ Apparatus or Data Reduction Apparatus 103 retrieves Prime Data Elements or adds new Prime Data Elements to the Prime Data Store, it can perform the read and write operations directly without data reduction.

Specifically, in FIG. 11H, Writer 150W can generally refer to a software and/or hardware component of a system that is involved when a given write operation is performed, and Reader 150R can generally refer to a software and/or hardware component of a system that is involved when a given read operation is performed. As shown in FIG. 11H, Writer 150W provides input data to the Data Distillation™ Apparatus or Data Reduction Apparatus 103, and receives Distilled Data 108 from Data Distillation™ Apparatus or Data Reduction Apparatus 103. Reader 150R provides retrieval requests 109 to Data Distillation™ Apparatus or Data Reduction Apparatus 103, and receives Retrieved Data Output 113 from Data Distillation™ Apparatus or Data Reduction Apparatus 103.

Implementation examples for FIG. 11H include, but are not limited to, incorporating or utilizing the Data Distillation™ Apparatus or Data Reduction Apparatus 103 in an application, operating system kernel, file system, data management module, device driver, or firmware of a flash or disk drive. This spans the variety of configurations and usages described in FIGS. 11B-F.

FIG. 11I illustrates how the Data Distillation™ apparatus may be used for data reduction in a block processing storage system. In such a block processing system, data is stored in blocks, and each block is identified by a Logical Block Address or LBA. Blocks are continuously being modified and overwritten so that fresh data may be overwritten into a block identified by a particular LBA. Each block in the system is treated as a candidate element and the Data Distillation™ apparatus may be used to reduce the Candidate Element into the losslessly reduced form comprising of a reference to a Prime Data Element (stored in a particular Prime Data Element Block) and in the case of a Derivative Element a reference to a Reconstitution program (stored in a particular Reconstitution Program Block). FIG. 11I introduces a data structure 1151 that maps the content of the block identified by an LBA to a corresponding Element in losslessly reduced form. Against each LBA will reside the specification of the associated Element. For a system employing fixed sized blocks, it is convenient to have the incoming blocks, the Prime Data Element Blocks 1152, and also Reconstitution Program Blocks 1153 to all be of fixed size. In this system, each Prime Data Element may be stored as an individual block. Multiple Reconstitution Programs may be packed into a Reconstitution Program Block which is also of the same fixed size. The data structure also contains a reference to the Count field and associated metadata residing at the Leaf Node Data structure for each of the Prime Data Elements and the Reconstitution Programs, so that when the block is overwritten with fresh data, the previous data residing at the LBA can be effectively managed—the count field for the existing Prime Data Element and Reconstitution Program (that is being overwritten) has to be decremented, and likewise the Count for a Prime Data Element that is referenced by incoming data into the LBA has to be incremented. By maintaining the reference to the Count field in this data structure 1151, overwrites can be speedily managed, thus enabling a high performance block processing storage system that takes full advantage of the data reduction offered by the Data Distillation™ apparatus.

Figure 12A:
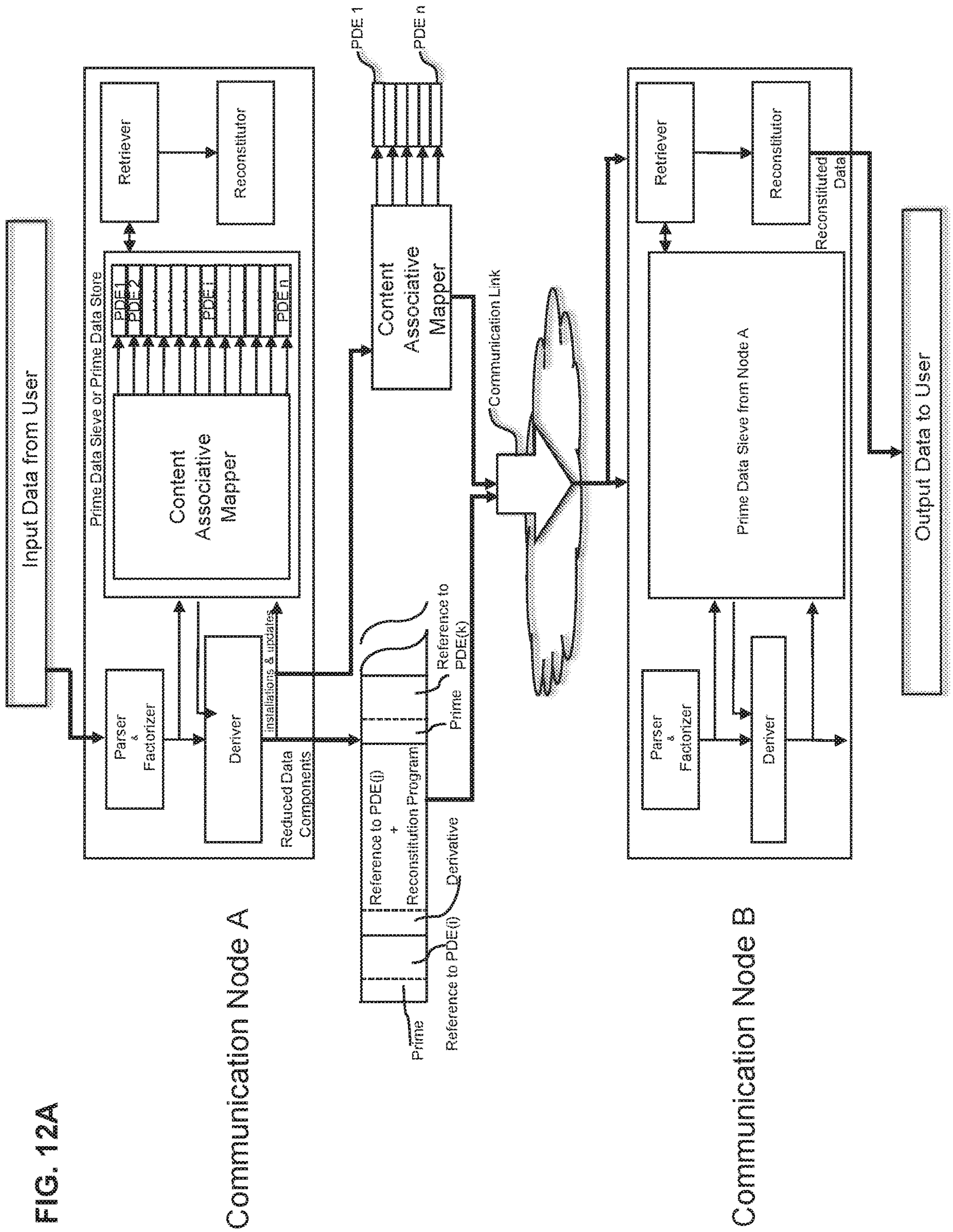
FIGS. 12A-12B show the use of the Data Distillation™ apparatus for the communication of data across a bandwidth constrained communication medium in accordance with some embodiments described herein.

FIG. 12A shows the use of the Data Distillation™ apparatus for the communication of data across a bandwidth-constrained communication medium in accordance with some embodiments described herein. In the setup shown, Communication Node A creates a set of files to be sent over to Communication Node B. Node A employs the Data Distillation™ apparatus to transform the input files into distilled data or Distilled Files, containing references to Prime Data Elements installed in a Prime Data Sieve, as well as Reconstitution Programs for derivative elements. Node A then sends the Distilled Files along with the Prime Data Sieve to Node B (the Prime Data Sieve can be sent prior to, concurrently, or after sending the Distilled Files; moreover, the Prime Data Sieve may be sent over the same communication channel or over a different communication channel than the communication channel that is used for sending the Distilled Files). Node B installs the Prime Data Sieve in a corresponding structure at its end, and subsequently feeds the Distilled Files through the Retriever and Reconstitutor that are resident in Node B's Data Distillation™ apparatus to yield the original set of files that were created by Node A. Thus, a more efficient use is made of the bandwidth-constrained communication medium, by employing the Data Distillation™ apparatus at both ends of the medium to send only the reduced data. Note that using Data Distillation™ enables exploiting redundancy across a larger scope (beyond what is viable using conventional techniques, such as Lempel-Ziv) so that even large files or groups of files can be transmitted efficiently.

We now discuss the use of the Data Distillation™ apparatus in Wide Area Network installations where workgroups collaboratively share data that is spread across multiple nodes. When data is first created, it can be reduced and communicated as illustrated in FIG. 12A. Wide Area Networks maintain copies of the data at each site to enable fast local access to the data. Use of the Data Distillation™ apparatus can reduce the footprint at each site. Furthermore, upon subsequent ingestion of fresh data at any of the sites, any redundancy between the fresh data and the contents of the pre-existing Prime Data Sieve can be exploited to reduce the fresh data.

Figure 12B:
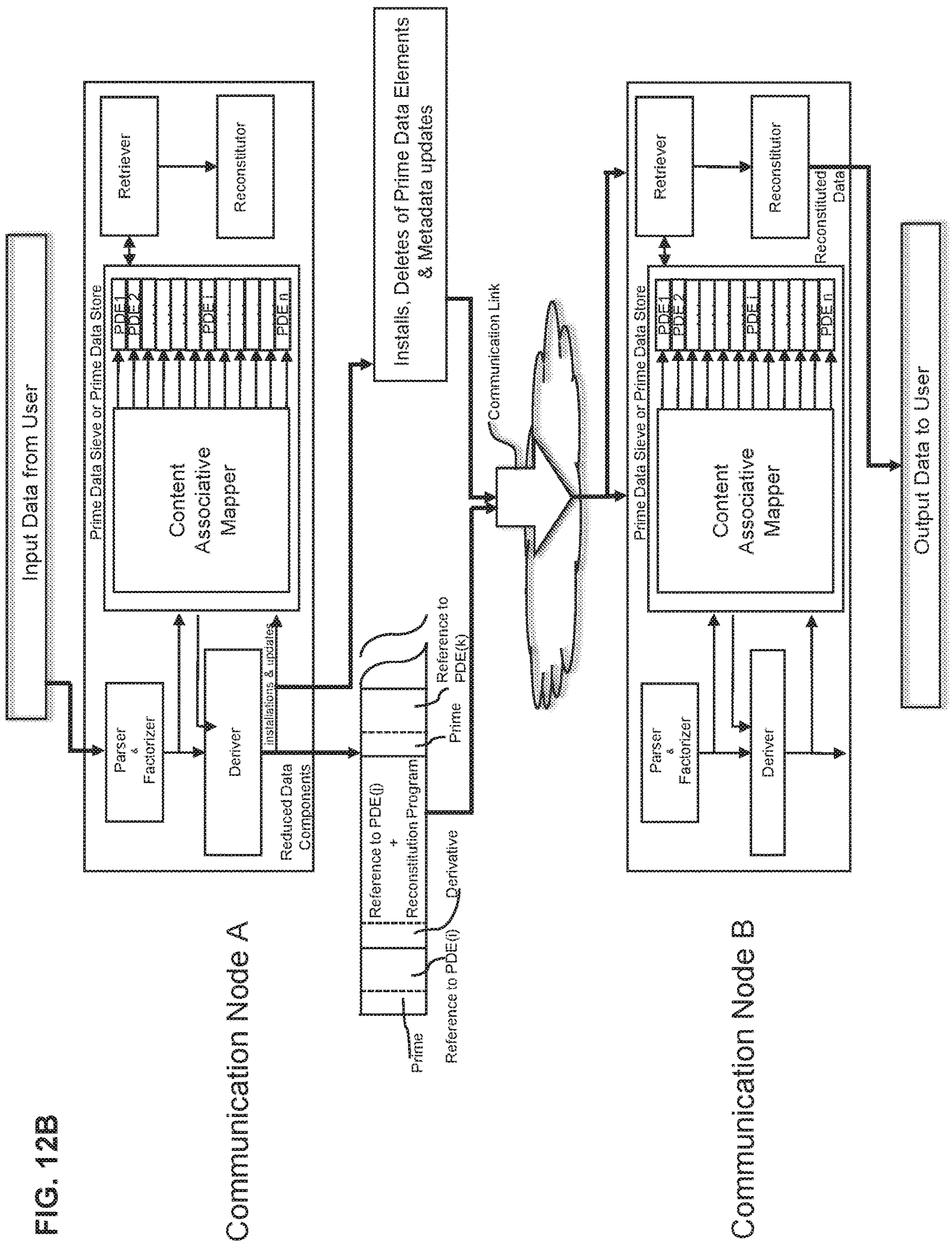

In such an installation, any modifications to the data at any given site need to be communicated to all other sites, so that the Prime Data Sieve at each site is kept consistent. Hence, as shown in FIG. 12B, updates such as installations and deletions of Prime Data Elements, as well as metadata updates, can be communicated to the Prime Data Sieve at each site in accordance with some embodiments described herein. For example, upon installing a fresh Prime Data Element into the Sieve at a given site, the Prime Data Element needs to be communicated to all other sites. Each site can access the Sieve in a content associative manner using the value of the Prime Data Element and determine where in the Sieve the new entry needs to be added. Likewise, upon deleting a Prime Data Element from the Sieve at a given site, all other sites need to be updated to reflect the deletion. One way this could be accomplished is by communicating the Prime Data Element to all sites so that each site can content-associatively access the Sieve using the Prime Data Element to determine which entry in the leaf node needs to be deleted, along with necessary updates to the related links in the tree as well as deletion of that Prime Data Element from the Sieve. Another method is to communicate to all sites a reference to the entry for the Prime Data Element in the leaf node where the Prime Data Element resides.

Thus, the Data Distillation™ apparatus can be used to reduce the footprint of data stored across the various sites of a Wide Area Network as well as make efficient use of the communication links of the network.

FIGS. 12C-12K illustrate the various components of the reduced data produced by the Data Distillation™ apparatus for various usage models in accordance with some embodiments described herein.

Figure 12C:
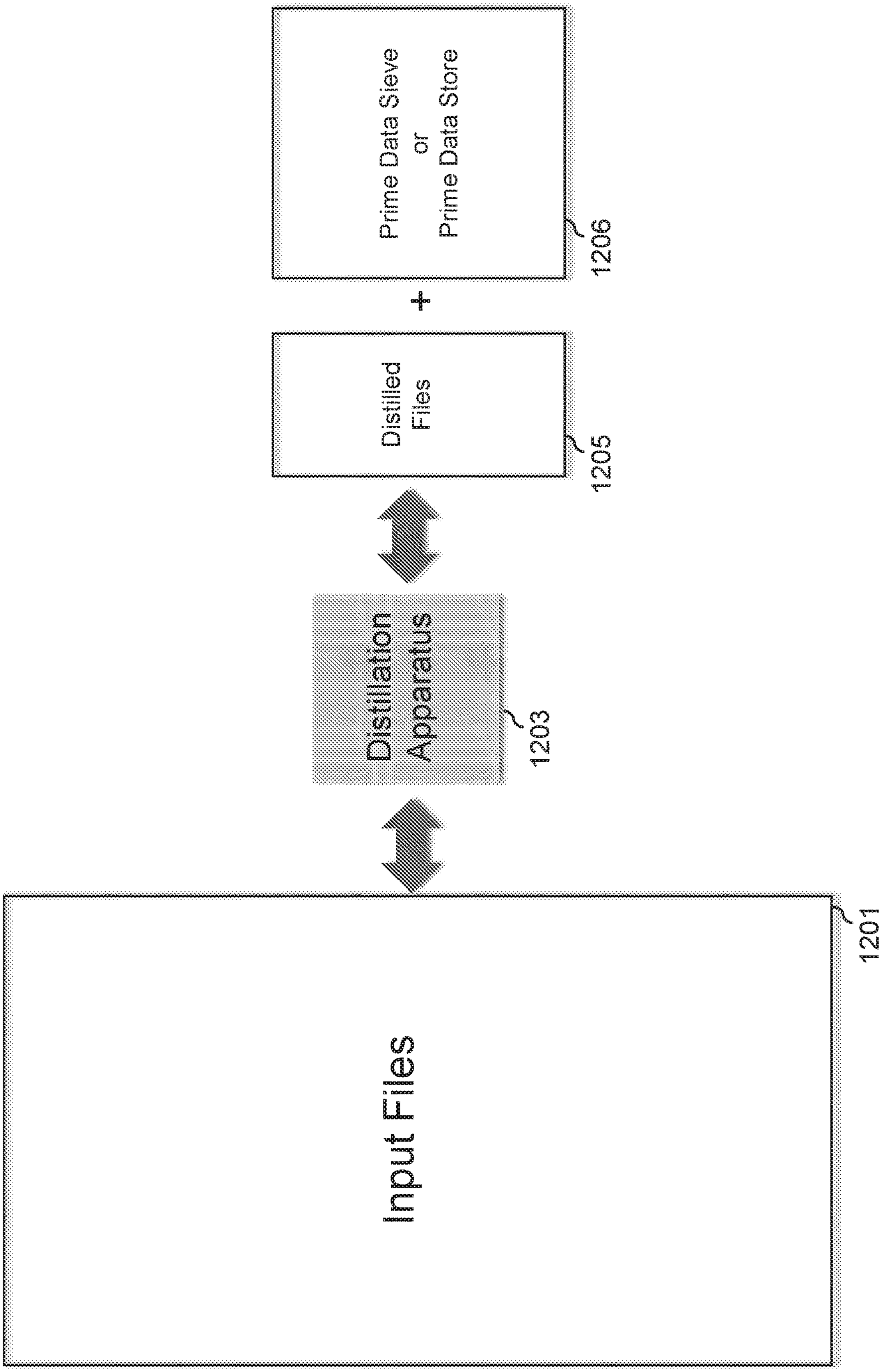
FIGS. 12C-12K illustrate the various components of the reduced data produced by the Data Distillation™ apparatus for various usage models in accordance with some embodiments described herein.

FIG. 12C illustrates how the Data Distillation™ apparatus 1203 ingests a set of Input Files 1201 and after completion of the distillation process generates a set of Distilled Files 1205 and a Prime Data Sieve or Prime Data Store 1206. The Prime Data Sieve or Prime Data Store 1206 of FIG. 12C itself is comprised of two components, viz. Mapper 1207 and the Prime Data Elements (or PDEs) 1208 as shown in FIG. 12D.

Mapper 1207 itself has two components within it, namely, the set of tree node data structures and the set of leaf node data structures that define the overall tree. The set of tree node data structures could be placed into one or more files. Likewise the set of leaf node data structures could be placed into one or more files. In some embodiments, a single file called the Tree Nodes File holds the entire set of tree node data structures for the tree created for the Prime Data Elements for the given dataset (Input Files 1201), and another single file called the Leaf Nodes File holds the entire set of leaf node data structures for the tree created for the Prime Data Elements for that dataset.

Figure 12D:
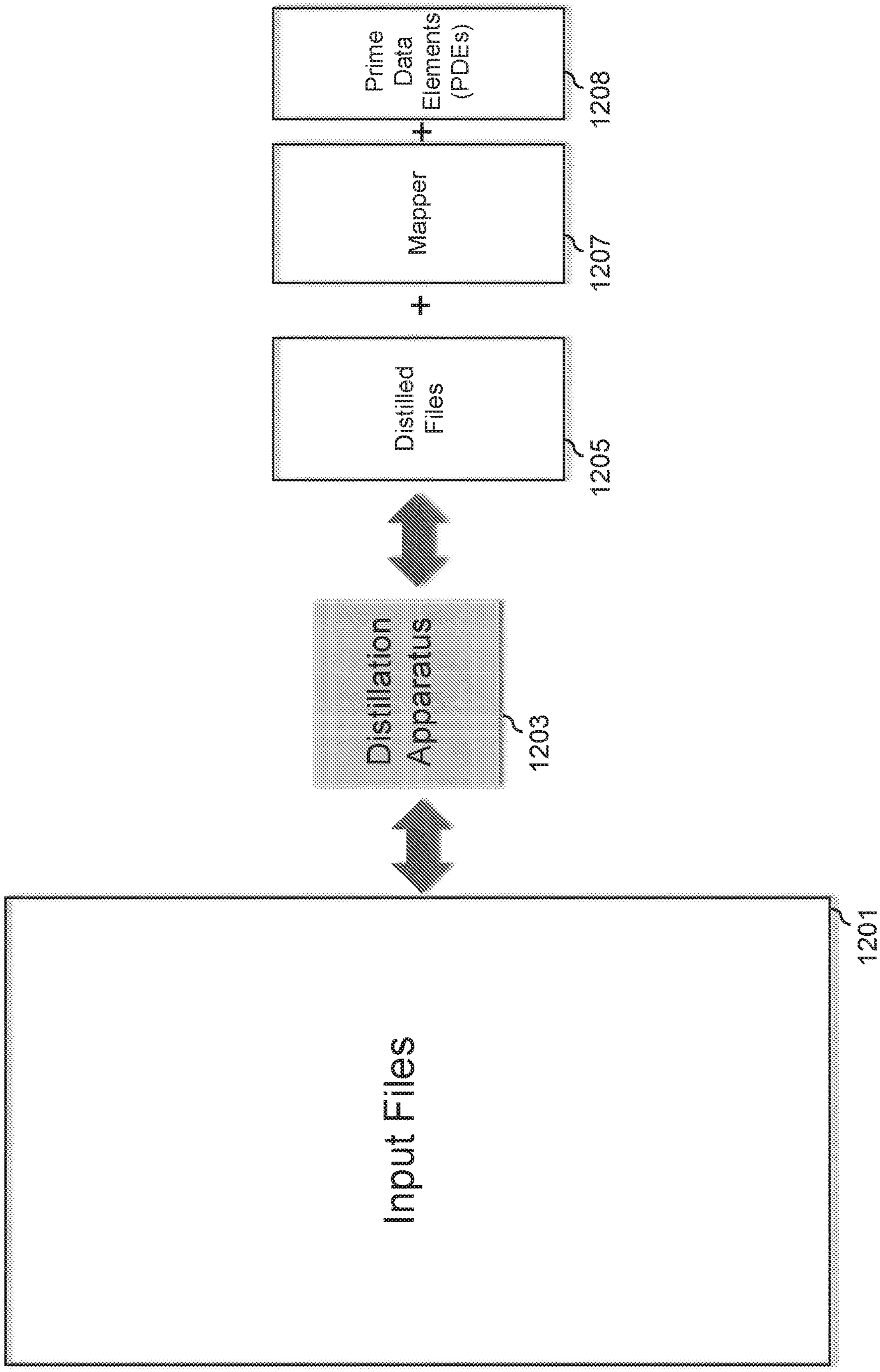

In FIG. 12D, Prime Data Elements 1208 contains the set of Prime Data Elements created for the given dataset (Input Files 1201). The set of Prime Data Elements could be placed into one or more files. In some embodiments, a single file called the PDE File holds the entire set of Prime Data Elements created for the given dataset.

The tree nodes in the Tree Nodes File will contain references to other tree nodes within the Tree Nodes File. The deepest layer (or lowermost levels) of tree nodes in the Tree Nodes File will contain references to entries in leaf node data structures in the Leaf Nodes File. Entries in the leaf node data structures in the Leaf Nodes File will contain references to Prime Data Elements in the PDE File.

Figure 12E:
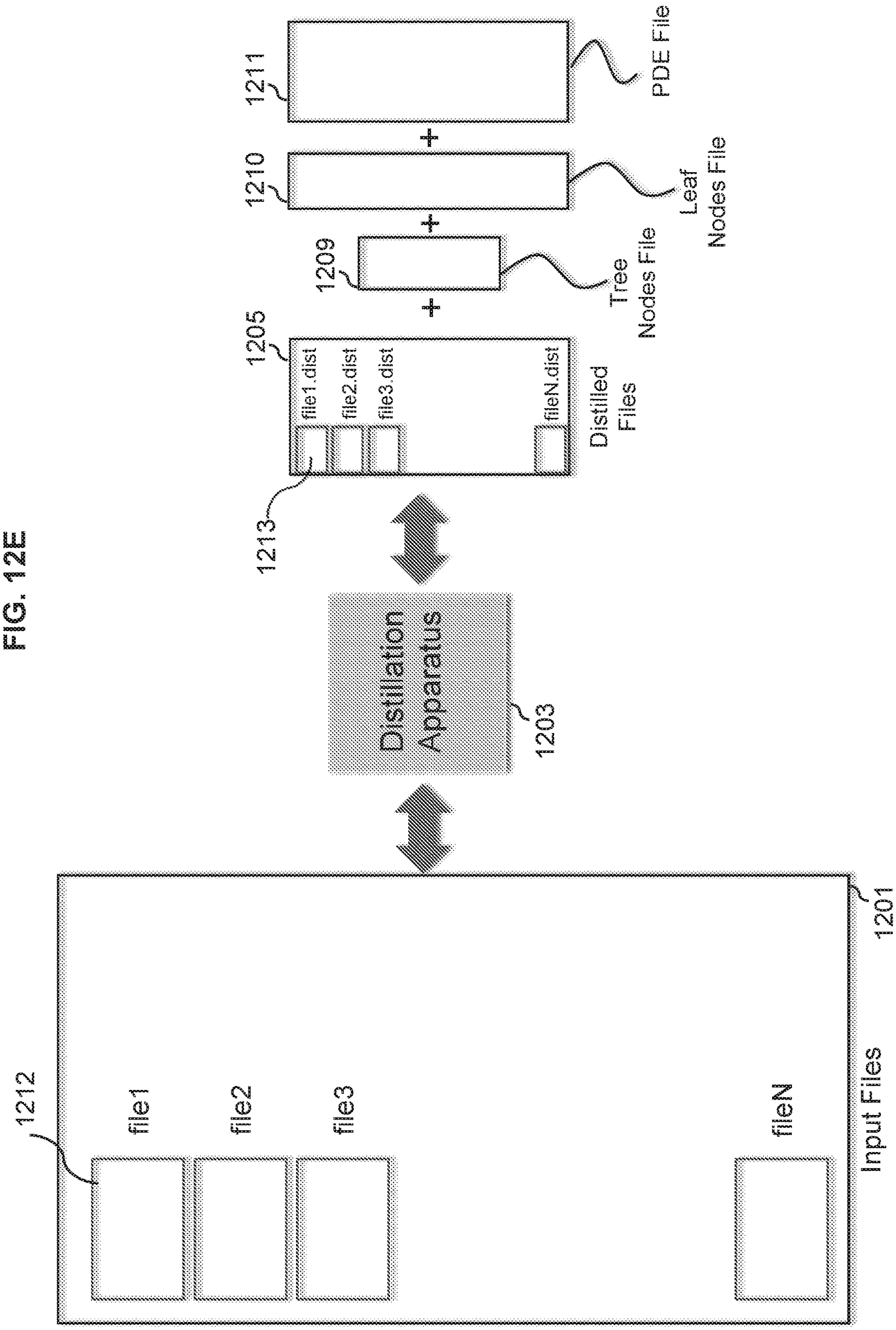
Figure 12F:
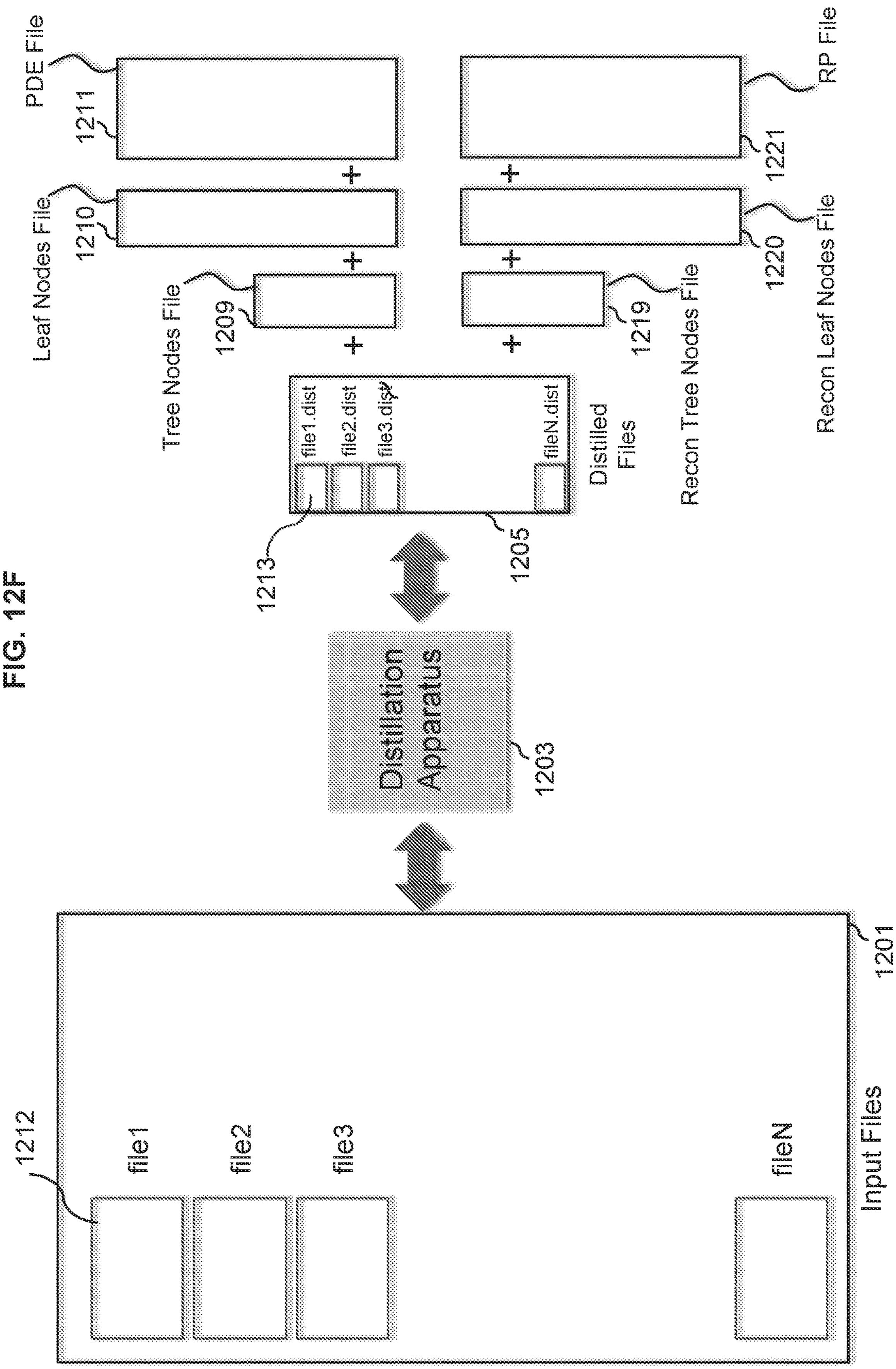

The Tree Nodes File, Leaf Nodes File and PDE File are illustrated in FIG. 12E which shows details of all the components created by the apparatus. FIG. 12E shows a set of Input Files 1201 comprising of N files named file1, file2, file3, . . . fileN that get reduced by the Data Distillation™ apparatus to produce a set of Distilled Files 1205 and the various components of the Prime Data Sieve, viz., Tree Nodes File 1209, Leaf Nodes File 1210, and PDE File 1211. Distilled Files 1205 comprises of N files named file1.dist, file2.dist, file3.dist . . . fileN.dist. The Data Distillation™ apparatus factorizes the input data into its constituent elements and creates two categories of data elements—Prime Data Elements and Derivative Elements. The Distilled Files contain descriptions of the data elements in the losslessly reduced format and contain references to Prime Data Elements in the PDE File. Each file in Input Files 1201 has a corresponding distilled file in Distilled Files 1205. For example, file1 1212 in Input Files 1201 corresponds to the distilled file named file1.dist 1213 in Distilled Files 1205. FIG. 12R illustrates an alternate representation of the Input Dataset which is specified as a set of Input Files and Directories or Folders.

Note that FIG. 12E shows the various components created by the Data Distillation Apparatus based on an organization of the Distilled Data and the Prime Data Sieve in accordance with FIG. 1A, where Reconstitution Programs are placed in the losslessly reduced representation of the Element in the Distilled File. Note that some embodiments (in accordance with FIG. 1B) can place the Reconstitution Programs in the Prime Data Sieve and treat them just like Prime Data Elements. The losslessly reduced representation of the Element in the Distilled File will contain a reference to the Reconstitution Program in the Prime Data Sieve (rather than contain the Reconstitution Program itself). In these embodiments, the Reconstitution Programs will be treated like Prime Data Elements and be produced in the PDE File 1211. In yet another embodiment, in accordance with FIG. 1C, the Reconstitution Programs are stored separate from the Prime Data Elements in a structure called the Reconstitution Program Store. In such embodiments, the losslessly reduced representation of the Element in the Distilled File will contain a reference to the Reconstitution Program in the Reconstitution Program Store. In such embodiments, as illustrated in FIG. 12F, in addition to producing the Tree Nodes File 1209, Leaf Nodes File 1210 and PDE File 1211 for the tree organization of the Prime Data Elements, the apparatus will also produce a second set of tree and leaf node files referred to as Recon Tree Nodes File 1219 and Recon Leaf Nodes File 1220, along with a file containing all the Reconstitution Programs referred to as the RP File 1221.

The Data Distillation™ apparatus shown in FIG. 12E also stores configuration and control information governing its operation in one or more of the Tree Nodes File 1209, Leaf Nodes File 1210, PDE File 1211 and Distilled Files 1205. Alternatively, a fifth component containing this information may be generated. Similarly for the apparatus shown in FIG. 12F, the configuration and control information could be stored in one or more of the various components shown in FIG. 12F, or it could be stored in another component generated for this purpose.

Figure 12G:
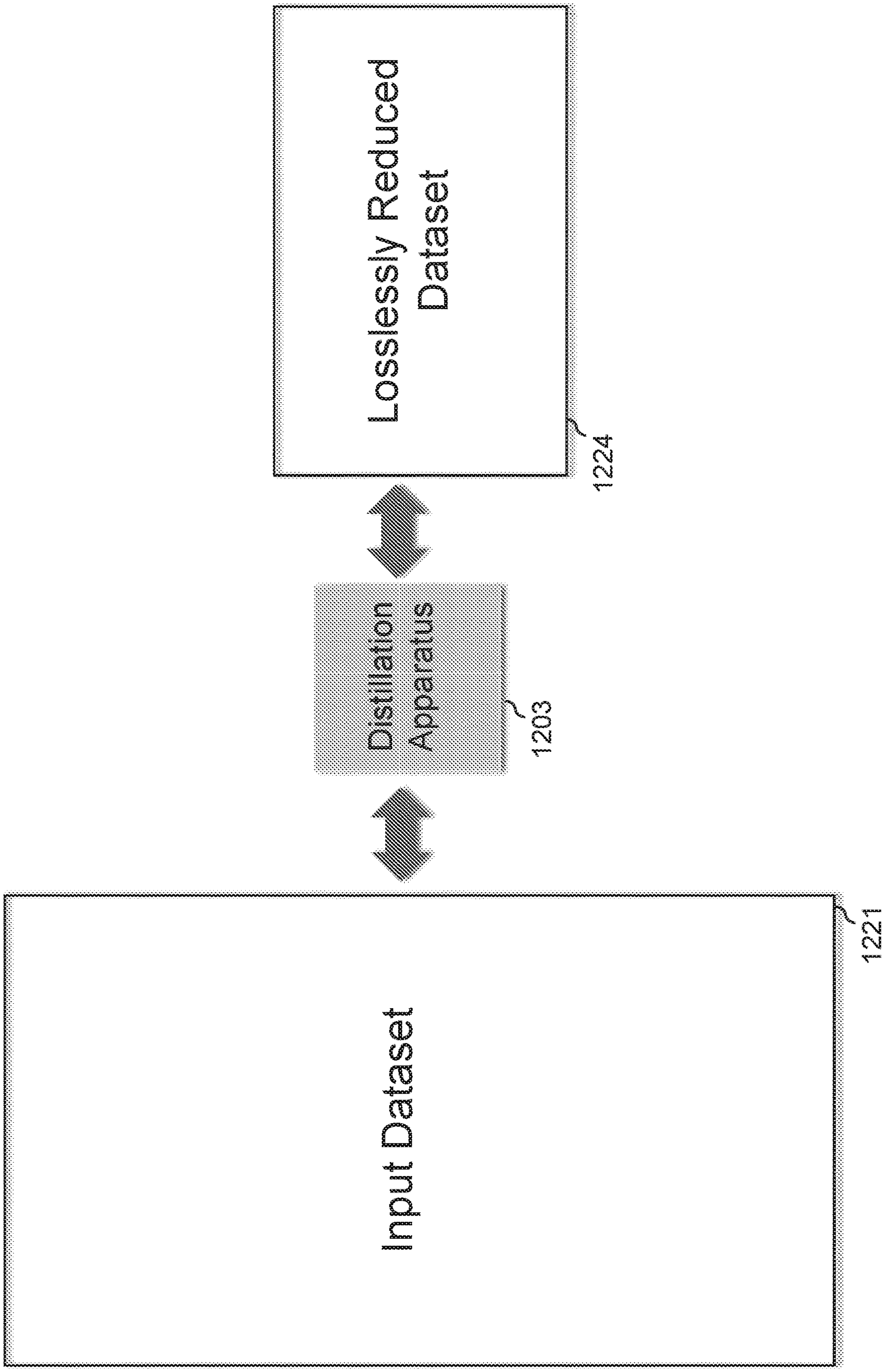

FIG. 12G illustrates an overview of the usage of the Data Distillation™ apparatus, where a given dataset (Input Dataset 1221) is fed to the Data Distillation™ apparatus 1203 and processed to produce a losslessly reduced dataset (Losslessly Reduced Dataset 1224). Input Dataset 1221 could be comprised of a collection of files, objects, blocks, chunks, or extracts from a data stream. Note that FIG. 12E illustrates the example where the dataset is comprised of files. Input Dataset 1221 of FIG. 12G corresponds to Input Files 1201 of FIG. 12 E1, while Losslessly Reduced Dataset 1224 of FIG. 12G includes four components shown in FIG. 12E, namely Distilled Files 1205, Tree Nodes File 1209, Leaf Nodes File 1210, and PDE File 1211 of FIG. 12E. In FIG. 12G, the Data Distillation™ apparatus exploits redundancy among data elements across the entire scope of the Input Dataset that is presented to it.

Figure 12H:
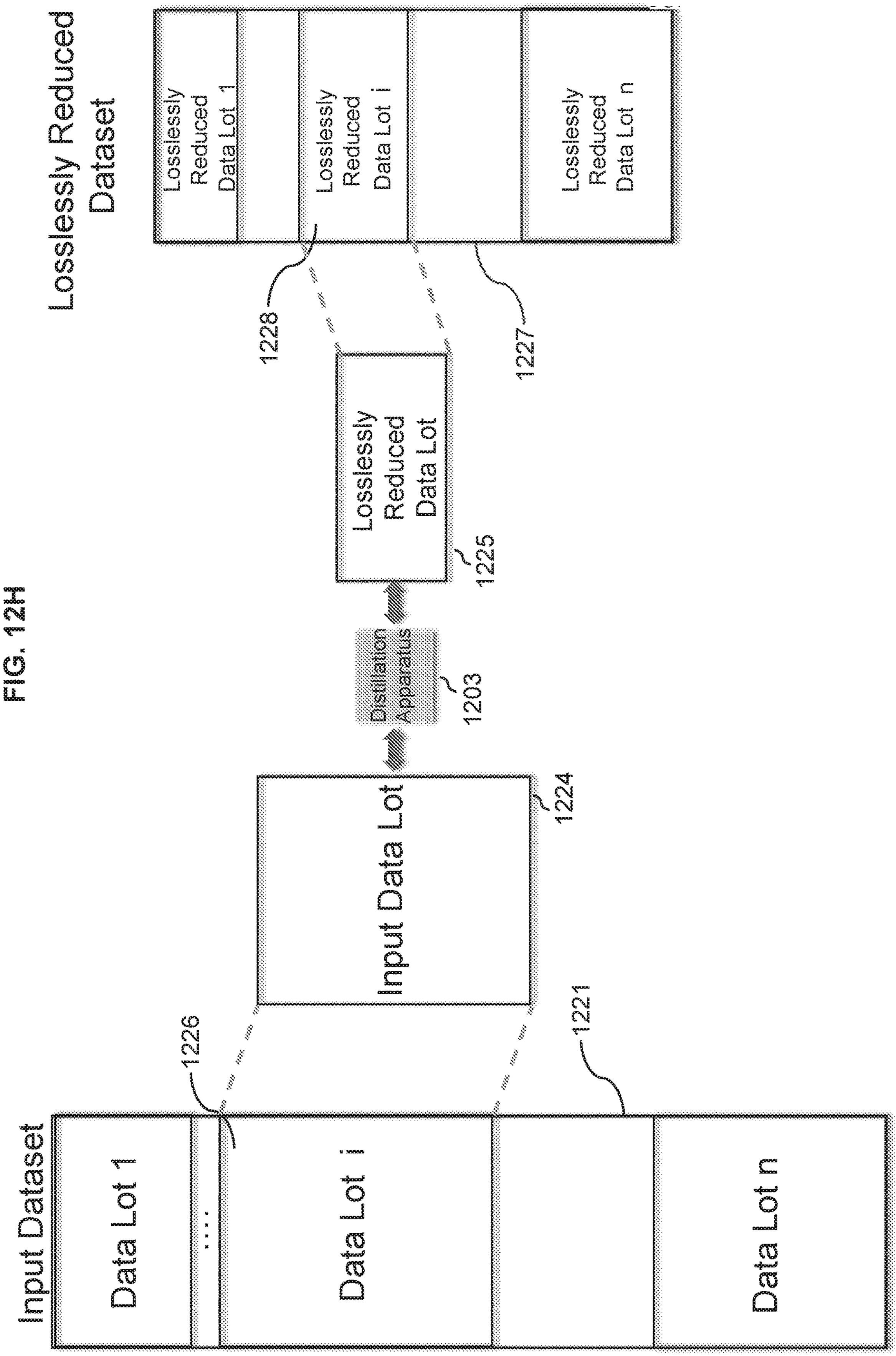

The Data Distillation™ apparatus can be configured to exploit redundancy across a subset of the Input Dataset and deliver lossless reduction for each subset of data presented to it. For example, as shown in FIG. 12H, Input Dataset 1221 can be partitioned into numerous smaller collections of data, each collection being referred to in this disclosure as a "lot" or a "Lot of Data" or a "Data Lot". FIG. 12H shows the Data Distillation™ apparatus configured to ingest Input Data Lot 1224 and produce Losslessly Reduced Data Lot 1225. FIG. 12H shows Input Dataset 1221 comprised of a number of collections of data which are Data Lot 1, . . . Data Lot i, . . . Data Lot n. The data is presented to the Data Distillation™ apparatus one Data Lot at a time, and redundancy is exploited across the scope of each Data Lot to generate a Losslessly Reduced Data Lot. For example, Data Lot i 1226 from Input Dataset 1221 is fed to the apparatus and Losslessly Reduced Data Lot i 1228 is delivered to Losslessly Reduced Dataset 1227. Each Data Lot from Input Dataset 1221 is fed to the apparatus and the corresponding Losslessly Reduced Data Lot is delivered to the Losslessly Reduced Dataset 1227. Upon consuming and reducing all of Data Lot 1, . . . Data Lot i . . . Data Lot n, Input Dataset 1221 is reduced to Losslessly Reduced Dataset 1227.

While the Data Distillation™ apparatus is by design already efficient at exploiting redundancy across the global scope of data, the above technique may be used to further speed up the data reduction process and further improve its efficiency. The throughput of the data reduction process can be increased by limiting the size of a Data Lot to be able to fit into the available memory of a system. For example, an Input Dataset which is many terabytes or even petabytes in size could be broken up into numerous Data Lots each of size say 256 GB, and each Data Lot can be speedily reduced.

Using a single processor core (Intel Xeon E5-1650 V3, Haswell 3.5 Ghz processor) with 256 GB of memory, such a solution exploiting redundancy across a scope of 256 GB has been implemented in our labs to yield ingest rates of several hundred megabytes per second of data while delivering reduction levels of 2-3× on various datasets. Note that a scope of 256 GB is many million-fold larger than 32 KB, which is the size of the window at which the Lempel Ziv method delivers ingest performance of between 10 MB/sec to 200 MB/sec on modern processors. Thus, by limiting the scope of redundancy appropriately, improvements in the speed of the data distillation process can be achieved by potentially sacrificing some reduction.

Figure 12I:
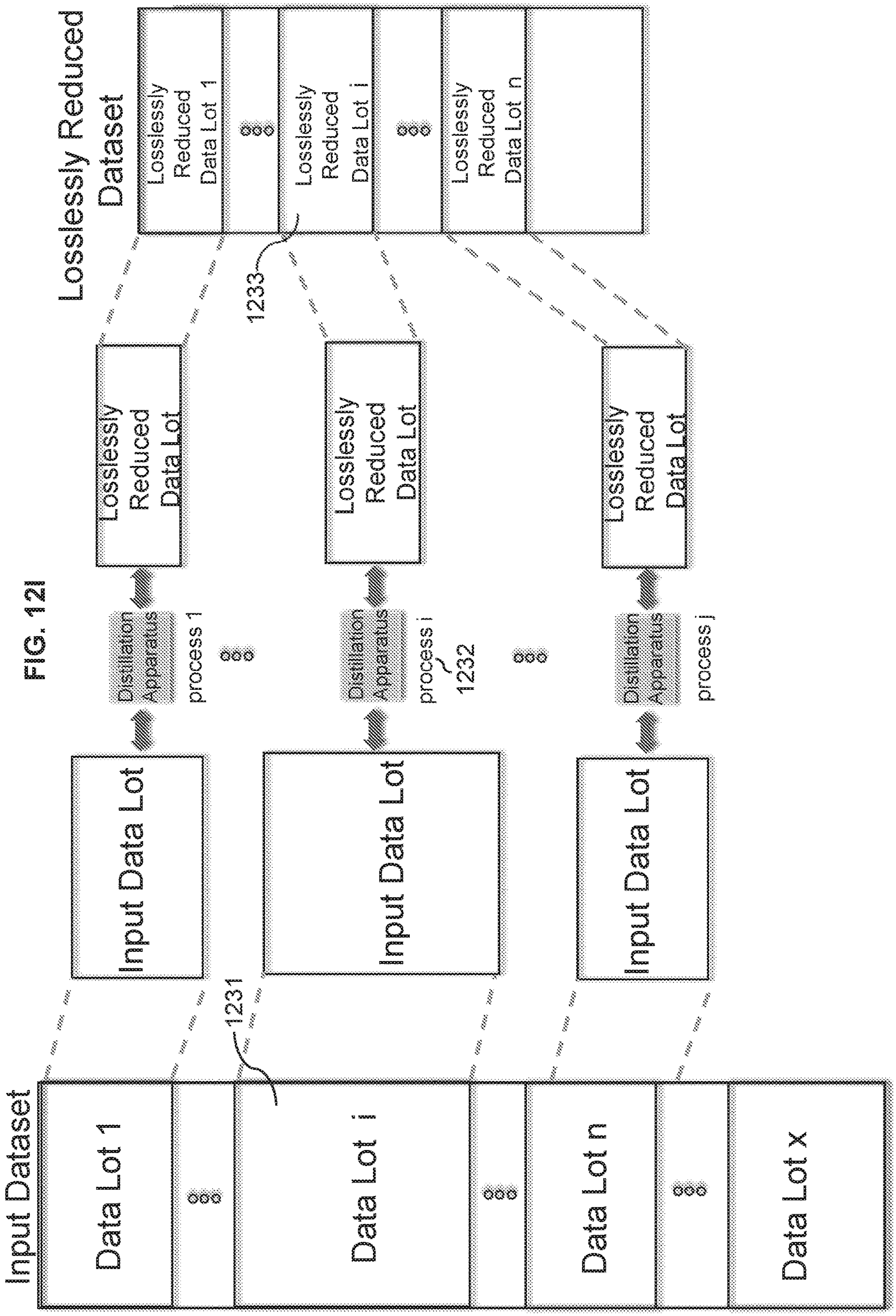

FIG. 12I illustrates a variation of the setup in FIG. 12H, and shows multiple data distillation processes running on multiple processors to significantly boost the throughput of data reduction (and also data reconstitution/retrieval) of the input dataset. FIG. 12I shows the Input Dataset 1201 partitioned into x number of Data Lots, and the x independent Data Lots are fed into the j independent processes running on independent processor cores (with each process being allocated sufficient memory to accommodate any Data Lot that will be fed to it) to get executed in parallel and yield approximately j-fold speedup for both data reduction as well as reconstitution/retrieval.

FIG. 12H shows the Data Distillation™ apparatus configured to ingest Input Data Lot 1224 and produce Losslessly Reduced Data Lot 1225. FIG. 12H shows Input Dataset 1221 comprised of a number of collections of data which are Data Lot 1, . . . Data Lot i, . . . Data Lot n. In some embodiments, alternative partitioning schemes could be employed that partition the input dataset into the multiple Data Lots, where the Data Lot boundary is dynamically determined in order to make best use of available memory. The available memory could either be utilized to firstly hold all the tree nodes, or it could be utilized to hold all the tree nodes and all the leaf nodes for the Data Lot, or lastly it could be utilized to hold all the tree nodes, leaf nodes and all the prime data elements. These three different choices enable alternative operating points for the apparatus. For example, dedicating the available memory for the tree nodes enables a much larger scope of data to be accommodated in a Data Lot, but this requires that the apparatus must fetch the leaf node as well as relevant prime data elements from storage when needed, thus incurring additional latency. Alternatively, dedicating the available memory to accommodate both the tree nodes and the leaf nodes speeds up the distillation, but reduces the effective size of the tree and consequently the scope of data that can be accommodated in the Data Lot. Lastly, using the available memory to hold all of the tree nodes, the leaf nodes and the prime data elements will enable the fastest distillation, but the size of the Data Lot that can be supported as a single scope will be the smallest. In all these embodiments, the Data Lot will be dynamically closed the moment the memory limit is reached, and subsequent files from the input dataset become part of a fresh Data Lot.

Further refinements exist that can improve the efficiency of the apparatus and speedup the reconstitution process. In some embodiments, a single unified Mapper is used for the distillation, but instead of holding the prime data elements in a single PDE File, the prime data elements are held across N PDE FILES. Thus, the erstwhile single PDE FILE is partitioned into n PDE Files, each smaller than a certain threshold size, and each partition being created during the distillation process when the PDE File exceeds that threshold size (upon growth due to installations of prime data elements). Distillation proceeds for each input file by consulting the Mapper to content-associatively select the appropriate prime data element suitable for derivation, and subsequently deriving off the appropriate prime data element that is fetched from the appropriate PDE File where it resides. Each distilled file is further enhanced to list out all those PDE Files (out of the n PDE Files) which contain prime data elements to which the particular distilled file makes references. In order to reconstitute the particular distilled file, only those listed PDE files will need to be loaded up or opened to be accessed for the reconstitution. This has the advantage that for reconstitution of a single distilled file or a few distilled files, only those PDE Files containing the prime data elements needed for that particular distilled file need to be accessed or kept active, while the other PDE Files need not be retained or loaded into fast tiers of memory or storage. Thus, reconstitution can be sped up and made more efficient.

The partitioning of the PDE File into n PDE Files can be further guided by criteria that localizes the reference patterns made to the prime data during the reduction of any given file in the dataset. The apparatus can be enhanced with counters that count and estimate the density of references to elements in the current PDE File. If this density is high, the PDE File will not be partitioned or split, and will keep growing upon subsequent installation of elements. Once the density of references from a given distilled file tapers down, the PDE File can be allowed to be split and partitioned upon subsequent growth beyond a certain threshold. Once partitioned, a fresh PDE File will be opened, and subsequent installations from subsequent distillation will be made into this fresh PDE File. This arrangement will further speed up reconstitution in the event that only a subset of files from a Data Lot need to be reconstituted.

Figure 12J:
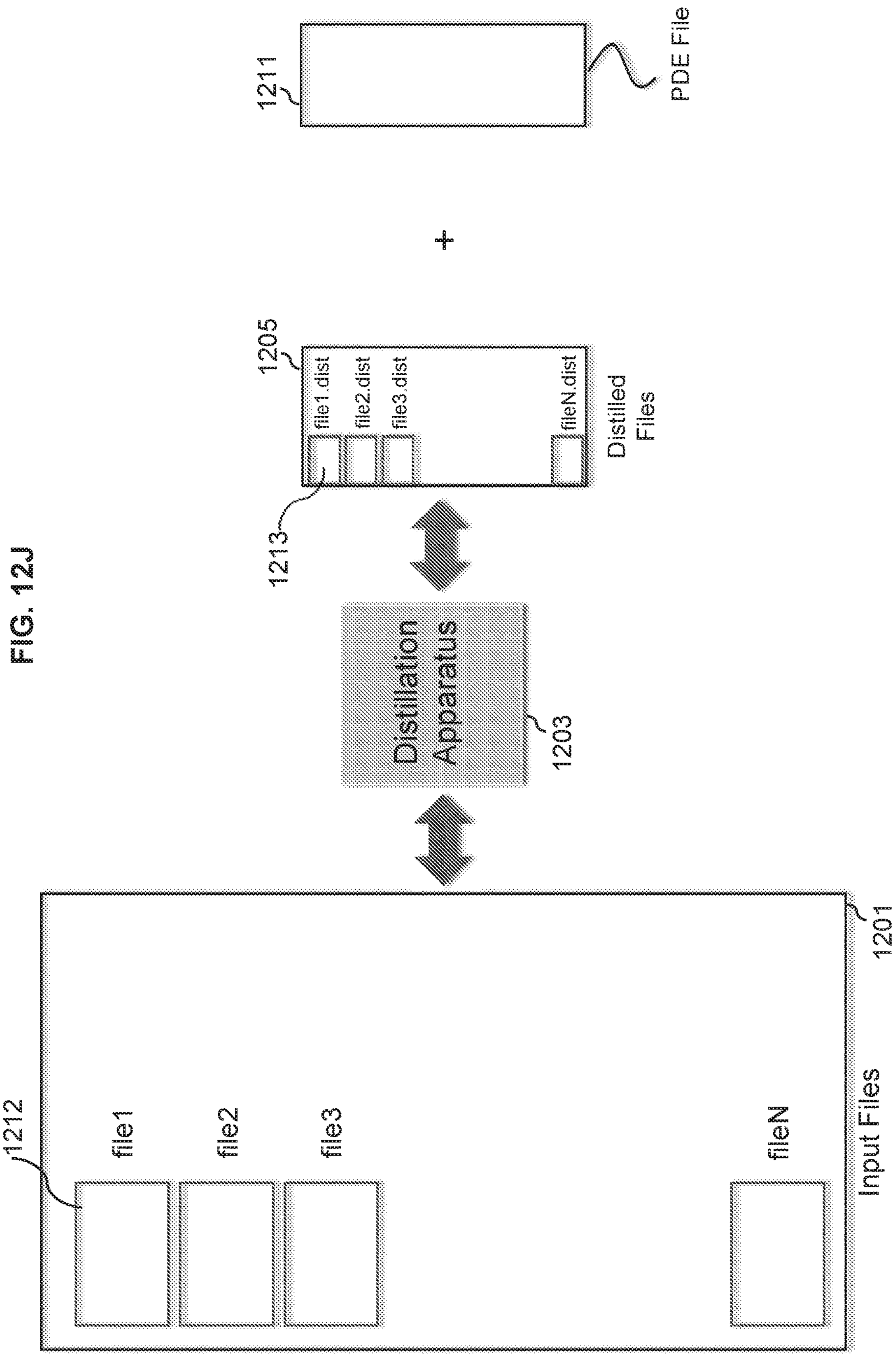

FIG. 12J illustrates the various components of the reduced data produced by the Data Distillation™ apparatus for a usage model where the mapper is no longer needed to be retained subsequent to reduction of the Input Dataset. Examples of such usage models are certain kinds of data backup and data archiving applications. In such a usage model, the subsequent use of the reduced data is reconstitution and retrieval of the Input Dataset from the Reduced Dataset. In such a scenario, the footprint of the Reduced Data can be further reduced by not storing the Mapper after the data reduction is completed. FIG. 12J shows Input Files 1201 fed to the apparatus, which produces Distilled Files 1205 and PDE File 1211—these components comprise the Reduced Data in this scenario. Note that the Input Files 1201 can be completely regenerated and recovered using Distilled Files 1205 and PDE File 1211 only. Recall that the losslessly reduced representation for each element in the Distilled Files contains the Reconstitution Program where needed, as well as references to Prime Data Elements in the PDE File. Coupled with the PDE File, this is all the information needed to execute reconstitution. It is also noteworthy to point out an important benefit of this arrangement on the performance efficiency of the reconstitution and retrieval of the Input Dataset. In this embodiment, the apparatus factorizes the input dataset into Distilled Files and prime data elements which are contained in a separate PDE File. During reconstitution, the PDE File can be loaded from storage in to available memory first, and subsequently the Distilled Files can be successively read from storage for reconstitution. During the reconstitution of each Distilled File, any prime data elements needed for the reconstitution of the Distilled File will be speedily retrieved from memory without incurring any additional storage access latency for the read of the prime data elements. Reconstituted Distilled Files can be written out to storage as they are completed. This arrangement precludes the need to perform random storage accesses that would otherwise have a harmful effect on performance. In this solution, the load of the PDE File from storage is a set of accesses for a sequentially contiguous chunk of bytes, the read of each Distilled File is also a set of accesses for a sequentially contiguous chunk of bytes, and lastly each reconstituted input file is written out to storage as a set of accesses for a sequentially contiguous chunk of bytes. The storage performance of this arrangement more closely tracks the performance of reading and writing sequentially contiguous chunks of bytes rather than the performance of a solution which incurs multiple random storage accesses.

Figure 12K:
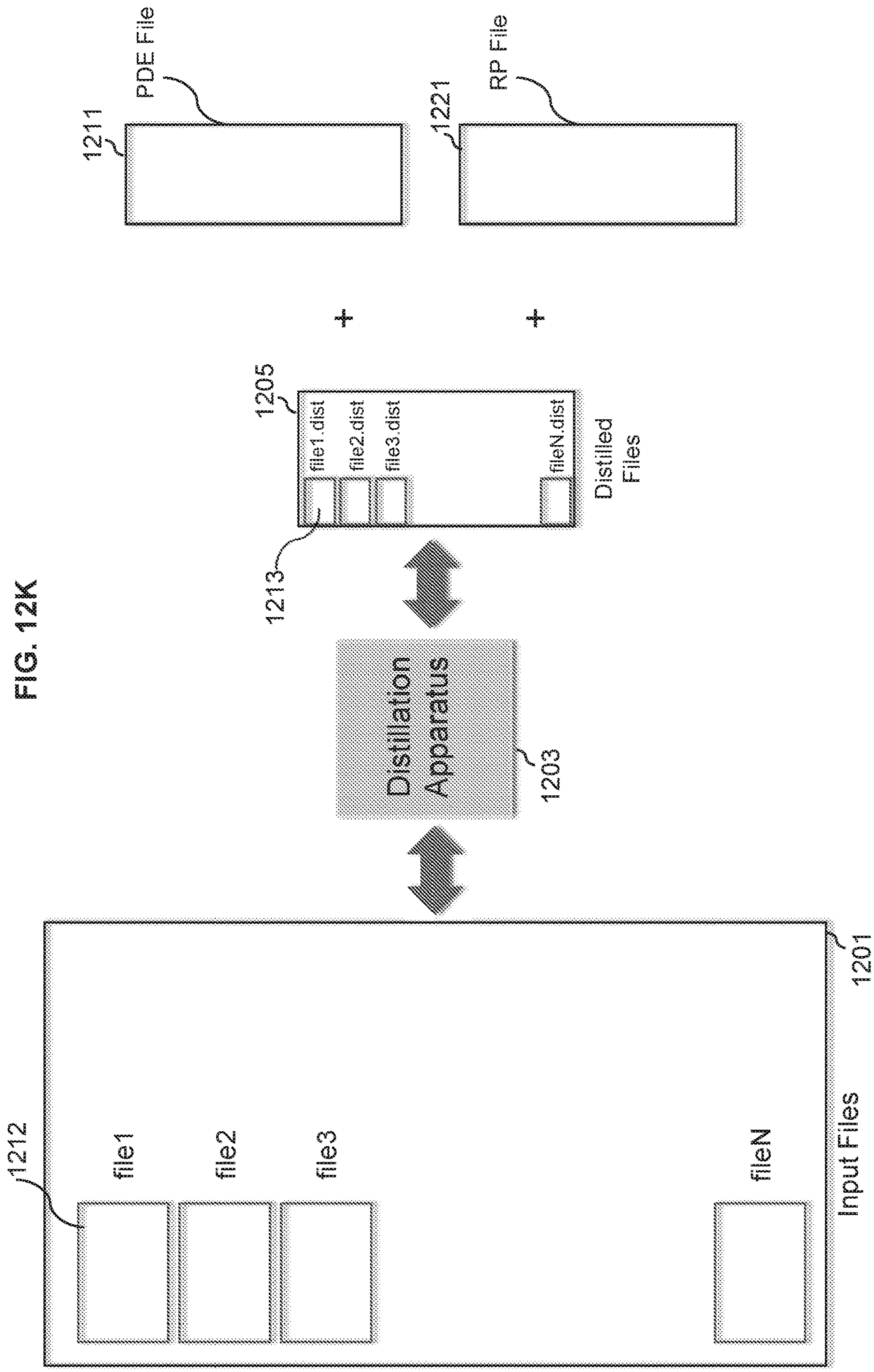

Note that FIG. 12J shows the various components created by the Data Distillation Apparatus based on an organization of the Distilled Data and the Prime Data Sieve in accordance with FIG. 1A, where Reconstitution Programs are placed in the losslessly reduced representation of the Element in the Distilled File. Note that some embodiments (in accordance with FIG. 1B) can place the Reconstitution Programs in the Prime Data Sieve and treat them just like Prime Data Elements. The losslessly reduced representation of the Element in the Distilled File will contain a reference to the Reconstitution Program in the Prime Data Sieve (rather than contain the Reconstitution Program itself). In these embodiments, the Reconstitution Programs will be treated like Prime Data Elements and be produced in the PDE File 1211. In yet another embodiment, in accordance with FIG. 1C, the Reconstitution Programs are stored separate from the Prime Data Elements in a structure called the Reconstitution Program Store. In such embodiments, the losslessly reduced representation of the Element in the Distilled File will contain a reference to the Reconstitution Program in the Reconstitution Program Store. In such embodiments, in addition to producing the PDE file for the Prime Data Elements, the apparatus will also produce a file containing all the Reconstitution Programs referred to as the RP File. This is shown in FIG. 12K, which shows the components of the reduced data for usage models where the mappers no longer need to be retained. FIG. 12K shows the reduced data components comprising the Distilled Files 1205, PDE File 1211, and RP File 1221.

FIGS. 12L-P illustrate how the Distillation process can be deployed and executed on distributed systems to be able to accommodate very large datasets at very high ingest rates in accordance with some embodiments described herein.

Figure 12L:
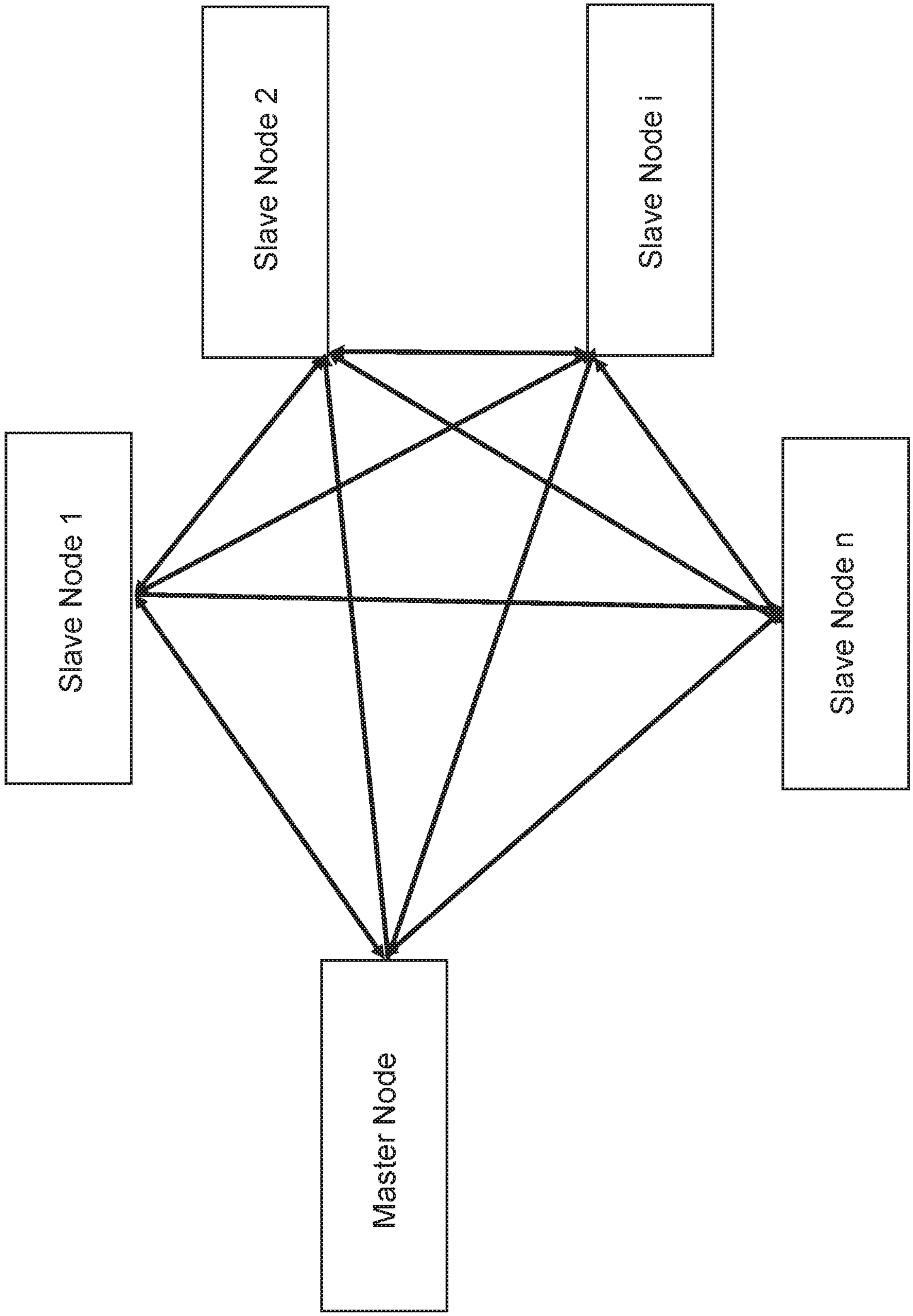
FIGS. 12L-R illustrate how the Distillation process can be deployed and executed on distributed systems to be able to accommodate significantly larger datasets at very high ingest rates in accordance with some embodiments described herein.

The distributed computing paradigm entails distributed processing of large datasets by programs running on multiple computers. FIG. 12L shows a number of computers networked together in an organization referred to as a distributed computing cluster. FIG. 12L shows point-to-point links between the computers, but it will be understood that any communication topology, e.g., hub-and-spoke topology or mesh topology, can be used in place of the topology shown in FIG. 12L. In a given cluster, one node is appointed as the master node which distributes tasks to the slave nodes and controls and co-ordinates their overall operation. Slave nodes execute tasks as directed by the master.

The Data Distillation Process can be executed in a distributed fashion across the multiple nodes of a distributed computing cluster to harness the total compute, memory, and storage capacity of the numerous computers in the cluster. In this setup, a master distillation module on the master node interacts with slave distillation modules running on slave nodes to achieve the data distillation in a distributed fashion. To facilitate this distribution, the Prime Data Sieve of the apparatus can be partitioned into multiple independent subsets or subtrees that can be distributed across multiple slave modules running on the slave nodes. Recall that in the Data Distillation Apparatus, the Prime Data Elements are organized in tree form based upon their Names, and their Names are derived from their content. The Prime Data Sieve can be partitioned into multiple independent subsets or Child Sieves based on the leading bytes of the Name of Elements in the Prime Data Sieve. There can be multiple ways to partition the Name space across multiple subtrees. For example, the values of the leading bytes of the Name of elements can be partitioned into a number of subranges, and each subrange assigned to a Child Sieve. There can be as many subsets or partitions created as there are slave modules in the cluster, so each independent partition is deployed on a particular slave module. Using the deployed Child Sieve, each slave module is designed to execute the data distillation process on candidate elements that it receives.

Figure 12M:
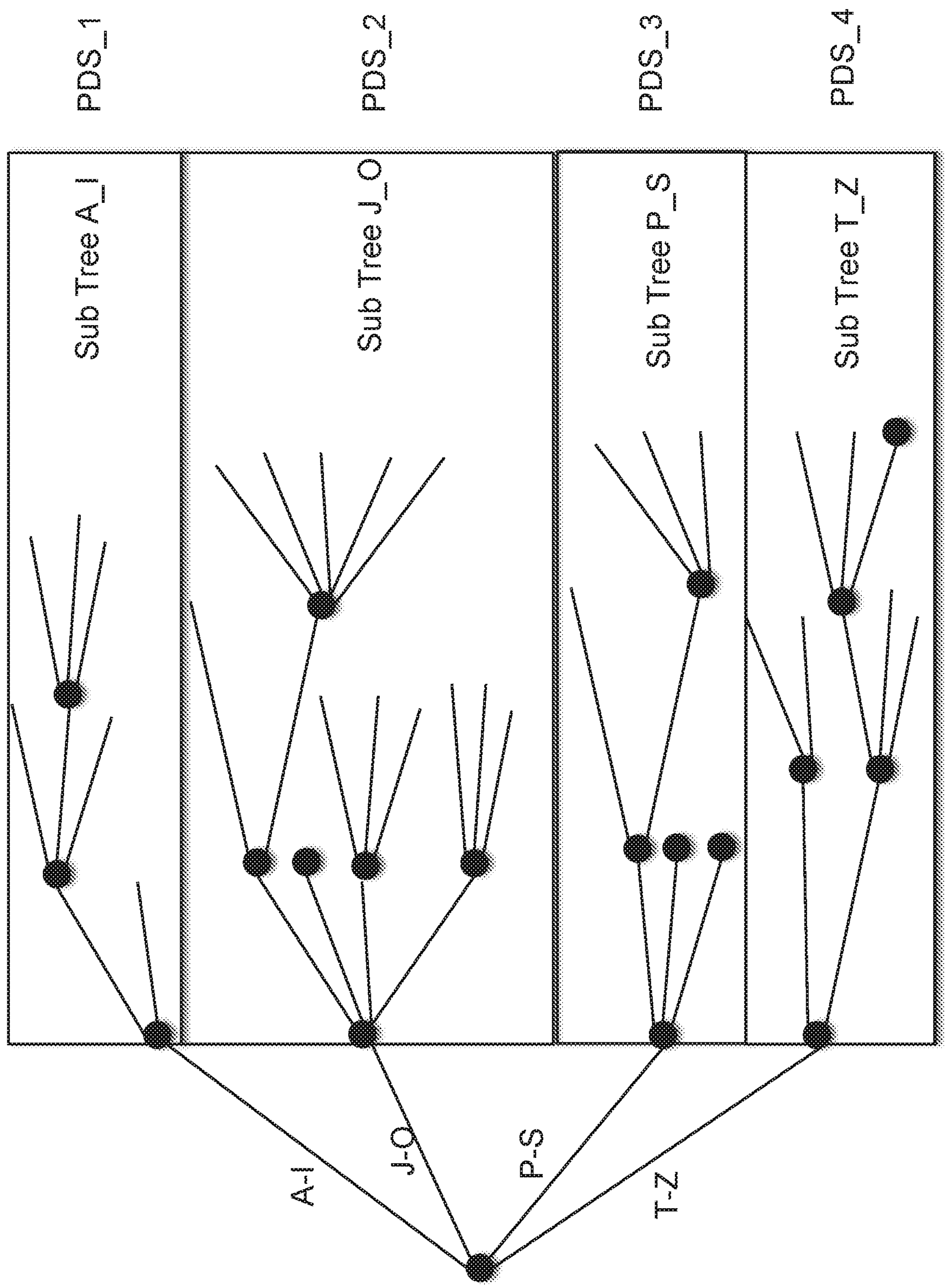

FIG. 12M illustrates a sample partition of the Prime Data Sieve into 4 Prime Data Sieves or Child Sieves labeled PDS_1, PDS_2, PDS_3, and PDS_4 which will be deployed on 4 slave modules running on 4 nodes. The partitioning is based on the leading byte of the Names of Prime Data Elements. In the example shown, the leading byte of the Name of all elements in PDS_1 will be in the range A through I and the Sieve PDS_1 will have a Name A_I marked by the range of values that steer to it. Likewise, the leading byte of the Name of all elements in PDS_2 will be in the range J through O and the Child Sieve PDS_2 will have a Name J_O marked by the range of values that steer to it. Likewise, the leading byte of the Name of all elements in PDS_3 will be in the range P through S and the Child Sieve PDS_3 will have a Name P_S marked by the range of values that steer to it. Lastly, the leading byte of the Name of all elements in PDS_4 will be in the range T through Z and the Child Sieve PDS_4 will have a Name T_Z marked by the range of values that steer to it.

In this setup, the master module running on the master node receives an Input File and performs a lightweight parsing and factorization of the Input File to break the Input File into a sequence of candidate elements, and subsequently steer each candidate element to a suitable slave module for further processing. The lightweight parsing might include parsing each candidate element against a schema, or might include the application of fingerprinting on the candidate element to determine the dimensions that constitute the leading bytes of the Name of the candidate element. The parsing at the master is limited to identify only as many bytes as is sufficient to determine which slave module should receive the candidate element. Based upon the value in the leading bytes of the Name of the candidate element, the candidate is forwarded to the slave module at the slave node which holds the Child-Sieve that corresponds to this specific value.

As data accumulates into the Sieve, the partition can be intermittently revisited and rebalanced. The partitioning and rebalancing functions can be performed by the master module.

Upon receiving a candidate element, each slave module executes the Data Distillation process, starting with a complete parsing and examination of the candidate element to create its Name. Using this Name, the slave module performs a content associative lookup of the Child Sieve, and executes the distillation process to convert the candidate element into an Element in the losslessly reduced representation with respect to that Child Sieve. The losslessly reduced representation of an Element in the Distilled File is enhanced with a field called SlaveNumber to identify the slave module and corresponding Child Sieve with respect to which the Element has been reduced. The losslessly reduced representation of the Element is sent back to the master module. If the candidate element is not found in the Child Sieve or cannot be derived from Prime Data Elements in the Child Sieve, a fresh Prime Data Element is identified to be allocated into the Child Sieve.

The master module continues to steer all candidate elements from an Input File to appropriate slave modules and accumulates the incoming Element descriptions (in losslessly reduced representation) until it has received all Elements for the Input File. At that point a global commit communication can be issued to all slave modules to update their respective Child Sieves with the outcome of their individual distillation processes. The Distilled File for the input is stored at the master module.

In some embodiments, rather than wait for the entire Distilled File to be prepared before any slave can update its Child Sieve with either fresh Prime Data Elements or metadata, the updates to the Child Sieves may be completed as the candidate elements get processed at the slave modules.

In some embodiments, each Child Sieve contains Prime Data Elements as well as Reconstitution Programs in accordance with the descriptions for FIGS. 1B and 1C. In such embodiments, the Reconstitution Program is stored in the Child Sieve and the losslessly reduced representation contains references to both Prime Data Elements as well as Reconstitution Programs (where needed) in the Child Sieve. This further reduces the size of the Element and hence the size of the Distilled File which needs to be stored at the master module. In some embodiments, the Prime Reconstitution Program Sieve in each Child Sieve contains those Reconstitution Programs that are used to create Derivations off Prime Data Elements resident in that Child Sieve. In such a case, the Prime Reconstitution Programs are available locally at the Slave Node and enable rapid derivation and reconstitution without any delay that would otherwise be incurred to fetch the Prime Reconstitution Program from a remote node. In other embodiments, the Prime Reconstitution Program Sieve is distributed globally across all the nodes to take advantage of the total capacity of the distributed system. The losslessly reduced representation is enhanced with a second field that identifies the slave node or Child Sieve that contains the Prime Reconstitution Program. In such an embodiment, the solution incurs an additional delay to fetch the Prime Reconstitution Program from a remote node in order to either generate the final Reconstitution Program through derivation, or to reconstitute the Element. The overall method takes advantage of the combined storage capacity of all the slave nodes to distribute files across all the nodes, based upon the content of each chunk or candidate element in each file.

Data retrieval is similarly co-ordinated by the master module. The master module receives a Distilled File and examines the losslessly reduced specification for each Element in the Distilled File. It extracts the field "SlaveNumber" that indicates which slave module will reconstitute the Element. The Element is then sent to the appropriate slave module for reconstitution. The Reconstituted Element is then sent back to the master module. The master module assembles Reconstituted Elements from all the slaves and forwards the Reconstituted file to the consumer that is demanding the file.

Figure 12N:
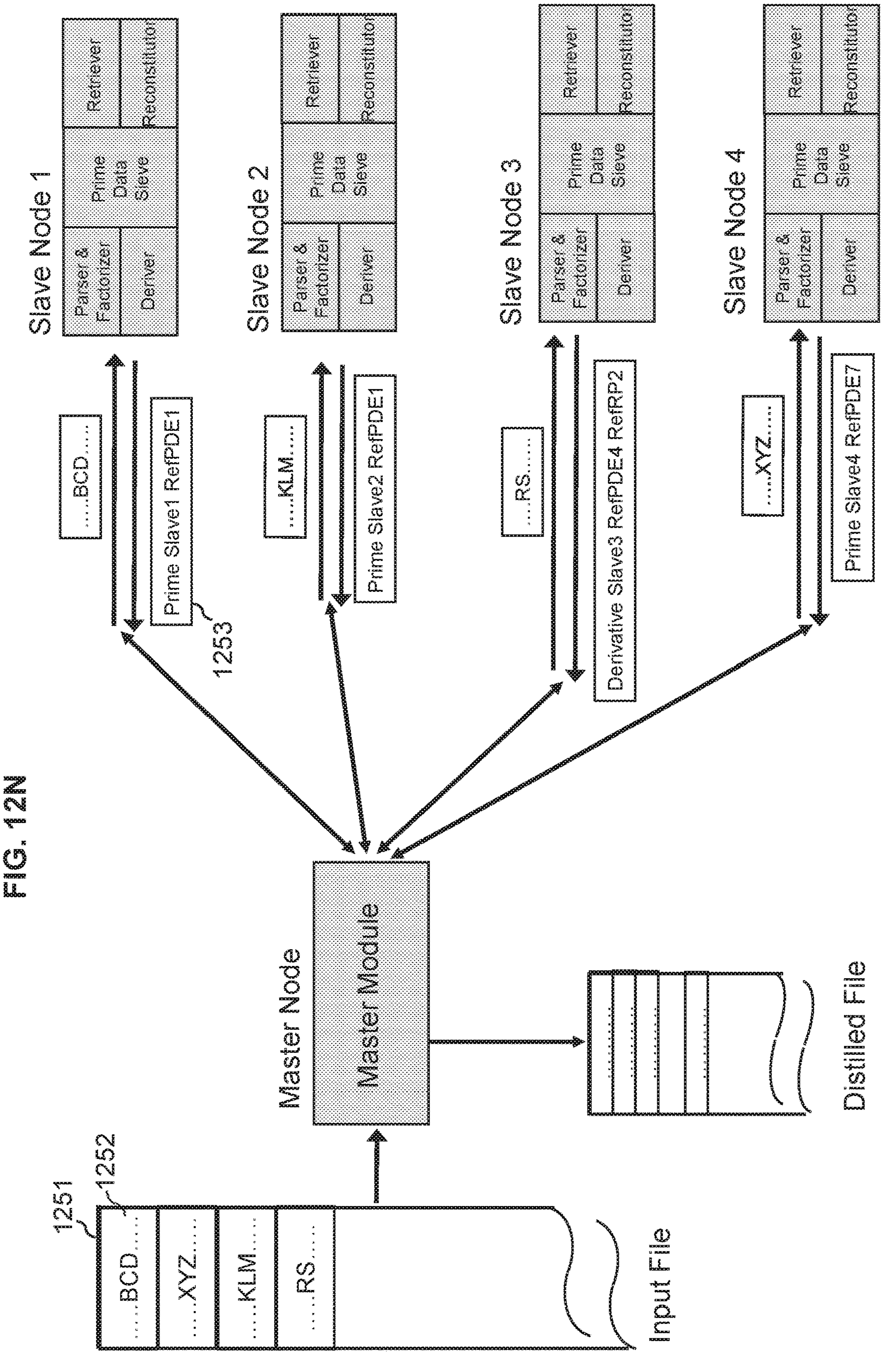

FIG. 12N illustrates how the Data Distillation apparatus may be deployed and executed in distributed systems. Input File 1251 is fed to the master module which parses and identified the leading bytes of the Name of each candidate element in the file. The master module steers candidate elements to one of 4 slave modules. Slave Module1 at Slave Node 1 which holds PDS_1 or Child Sieve with Name A_I containing Prime Data Elements with leading byte of Name bearing values in the range A through I receives Candidate Element 1252 with Name BCD . . . which is determined to be a duplicate of an element already present in Child Sieve with Name A_I. Slave Module 1 returns the Losslessly Reduced Representation 1253 which contains the indicator that the Element is prime, and residing in Slave1 at address refPDE1. The master sends all candidate elements to the relevant slave modules as shown in FIG. 12N and assembles and collects and finally stores the Distilled File.

Figure 12O:
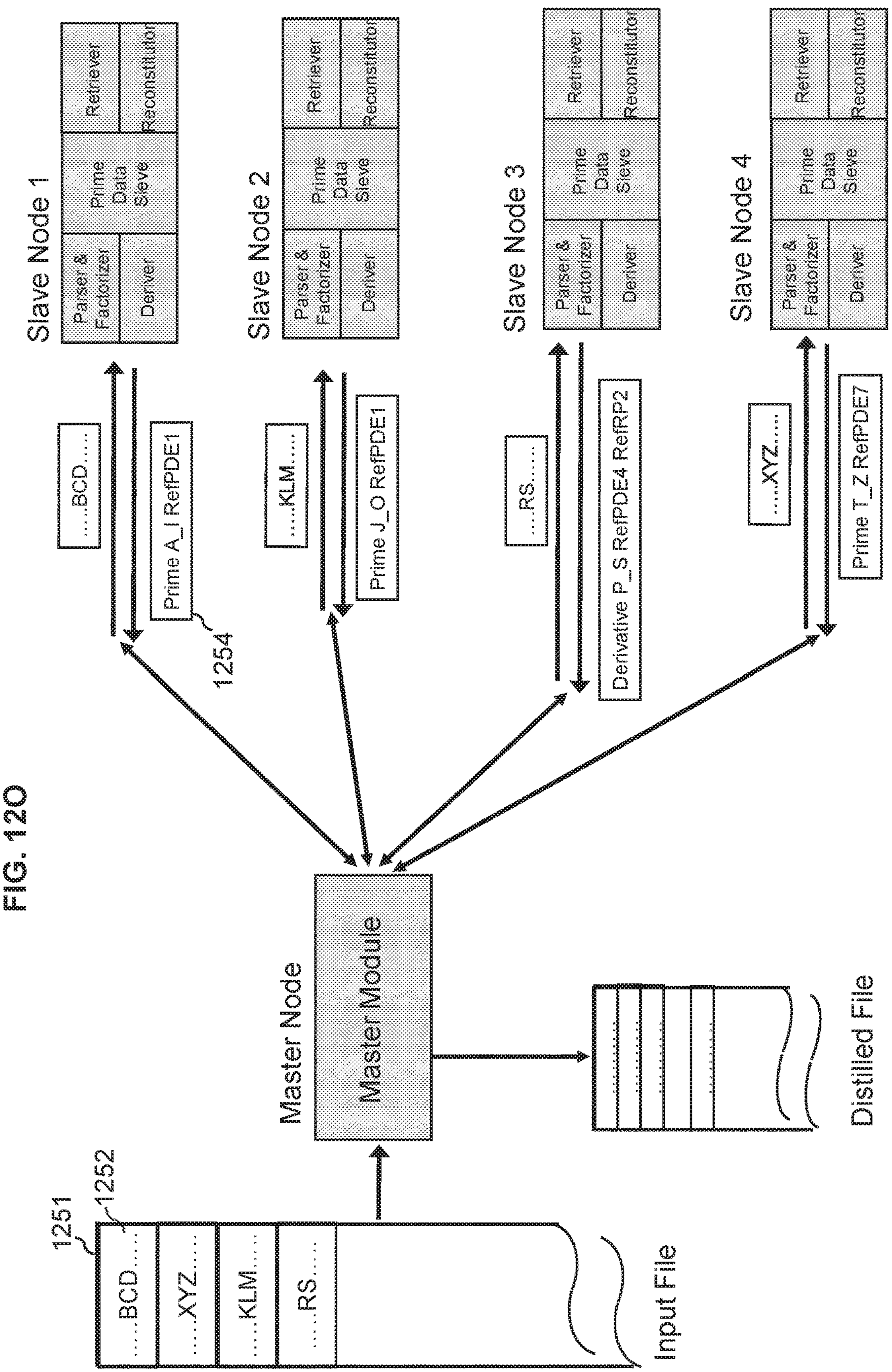

FIG. 12O illustrates a variation of the scheme shown in FIG. 12N. In this variation, in the losslessly reduced representation of each element in the distilled file, the field which identifies the particular Child_Sieve with respect to which the element has been reduced contains the Name of that Child_Sieve instead of the number of the module or node on which that Child_Sieve resides. Hence, the field SlaveNumber is replaced by the field Child_Sieve_Name. This has the benefit of referring to the relevant Child_Sieve by its virtual address rather than the number of the module or the physical node where the Child_Sieve resides. Thus, as can be seen in FIG. 12O, Slave Module1 at Slave Node 1 which holds PDS_1 or Child Sieve with Name A_I containing Prime Data Elements with leading byte of Name bearing values in the range A through I receives Candidate Element 1252 with Name BCD . . . which is determined to be a duplicate of an element already present in Child Sieve with Name A_I. Slave Module 1 returns the Losslessly Reduced Representation 1254 which contains the indicator that the Element is prime, and residing in Child_Sieve with Name A_I at address refPDE1.

Note that by employing the arrangements described in FIGS. 12L through 12O, the overall throughput rate of the data distillation process can be increased. The throughput at the master will now be limited by lightweight parsing and dispatch of candidate elements from the master module. Distillation for numerous candidate elements will execute in parallel, so long as their content steers them to distinct slave modules.

To further boost the overall throughput, the task of lightweight parsing and factorization of the input stream to identify which Child_Sieve should receive the candidate element can be parallelized. This task can be partitioned by the master module into multiple concurrent tasks to be executed in parallel by the slave modules running on the multiple slave nodes. This can be accomplished by looking ahead in the data stream and slicing the data stream into multiple partially overlapping segments. These segments are sent by the master to each of the slave modules which perform the lightweight parsing and factorization in parallel and send back the results of the factorization to the master. The master resolves the factorization across the boundaries of each of the segments and then routes the candidate elements to the appropriate slave module.

Figure 12P:
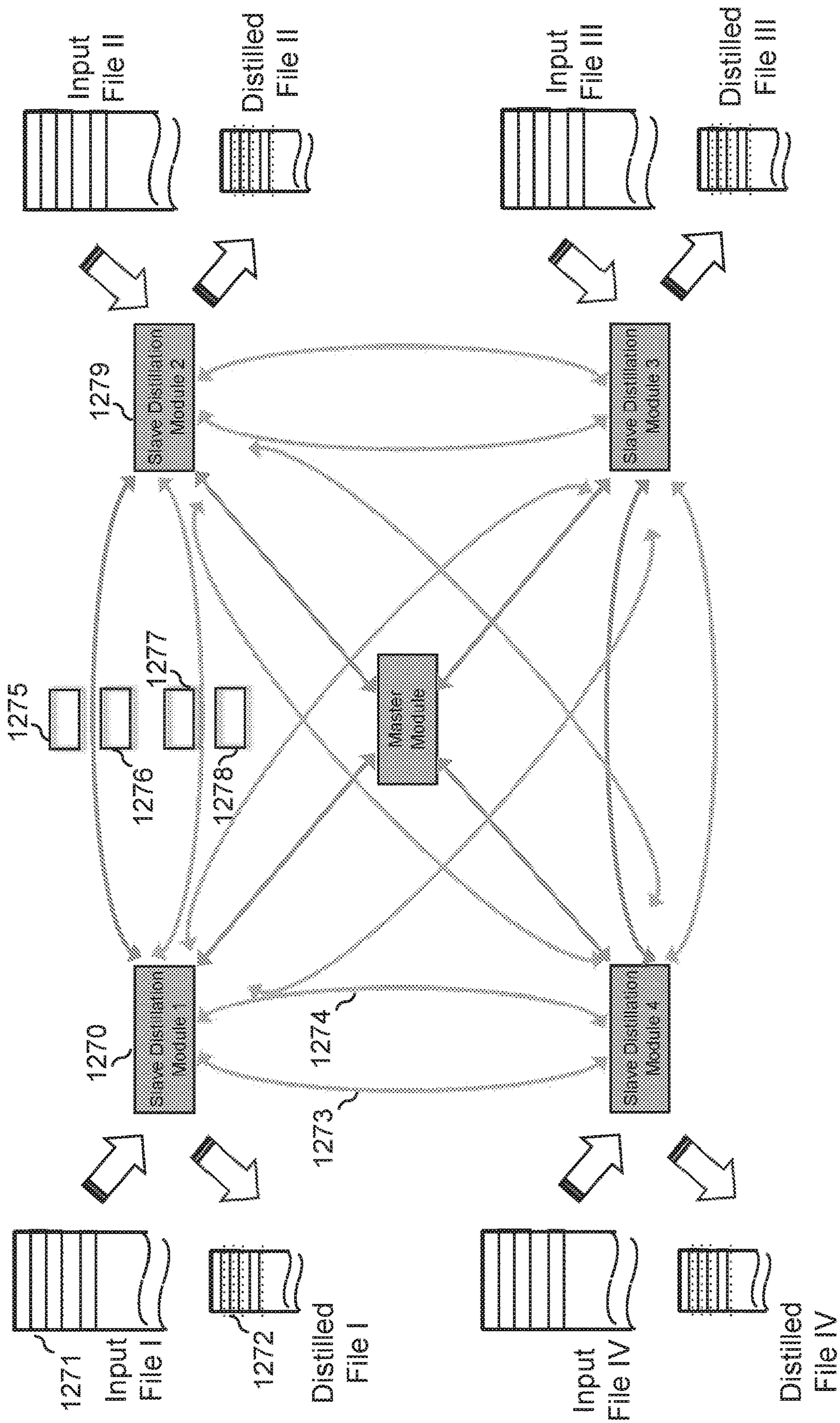

FIGS. 12L through 12O described an arrangement where the data distillation apparatus operates in a distributed fashion with a master distillation module running on a master node and multiple slave distillation modules running on slave nodes. The master module was responsible for performing the partitioning of Prime Data Elements across the various Child Sieves. In the arrangement shown, all Input Files to be ingested were ingested by the master module and losslessly reduced Distilled Files were retained at the master module, while all Prime Data Elements (and any Prime Reconstitution Programs) resided in Child Sieves at the various slaves. Data retrieval requests for a File were also processed by the master, and the reconstitution of the corresponding Distilled Files was coordinated by the master. FIG. 12P illustrates a variation where Input Files can be ingested by any of the slave distillation modules (and the corresponding Distilled Files retained at those modules), and data retrieval requests can be processed by any of the slave distillation modules. The master module continues to perform the partitioning of the Prime Data Elements across the Child Sieves in the same manner, so that the distribution of Prime Data Elements across the Child Sieves would be the same as in the arrangements shown in FIGS. 12L through 12O. However, in the new arrangement shown in FIG. 12P, each slave module is made aware of the partitioning, since each slave module can both ingest and retrieve data. Additionally, all modules are made aware of the existence and location of Distilled Files created and stored at each of the modules upon ingestion of data by those modules. This allows any slave module to satisfy data retrieval requests for any of the Files stored in the entire system.

As shown in FIG. 12P, each of the slave modules can ingest and retrieve data from the distributed storage system. For example Slave Distillation Module 1 1270 ingests Input File I 1271 and performs lightweight parsing to factorize the Input File I and route candidate elements to the module containing the Child Sieve that corresponds to the name of each candidate element from Input File I. For example, candidate element 1275 from Input File I is sent to Slave Distillation Module 2 1279. Likewise, Slave Distillation Module 2 1279 ingests Input File II and performs lightweight parsing to factorize the Input File II and route candidate elements to the module containing the Child Sieve that corresponds to the name of each candidate element from Input File II. For example, candidate element 1277 from Input File II is sent to Slave Distillation Module 1 1270. Each of the Slave Distillation Modules process the candidate elements that they receive, complete the distillation process with respect to their Child Sieve, and return the losslessly reduced representation of the candidate element back to the initiating module that ingested the data. For example, in response to receiving candidate element 1275 from Input File I from Slave Distillation module 1 1270, Slave Distillation Module 2 1279 returns losslessly reduced element 1276 to Slave Distillation Module 1 1270. Likewise, in response to receiving candidate element 1277 from Input File II from Slave Distillation module 2 1279, Slave Distillation Module 1 1270 returns losslessly reduced element 1278 to Slave Distillation Module 2 1279.

In this arrangement, retrieval of data can be satisfied at any slave module. The module that receives the retrieval request needs to first determine where the Distilled File for that requested File resides, and fetch the Distilled File from the corresponding slave module. Subsequently, the initiating slave module needs to co-ordinate the distributed reconstitution of the various elements in that Distilled File to yield the original File and deliver it to the requesting application.

In this fashion, the Data Distillation Process can be executed in a distributed manner across multiple nodes of a distributed system to more effectively harness the total compute, memory, and storage capacity of the numerous computers in the cluster. All nodes in the system can be utilized to ingest and retrieve data. This should enable very high rates of data ingestion and retrieval while taking full advantage of the total combined storage capacity of the nodes in the system. This also allows applications running on any node in the system to make a query at a local node for any data stored anywhere in the system, and to have that query satisfied efficiently and seamlessly.

In the arrangements described in FIGS. 12M through 12P, the partitioning of data across Child Sieves resident in the various nodes of the system was based upon the Name of Elements in a globally visible name space, where the Elements were extracted by factorizing the input Files. In an alternate arrangement, a Data Lot or an entire group of Files that share certain metadata can be assigned and stored on a particular Node. Thus the primary partitioning of the overall data is based on Data Lots, and is performed and managed by the master. All Slave Modules are kept aware of the allocation of Data Lots to Modules. A Data Lot will reside entirely on a given Slave Node. The Child Sieve on the Distillation Slave Module running on that Slave Node will contain all Prime Data Elements belonging to this Data Lot. In other words, the entire tree for all Prime Data Elements for a given Data Lot will reside completely on a single Child Sieve within a single Slave Distillation Module. All Distilled Files for a given Data Lot will also reside on the same Slave Distillation Module. Using this arrangement, Input Files can still be ingested by any of the slave distillation modules, and data retrieval requests can still be processed by any of the slave distillation modules. However, the entire data distillation process for a given Data Lot executes completely on the Module containing that Data Lot. Requests for data ingestion and data retrieval are routed from the initiating modules to the particular slave module that is designated to hold the particular Data Lot. This solution has the benefit of reduced communication overhead in the distributed environment when factorizing and distilling a Data Lot. Redundancy is no longer exploited across the entire global data footprint, but very efficiently exploited locally within the Data Lot. The solution still uses the combined storage capacity of the distributed system and offers seamless ability to query, ingest and retrieve any data from any node of the system.

Thus, employing the numerous techniques described above, an efficient use is made of the resources in the distributed system to perform data distillation on very large datasets at very high speeds.

Figure 12Q:
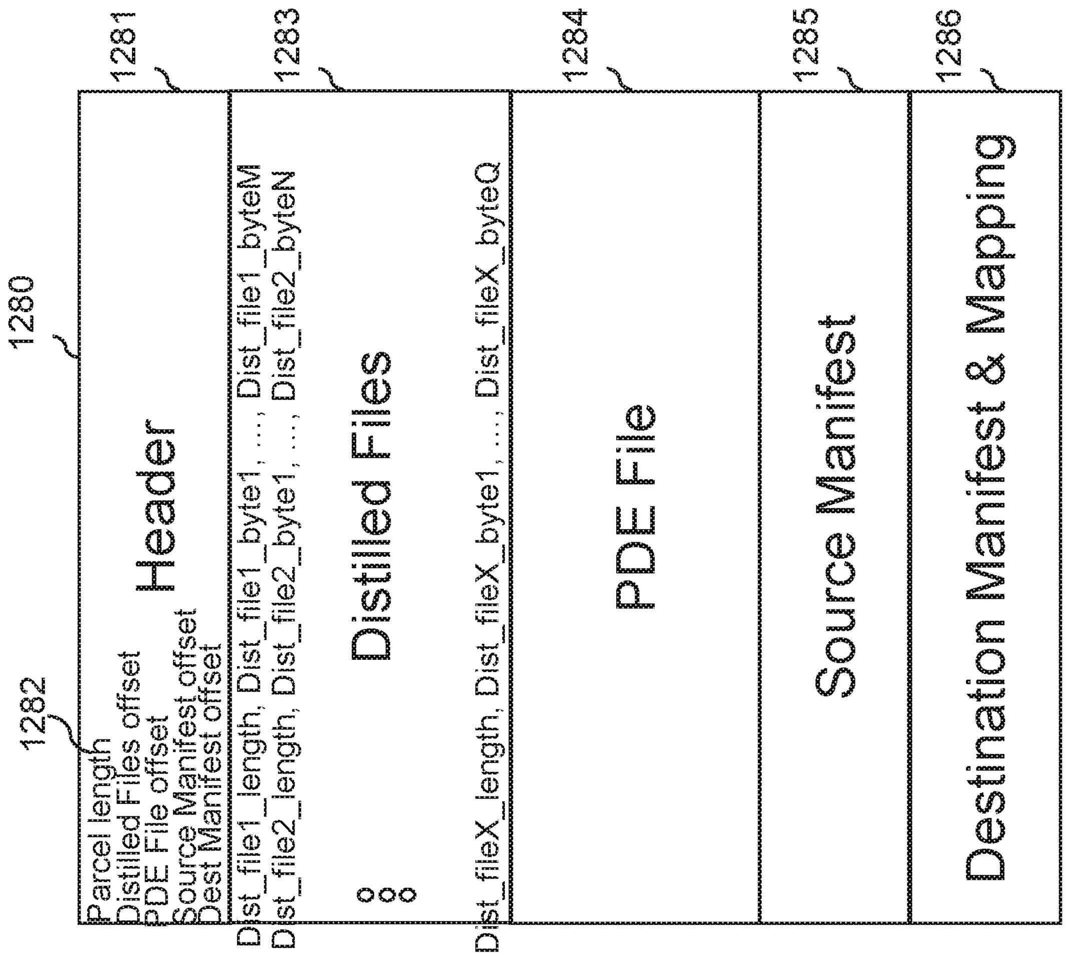
Figure 12R:
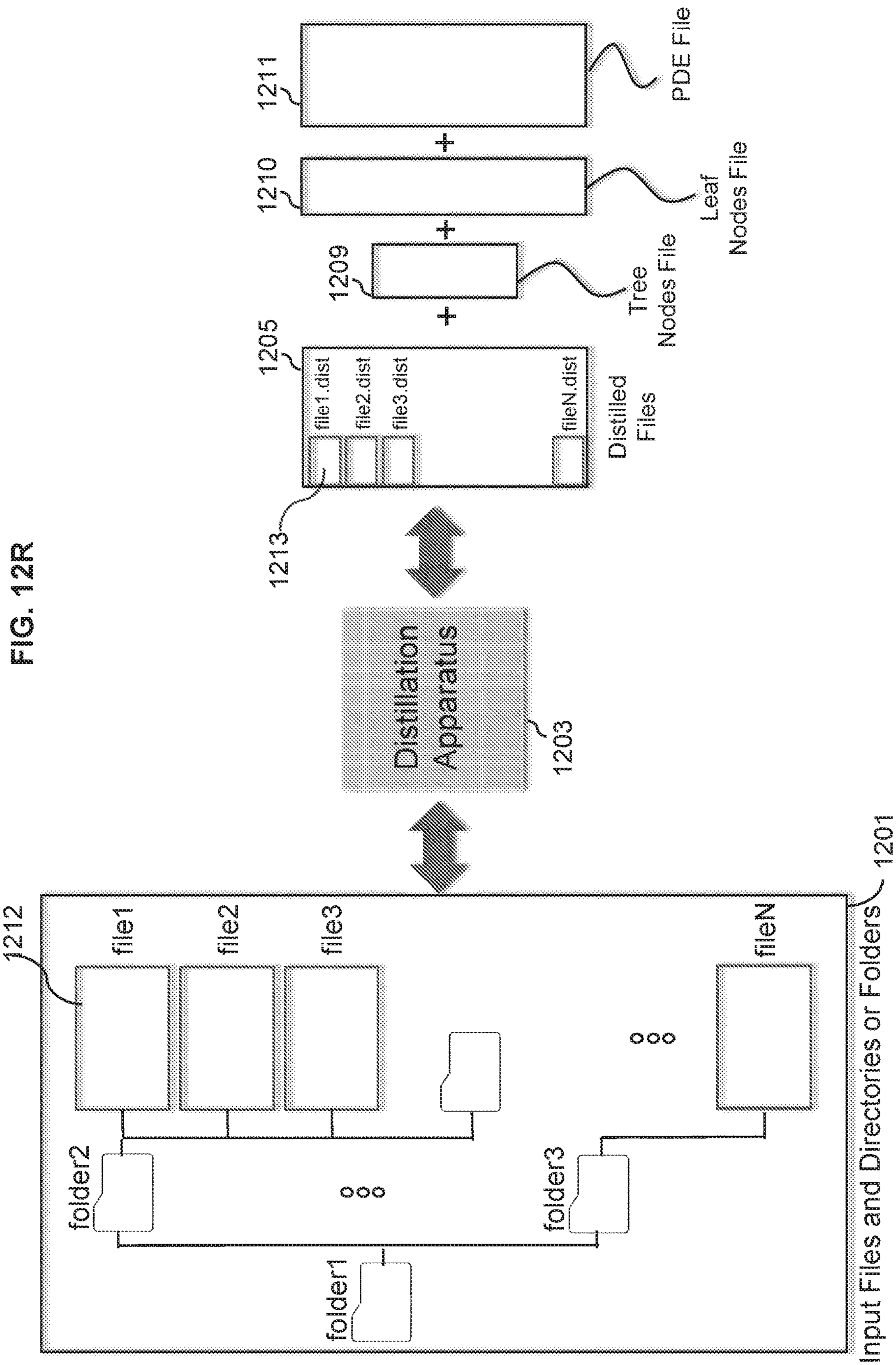

The Data Distillation™ method and apparatus can be further enhanced to facilitate efficient movement and migration of data. In some embodiments, the losslessly reduced dataset can be delivered in the form of multiple containers or Parcels to facilitate data movement. In some embodiments, one or more reduced Data Lots could fit into a single container or Parcel, and alternatively, a single reduced Data Lot can be converted into multiple Parcels. In some embodiments, a single reduced Data Lot is delivered as a single self-describing Parcel. FIG. 12Q illustrates the sample structure of such a Parcel. Parcel 1280 in FIG. 12Q can be viewed as a single file or contiguous set of bytes containing the following components sequentially concatenated to one another: (1) Header 1281, which is the Parcel Header which contains firstly the Parcel Length 1282 which specifies the length of the Parcel, and secondly contains offset identifiers identifying the offsets where the Distilled Files, the PDE File, and the various manifests are located in the Parcel; (2) Distilled Files 1283, which are the Distilled Files for the Data Lot concatenated one after another, with the length for each Distilled File first being specified followed by all the bytes comprising the Distilled File; (3) PDE File 1284, which is the PDE File, starting off with a length identifier for the PDE File followed by the body of the PDE File containing all the prime data elements; (4) Source Manifest 1285 which is a source manifest which describes the structure of the input dataset and identifies the unique directory structure, pathname and filename of each file in the Parcel. The source manifest also contains a listing of each node in the input Data Lot (which was reduced and turned into the Parcel) along with the metadata associated with each node; (5) Destination Manifest and Mapper 1286, which is the destination manifest and mapper. The destination mapper provides the intended mapping of each input node and file into the target destination directory and file structure or the target bucket/container and object/blob structure in the cloud. This manifest facilitates the movement, reconstitution and relocation of the various components in the Parcel to their final destination following data movement. Note that this destination mapper section can be independently altered to retarget the destination where the data in the Parcel is to be transported to and reconstituted.

In this manner the Losslessly reduced representation of the Data Lot is delivered as a Parcel in a format that is self-describing and that is suitable for the movement and relocation of the data.

Data reduction was performed on a variety of real world datasets using the embodiments described herein to determine the effectiveness of these embodiments. The real world datasets studied include the Enron Corpus of corporate email, various U.S. Government records and documents, U.S. Department of Transportation records entered into the MongoDB NOSQL database, and corporate PowerPoint presentations available to the public. Using the embodiments described herein, and factorizing the input data into variable-sized elements (with boundaries determined by fingerprinting) averaging 4 KB, an average data reduction of 3.23× was achieved across these datasets. A reduction of 3.23× implies that the size of the reduced data is equal to the size of the original data divided by 3.23×, leading to a reduced footprint with a compression ratio of 31%. Traditional data deduplication techniques were found to deliver a data reduction of 1.487× on these datasets using equivalent parameters. Using the embodiments described herein, and factorizing the input data into fixed-sized elements of 4 KB, an average data reduction of 1.86× was achieved across these datasets. Traditional data deduplication techniques were found to deliver a data reduction of 1.08× on these datasets using equivalent parameters. Hence, the Data Distillation™ solution was found to deliver significantly better data reduction than traditional data deduplication solutions.

The test runs also confirm that a small subset of the bytes of a Prime Data Element serve to order the majority of the elements in the Sieve, thus enabling a solution that requires minimal incremental storage for its operation.

The results confirm that the Data Distillation™ apparatus efficiently enables exploiting redundancy among data elements globally across the entire dataset, at a grain that is finer than the element itself. The lossless data reduction delivered by this method is achieved with an economy of data accesses and IOs, employing data structures that themselves require minimal incremental storage, and using a fraction of the total computational processing power that is available on modern multicore microprocessors. Embodiments described in the preceding sections feature systems and techniques that perform lossless data reduction on large and extremely large datasets while providing high rates of data ingestion and data retrieval, and that do not suffer from the drawbacks and limitations of conventional techniques.

Performing Content Associative Search and Retrieval on Data that has Been Losslessly Reduced by Deriving Data from Prime Data Elements Resident in a Prime Data Sieve The Data Distillation Apparatus described in the preceding text and illustrated in FIGS. 1A through 12P can be enhanced with certain features in order to efficiently perform multidimensional search and content associative retrieval of information from the data that is stored in the losslessly reduced format. Such multidimensional searches and data retrieval are key building blocks for an analytics or data warehousing application. These enhancements will now be described.

FIG. 13 shows a Leaf Node Data Structure similar to the structure illustrated in FIG. 3H. However, in FIG. 13, the entry in the leaf node data structure for each Prime Data Element is enhanced to contain references (which will also be called Reverse References or Reverse Links) to all Elements in the Distilled Data that contain a reference to that particular Prime Data Element. Recall that the Data Distillation scheme factorizes data from an Input File into a sequence of Elements which are placed in the Distilled File in a reduced format using a specification such as that described in FIG. 1H. There are two kinds of Elements in the Distilled File—Prime Data Elements and Derivative Elements. The specification for each of these Elements in the Distilled File will contain references to Prime Data Elements resident in the Prime Data Sieve. For each of these references (from Element in Distilled File to Prime Data Element in the Prime Data Sieve) there will be a corresponding Reverse Link or Reverse Reference (from entry for the Prime Data Element in the Leaf Node Data structure to Element in the Distilled File) installed in the Leaf Node Data Structure. The Reverse Reference determines the offset within the Distilled File that marks the start of the losslessly reduced representation of the Element. In some embodiments, the Reverse Reference comprises the name of the Distilled File and an offset within that file which locates the start of the Element. As shown in FIG. 13, along with the Reverse Reference to each Element in the Distilled File, the leaf node data structure also keeps an indicator which identifies whether the Element being referred to in the Distilled File is a Prime Data Element (prime) or whether it is a Derivative Element (deriv). During the distillation process, the Reverse Links are installed into the Leaf Node Data Structures as and when Elements are placed into the Distilled File.

The Reverse Reference or Reverse Link is designed as a universal handle which can reach all Elements in all Distilled Files that share the Prime Data Sieve.

The addition of the Reverse References is not expected to significantly impact the data reduction achieved, since data element size is expected to be chosen such that each reference is a fraction of the size of the data element. For example, consider a system where Derivative Elements are constrained to each derive off no more than 1 Prime Data Element (so multi-element derivatives are not allowed). The total number of Reverse References across all Leaf Node Data Structures will equal the total number of Elements across all Distilled Files. Assume the sample input dataset of 32 GB size is reduced to 8 GB of losslessly reduced data, employing an average element size of 1 KB, and yielding a reduction ratio of 4×. There are 32M elements in the input data. If each Reverse Reference is 8 B in size, the total space occupied by the Reverse References is 256 MB, or 0.25 GB. This is a small increase to the 8 GB footprint of the reduced data. The new footprint will be 8.25 GB and the effective reduction achieved will be 3.88×, which represents a loss of reduction of 3%. This is a small price to pay for the benefits of powerful content associative data retrieval on the reduced data.

As described earlier in this document, the Distillation Apparatus can employ a variety of methods to determine the locations of the various components of the Skeletal Data Structure within the content of a candidate element. The various components of the Skeletal Data Structure of the element can be considered as Dimensions, so that a concatenation of these Dimensions followed by the rest of the content of each element is used to create the Name of each element. The Name is used to order and organize the Prime Data Elements in the tree.

In usage models where the structure of the input data is known, a schema defines the various fields or Dimensions. Such a schema is furnished by the Analytics Application that is using this Content Associative Data Retrieval Apparatus and is provided to the apparatus through an interface to the application. Based upon the declarations in the schema, the Parser of the Distillation Apparatus is able to parse the content of a candidate element to detect and locate the various Dimensions and create the Name of the candidate element. As described earlier, Elements that have the same content in the fields corresponding to the Dimensions will be grouped together along the same leg of the tree. For each Prime Data Element installed into the Sieve, the information on the Dimensions can be stored as metadata in the entry for that Prime Data Element in the Leaf Node Data Structure. This information can include the locations, sizes, and values of content at each of the declared Dimensions and can be stored in the field referred to in FIG. 13 as "Other Metadata for Prime Data Element".

FIG. 14A illustrates a sample schema that provides a description of the structure of the input dataset and a description of the correspondence between the structure of the input dataset and Dimensions in accordance with some embodiments described herein. Structure description 1402 is an excerpt or a portion of a more complete schema that describes the complete structure of the input data. Structure description 1402 includes a listing of keys (e.g., "PROD_ID," "MFG," "MONTH," "CUS_LOC," "CATEGORY," and "PRICE") followed by the type of value that corresponds to the key. The colon character ":" is used as a delimiter to separate the key from the type of the value, and the semicolon character ";" is used as a delimiter to separate distinct pairs of keys and the corresponding type of value. Note that the complete schema (of which Structure 1402 is a part) may specify additional fields to identify the start and end of each input, and also possibly other fields outside of Dimensions. Dimension mapping description 1404 describes how the Dimensions that are used for organizing Prime Data Elements map to the key values in the structured input dataset. For example, the first line in Dimension mapping description 1404 specifies that the first four bytes (because the first line ends with the text "prefix=4") of the value corresponding to the key "MFG" in the input dataset is used to create Dimension 1. The remaining lines in Dimension mapping description 1404 describe how to create the other three dimensions based on the structured input data. In this mapping of keys to Dimensions, the order of the keys as they appear in the input does not necessarily match the order of the Dimensions. Using the schema descriptions provided, the parser can recognize these Dimensions in the input data to create the Name of the candidate element. For the example in FIG. 14A, and using Dimension mapping description 1404, the Name of a candidate element will be created as follows—(1) the first 4 bytes of the Name will be the first 4 bytes from the value corresponding to the key "MFG" which is declared as Dimension 1, (2) the next 4 bytes of the Name will be the first 4 bytes from the value corresponding to the key "CATEGORY" which is declared as Dimension 2, (3) the next 3 bytes of the Name will be the first 3 bytes from the value corresponding to the key "CUS_LOC" which is declared as Dimension 3, (4) the next 3 bytes of the Name will be the first 3 bytes from the value corresponding to the key "MONTH" which is declared as Dimension 4, (5) the next set of the bytes of the Name will be comprised of a concatenation of the rest of the bytes from the Dimensions, (6) and finally, after all the bytes of the Dimensions are exhausted, the rest of the bytes of the Name will be the created from a concatenation of the rest of the bytes of the candidate element.

The schemas furnished by the application driving this apparatus may specify a number of Primary Dimensions as well as a number of Secondary Dimensions. Information for all of these Primary and Secondary Dimensions can be retained in the metadata in the Leaf Node Data Structure. The Primary Dimensions are used to form the principal axis along which to sort and organize the elements in the Sieve. If Primary Dimensions are exhausted and subtrees with large membership still remain, then Secondary Dimensions may also be used deeper down the tree to further subdivide the elements into smaller groups. Information on the Secondary Dimensions can be retained as metadata and also used as secondary criteria to differentiate the elements within a leaf node. In some embodiments offering content associative multidimensional search and retrieval, a requirement may be placed that all incoming data must contain the keys and valid values for each of the Dimensions declared by the schema. This allows the system a way to ensure that only valid data enters the desired subtrees in the Sieve. Candidate elements which either do not contain all fields specified as Dimensions or which contain invalid values in the values corresponding to the fields for the Dimensions will be sent down a different subtree as illustrated earlier in FIG. 3E.

The Data Distillation apparatus is constrained in one additional way in order to comprehensively support content associative search and retrieval of data based upon the content in the Dimensions. When Derivative Elements are created off a Prime Data Element, the Deriver is constrained to ensure that both the Prime Data Element and the Derivative have the exact same content in the value fields for each of the corresponding Dimensions. Thus, when a derivative is being created, the Reconstitution Program is not allowed to perturb or modify the content in the value fields corresponding to any of the Dimensions of the Prime Data Element, in order to construct the Derivative Element. Given a candidate element, during lookup of the Sieve, if the candidate element has different content in any of the Dimensions compared to the corresponding Dimensions of the target Prime Data Element, a fresh Prime Data Element needs to be installed, rather than accept the derivative. For example, if a subset of the Primary Dimensions sufficiently sort the elements into distinct groups in the tree so that a candidate element arrives at a leaf node to find a Prime Data Element that has the same content in this subset of Primary Dimensions but different content in either the remaining Primary Dimensions or the Secondary Dimensions, then, instead of creating a derivative, a fresh Prime Data Element needs to be installed. This feature ensures that all data can be searched using the Dimensions by simply querying the Prime Data Sieve.

The Deriver may employ a variety of implementation techniques to enforce the constraint that the Candidate Element and the Prime Data Element must have the exact same content in the value fields for each of the corresponding Dimensions. The Deriver may extract information comprising the locations, lengths and content of the fields corresponding to the Dimensions from the Skeletal Data Structure of the Prime Data Element. Similarly, this information is received from the Parser/Factorizer or computed for the Candidate Element. Next the corresponding fields for the Dimensions from the candidate Element and the Prime Data Element can be compared for equality. Once confirmed to be equal, the Deriver may proceed with the rest of the Derivation. If there is no equality, the Candidate Element is installed in the Sieve as a fresh Prime Data Element.

The restrictions described above are not expected to significantly hamper the degree of data reduction for most usage models. For example, if input data is comprised of a set of Elements which are data warehouse transactions of size 1000 bytes each, and if a set of 6 Primary Dimensions and 14 Secondary Dimensions are specified by the schema, each with say 8 bytes of data per Dimension, the total bytes occupied by content at the Dimensions is 160 bytes. No perturbations are allowed on these 160 bytes when creating a derivative. This would still leave the remaining 840 bytes of candidate element data available for perturbation to create derivatives, thus leaving ample opportunity for exploitation of redundancy, while simultaneously enabling the data from the data warehouse to be searched and retrieved in a content associative manner using the Dimensions.

To execute a search query for data containing specific values for fields in the Dimensions, the apparatus can traverse the tree and reach a node in the tree that matches the Dimensions specified, and all Leaf Node Data structures below that node can be returned as the result of the lookup. References to Prime Data Elements present at the Leaf Node can be used to fetch the desired Prime Data Elements if required. The Reverse Links enable retrieval of the input Element (in losslessly reduced format) from the Distilled File, if so desired. The Element can subsequently be reconstituted to yield the original input data. Thus, the enhanced apparatus allows all the searching to be done on data in the Prime Data Sieve (which is a smaller subset of the total data) while yet being able to reach and retrieve all derivative elements as needed.

The apparatus as enhanced can be used to execute search and lookup Queries for powerful searches and retrieval of relevant subsets of data based upon the content in Dimensions specified by the query. A Content Associative Data Retrieval Query will have the form "Fetch (Dimension 1, value of Dimension 1; Dimension 2, Value of Dimension 2; . . . ). The Query will specify the Dimensions involved in the search as well as the values to be used for each of the specified Dimensions for content associative search and lookup. A query may specify all the Dimensions or it may specify only a subset of the Dimensions. The Queries may specify compound conditions based on multiple dimensions as the criteria for the search and retrieval. All data in the Sieve which has the specified values for the specified Dimensions will be retrieved.

A variety of Fetch queries can be supported and made available to the Analytics Application that is using this Content Associative Data Retrieval Apparatus. Such queries will be furnished to the apparatus through an interface from the application. The interface provides queries from the application to the apparatus and returns results of queries from the apparatus to the application. Firstly, a query FetchRefs can be used to fetch a reference or Handle to the Leaf Node Data Structure in FIG. 13 (along with the Child ID or index of the entry) for each Prime Data Element that matches the query. A second form of query FetchMetaData can be used to fetch the metadata (including the Skeletal Data Structure, information on the Dimensions, and References to Prime Data Elements) from the entry in the Leaf Node Data Structure in FIG. 13 for each Prime Data Element that matches the query. A third form of query FetchPDEs will fetch all the Prime Data Elements that match the search criteria. Another form of query FetchDistilledElements will fetch all Elements in the Distilled File that match the search criteria. Yet another form of query FetchElements will fetch all Elements in the Input Data that match the search criteria. Note that for the FetchElements query, the apparatus will first fetch Distilled Elements and then reconstitute the relevant Distilled Elements into Elements from the Input Data and return these as the results of the query.

In addition to such multidimensional content associative Fetch primitives, the interface may also provide to the application the capability to directly access Prime Data Elements (using the Reference to the Prime Data Element) and Elements in the Distilled File (using the Reverse Reference to the Element). Additionally, the interface may provide to the application the capability to Reconstitute a Distilled Element in the Distilled File (given a Reference to the Distilled Element) and deliver the Element as it existed in the Input Data.

A judicious combination of these queries can be used by an Analytics application to perform searches, determine relevant unions and intersections, and glean important insights.

Figure 14B:
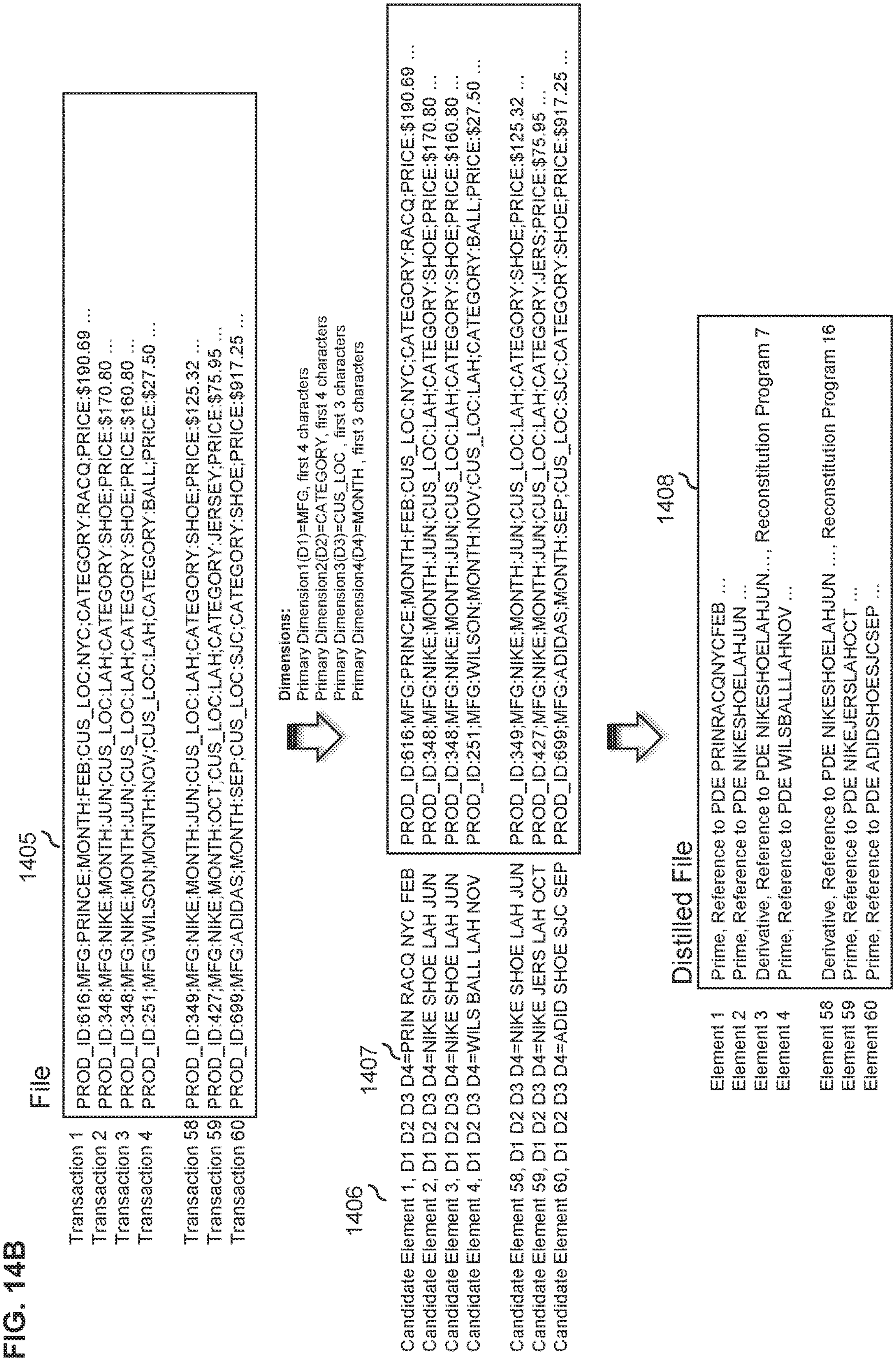

FIG. 14B explained below illustrates an example of an input dataset with structure described in structure description 1402. In this example, the input data contained in File 1405 contains e-commerce transactions. The input data is converted into a series of candidate elements 1406 by the parser in the data distillation apparatus, using the schema and Dimension declarations in FIG. 14A. Note how the leading bytes of the Name of each candidate element are comprised of content from the Dimensions. For example, the leading bytes for Name 1407 for Candidate Element 1 is PRINRACQNYCFEB. These Names are used to organize the candidate elements in tree form. After data reduction is complete, the distilled data is placed in Distilled File 1408.

Figure 14C:
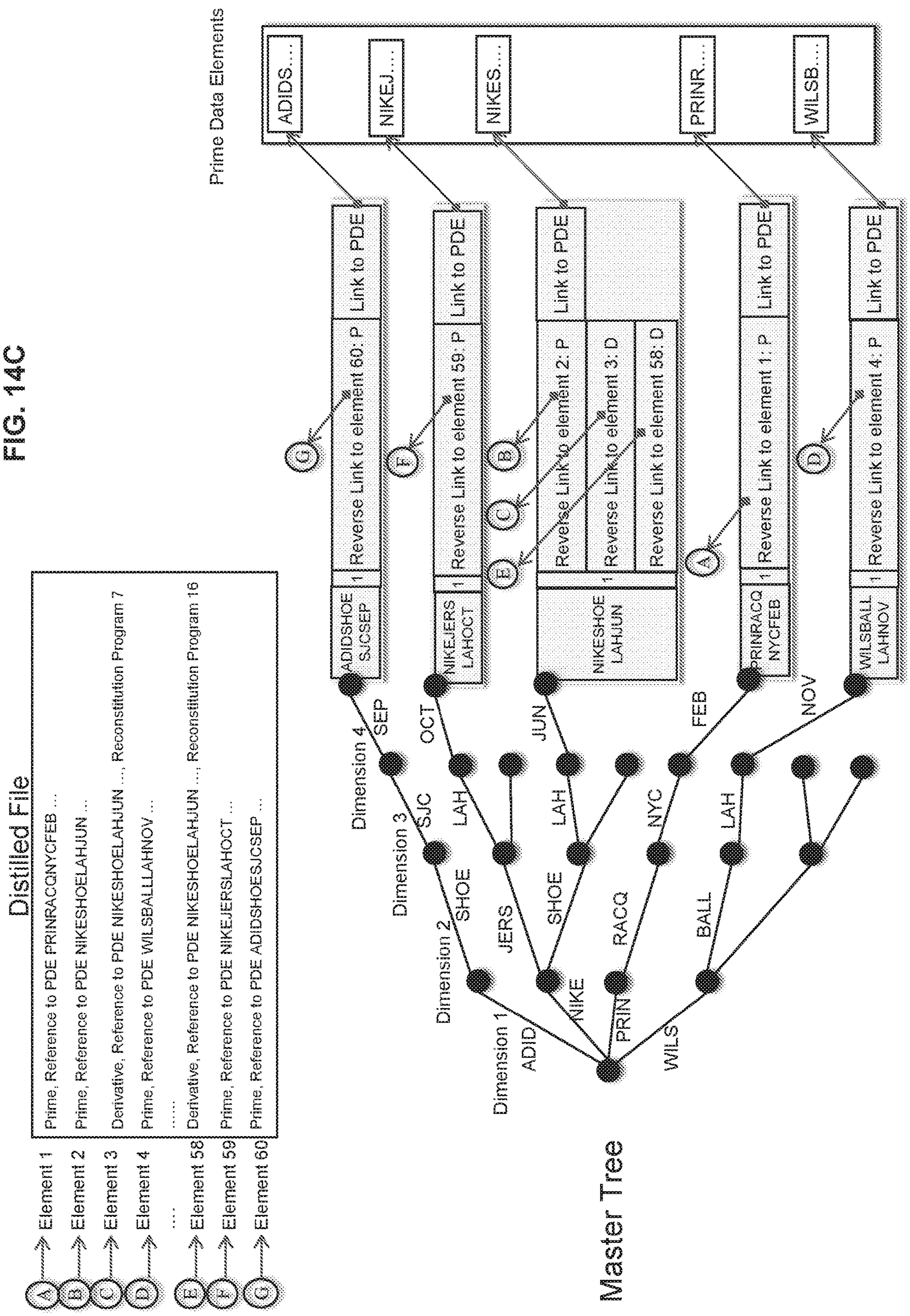

FIG. 14C explained below illustrates how Dimension mapping description 1404 can be used to parse the input dataset illustrated in FIG. 14A according to structure description 1402, determine Dimensions according to dimension mapping description 1404, and organize Prime Data Elements in a tree based on the determined Dimensions. In FIG. 14C, Prime Data Elements are organized in a Master Tree using a total of 14 characters taken from 4 Dimensions. Shown in the Master Tree is a portion of the Leaf Node Data Structure for the various Prime Data Elements. Note that for purposes of easy viewing, the complete Leaf Node Data structure of FIG. 13 is not shown. However, FIG. 14C shows the Path Info or name of each entry in the leaf node data structure, the Child ID, all Reverse References or Reverse Links from Prime Data Elements to Elements in the Distilled File along with indicator of whether the Element in the Distilled File is "prime" (denoted by P) or "deriv" (denoted by D), and also the Reference to the Prime Data Element. FIG. 14C shows 7 elements in the Distilled File mapped to 5 Prime Data Elements in the Master Tree. In FIG. 14C, Reverse Link A for Prime Data Element with Name PRINRACQNYCFEB refers back to Element 1 in the Distilled File. Meanwhile, Prime Data Element with name NIKESHOELAHJUN has 3 Reverse Links B, C, and E to Element 2, Element 3, and Element 58 reply. Note that Element 3 and Element 58 are derivatives of Element 2.

Figure 14D:
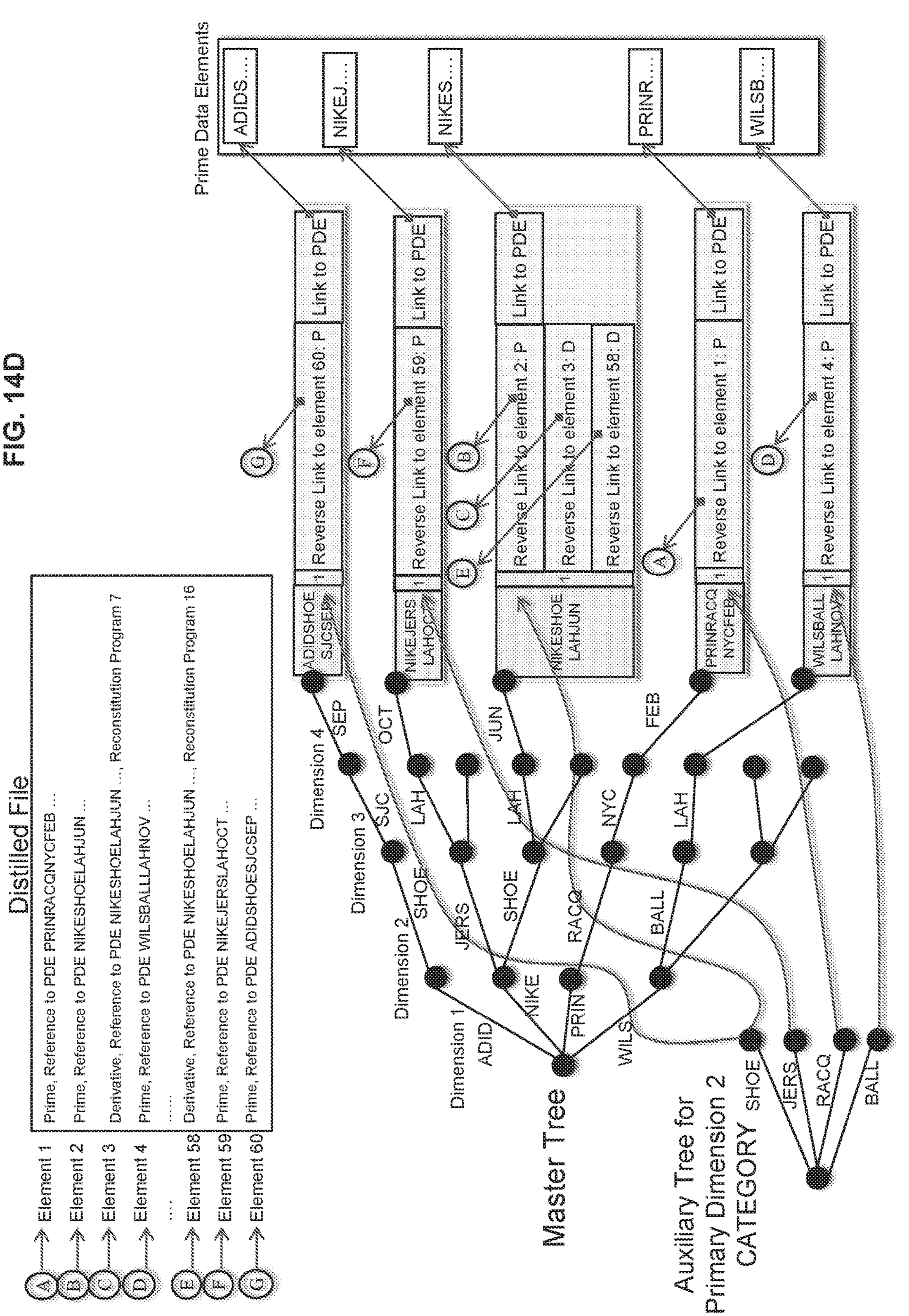

FIG. 14D shows an auxiliary index or auxiliary tree created from the Dimensions to improve the efficiency of searches. In this example the auxiliary mapping tree created is based on Dimension 2 (which is CATEGORY). By directly traversing this auxiliary tree, all elements of a given CATEGORY in the input data can be found without more expensive traversals of the master tree that might otherwise have been incurred. For example, a traversal down the leg that is denoted by "SHOE" leads directly to two Prime Data Elements for shoes which are ADIDSHOESJCSEP and NIKESHOELAHJUN.

Alternatively, such an auxiliary tree may be based on Secondary Dimensions and used to aid in rapid convergence of searches using the Dimensions.

Examples of Queries executed on the apparatus shown in FIG. 14D will now be provided. The Query FetchPDEs (Dimension1, NIKE;) will return two Prime Data Elements named NIKESHOELAHJUN and NIKEJERSLAHOCT. The Query FetchDistilledElements (Dimension 1, NIKE;) will return Element 2, Element 3, Element 58, and Element 59 which will be Distilled Elements in the losslessly reduced format. The Query FetchElements (Dimension 1, NIKE; Dimension 2, SHOE) will return Transaction 2, Transaction 3, and Transaction 58 from the input data File 1405. The Query FetchMetadata (Dimension 2, SHOES) will return the metadata stored in the leaf node data structure entry for each of the two Prime data Elements named ADIDSHOESJCSEP and NIKESHOELAHJUN.

The apparatus described thus far can be used to support searches based upon content that is specified in fields called Dimensions. Additionally, the apparatus can be used to support searches based upon a listing of keywords that are not included in the listing of Dimensions. Such keywords may be provided to the apparatus by an application such as a search engine that is driving the apparatus. The keywords may be specified to the apparatus via a schema declaration or passed in via a keyword list containing all the keywords, each separated by a declared separator (such as spaces, or commas, or linefeeds). Alternatively, both a schema as well as a keyword list may be used to collectively specify all the keywords. A very large number of keywords may be specified—the apparatus places no limit on the number of keywords. These search keywords will be referred to as Keywords. The apparatus can maintain an inverted index for search using these Keywords. The inverted index contains for each Keyword a listing of Reverse References to Elements in the Distilled Files that contain this Keyword.

Based upon the Keyword declarations in the schema or the Keyword list, the Parser of the Distillation Apparatus can parse the content of a candidate element to detect and locate the various Keywords (if and where found) in the incoming candidate element. Subsequently, the candidate element is converted into either a Prime Data Element or Derivative Element by the Data Distillation Apparatus and placed as an Element in the Distilled File. The inverted index for the Keywords that were found in this Element can be updated with Reverse References to this Element in the Distilled File. For each keyword found in the Element, the inverted index is updated to include a Reverse Reference to this Element in the Distilled File. Recall that Elements in the Distilled File are in the losslessly reduced representation.

Upon a search Query of the data using a Keyword, the inverted index is consulted to find and extract Reverse References to Elements in the Distilled File that contain this Keyword. Using the Reverse Reference to such an Element, the losslessly reduced representation of the Element can be retrieved, and the Element can be reconstituted. The Reconstituted Element can then be provided as the result of the search Query.

The inverted index can be enhanced to contain information which locates the offset of the Keyword in the Reconstituted Element. Note that the offset or location of each Keyword detected in the candidate element can be determined by the Parser and hence this information can also be recorded in the inverted index when the Reverse Reference to the Element in the Distilled File is placed into the inverted index. Upon a search Query, after the inverted index is consulted to retrieve a Reverse Reference to an Element in the Distilled File that contains the relevant Keyword, and after the Element is reconstituted, the recorded offset or location of the Keyword in the Reconstituted Element (same as the original input candidate element) can be used to pinpoint where the Keyword exists in the Input data or Input File.

FIG. 15 illustrates the inverted index to facilitate search based on Keywords. For each Keyword, the inverted index contains pairs of values—the first is a Reverse Reference to the losslessly reduced Element in the Distilled File that contains the Keyword, and the second value is the Offset of the Keyword in the Reconstituted Element.

Dimensions and Keywords have different implications to the Prime Data Sieve in the Data Distillation Apparatus. Note that the Dimensions are used as the principal axes along which to organize Prime Data Elements in the Sieve. Dimensions form the Skeletal Data Structure of each Element in the data. The Dimensions are declared based upon knowledge of the structure of the incoming data. The Deriver is constrained such that any Derivative Element that is created must have the exact same content as the Prime Data Element in the values of the fields for each of the corresponding Dimensions.

These properties need not hold for the Keywords. In some embodiments, neither is there an a priori requirement that the Keywords even exist in the data, nor is the Prime Data Sieve required to be organized based on the Keywords, and nor is the Deriver constrained with regards to derivations involving content containing the Keywords. The Deriver is free to create a derivative from a Prime Data Element by modifying the values of Keywords if necessary. The locations of the Keywords are simply recorded where found upon scanning the input data, and the inverted index is updated. Upon a content associative search based on the Keywords, the inverted index is queried and all locations of the Keywords are obtained.

In other embodiments, the Keywords are not required to exist in the data (the absence of Keywords in the data does not invalidate the data), but the Prime Data Sieve is required to contain all Elements that contain Keywords, and the Deriver is constrained with regards to derivations involving content containing the Keywords—no derivations are allowed other than reducing duplicates. The purpose of these embodiments is that all distinct Elements containing any Keyword must exist in the Prime Data Sieve. This is an example where the rules governing the selection of Prime Data are conditioned by the Keywords. In these embodiments, a modified inverted index may be created which contains, for each Keyword, a Reverse Reference to each Prime Data Element containing the Keyword. On these embodiments, powerful Keyword-based search capability is realized, wherein searching only the Prime Data Sieve is as effective as searching the entire data.

Other embodiments may exist where the Deriver is constrained so that the Reconstitution Program is not allowed to perturb or modify the contents of any Keyword found in the Prime Data Element, in order to formulate a Candidate Element as a Derivative Element of that Prime Data Element. The Keyword needs to propagate unchanged from the Prime Data Element to the Derivative. If the Deriver needs to modify bytes of any Keyword found in the Prime Data Element in order to successfully formulate the candidate as a derivative of this Prime Data Element, the Derivative may not be accepted, and the candidate must be installed as a fresh Prime Data Element in the Sieve.

The Deriver may be constrained in a variety of ways with regards to derivations involving the Keywords so that the rules governing the selection of Prime Data are conditioned by the Keywords.

The apparatus for Search of data using Keywords can accept updates to the listing of Keywords. Keywords can be added without any changes to the data that is stored in losslessly reduced form. When new Keywords are added, fresh incoming data can be parsed against the updated Keyword list, and the inverted index updated with the incoming data subsequently being stored in losslessly reduced form. If the existing data (that is already stored in losslessly reduced form) needs to be indexed against the new Keywords, the apparatus can progressively read in the Distilled Files (either one or more Distilled Files at a time, or one Losslessly Reduced Data Lot at a time), reconstitute the original files (but without disturbing the losslessly reduced stored data), and parse the reconstituted files to update the inverted index. All this while, the entire data repository can continue to remain stored in losslessly reduced form.

Figure 16A:
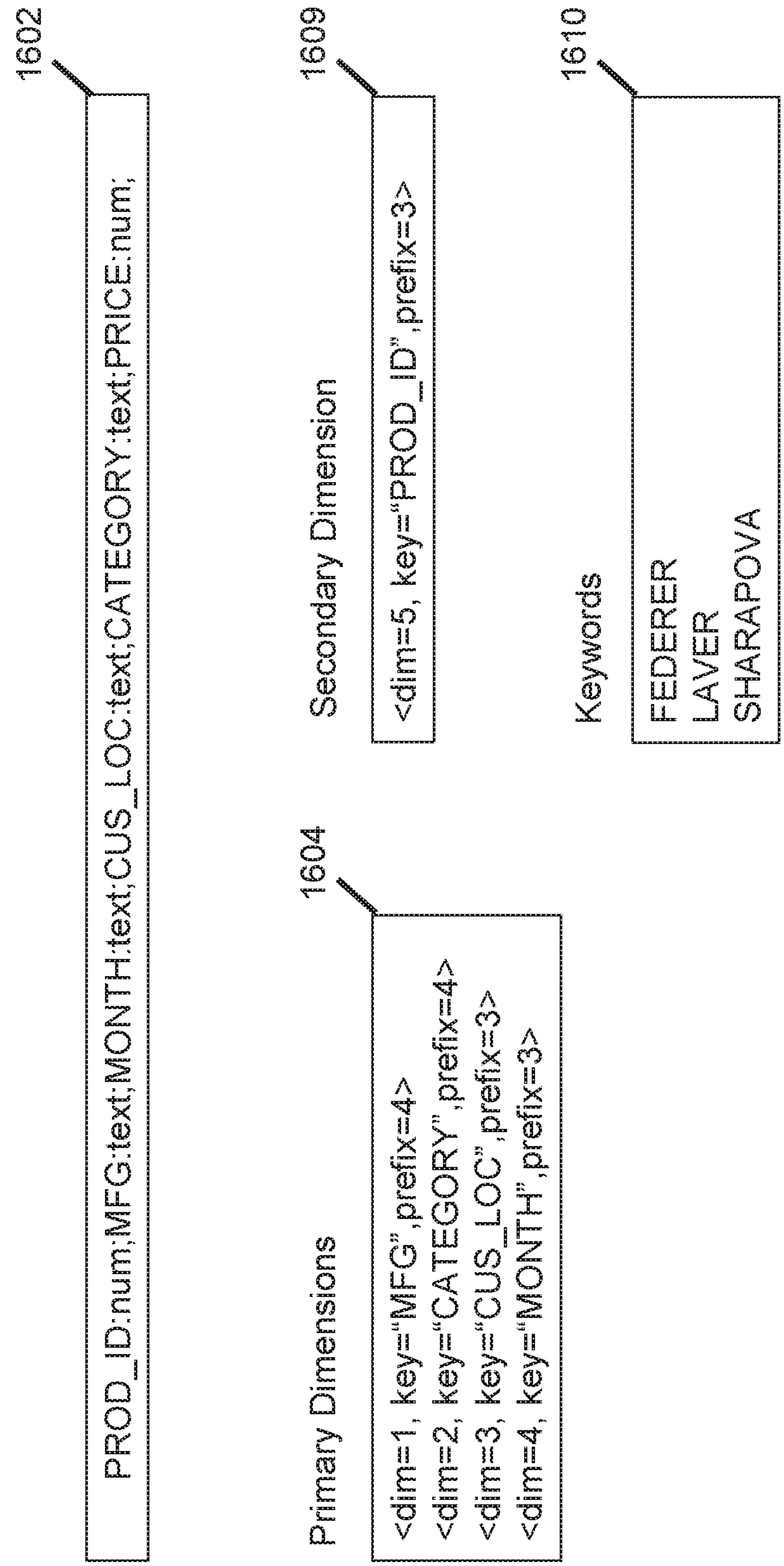
Figure 16C:
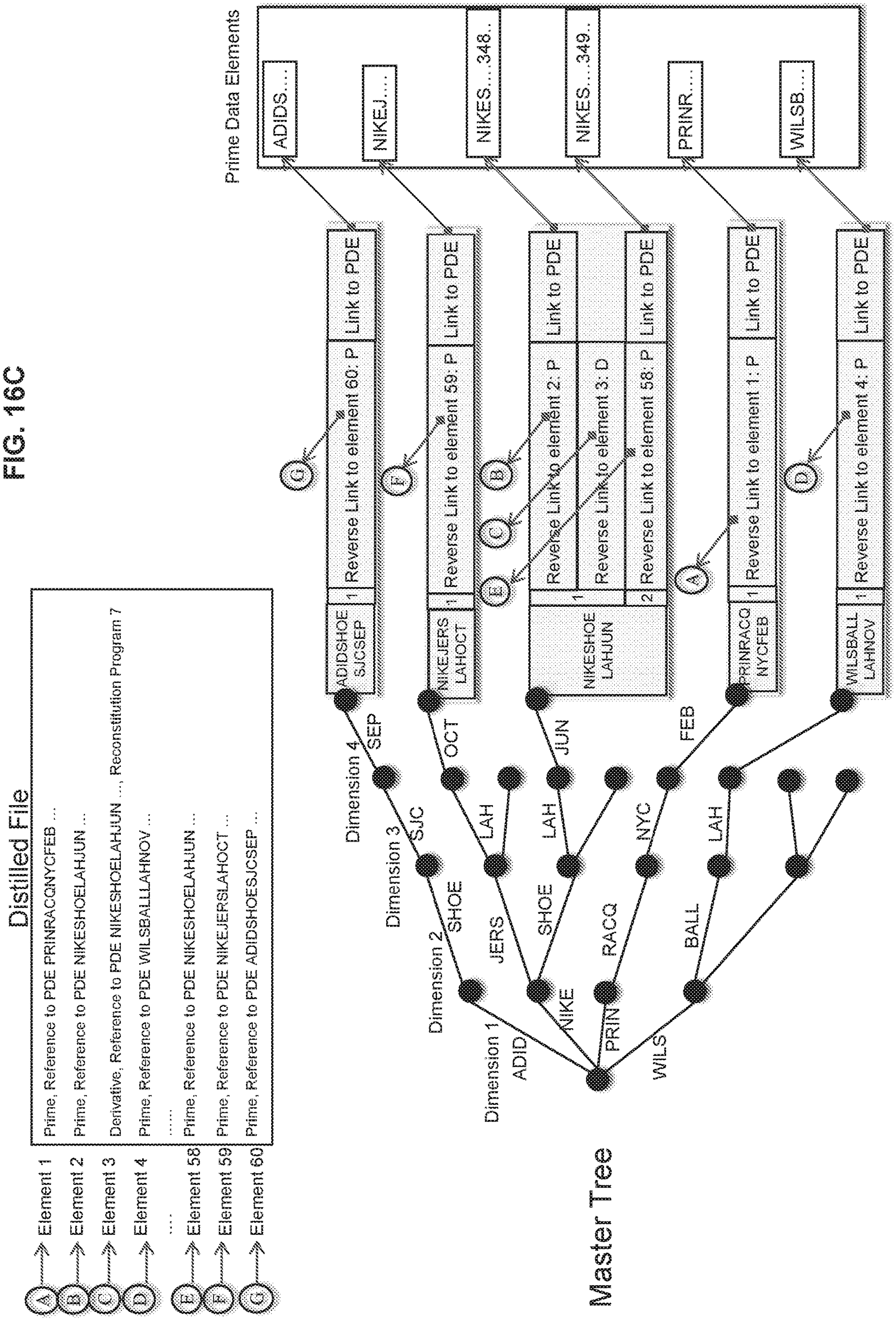

FIG. 16A illustrates a schema declaration that is a variation of the schema shown in FIG. 14A. The schema in FIG. 16A includes a declaration of a Secondary Dimension 1609 and a listing of Keywords 1610. FIG. 16B illustrates an example of an input dataset 1611 with structure described in structure description 1602, which is parsed and converted into a set of candidate elements with names based on the declared Primary Dimensions. The candidate elements are converted into Elements in Distilled File 1613. The declaration of the Secondary Dimension "PROD_ID" places a constraint on the Deriver such that candidate element 58 may not be derived from the Prime Data Element "NIKESHOELAHJUN with PROD_ID=348", and hence one additional Prime Data Element "NIKESHOELAHJUN with PROD_ID=349" is created in the Prime Data Sieve. Although the input dataset is the same as that shown in FIG. 14B, the outcome of the distillation is to yield 7 Distilled Elements but 6 Prime Data Elements. FIG. 16C shows the Distilled File, the Master Tree, and the Prime Data Elements created as a result of the distillation process.

Figure 16D:
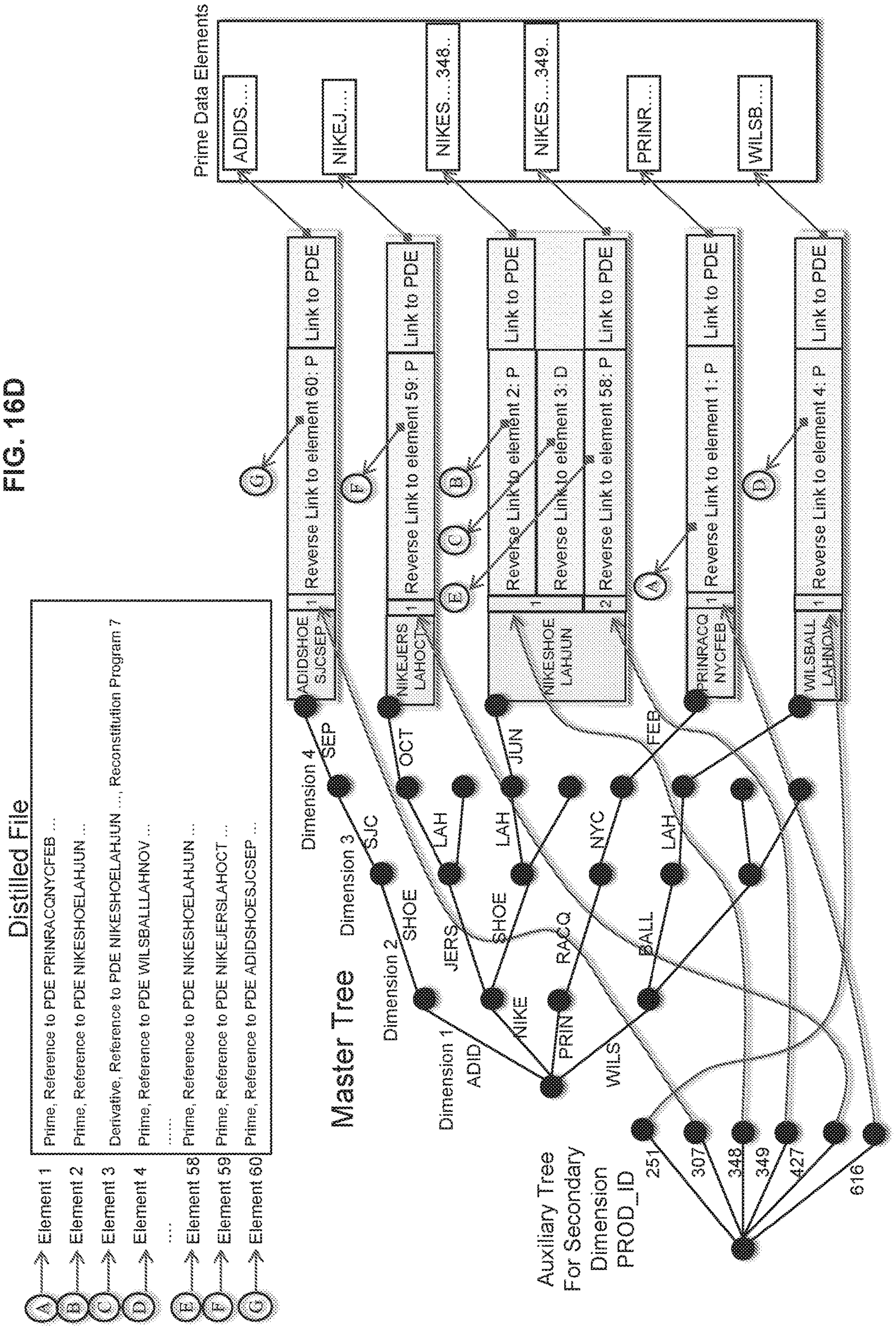

FIG. 16D illustrates an auxiliary tree created for the Secondary Dimension "PROD_ID". Traversing this tree with a specific PROD_ID value leads a Prime Data Elements with that particular PROD_ID. For example the Query FetchPDEs (Dimension 5, 251), or alternatively the Query FetchPDEs (PROD_ID, 251), which asks for Prime Data Elements with PROD_ID=251 yields the Prime Data Element WILSBALLLAHNOV.

Figure 16E:
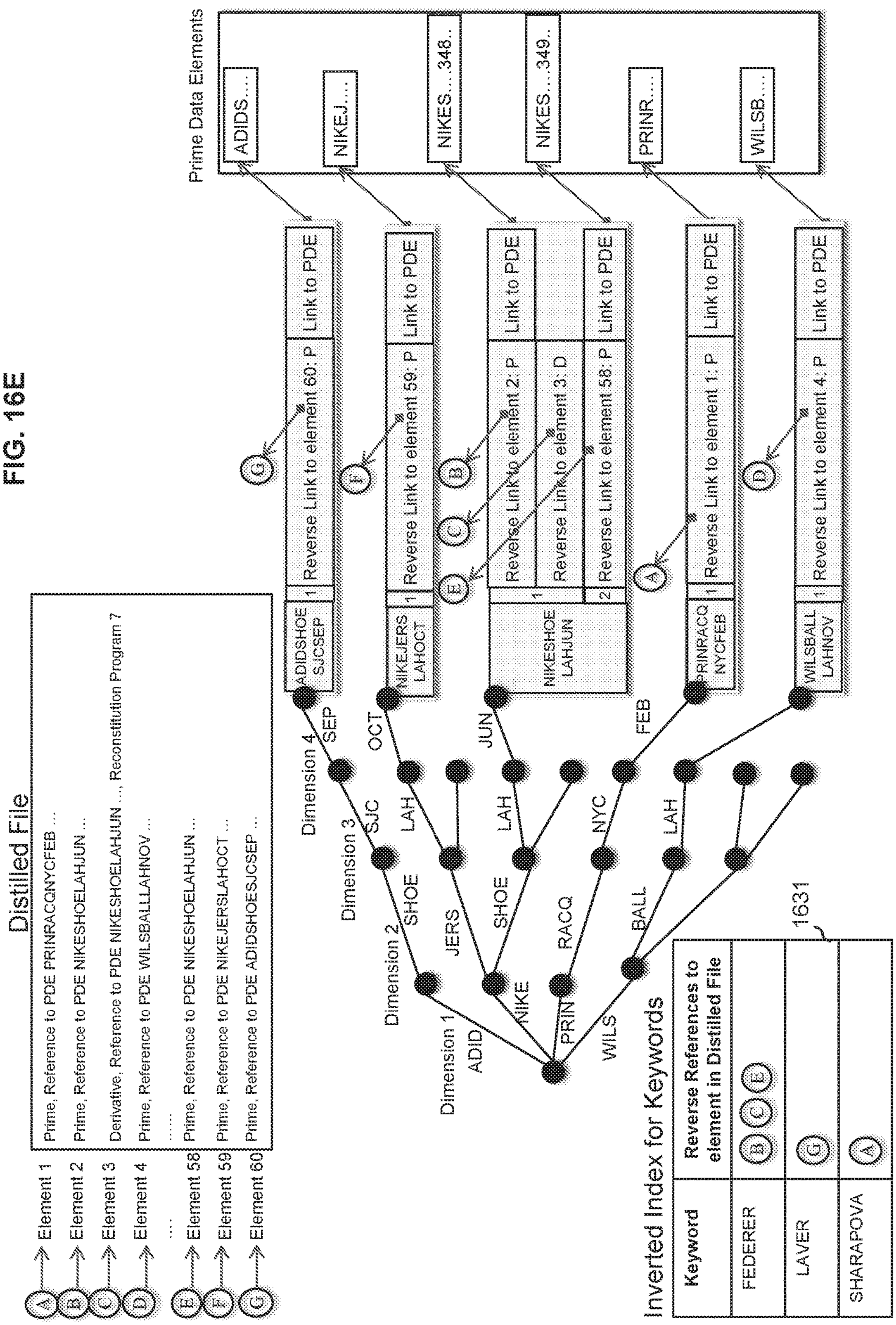

FIG. 16E illustrates an inverted index (labeled Inverted Index For Keywords 1631) created for the 3 Keywords declared in FIG. 16A Structure 1610. These Keywords are FEDERER, LAVER, and SHARAPOVA. The inverted index is updated after parsing and consuming the input dataset 1611. The Query FetchDistilledElements (Keyword, Federer) will utilize the inverted index (rather than the Master Tree or Auxiliary Tree) to return Element 2, Element 3, and Element 58.

Figure 17:
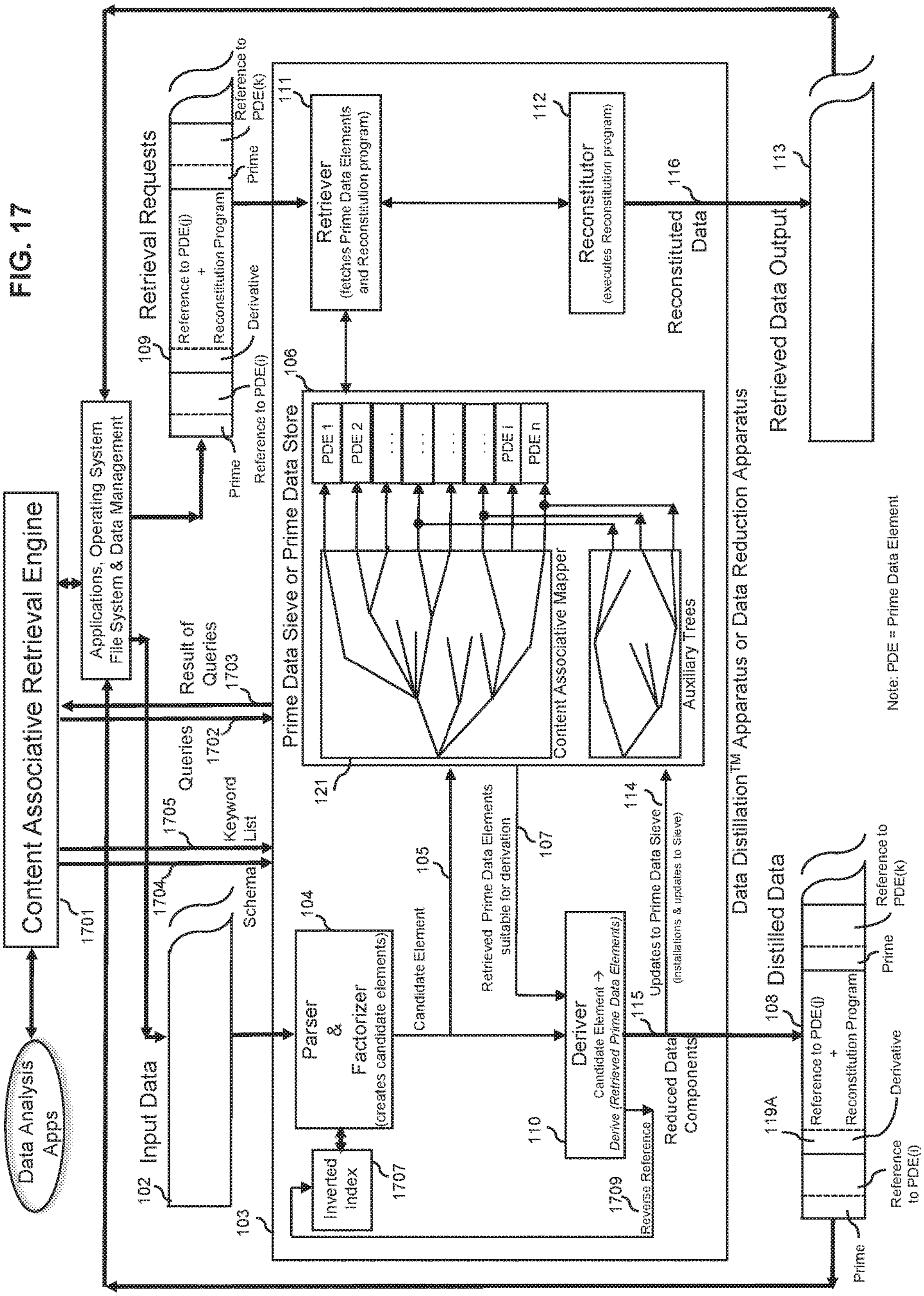

FIG. 17 shows a block diagram of the overall apparatus as enhanced for Content Associative Data Retrieval. Content Associative Data Retrieval Engine 1701 provides the Data Distillation apparatus with Schema 1704 or structure definitions including Dimensions for the data. It also provides the apparatus with Keyword lists 1705. It issues Queries 1702 for search and retrieval of data from the Distillation Apparatus, and receives the results of the queries as Results 1703. Deriver 110 is enhanced to be aware of the declarations of the Dimensions to prohibit modification of content at the locations of the Dimensions when creating a derivative. Note that the Reverse References from entries in the leaf node data structure to Elements in the Distilled Files are stored in the leaf node data structures in Prime Data Sieve 106. Likewise, auxiliary indexes are also stored in Prime Data Sieve 106. Also shown is Inverted Index 1707 which is updated with Reverse Reference 1709 by Deriver 110 when the Element is being written to the Distilled Data. This Content Associative Data Retrieval Engine interacts with other Applications (such as Analytics, Data Warehousing, and Data Analysis Applications), providing them with results of executed Queries.

In summary, the enhanced Data Distillation apparatus enables powerful multidimensional content associative search and retrieval on data that is stored in losslessly reduced form.

The Data Distillation™ apparatus can be employed for the purposes of lossless reduction of audio and video data. The data reduction accomplished by the method is achieved by deriving components of the audio and video data from prime data elements resident in a content associative sieve. Applications of the method for such purposes will now be described.

FIGS. 18A-B show a block diagram for an Encoder and Decoder for compression and decompression of audio data according to the MPEG 1, Layer 3 Standard (also referred to as MP3). MP3 is an audio coding format for digital audio which uses a combination of lossy and lossless data reduction techniques to compress incoming audio. It manages to compress Compact Disc (CD) audio down from 1.4 Mbps to 128 Kbps. MP3 takes advantage of the limitations of the human ear to suppress components of the audio that will not be perceptible to the human ear of most people. To achieve this, a set of techniques collectively referred to as Perceptual Coding techniques are employed, which lossily but imperceptibly reduce the size of a snippet of audio data. The Perceptual Coding techniques are lossy, and information lost during these steps cannot be regained. These Perceptual Coding techniques are supplemented by Huffman Coding, which is a lossless data reduction technique described earlier in this document.

In MP3, the incoming audio stream is compressed into a sequence of several small data frames, each containing a frame header and compressed audio data. The original audio stream is periodically sampled to produce a sequence of snippets of audio which are then compressed employing Perceptual Coding and Huffman Coding to produce a sequence of MP3 data frames. Both the Perceptual Coding and Huffman Coding techniques are applied locally within each snippet of the audio data. The Huffman Coding technique exploits redundancy locally within a snippet of audio but not globally across the audio stream. Thus the MP3 techniques do not exploit redundancy globally—neither across a single audio stream, nor between multiple audio streams. This represents an opportunity for further data reduction beyond what MP3 can achieve.

Each MP3 data frame represents an audio snippet of 26 ms. Each frame stores 1152 samples and is subdivided into two granules each containing 576 samples. As can be seen in the Encoder Block Diagram in FIG. 18A, during encoding of a digital audio signal, time domain samples are taken and converted into 576 frequency domain samples through a process of filtering and by application of the Modified Discrete Cosine Transform (MDCT). Perceptual Coding techniques are applied to reduce the amount of information contained in the samples. The output of the Perceptual Coding is a Non-uniformly Quantized Granule 1810 which contains reduced information per frequency line. Huffman Coding is then used to further reduce the size of the granules. The 576 frequency lines of each granule may use multiple Huffman tables for their encoding. The output of the Huffman Encoding is the main Data component of the frame comprising scale factors, Huffman encoded bits, and ancillary data. Side information (used to characterize and locate various fields) is placed into the MP3 Header. The output of the Encoding is an MP3 encoded audio signal. At a BitRate of 128 Kbps, the size of an MP3 frame is 417 or 418 bytes.

Figure 18C:
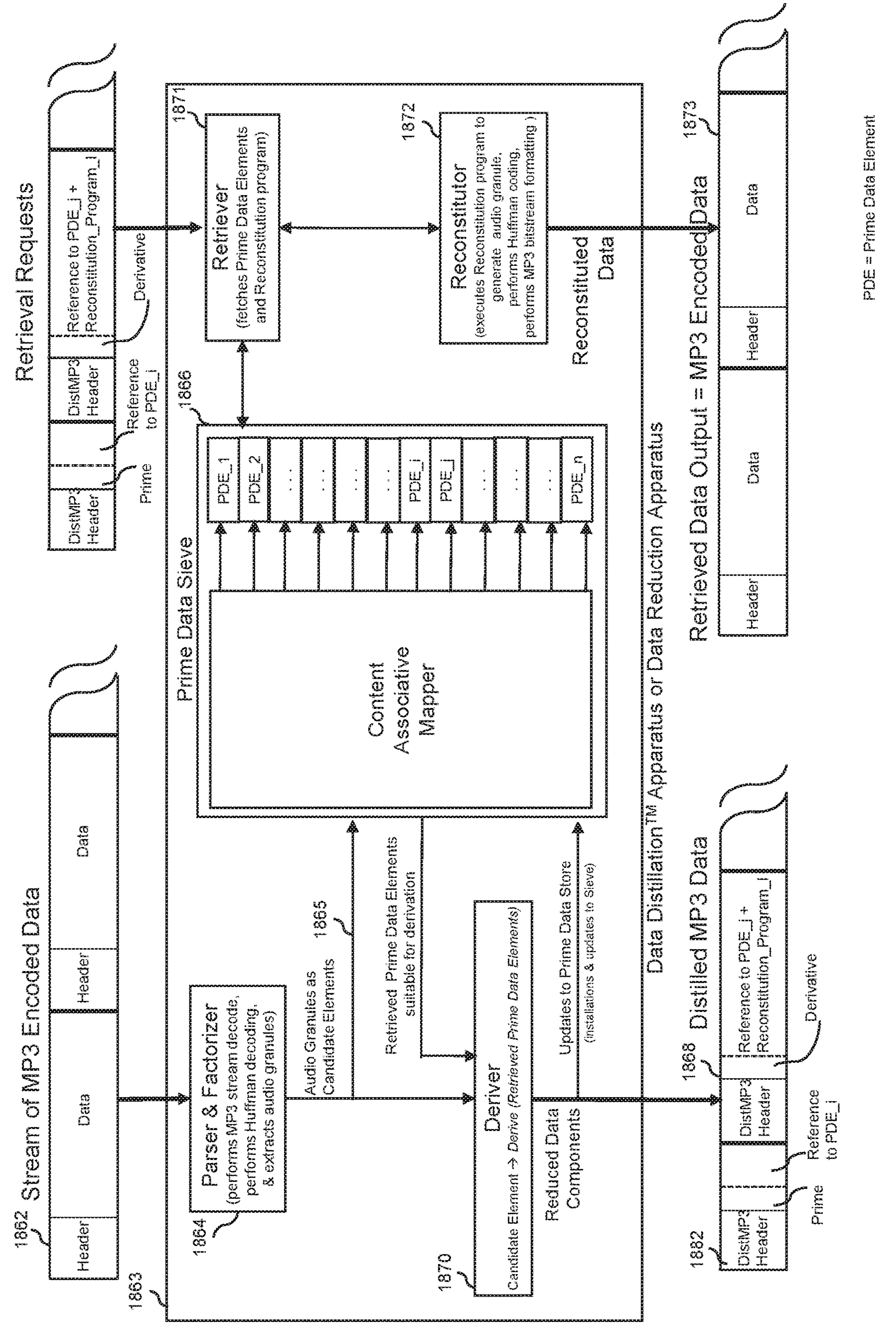
FIG. 18C shows how the Data Distillation apparatus first shown in FIG. 1A can be enhanced to perform data reduction on MP3 data.

FIG. 18C shows how the Data Distillation apparatus first shown in FIG. 1A can be enhanced to perform data reduction on MP3 data. The method illustrated in FIG. 18C factorizes the MP3 data into candidate elements and exploits redundancy between elements at a grain finer than the element itself. For MP3 data, the Granule is chosen as the Element. In one embodiment, the Non-uniformly Quantized Granule 1810 (as shown in FIG. 18A) may be treated as the Element. In another embodiment the Element may be comprised of a concatenation of the Quantized Frequency Lines 1854 and the ScaleFactors 1855.

In FIG. 18C, the Stream of MP3 Encoded Data 1862 is received by the Data Distillation Apparatus 1863 and reduced into a stream of Distilled MP3 Data 1868, stored in the losslessly reduced form. The incoming Stream of MP3 Encoded Data 1862 comprises of a sequence of pairs of MP3 Header and MP3 Data. The MP3 Data includes CRC, Side Information, Main Data and Ancillary Data. The outgoing Distilled MP3 Data created by the apparatus comprises of a similar sequence of pairs (each pair being a DistMP3 Header followed by an Element Specification in losslessly reduced format). The DistMP3 Header contains all the components of the original frame other than the Main Data, namely it contains the MP3 Header, CRC, Side Information, and Ancillary Data. The Element field in this Distilled MP3 Data contains Granules specified in losslessly reduced form. Parser/Factorizer 1864 performs a first decoding of the incoming MP3 Encoded Stream (including performing Huffman decoding) to extract the Quantized Frequency Lines 1851 and ScaleFactors 1852 (which are shown in FIG. 18B) and to generate Audio Granule 1865 as a Candidate Element. The first decoding steps performed by the Parser/Factorizer are the same as the steps of Sychronization and Error Checking 1851, Huffman Decoding 1852, and Scale Factor Decoding 1853 of FIG. 18B—these steps are performed in any standard MP3 Decoder and are well known in the existing art. Prime Data Sieve 1866 contains Granules as Prime Data Elements, organized to be accessed in a Content Associative manner. During installation of a Granule into the Prime Data Sieve, the content of the Granule is used to ascertain where in the Sieve the Granule should be installed and to update the Skeletal Data Structure and metadata in the appropriate leaf node of the Sieve. Subsequently, the Granule is Huffman Coded and compressed so that it can be stored in the Sieve with a footprint no greater than the footprint it occupied when residing in the MP3 Data. Whenever a Granule in the Sieve is needed as a Prime Data Element by the Deriver, the Granule is decompressed before it is furnished to the Deriver. Using the Data Distillation Apparatus, incoming Audio Granules are derived by Deriver 1870 from Prime Data Elements (which are also Audio Granules) resident in the Sieve, and a losslessly reduced representation or distilled representation of the Granule is created and placed in the Distilled MP3 Data 1868. This distilled representation of the Granule is placed into the Element field replacing the Huffman Coded information that originally existed in the Main Data field of the MP3 frame. The distilled representation of each Element or Granule is encoded using a format shown in FIG. 1H—each Element in the Distilled Data is either a Prime Data Element (accompanied by a Reference to a Prime Data Element or Prime Granule in the Sieve), or a Derivative Element (accompanied by a Reference to a Prime Data Element or Prime Granule in the Sieve, plus a Reconstitution Program that generates the Derivative Element from the Prime Data Element being referred to). During the derivation step, the Threshold for accepting the derivation may be set to be a fraction of the size of the original Huffman Coded information that resided in the Main Data field of the frame being reduced. Thus, unless the sum of the Reconstitution Program and the reference to the Prime Data Element is less than this fraction of the size of the corresponding Main Data field of the MP3 encoded frame (that contained Huffman coded data), the derivation will not be accepted. If the sum of the Reconstitution Program and the reference to the Prime Data element is less than this fraction of the size of the existing Main Data field of the encoded MP3 frame (that contained Huffman coded data), a decision can be made to accept the Derivation.

The above described method enables the exploitation of redundancy at a global scope, across multiple Audio Granules stored in the apparatus. MP3 Encoded Data files may be transformed into Distilled MP3 Data and stored in losslesly reduced form. When needed to be retrieved, the data retrieval process (employing Retriever 1871 and Reconstitutor 1872) can be invoked to reconstitute the MP3 Encoded Data 1873. In the apparatus shown in FIG. 18C, the Reconstitutor is responsible for executing the Reconstitution Program to generate the desired Granule. It is additionally enhanced to perform the Huffman Coding step (shown as Huffman Coding 1811 in FIG. 18A) needed to generate the MP3 Encoded data. This data can then be fed to a standard MP3 Decoder to play the audio.

In this fashion, the Data Distillation Apparatus may be adapted and employed to further reduce the size of MP3 audio files.

In another variation of the scheme described, upon receiving an MP3 Encoded Stream, the Parser/Factorizer takes the entire Main Data field as a Candidate Element for derivation or as a Prime Data Element for installation into the Prime Data Sieve. In this variation, all Elements will continue to remain Huffman Coded, and Reconstitution Programs will operate upon Elements that are already Huffman Coded. This variation of the Data Distillation Apparatus may also be employed to further reduce the size of MP3 audio files.

In a manner similar to that described in the preceding sections and illustrated in FIGS. 18A-C, the Data Distillation™ apparatus can be employed for the purposes of lossless reduction of video data. The data reduction accomplished by the method is achieved by deriving components of the video data from prime data elements resident in a content associative sieve. Video data streams comprise of audio and moving picture components. A method for distillation of the audio component has already been described. The moving picture components will now be addressed. The moving picture components are typically organized as a series of groups of pictures. A group of pictures starts off with an I frame and is typically followed by a number of predicted frames (called P frames and B frames). The I frames are typically bulkier and contain a complete snapshot of the picture, while the predicted frames are derived after employing techniques such as motion estimation with respect to the I frame or with respect to other derived frames. Some embodiments of the Data Distillation™ apparatus extract the I frames from the video data as Elements and perform the data distillation process on them, thus retaining certain I frames as prime data elements resident in a content associative sieve, while the rest of the I frames are derived off the prime data elements. The described method enables the exploitation of redundancy at a global scope, across multiple I frames both within the video file and across multiple video files. Since I frames are typically the bulky component of the moving picture data, this approach will yield a reduction in the footprint of the moving picture component. Applying the distillation technique to both the audio component as well as the moving picture component will serve to losslessly reduce the overall size of the video data.

Figure 19:
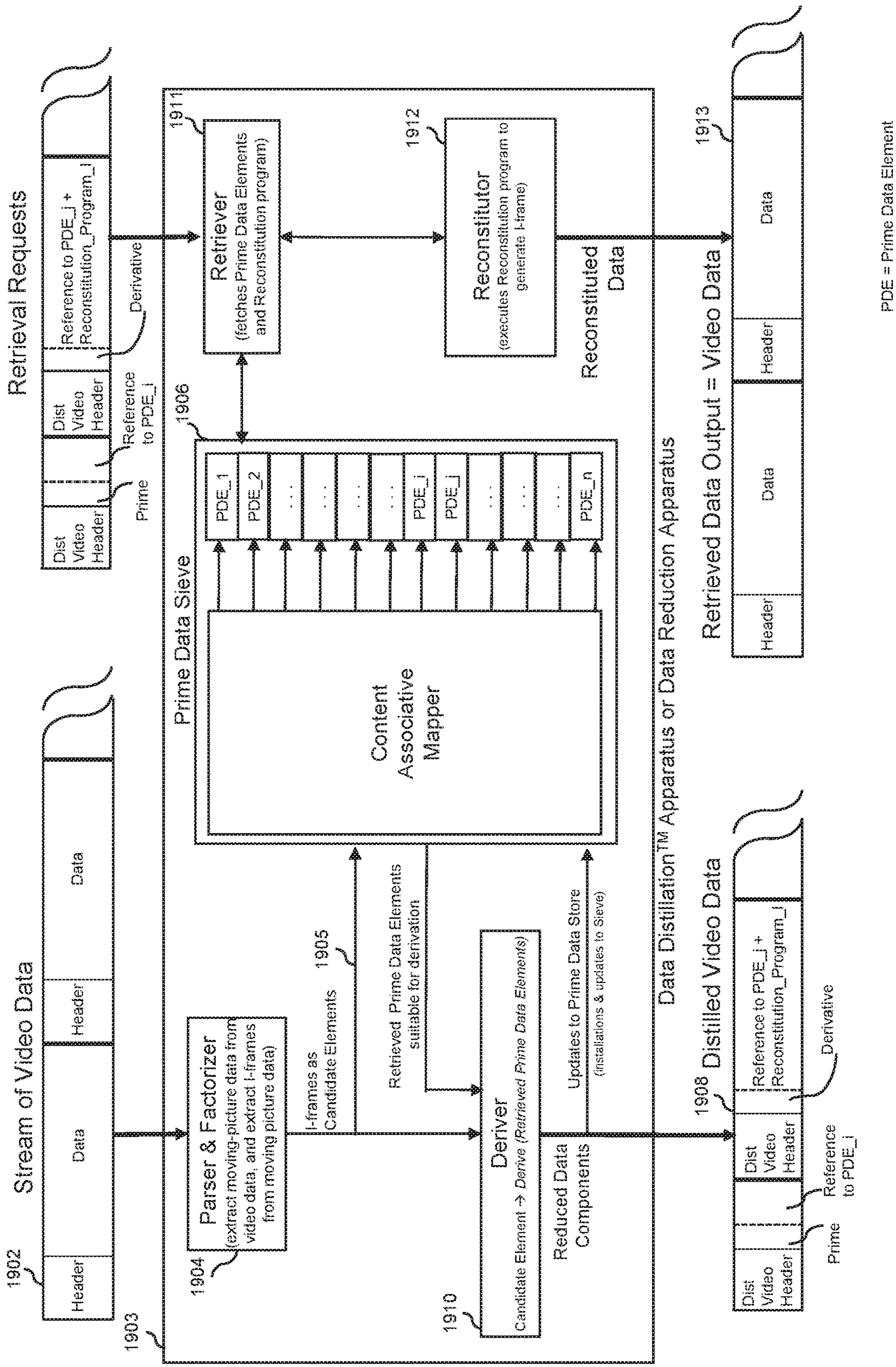
FIG. 19 shows how the Data Distillation apparatus first shown in FIG. 1A can be enhanced to perform data reduction on video data.

FIG. 19 shows how the Data Distillation apparatus first shown in FIG. 1A can be enhanced to perform data reduction on video data. Stream of Video Data 1902 is received by the Data Distillation Apparatus 1903 and reduced into a stream of Distilled Video Data 1908, stored in the losslessly reduced form. The incoming Stream of Video Data 1902 comprises two components—compressed moving-picture data and compressed audio data. The outgoing Distilled Video Data created by the apparatus also comprises two components, i.e., compressed moving-picture data and compressed audio data; however, these components are further reduced in size by Data Distillation Apparatus 1903. Parser/Factorizer 1904 extracts the compressed moving-picture data and compressed audio data from the Stream of Video Data 1902, and extracts (including performing any required Huffman decoding) intra-frames (I-frames) and predicted-frames from the compressed moving-picture data. I-frames are used as Candidate Elements 1905 to perform the content-associated lookup in Prime Data Sieve 1906. The set of Prime Data Elements (which are also I-frames) returned by Prime Data Sieve 1906 are used by Deriver 1910 to generate a losslessly reduced representation or distilled representation of the I-frame, and the losslessly reduced I-frame is placed in the Distilled Video Data 1908. The distilled representation is encoded using a format shown in FIG. 1H—each Element in the Distilled Data is either a Prime Data Element (accompanied by a Reference to a Prime Data Element in the Sieve), or a Derivative Element (accompanied by a Reference to a Prime Data Element in the Sieve, plus a Reconstitution Program that generates the Derivative Element from the Prime Data Element being referred to). During the derivation step, the Threshold for accepting the derivation may be set to be a fraction of the size of the original I-frame. Thus, unless the sum of the Reconstitution Program and the reference to the Prime Data Element is less than this fraction of the size of the corresponding I-frame, the derivation will not be accepted. If the sum of the Reconstitution Program and the reference to the Prime Data element is less than this fraction of the size of the original I-frame, a decision can be made to accept the Derivation.

The above described method enables the exploitation of redundancy at a global scope, across multiple I-frames of multiple video data sets stored in the apparatus. When needed to be retrieved, the data retrieval process (employing Retriever 1911 and Reconstitutor 1912) can be invoked to reconstitute the Video Data 1913. In the apparatus shown in FIG. 19, the Reconstitutor is responsible for executing the Reconstitution Program to generate the desired I-frame. It is additionally enhanced to combine the compressed audio data with the compressed moving-picture data (essentially the inverse of the extraction operations that were performed by Parser & Factorizer 1904) to generate the Video Data 1913. This data can then be fed to a standard video decoder to play the video.

In this fashion, the Data Distillation Apparatus may be adapted and employed to further reduce the size of video files.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for reducing video data, the method comprising:

extracting compressed moving-picture data and compressed audio data from the video data;

extracting intra-frames (I-frames) from the compressed moving-picture data;

extracting a set of predicted frames from the compressed moving-picture data;

maintaining a data structure that organizes prime data elements, wherein each prime data element is an I-frame, wherein each prime data element has a name that is constructed by concatenating bytes extracted from specific locations in the prime data element, and wherein the data structure organizes the prime data elements based on the names of the prime data elements;

losslessly reducing the I-frames to obtain losslessly-reduced I-frames, wherein losslessly reducing the I-frames comprises, for each I-frame, identifying a first set of prime data elements by using the I-frame to perform a first content-associative lookup on a data structure that organizes prime data elements based on their names, wherein said performing the first content-associative lookup comprises (1) constructing a name of the I-frame using the same method that was used to construct names of prime data elements in the data structure, and (2) using the name of the I-frame to navigate through the data structure, and using the first set of prime data elements to losslessly reduce the I-frame to obtain (i) if the I-frame is a duplicate of a prime data element in the first set of prime data elements, a reference to the prime data element, or (ii) if the I-frame is not a duplicate of any prime data elements in the first set of prime data elements, a reference to one or more prime data elements in the first set of prime data elements, and a sequence of transformations that derives the I-frame from the one or more prime data elements; and wherein the reduced video data comprises the losslessly-reduced I-frames, prime data elements referenced by the losslessly-reduced I-frames, the set of predicted frames, and the compressed audio data.

2. The method of claim 1, wherein using the first set of prime data elements to losslessly reduce the I-frame comprises:

in response to determining that a sum of (i) sizes of references to the first set of prime data elements and (ii) a size of a description of a reconstitution program is less than a threshold fraction of a size of the I-frame, generating a first losslessly reduced representation of the I-frame, wherein the first losslessly reduced representation includes a reference to each prime data element in the first set of prime data elements and a description of the reconstitution program; and in response to determining that the sum of (i) the sizes of the references to the first set of prime data elements and (ii) the size of the description of the reconstitution program is greater than or equal to the threshold fraction of the size of the I-frame, adding the I-frame as a new prime data element in the data structure, and generating a second losslessly reduced representation of the I-frame, wherein the second losslessly reduced representation includes a reference to the new prime data element.

3. The method of claim 1, wherein the method further comprises:

decompressing the compressed audio data to obtain a set of audio components; and for each audio component in the set of audio components, identifying a second set of prime data elements by using the audio component to perform a second content-associative lookup on the data structure that organizes prime data elements based on their contents, and using the second set of prime data elements to losslessly reduce the audio component.

4. The method of claim 3, wherein using the second set of prime data elements to losslessly reduce the audio component comprises:

in response to determining that a sum of (i) sizes of references to the second set of prime data elements and (ii) a size of a description of a reconstitution program is less than a threshold fraction of a size of the audio component, generating a first losslessly reduced representation of the audio component, wherein the first losslessly reduced representation includes a reference to each prime data element in the second set of prime data elements and a description of the reconstitution program; and in response to determining that the sum of (i) the sizes of the references to the second set of prime data elements and (ii) the size of the description of the reconstitution program is greater than or equal to the threshold fraction of the size of the audio component, adding the audio component as a new prime data element in the data structure, and generating a second losslessly reduced representation of the audio component, wherein the second losslessly reduced representation includes a reference to the new prime data element.

5. The method of claim 4, wherein the description of the reconstitution program specifies a sequence of transformations which, when applied to the second set of prime data elements, results in the audio component.

6. The method of claim 1, wherein said extracting the I-frames from the compressed moving-picture data comprises performing Huffman decoding.

7. The method of claim 6, further comprising:

extracting a set of predicted frames from the compressed moving-picture data; and after said losslessly reducing the I-frames to obtain the losslessly-reduced I-frames, performing Huffman coding on the losslessly-reduced I-frames to obtain Huffman-coded losslessly-reduced I-frames, thereby obtaining reduced video data comprising the Huffman-coded losslessly-reduced I-frames, the set of predicted frames, and the compressed audio data.

8. The method of claim 7, further comprising:

in response to receiving a request to retrieve the video data, recreating the compressed moving-picture data by (1) performing Huffman decoding on the Huffman-coded losslessly-reduced I-frames to obtain the losslessly-reduced I-frames, (2) reconstituting the I-frames from the losslessly-reduced I-frames, and (3) performing Huffman coding on the I-frames and combining with the set of predicted frames, and combining the compressed moving-picture data with the compressed audio data to obtain the video data.

9. A non-transitory computer-readable storage medium storing instructions that, when executed by a computer, cause the computer to perform a method for reducing video data, the method comprising:

extracting compressed moving-picture data and compressed audio data from the video data;

extracting intra-frames (I-frames) from the compressed moving-picture data;

extracting a set of predicted frames from the compressed moving-picture data;

maintaining a data structure that organizes prime data elements, wherein each prime data element is an I-frame, wherein each prime data element has a name that is constructed by concatenating bytes extracted from specific locations in the prime data element, and wherein the data structure organizes the prime data elements based on the names of the prime data elements;

losslessly reducing the I-frames to obtain losslessly-reduced I-frames, wherein losslessly reducing the I-frames comprises, for each I-frame, identifying a first set of prime data elements by using the I-frame to perform a first content-associative lookup on a data structure that organizes prime data elements based on their names, wherein said performing the first content-associative lookup comprises (1) constructing a name of the I-frame using the same method that was used to construct names of prime data elements in the data structure, and (2) using the name of the I-frame to navigate through the data structure, and using the first set of prime data elements to losslessly reduce the I-frame to obtain (i) if the I-frame is a duplicate of a prime data element in the first set of prime data elements, a reference to the prime data element, or (ii) if the I-frame is not a duplicate of any prime data elements in the first set of prime data elements, a reference to one or more prime data elements in the first set of prime data elements, and a sequence of transformations that derives the I-frame from the one or more prime data elements; and wherein the reduced video data comprises the losslessly-reduced I-frames, prime data elements referenced by the losslessly-reduced I-frames, the set of predicted frames, and the compressed audio data.

10. The non-transitory computer-readable storage medium of claim 9, wherein using the first set of prime data elements to losslessly reduce the I-frame comprises:

in response to determining that a sum of (i) sizes of references to the first set of prime data elements and (ii) a size of a description of a reconstitution program is less than a threshold fraction of a size of the I-frame, generating a first losslessly reduced representation of the I-frame, wherein the first losslessly reduced representation includes a reference to each prime data element in the first set of prime data elements and a description of the reconstitution program; and in response to determining that the sum of (i) the sizes of the references to the first set of prime data elements and (ii) the size of the description of the reconstitution program is greater than or equal to the threshold fraction of the size of the I-frame, adding the I-frame as a new prime data element in the data structure, and generating a second losslessly reduced representation of the I-frame, wherein the second losslessly reduced representation includes a reference to the new prime data element.

11. The non-transitory computer-readable storage medium of claim 9, wherein the method further comprises:

decompressing the compressed audio data to obtain a set of audio components; and for each audio component in the set of audio components, identifying a second set of prime data elements by using the audio component to perform a second content-associative lookup on the data structure that organizes prime data elements based on their contents, and using the second set of prime data elements to losslessly reduce the audio component.

12. The non-transitory computer-readable storage medium of claim 11, wherein using the second set of prime data elements to losslessly reduce the audio component comprises:

in response to determining that a sum of (i) sizes of references to the second set of prime data elements and (ii) a size of a description of a reconstitution program is less than a threshold fraction of a size of the audio component, generating a first losslessly reduced representation of the audio component, wherein the first losslessly reduced representation includes a reference to each prime data element in the second set of prime data elements and a description of the reconstitution program; and in response to determining that the sum of (i) the sizes of the references to the second set of prime data elements and (ii) the size of the description of the reconstitution program is greater than or equal to the threshold fraction of the size of the audio component, adding the audio component as a new prime data element in the data structure, and generating a second losslessly reduced representation of the audio component, wherein the second losslessly reduced representation includes a reference to the new prime data element.

13. The non-transitory computer-readable storage medium of claim 12, wherein the description of the reconstitution program specifies a sequence of transformations which, when applied to the second set of prime data elements, results in the audio component.

14. The non-transitory computer-readable storage medium of claim 9, wherein said extracting the I-frames from the compressed moving-picture data comprises performing Huffman decoding.

15. The non-transitory computer-readable storage medium of claim 14, further comprising:

extracting a set of predicted frames from the compressed moving-picture data; and after said losslessly reducing the I-frames to obtain the losslessly-reduced I-frames, performing Huffman coding on the losslessly-reduced I-frames to obtain Huffman-coded losslessly-reduced I-frames, thereby obtaining reduced video data comprising the Huffman-coded losslessly-reduced I-frames, the set of predicted frames, and the compressed audio data.

16. The non-transitory computer-readable storage medium of claim 15, further comprising:

in response to receiving a request to retrieve the video data, recreating the compressed moving-picture data by (1) performing Huffman decoding on the Huffman-coded losslessly-reduced I-frames to obtain the losslessly-reduced I-frames, (2) reconstituting the I-frames from the losslessly-reduced I-frames, and (3) performing Huffman coding on the I-frames and combining with the set of predicted frames, and combining the compressed moving-picture data with the compressed audio data to obtain the video data.

17. An apparatus, comprising:

a processor; and a non-transitory computer-readable storage medium storing instructions that, when executed by the processor, cause the apparatus to perform a method for reducing video data, the method comprising:

extracting compressed moving-picture data and compressed audio data from the video data;

extracting intra-frames (I-frames) from the compressed moving-picture data;

extracting a set of predicted frames from the compressed moving-picture data;

maintaining a data structure that organizes prime data elements, wherein each prime data element is an I-frame, wherein each prime data element has a name that is constructed by concatenating bytes extracted from specific locations in the prime data element, and wherein the data structure organizes the prime data elements based on the names of the prime data elements;

losslessly reducing the I-frames to obtain losslessly-reduced I-frames, wherein losslessly reducing the I-frames comprises, for each I-frame, identifying a first set of prime data elements by using the I-frame to perform a first content-associative lookup on a data structure that organizes prime data elements based on their names, wherein said performing the first content-associative lookup comprises (1) constructing a name of the I-frame using the same method that was used to construct names of prime data elements in the data structure, and (2) using the name of the I-frame to navigate through the data structure, and using the first set of prime data elements to losslessly reduce the I-frame to obtain (i) if the I-frame is a duplicate of a prime data element in the first set of prime data elements, a reference to the prime data element, or (ii) if the I-frame is not a duplicate of any prime data elements in the first set of prime data elements, a reference to one or more prime data elements in the first set of prime data elements, and a sequence of transformations that derives the I-frame from the one or more prime data elements; and wherein the reduced video data comprises the losslessly-reduced I-frames, prime data elements referenced by the losslessly-reduced I-frames, the set of predicted frames, and the compressed audio data.

18. The apparatus of claim 17, wherein using the first set of prime data elements to losslessly reduce the I-frame comprises:

in response to determining that a sum of (i) sizes of references to the first set of prime data elements and (ii) a size of a description of a reconstitution program is less than a threshold fraction of a size of the I-frame, generating a first losslessly reduced representation of the I-frame, wherein the first losslessly reduced representation includes a reference to each prime data element in the first set of prime data elements and a description of the reconstitution program; and in response to determining that the sum of (i) the sizes of the references to the first set of prime data elements and (ii) the size of the description of the reconstitution program is greater than or equal to the threshold fraction of the size of the I-frame, adding the I-frame as a new prime data element in the data structure, and generating a second losslessly reduced representation of the I-frame, wherein the second losslessly reduced representation includes a reference to the new prime data element.

* * * * *